US005905286A

United States Patent [19]

Iwamatsu et al.

[11] Patent Number: 5,905,286

[45] **Date of Patent: *May 18, 1999**

[54] SEMICONDUCTOR DEVICE

[75] Inventors: Toshiaki Iwamatsu; Yasuo Yamaguchi; Shigenobu Maeda; Shoichi Miyamoto; Akihiko Furukawa; Yasuo Inoue, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/794,504

[22] Filed: Feb. 4, 1997

Related U.S. Application Data

[63] Continuation of application No. 08/461,777, Jun. 5, 1995, abandoned.

[30] Foreign Application Priority Data

| | | | |
|---|---|---|---|
| Nov. 2, 1994 | [JP] | Japan | 6-269695 |
| Dec. 15, 1994 | [JP] | Japan | 6-334025 |

[51] Int. Cl.[6] .......... H01L 27/01; H01L 27/12; H01L 31/0392

[52] U.S. Cl. .......... 257/347

[58] Field of Search .......... 257/347

[56] References Cited

U.S. PATENT DOCUMENTS

| | | | |
|---|---|---|---|
| 4,753,896 | 6/1988 | Matloubian . | |
| 5,023,197 | 6/1991 | Haond et al. . | |
| 5,039,621 | 8/1991 | Pollack . | |
| 5,294,281 | 3/1994 | Iwamaysu | 257/347 |
| 5,550,397 | 8/1996 | Lifshitz et al. . | |

FOREIGN PATENT DOCUMENTS

| | | |
|---|---|---|
| 60-258957 | 12/1985 | Japan . |
| 61-251166 | 11/1986 | Japan . |
| 63-237573 | 10/1988 | Japan . |
| 1-196811 | 8/1989 | Japan . |
| 1295463 | 11/1989 | Japan . |
| 2-187069 | 7/1990 | Japan . |
| 2-224276 | 9/1990 | Japan . |
| 3-24735 | 2/1991 | Japan . |
| 4-83361 | 3/1992 | Japan . |
| 4-176165 | 6/1992 | Japan . |
| 5-152570 | 6/1993 | Japan . |
| 5-166919 | 7/1993 | Japan . |
| 6-85053 | 3/1994 | Japan . |

OTHER PUBLICATIONS

Electronics Letters, Aug. 18, 1983, vol. 19 No. 17, pp. 684–685.

"Novel LSI/SOI Wafer Fabrication Using Device Layer Transfer Technique", Hamaguchi et al., IEDM 85, pp. 688–691.

*Primary Examiner*—Steohen D. Meier
*Attorney, Agent, or Firm*—McDermott, Will & Emery

[57] ABSTRACT

In a semiconductor device having an SOI structure and a method of manufacturing the same, influence by a parasitic transistor can be prevented, and no disadvantage is caused in connection with a manufacturing process. In this semiconductor device, an upper side portion of a semiconductor layer is rounded. Thereby, concentration of an electric field at the upper side portion of the semiconductor layer can be prevented. As a result, lowering of a threshold voltage of a parasitic transistor can be prevented, so that the parasitic transistor does not adversely affect subthreshold characteristics of a regular transistor. Owing to provision of a concavity of a U-shaped section, generation of etching residue can be prevented when etching a gate electrode for patterning the same. Thereby, a disadvantage is not caused in connection with the manufacturing process.

15 Claims, 108 Drawing Sheets

8a 13 6 8a 13 8a
109
2
1
13 3a 3b 50 3d 3c 3a 13 13 3e 50 3g 3f 13

SEMICONDUCTOR DEVICE

This application is a continuation of application Ser. No. 08/461,777 filed Jun. 5, 1995 now abandoned.

BACKGROUND OF THE INVENTION

1. Field of the Invention

The present invention relates in general to a semiconductor device and a method of manufacturing the same, and in particular to a semiconductor device formed on an insulating layer and a method of manufacturing the same.

2. Description of the Background Art

In order to improve the performance of semiconductor devices, there have been developed semiconductor devices in which circuit elements are isolated by dielectrics and a floating capacitance is small. For forming transistors on a thin silicon film on an insulating film, which will be referred to as an SOI (Silicon On Insulation) layer, an MESA isolating method is used for isolating the transistors from each other. According to this MESA isolating method, the isolated transistors are formed at completely isolated or insular SOI layers, respectively. This brings about many advantages such as prevention of influence of latch-up between adjacent transistors.

FIGS. 198 to 206 are cross sections showing a process of manufacturing an SOI-MOSFET using a conventional MESA isolating method. Referring to FIG. 206, description will be given on a structure of the SOI-MOSFET formed by the conventional MESA solating method. In this SOI-MOSFET, a buried oxide film 2 is formed on a silicon substrate 1. SOI layers 3 are formed at predetermined regions on buried oxide film 2 with a predetermined space between each other. Silicon substrate 1, buried oxide film 2 and SOI layers 3 form an SOI substrate. Source/drain regions 3*e* and 3*f* having an LDD structure are formed on SOI layer 3 at an PMOS region with a predetermined space between each other and are located at opposite sides of a channel region 3*g*. Titanium silicide films 8*a* are formed on the surfaces of source/drain regions 3*e* and 3*f*. A gate electrode 6 is formed on channel region 3*g* with a gate oxide film 5 therebetween. Titanium silicide film 8*a* is also formed also on the upper surface of gate electrode 6. Side wall oxide films 13 are formed in contact with side surfaces of gate electrode 6.

On SOI layer 3 at an NMOS region, there are formed source/drain regions 3*b* and 3*c* having an LDD structure with a predetermined space between each other and are located at opposite sides of a channel region 3*d*. A gate electrode 6 is formed on channel region 3*d* with a gate oxide film 50 therebetween. Side wall oxide films 13 are formed in contact with side surfaces of gate electrode 6. Titanium silicide films 8*a* are formed on source/drain regions 3*b* and 3*c* and gate electrode 6. The PMOS and NMOS regions are covered with an interlayer oxide film 9. Contact holes are formed at regions of interlayer oxide film 9 located above source/drain regions 3*b*, 3*c*, 3*e* and 3*f*. There are provided metal interconnection layers 10 having portions filling the contact holes. Gate electrodes 6 are formed of polycrystalline silicon films containing phosphorus (P) at $1\times10^{20}/cm^2$ or more. Titanium silicide films 8*a* are formed for reducing resistances of source/drain regions 3*b*, 3*c*, 3*e* and 3*f* and gate electrode 6.

Referring to FIGS. 198 to 206, a process of manufacturing the SOI-MOSFET using the conventional MESA isolating method will be described below.

As shown in FIG. 198, buried oxide film 2 is first formed on silicon substrate 1. After forming SOI layer 3 on buried oxide film 2, a surface of SOI layer 3 is oxidized to form oxide film 5 having a thickness from about 100 Å to about 200 Å. A resist 201 is formed at predetermined regions on oxide film 5. Using resist 201 as a mask, dry etching is effected on oxide film 5 and SOI layer 3. Thereby, SOI layers 3 forming active regions of transistors spaced by a predetermined distance are formed as shown in FIG. 199.

In this isolating method, predetermined regions of SOI layer 3 are removed by the etching to break electrical connection between adjacent transistors, which is called the MESA isolating method. Thereafter, resist 201 is removed. A resist 202 is formed to cover the PMOS region. Using resist 202 as a mask, boron ions are implanted into SOI layer 3 at the NMOS region under the conditions of 20 keV and $1\times10^{12}$–$3\times10^{12}/cm^2$. This implantation is performed for forming the channel region of NMOSFET. Thereafter, resist 202 is removed.

As shown in FIG. 200, a resist 203 is then formed over the NMOS region. Using resist 203 as a mask, phosphorus ions are implanted into SOI layer 3 at the PMOS region under the conditions of 30 kev and $1\times10^{11}$–$3\times10^{11}/cm^2$. This implantation is performed for forming the channel region of the PMOSFET. Thereafter, resist 203 is removed. Oxide film 5 on SOI layer 3 is removed.

As shown in FIG. 201, gate oxide film 50 having a thickness of about 100 Å is formed over each SOI layer 3. Polycrystalline silicon layer 6 containing phosphorus at $1\times10^{20}/cm^2$ or more and having a thickness of about 2000 Å is formed over gate oxide films 50 and buried oxide film 2. A resist 204 is formed at predetermined regions on polycrystalline silicon layer 6. Using resist 204 as a mask, dry etching is effected on polycrystalline silicon layer 6 to form gate electrodes 6 as shown in FIG. 202. After removing resist 204 (shown in FIG. 201), a resist 205 is formed over the PMOS region. Using resist 205 and gate electrodes 6 at the NMOS region as a mask, phosphorus ions are implanted into SOI layer 3 at the NMOS region under the conditions of 40 keV and $1\times10^{13}$–$3\times10^{13}/cm^2$. This implantation is performed for forming a lightly doped region in the LDD structure. Thereafter, resist 205 is removed.

As shown in FIG. 203, a resist 206 is formed over the NMOS region. Using resist 206 as a mask, boron ions are implanted into SOI layer 3 at the PMOS region under the conditions of 20 keV and $1\times10^{13}$–$3\times10^{13}/cm^2$. This implantation is performed for forming a lightly doped region forming the LDD structure of the PMOSFET. Thereafter, resist 206 is removed.

As shown in FIG. 204, side wall insulating films 13 are formed in contact with side surfaces of gate electrode 6. Side wall insulating films 13 may be formed by effecting anisotropic etching on an insulating film (now shown) which was formed over gate electrode 6. Thereafter, a resist 207 is formed over the PMOS region. Using resist 207, gate electrode 6 at the NMOS region and side wall insulating films 13 as a mask, phosphorus ions are implanted into SOI layer 3 at the NMOS region under the conditions of 40 keV and $4\times10^{15}$–$6\times10^{15}/cm^2$. This implantation is performed for forming heavily doped regions forming the source/drain regions in the NMOSFET. Thereafter, resist 207 is removed. Arsenic may be used as implanted ion species for the source/drain regions.

As shown in FIG. 205, a resist 208 is formed over the NMOS region. Using resist 208, gate electrode 6 at the PMOS region and side wall insulating films 13 as a mask, boron ions are implanted into SOI layer 3 at the PMOS region under the conditions of 20 keV and $4\times10^{15}$–$6\times10^{15}$/cm$^2$. This implantation is performed for forming heavily doped regions forming the source/drain regions in the PMOSFET. Thereby, source/drain regions 3*e* and 3*f* having the LDD structure are formed. Thereafter, resist 208 is removed.

Then, as shown in FIG. 206, titanium silicide layers 8*a* are formed on the surfaces of source/drain regions 3*b,* 3*c,* 3*e* and 3*f* and gate electrodes 6. After forming interlayer insulating film 9 of about 7000 Å in thickness over the whole surface, the contact holes are formed at regions located above source/drain regions 3*b,* 3*c,* 3*e* and 3*f.* The aluminum layer having portions filling the contact holes is formed and then is patterned to form metal interconnection layers 10. In this manner, the SOI-CMOSFETs isolated by the conventional MESA isolating method are completed as shown in FIG. 206.

However, in the conventional semiconductor device thus constructed, a parasitic transistor is formed at a region where gate electrode 6 and SOI layer 3 overlap with each other, and in particular at a region near the side surface of SOI layer 3. FIG. 207 is a cross section taken along line perpendicular to the section shown in FIG. 206. Referring to FIG. 207, an electric field concentrates at an upper end of SOI layer 3 where the parasitic transistor is formed, and an interface level is formed at the upper end due to the process. Therefore, a disadvantage occurs in connection with subthreshold characteristics of a regular MOS transistor formed at SOI layer 3. More specifically, since the threshold voltage of parasitic transistor lowers as already described, such a disadvantage is caused that the parasitic transistor is turned on by a voltage lower than the threshold voltage of the regular transistor. This and other disadvantages are specifically disclosed in "ELECTRONICS LETTERS 18th, August", Vol. 19, No. 17, 1983, pp. 684–685.

In order to overcome the above-noted problem, there have been proposed manufacturing processes for preventing concentration of electric field at the upper end of SOI layer 3. These are disclosed, for example, in U.S. Pat. No. 4,753,896. FIGS. 208 to 214 are cross sections showing the proposed manufacturing process. Referring to FIGS. 208 to 214, the proposed manufacturing process will be described below.

As shown in FIG. 208, buried insulating film 2 is first formed on semiconductor substrate 1. SOI layer 3 is formed on buried insulating film 2. A nitride film 4*a* is formed at a predetermined region of SOI layer 3 with oxide film 5 therebetween. Using nitride film 4*a* as a mask, impurity is ion-implanted into SOI layer 3. This ion implantation is performed for raising a threshold voltage of a parasitic transistor.

As shown in FIG. 209, side wall nitride film 4*b* is then formed in contact with side surfaces of nitride film 4*a* and oxide film 5. Using side wall nitride film 4*b* and nitride film 4*a* as a mask, dry etching is effected on SOI layer 3 to form patterned SOI layer 3 shown in FIG. 210.

As shown in FIG. 211, an oxide film 120 is formed to cover nitride film 4*a,* side wall nitride film 4*b,* SOI layer 3 and buried oxide film 2. Anisotropic etching is effected on oxide film 120 to form side wall oxide films 120 as shown in FIG. 213. Thereafter, nitride film 4*a,* side wall nitride film 4*b* and oxide film 5 are removed. As shown in FIG. 214, gate oxide film 50 is formed over SOI layer 3 and side wall oxide film 120, and then gate electrode 6 is formed on gate oxide film 50. In the structure thus formed, since side wall oxide film 120 is interposed between the side surface of SOI layer 3 and gate electrode 6, a portion of the parasitic transistor corresponding to a gate oxide film has a large thickness, so that an electric field applied from gate electrode 6 in the parasitic transistor is weaken. Consequently, the subthreshold characteristics of regular transistor is prevented from being affected by the characteristics of the parasitic transistor.

However, the proposed manufacturing process may suffer from the following problem FIGS. 215 to 217 are cross sections showing the problem of the proposed manufacturing process. In the proposed manufacturing process, heat treatment is performed to activate the impurity implanted into SOI layer 3 after forming oxide film 120 at the step shown in FIG. 212. During this heat treatment, oxidant moves up to the bottom and upper surfaces of the side portion of SOI layer 3 as shown in FIG. 215. Thereby, the side portion of SOI layer 3 is shaped into an acute form. In this state, the side wall oxide film 120 is formed as shown in FIG. 216, and then gate oxide film 50 and gate electrode 6 are formed. In this case, an electric field concentrates at the side portion of SOI layer 3. As a result, the threshold voltage of parasitic transistor lowers, and thus the parasitic transistor tends to be turned on. Thereby, the subthreshold characteristics of regular transistor are adversely affected.

In the process of forming side wall oxide film 120 shown in FIGS. 212 and 213, it is necessary to perform over-etching on oxide film 120 for completely removing oxide film 120 on nitride film 4*a* when performing the anisotropic etching on oxide film 120. As a result of this over-etching, side wall oxide film 120 is formed not to cover the upper portion of side surface of SOI layer 3 as shown in FIG. 219. Gate oxide film 50 and gate electrode 6 are formed over this structure as shown in FIG. 219, whereby the electric field disadvantageously concentrates at the upper side end of SOI layer 3. This lowers the threshold voltage of parasitic transistor, and thus the subthreshold characteristics of regular transistor are adversely affected. As described above, various problems arise in the manufacturing process proposed in the prior art, and consequently, it is difficult to improve the subthreshold characteristics of regular transistor.

SUMMARY OF THE INVENTION

An object of the invention is to provide a semiconductor device which is not affected by a parasitic transistor.

Another object of the invention is to provide a semiconductor device which can prevent concentration of an electric field at the vicinity of a side surface of an SOI layer.

Still another object of the invention is to provide a method which can easily manufacture a semiconductor device not affected by a parasitic transistor without complicating a manufacturing process.

A semiconductor device according to an aspect of the invention includes a semiconductor layer and a field-effect transistor. The semiconductor layer is formed at a predetermined region of an insulating layer, and has a main surface. The field-effect transistor is formed on the main surface of the semiconductor layer. The semiconductor layer has a round section at an upper portion of its side surface, and the insulating layer has a U-shaped concavity at a region located near a lower end of the side surface of the semiconductor layer. Preferably, the lower end of the side surface of the semiconductor layer may extend substantially perpendicularly to the main surface of the insulating layer, and an open end of the concavity of the insulating layer may extend continuously to the lower end of the side surface of the semiconductor layer. Preferably, a first side wall insulating film may be further formed in contact with the side surface of the semiconductor layer, and a second side wall insulating film may be formed in contact with a side surface of the first side wall insulating film.

According to the semiconductor device described above, since the upper side portion of the semiconductor layer located on the insulating layer has a round section, it is possible to prevent concentration of an electric filed at the upper side portion of the semiconductor layer. Thereby, lowering of a threshold voltage of a parasitic transistor is prevented. Since the insulating layer has the U-shaped concavity at the region located near the lower end of the side surface of the semiconductor layer, etching residue is prevented from remaining at the vicinity of the lower end of the side surface of the semiconductor layer when patterning a gate electrode layer at a later step. If the first side wall insulating film is provided in contact with the side surface of the semiconductor layer and the second side wall insulating film is provided in contact with the side surface of the first side wall insulating film, the first and second side wall insulating films are interposed between the side surface of the semiconductor layer and the gate electrode, which weakens an influence by an electric field applied from the gate electrode to the side surface of semiconductor layer. Thereby, the threshold voltage of the parasitic transistor increases.

A semiconductor device according to another aspect of the invention includes an insulating layer, a semiconductor layer, an oxide film, a first field-effect transistor and a nitride film. The insulating layer is patterned to have an isolated or insular form, and has a main surface. The semiconductor layer is formed on the main surface of the insulating layer. The oxide film is formed in contact with at least a side surface of the semiconductor layer. The first field-effect transistor is formed on the main surface of the semiconductor layer. The nitride film is formed in contact with a side surface of the insulating layer and a lower portion of the oxide film located at the side surface of the semiconductor layer. Preferably, the insulating layer may include first and second insulating layers spaced by a predetermined distance, the semiconductor layer may include first and second semiconductor layers formed on main surfaces of the first and second insulating layers, respectively, the nitride film may include a first nitride film formed in contact with a side surface of the first insulating layer and a lower portion of a side surface of the first semiconductor layer, a second nitride film formed in contact with a side surface of the second insulating layer and a lower portion of the side surface of the second semiconductor layer, and an oxide film may be buried between the first and second nitride films. More preferably, the nitride film may be buried such that the first insulating layer and the first semiconductor layer are opposed to the second insulating layer and the second semiconductor layer with the nitride film therebetween. Preferably, the side surface of the semiconductor layer may have a round section at its upper end. Preferably, the patterned insulating layer may be formed on a main surface of a semiconductor substrate, and a second field-effect transistor neighboring to the insulating layer may be formed at the main surface of the semiconductor substrate.

According to the semiconductor device of the above aspect, the nitride film is formed in contact with the side surface of the patterned and isolated insulating layer and the lower portion of the oxide film located at the side surface of the semiconductor layer formed on the insulating layer, so that oxidant is prevented from moving or flowing up to the lower surface of the semiconductor layer when oxidizing the side surface of the semiconductor layer damaged by etching during the patterning. Thereby, the rear surface of the semiconductor layer is not oxidized, and thus a stress is prevented from being applied to the semiconductor layer. The oxide film may be buried between the first nitride film, which is formed in contact with the side surface of the first insulating layer and the lower portion of the side surface of the first semiconductor layer, and the second nitride film, which is formed on the side surface of the second insulating layer and the lower portion of the side surface of the second semiconductor layer, whereby a difference in level or height is reduced, and a parasitic capacitance is reduced. The nitride film may be buried such that the first insulating layer and the first semiconductor layer formed thereon are opposed to the second insulating layer and the second semiconductor layer formed thereon with the nitride film therebetween, whereby a difference in level or height is reduced. The upper end portion of the side surface of the semiconductor layer may have a round section, which prevents concentration of an electric field at the upper end portion of the side surface of the semiconductor layer, so that lowering of the threshold voltage of a parasitic transistor is prevented. If the patterned insulating layer is formed on the main surface of the semiconductor substrate, and the second field-effect transistor neighboring to the insulating layer is formed on the main surface of the semiconductor substrate, the first and second field-effect transistors can be formed without leaving a space therebetween, so that the semiconductor device can be integrated to a higher extent.

A semiconductor device according to still another aspect of the invention includes a semiconductor layer and a field-effect transistor. The semiconductor layer is formed at a predetermined region on the insulating layer, has a main surface, is of a trapezoidal section, and has a round section at an upper portion of its side surface. The field-effect transistor is formed at the main surface of the semiconductor layer.

According to the above structure, concentration of an electric field at the upper side portion of the semiconductor layer can be suppressed as compared with the case where the semiconductor layer has a square section.

A semiconductor device according to yet another aspect of the invention includes semiconductor layers, a gate insulating film and a nitride film. The semiconductor layers are formed on an insulating layer, are located at a plurality of positions with a predetermined space between each other, and having main surfaces. The gate insulating film is formed in contact with upper surfaces and side surfaces of the semiconductor layers. The nitride film is formed to cover portions of the gate insulating film located on the side surfaces of the semiconductor layers and upper surfaces of portions of the insulating layer located between the semiconductor layers adjacent to each other.

According to the above structure, it is possible to prevent movement of oxidant up to lower surfaces of the semiconductor layers when oxidizing the upper portions of the side surfaces of the semiconductor layers. Thereby, a stress is prevented from being applied to the lower surfaces of the semiconductor layers.

A semiconductor layer according to a further aspect of the invention includes semiconductor layers, a concavity, side wall insulating films and a polycrystalline silicon layer. The semiconductor layers are formed on an insulating layer with a predetermined space between each other, and have main surfaces. The concavity is formed at a region of a main surface of the insulating layer located under a side end of the semiconductor layer. The side wall insulating films are in contact with the side surfaces of the semiconductor layers and have portions filling the concavity. The polycrystalline silicon layer is buried at an isolating region between the adjacent semiconductor layers.

According to the semiconductor device of this aspect, since the side wall insulating films formed on the side surfaces of the semiconductor layers fill the concavity at the insulating layer, an influence by an electric field applied from a gate electrode to the side surface of the semiconductor layer is weakened. Thereby, a threshold voltage of a parasitic transistor increases. Since the polycrystalline silicon layer is buried at the isolating region between the adjacent semiconductor layers, the isolating region is flattened. Since the polycrystalline silicon layer has the same thermal expansion coefficient as the semiconductor layer, a thermal stress is effectively suppressed in the structure.

A semiconductor device according to a further aspect of the invention includes an insulating layer, a semiconductor layer and an oxide film. The insulating layer has a convexity at a predetermined region. The semiconductor layer is formed on an upper surface of the convexity and has a portion at its lower surface supported by the convexity. The oxide film is interposed between the upper surface of the convexity and the semiconductor layer.

The above structure prevents generation of fixed electric charges at an interface between the insulating layer and the semiconductor layer.

According to a method of manufacturing a semiconductor device of an aspect of the invention, a nitride film is formed at a predetermined region on a main surface of a first semiconductor layer located on an insulating layer. A side wall insulating film is formed in contact with a side surface of the nitride film. The first semiconductor layer is etched to pattern the first semiconductor layer using the nitride film and the side wall insulating film as a mask. A second semiconductor layer covering at least the insulating layer, the first semiconductor layer and the nitride film is formed. The second semiconductor layer is oxidized to form an oxide film.

The above method can prevent movement of oxidant up to a lower surface of the first semiconductor layer through the insulating layer when oxidizing the second semiconductor layer. Meanwhile, since the oxidant moves onto the upper portion of the side surface of the first semiconductor layer, the upper side portion is oxidized to have a round section. Thereby, it is possible to prevent concentration of an electric field at the upper side portion of the first semiconductor layer, and the semiconductor device which can prevent a stress at the lower surface of the first semiconductor layer can be easily manufactured.

According to a method of manufacturing a semiconductor device of a further aspect of the invention, a nitride film is formed at a predetermined region on a main surface of a semiconductor layer located on an insulating layer, and a side wall insulating film is formed in contact with a side surface of the nitride film. Etching is effected on the semiconductor layer to remove a predetermined thickness using the nitride film and the side wall insulating film as a mask. The semiconductor layer is selectively oxidized to form an oxide film using the nitride film as a mask.

The above method can easily form the semiconductor layer of such a form that an upper portion of its side surface has a round section and a lower portion of the side surface is substantially perpendicular to the insulating layer.

According to a method of manufacturing a semiconductor device of a further aspect of the invention, a nitride film is formed at a predetermined region on a main surface of a semiconductor layer, and the semiconductor layer is selectively oxidized to form an oxide film using the nitride film as a mask. At least a region of the nitride film near its side surface is removed by the etching, and anisotropic etching is effected on the oxide film and the semiconductor layer using the nitride film as a mask.

Thereby, the semiconductor layer has such a form that an upper portion of its side surface has a round section and a lower portion of the side surface is substantially perpendicular to a main surface of the insulating layer. Therefore, the method can easily manufacture the semiconductor device not affected by a parasitic transistor.

According to the method of manufacturing a semiconductor device of a further aspect, after forming a nitride film at a predetermined region on a main surface of a first semiconductor layer, the first semiconductor layer is isotropically etched using the nitride film as a mask for removing a portion of the first semiconductor layer not located under the nitride film and a portion of the first semiconductor layer located under a side surface of the nitride film. A second semiconductor layer is formed by a sputtering method to cover the nitride film, the first semiconductor layer and the insulating layer. The second semiconductor layer is oxidized.

The above method provides the second semiconductor layer of which portion located on a side surface of the first semiconductor layer is thinner than the other portion. This promotes oxidation of the side portion of the first semiconductor layer, which was damaged during the etching, when oxidizing the second semiconductor layer.

According to a method of manufacturing a semiconductor device of a further aspect of the invention, a resist film is formed at a predetermined region on a main surface of a first semiconductor layer located on an insulating layer. Etching is effected on the first semiconductor layer to pattern the first semiconductor layer using the resist film as a mask. Impurity is ion-implanted into a side surface of the first semiconductor layer using the resist film as a mask. After removing the resist film, a sputtering method is performed to form a second semiconductor layer covering the first semiconductor layer and the insulating layer. The second semiconductor layer is oxidized.

This method provides the semiconductor layer of which portion located on a side surface of the first semiconductor layer is thinner than the other portion. This promotes oxidation of the side portion of the first semiconductor layer, which was damaged during the etching, when oxidizing the second semiconductor layer.

According to a method of manufacturing a semiconductor device of a further aspect of the invention, a nitride film is formed at a predetermined region on a main surface of a first semiconductor layer located on an insulating layer. A side wall oxide film is formed in contact with a side surface of the nitride film. The first semiconductor layer is etched to pattern the first semiconductor layer using the nitride film and the side wall oxide film as a mask. After removing the side wall oxide film, inactive ions are implanted into the first semiconductor layer using the nitride film as a mask. Thereafter, heat treatment is performed. The first semiconductor layer is oxidized to form an oxide film using the nitride film as a mask. Impurity ions are implanted into the side surface of the first semiconductor layer through the oxide film.

According to the method of manufacturing the semiconductor device of the above aspect, since the heat treatment is performed after the inactive ions are implanted into the first semiconductor layer using the nitride film as a mask, metal contaminant in the semiconductor layer is gathered into a region into which inactive ions were implanted. By oxidizing the first semiconductor layer, the metal contaminant is taken into the oxide film which is formed by oxidizing the first semiconductor layer. Thereby, the metal contaminant is prevented from remaining at the vicinity of a side surface of the first semiconductor layer.

According to a method of manufacturing a semiconductor device of a further aspect of the invention, a nitride film is formed on a main surface of a first semiconductor layer, and a resist film is formed at a predetermined region on the nitride film. Inactive ions and impurity ions are implanted into a region near a side surface of the first semiconductor layer using the resist film as a mask. A second semiconductor layer is formed to cover the nitride film, the first semiconductor layer and the insulating layer. A region near the side surface of the first semiconductor layer and the second semiconductor layer are oxidized.

Thereby, metal contaminant is absorbed into an oxide film formed by oxidation, and a threshold voltage at the region near the side surface of the first semiconductor layer rises.

According to a method of manufacturing a semiconductor device of a further aspect of the invention, a nitride film is formed at a predetermined region on a main surface of a semiconductor layer, and the semiconductor layer is selectively oxidized over a predetermined thickness to form a first oxide film using the nitride film as a mask. After removing the first oxide film, the semiconductor layer is oxidized over a remaining thickness to form a second oxide film using the nitride film as a mask.

Thereby, a side surface of the semiconductor layer has a round section at and near its upper portion, and also has a lower portion extending substantially perpendicularly to a main surface of the insulating layer. This prevents formation of a region of the semiconductor layer having a reduced thickness near the side surface of the semiconductor layer.

According to a method of manufacturing a semiconductor device of a further aspect of the invention, a nitride film is formed at a predetermined region on a main surface of a semiconductor layer located on an insulating layer. The semiconductor layer is etched to pattern the semiconductor layer using the nitride film as a mask. A side portion of the semiconductor layer is oxidized using the nitride film as a mask. At least a portion of the nitride film located near the side surface of the semiconductor layer is removed. Impurity ions are implanted into a portion near the side surface of the semiconductor layer using the nitride film as a mask.

This allows easy formation of an impurity implanted layer, which serves to raise a threshold voltage of a parasitic transistor, at the vicinity of the side surface of the semiconductor layer.

According to a method of manufacturing a semiconductor device of a further aspect of the invention, a nitride film is formed at a predetermined region on a main surface of a semiconductor layer located on an insulating layer. Then, the semiconductor layer is selectively oxidized to form a first oxide film using the nitride film as a mask. After removing the first oxide film by etching, a side portion of the semiconductor layer is oxidized to form a second oxide film using the nitride film as a mask.

According to the method of manufacturing the semiconductor device of the above aspect, the nitride film formed at the predetermined region on the main surface of the semiconductor layer is used as a mask, and the semiconductor layer is selectively oxidized to form the first oxide film. At this stage, a lower portion of the side surface of the semiconductor layer has an acute form. Thereafter, the side portion of the semiconductor layer is oxidized using the nitride film as a mask. During this oxidation, the acute portion is oxidized prior to oxidation of the other portion, so that the semiconductor layer ultimately has the side portion of a round section.

According to a method of manufacturing a semiconductor device of a further aspect of the invention, a nitride film is formed at a predetermined region on a main surface of a semiconductor layer located on an insulating layer. The semiconductor layer is selectively oxidized over a predetermined thickness to form a first oxide film using the nitride film as a mask. The first oxide film is etched and removed using the nitride film as a mask. A side wall nitride film is formed in contact with a side surface of the nitride film. A predetermined portion of the semiconductor layer is anisotropically etched and removed using the side wall nitride film as a mask. A side surface of the semiconductor layer is oxidized to form a second oxide film.

According to the method of manufacturing the semiconductor device of the above aspect, since the first oxide film is formed by selectively oxidizing the semiconductor layer over a predetermined thickness using the nitride film as a mask, an upper side portion of the semiconductor layer located at a boundary region between the semiconductor layer and the first oxide film is rounded when forming the first oxide film. This suppresses concentration of an electric field applied from a gate electrode to the upper side portion of the semiconductor layer in the completed structure. After forming the side wall nitride film on the side surface of the nitride film, a predetermined portion of the semiconductor layer is removed using the side wall nitride film as a mask, so that the produced semiconductor layer has a thickness larger than the originally designed size by a value corresponding to a thickness of the side wall nitride film. Therefore, an effective channel width is not reduced by oxidation of the side surface of the semiconductor layer.

According to a method of manufacturing a semiconductor device of a further aspect of the invention, a semiconductor layer having a main surface is formed on an insulating layer, and then an oxide film is formed on the main surface of the semiconductor layer. A nitride film is formed on the oxide film. A side wall nitride film being in contact with a side surface of the nitride film is formed on the oxide film. The semiconductor layer is etched into an isolated or insular form using the nitride film and the side wall nitride film as a mask. A side surface of the semiconductor layer is oxidized to form a side wall oxide film using the nitride film and the side wall nitride film as a mask. The nitride film and the side wall nitride film are removed with thermophosphoric acid.

According to the method of manufacturing the semiconductor device of the above aspect, since the nitride film and the side wall nitride film are formed on the oxide film formed on the main surface of the semiconductor layer, the oxide film located under the nitride film and the side wall nitride film serves as a protective film for the semiconductor layer when removing the nitride film and the side wall nitride film with the thermo-phosphoric acid. Thereby, the upper surface of the semiconductor layer is prevented from being etched by the thermo-phosphoric acid when removing the side wall nitride film.

According to a method of manufacturing a semiconductor device of a further aspect of the invention, a second semiconductor layer is formed on a main surface of a first semiconductor layer located on an insulating layer. A nitride film is formed at a predetermined region on a main surface of the second semiconductor layer. The second semiconductor layer is selectively oxidized to give a trapezoidal section to the second semiconductor layer using the nitride film as a mask. The second and first semiconductor layers are anisotropically etched to remove the second semiconductor layer and give a trapezoidal section to the first semiconductor layer.

This method can easily manufacture the semiconductor device which can suppress concentration of an electric field.

According to a method of manufacturing a semiconductor device of a further aspect of the invention, a plurality of isolated semiconductor layers are formed on an insulating layer with a predetermined space between each other. A nitride film is formed to cover an upper surface of the insulating layer located at an isolation region between the adjacent semiconductor layers as well as a side surface of the semiconductor layer. An upper side portion of the semiconductor layer is oxidized using the nitride film as a mask.

The method can effectively prevent movement of oxidant up to a lower surface of the semiconductor layer when oxidizing the upper side portion of the semiconductor layer.

According to a method of manufacturing a semiconductor device of a further aspect of the invention, a plurality of isolated semiconductor layers are formed on a main surface of an insulating layer with a predetermined space between each other. A concavity is formed at a region of the insulating layer located between the isolated semiconductor layers and near a lower side portion of the semiconductor layer. A side wall insulating film filling the concavity at the lower side portion of the semiconductor layer is formed in contact with the side surface of the semiconductor layer. A polycrystalline silicon layer filling the concavity between the adjacent semiconductor layers is formed.

This method can easily form a structure in which the isolating region is flattened.

According to a method of manufacturing a semiconductor device of a further aspect of the invention, a semiconductor layer is formed on a first insulating layer. A second insulating layer is formed at a region on a main surface of the semiconductor layer corresponding to an isolation region. An epitaxial growth layer having a trapezoidal section is formed by epitaxial growth from an exposed surface of the semiconductor layer using the second insulating layer as a mask. After removing the second insulating layer, anisotropic etching is effected on the epitaxial growth layer and the semiconductor layer to form a plurality of isolated semiconductor layers each having a trapezoidal section.

This method can easily manufacture the semiconductor device which suppresses concentration of an electric field.

According to a method of manufacturing a semiconductor device of a further aspect of the invention, a semiconductor layer is formed at a predetermined region on a main surface of an insulating layer. The insulating layer is isotropically etched, using the semiconductor layer as a mask, to remove a portion of the insulating layer in contact with a lower surface of the semiconductor layer by a predetermined amount. The semiconductor layer is oxidized to form an oxide film at least between the lower surface of the semiconductor layer and the insulating layer.

The above method prevents generation of fixed charges between the insulating layer and the semiconductor layer.

According to a method of manufacturing a semiconductor device of a further aspect of the invention, a nitride film is formed at a predetermined region on a main surface of a semiconductor layer located at a predetermined region on an insulating layer. The semiconductor layer is selectively oxidized to form an element isolating oxide film using the nitride film as a mask. Impurity is ion-implanted into a side end of the semiconductor layer through the element isolating oxide film using the nitride film as a mask.

This method prevents such a disadvantage that impurity implanted into the side end of the semiconductor layer is absorbed when forming the element isolating oxide film. Thereby, lowering of a threshold voltage of a parasitic transistor is prevented.

According to a method of manufacturing a semiconductor device of a further aspect of the invention, a nitride film is formed at a predetermined region on a main surface of a semiconductor layer located on an insulating layer. The semiconductor layer is etched to pattern the semiconductor layer into a plurality of isolated forms using the nitride film as a mask. A side surface of the semiconductor layer is oxidized to form a side wall oxide film using the nitride film as a mask. Impurity is ion-implanted into a portion of the semiconductor layer near its side surface through the side wall oxide film using the nitride film as a mask.

This method prevents such a disadvantage that impurity implanted into the portion of the semiconductor layer near the side surface is absorbed when forming the side wall oxide film. Thereby, lowering of a threshold voltage of a parasitic transistor is prevented.

According to a method of manufacturing a semiconductor device of a further aspect of the invention, a semiconductor layer is formed on an insulating layer, and the semiconductor layer and the insulating layer are patterned into a predetermined form. A nitride film is formed in contact with a side surface of the insulating layer and a lower portion of a side surface of the semiconductor layer. The side surface of the semiconductor layer is oxidized using the nitride film as a mask. Preferably, the step of oxidizing the side surface of the semiconductor layer may be performed in a wet atmosphere under a temperature condition not lower than 1100° C. Preferably, CMP (Chemical-Mechanical Polishing) may be effected on an upper portion of the side surface of the semiconductor layer prior to the step of oxidizing the side surface of the semiconductor layer, such that the upper portion of the side surface may be rounded. Preferably, the semiconductor layer and the insulating layer may be patterned to form a first insulating layer and a first semiconductor layer located on the first insulating layer as well as a second insulating layer spaced from the first insulating layer by a predetermined distance and the second semiconductor layer located on the second insulating layer, formation of the nitride film is performed such that a first nitride film is formed in contact with a side surface of the first insulating layer and a lower portion of a side surface of the first semiconductor layer and a second nitride film is formed in contact with a side surface of a second insulating layer and a lower portion of a side surface of a second semiconductor layer, and an oxide film may be formed to fill a space between the first and second nitride films.

According to the method of manufacturing the semiconductor device of the above aspect, the nitride film is formed in contact with the side surface of the insulating layer and the lower portion of the side surface of the semiconductor layer, and then the side surface of the semiconductor layer is oxidized using the nitride film as a mask, so that oxidant is prevented from moving to a space between the semiconductor layer and the insulating layer during oxidation of the side surface of the semiconductor layer. Thereby, a stress applied to a rear surface of the semiconductor layer is prevented. As a result, a leak current which may be caused by the stress is prevented. If the oxidation of the side surface of the semiconductor layer is performed in the wet atmosphere under the temperature condition not lower than 1100° C., the upper portion of the side surface of the semiconductor layer can be easily rounded. If the CMP is effected on the upper portion of the side surface of the semiconductor layer to round the upper portion of the side surface of the semiconductor layer prior to the oxidation of the side surface of the semiconductor layer, the semiconductor device, which suppresses concentration of an electric field at the upper portion of the side surface of the semiconductor layer, can be easily formed. Further, the semiconductor layer and the insulating layer may be patterned to form the first insulating layer and the semiconductor layer located thereon as well as the second insulating layer spaced from the first insulating layer by a predetermined distance and the second semiconductor layer located thereon, the first nitride film may be formed in contact with the side surface of the first insulating layer and the lower portion of the side surface of the first semiconductor layer, the second nitride film may be formed in contact with the side surface of the second insulating layer and the lower portion of the side surface of the second semiconductor layer, and the oxide film may be formed to fill the area between the first and second nitride films. In this case, the oxide film reduces a difference in level, and a parasitic capacitance is also reduced.

According to a method of manufacturing a semiconductor device of a further aspect of the invention, a semiconductor layer, a first nitride film and an etching stopper layer are successively formed on an insulating layer. The etching stopper layer, the first nitride film, the semiconductor layer and the insulating layer are etched to have predetermined forms. A second nitride film is formed to cover the etching stopper layer, the first nitride film, the semiconductor layer and the insulating layer. The second nitride film is etched to leave a portion of the second nitride film being in contact with a side surface of the insulating layer and a lower portion of a side surface of the semiconductor layer.

Thereby, oxidant is prevented from moving to an area between the semiconductor layer and the insulating layer as well as an upper surface of the semiconductor layer when oxidizing the semiconductor layer. Thereby, only the side surface of the semiconductor layer is easily oxidized.

According to a method of manufacturing a semiconductor device of a further aspect of the invention, a semiconductor layer is formed on an insulating layer, and then the insulating layer and the semiconductor layer are patterned. Thereby, a first insulating layer and a first semiconductor layer located thereon as well as a second insulating layer spaced from the first insulating layer by a predetermined distance and a second semiconductor layer located thereon are formed. A nitride film is formed to fill a space between, on one hand, the first insulating layer and the first semiconductor layer and, on the other hand, the second insulating layer and the second semiconductor layer. The nitride film is etched back to leave a portion of the nitride film being in contact with side surfaces of the first and second insulating layers and lower portions of side surfaces of the first and second semiconductor layers.

Thereby, it is possible to prevent movement of oxidant to the lower surfaces of the first and second semiconductor layers when oxidizing the first and second semiconductor layers, and the nitride film reduces a difference in level between the first and second insulating layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 23:
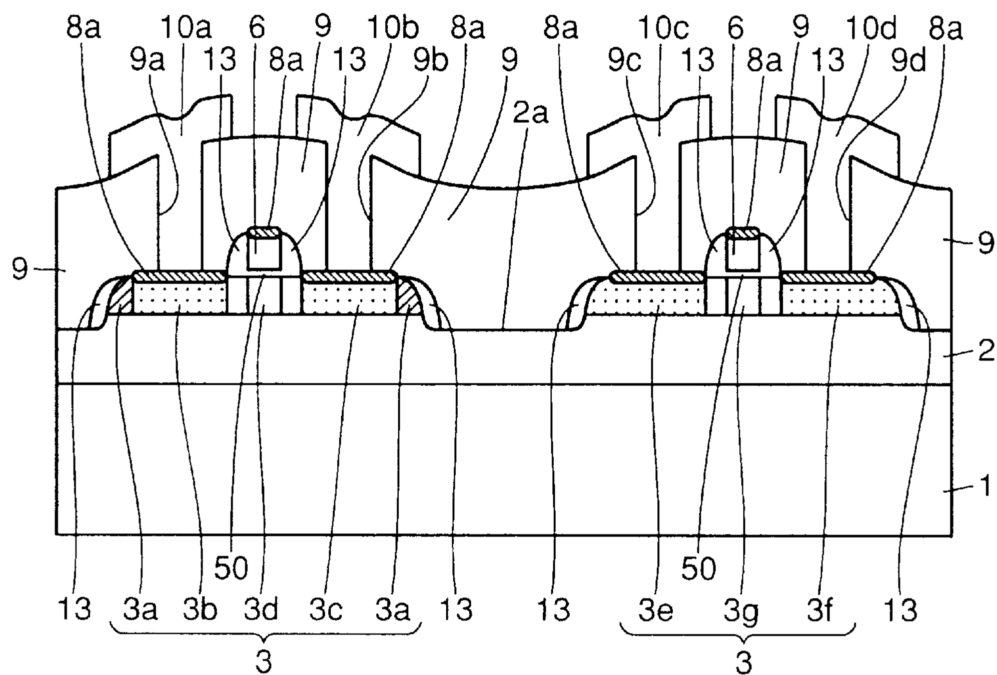

Referring first to FIG. 23, a structure of a semiconductor device of a first embodiment will be described below. In this first embodiment, a buried oxide film 2 is formed on a silicon substrate 1. A semiconductor layer 3 for an NMOS region and a semiconductor layer 3 for a PMOS region are formed on buried oxide film 2 with a predetermined space between each other.

Source drain regions 3*b* and 3*c* having an LDD structure are formed at SOI layer 3 in the NMOS region and are spaced by a predetermined distance with a channel region 3*d* therebetween. An impurity implanted region 3*a* for raising a threshold voltage of a parasitic transistor is formed at the vicinity of a side surface of SOI layer 3 at the NMOS region. Side wall insulating films 13 are formed in contact with side surfaces of SOI layer 3 at the NMOS region. A gate electrode 6 is formed on channel region 3*d* with a gate oxide film 50 therebetween. Side wall insulating films 13 are also formed in contact with side surfaces of gate electrode 6. A titanium silicide film 8*a* is formed over the surfaces of source/drain regions 3*b* and 3*c* and the surface of gate electrode 6 for reducing a resistance.

Source drain regions 3*e* and 3*f* having an LDD structure are formed at SOI layer 3 in the PMOS region and are spaced by a predetermined distance with a channel region 3*g* therebetween. Side wall insulating films 13 are formed in contact with side surfaces of SOI layer 3. A gate electrode 6 is formed on channel region 3*g* with gate oxide film 50 therebetween. Side wall insulating films 13 are formed in contact with side surfaces of gate electrode 6. Titanium silicide film 8*a* is formed over the surfaces of source/drain regions 3*e* and 3*f* and the surface of gate electrode 6 for reducing a resistance.

In this first embodiment, upper side portions of each SOI layer 3 are rounded. Thereby, it is possible to prevent concentration of an electric field at the upper side portions of SOI layers 3. Consequently, lowering of a threshold voltage of a parasitic transistor can be prevented, which suppresses turn-on of the parasitic transistor. As a result, subthreshold characteristics of a regular MOS transistor are prevented from being adversely affected by the parasitic transistor. The lower portion of the side surface of SOI layer 3 extends substantially perpendicularly to a main surface of the buried oxide film 2, so that such a structure can be prevented that a thin portion is formed at the lower side portion of SOI layer 3. Thereby, it is possible to prevent lowering of the threshold voltage of parasitic transistor which may be caused by reduction of the thickness of SOI layer 3 at the vicinity of its side surface.

In this first embodiment, buried oxide film 2 is provided at its main surface with a U-shaped concavity 2*a,* which is located at a region between SOI layers 3 at the NMOS and PMOS regions. Concavity 2 has a rounded portion at and near its open end. Thereby, it is possible to prevent effectively remaining of etching residue near the lower side portions of SOI layers 3, which may be caused by the fact that the lower portion of side surface of SOI layer 3 extends perpendicularly.

An interlayer oxide film 9 is formed over SOI layers 3 and gate electrodes 6. Interlayer oxide film 9 is provided at predetermined regions with contact holes 9*a,* 9*b,* 9*c* and 9*d.* There are formed interconnections 10*a,* 10*b,* 10*c* and 10*d* which have portions located in contact holes 9*a*–9*d* and electrically connected to source/drain regions 3*b,* 3*c,* 3*e* and 3*f,* respectively.

Referring to FIGS. 1 to 23, a process of manufacturing a semiconductor device of the first embodiment will be described below.

Figure 1:
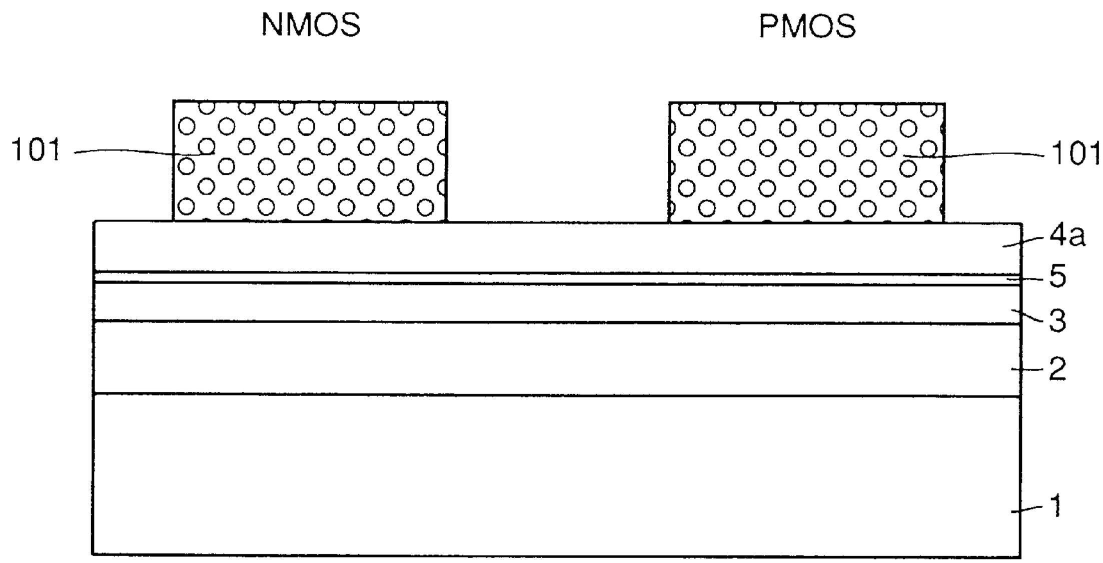
FIGS. 1 to 6 are cross sections showing 1st to 6th steps of a process of manufacturing a semiconductor device according to a first embodiment of the invention, respectively.

Referring first to FIG. 1, buried oxide film 2 is formed on silicon substrate 1, and then SOI layer 3 is formed on buried oxide film 2. Silicon substrate 1, buried oxide film 2 and SOI layer 3 form the SOI substrate. This SOI substrate may be formed by an SIMOX (Separation by Implanted Oxygen) method, a wafer bonding method or another appropriate method. Thereafter, oxide film 5 having a thickness of about 100 Å is formed on SOI layer 3. Oxide film 5 may be formed by the CVD method under the temperature condition of about 800° C., or by oxidizing the surface of SOI layer 3 under the temperature condition of about 800° C. A nitride film 4*a* having a thickness of about 1000 Å is formed on oxide film 5 under the temperature condition of about 700° C. A resist 101 is formed over regions on nitride film 4*a* corresponding to active regions. Using resist 101 as a mask, nitride film 4*a* is anisotropically etched to pattern nitride film 4*a*.

Figure 2:
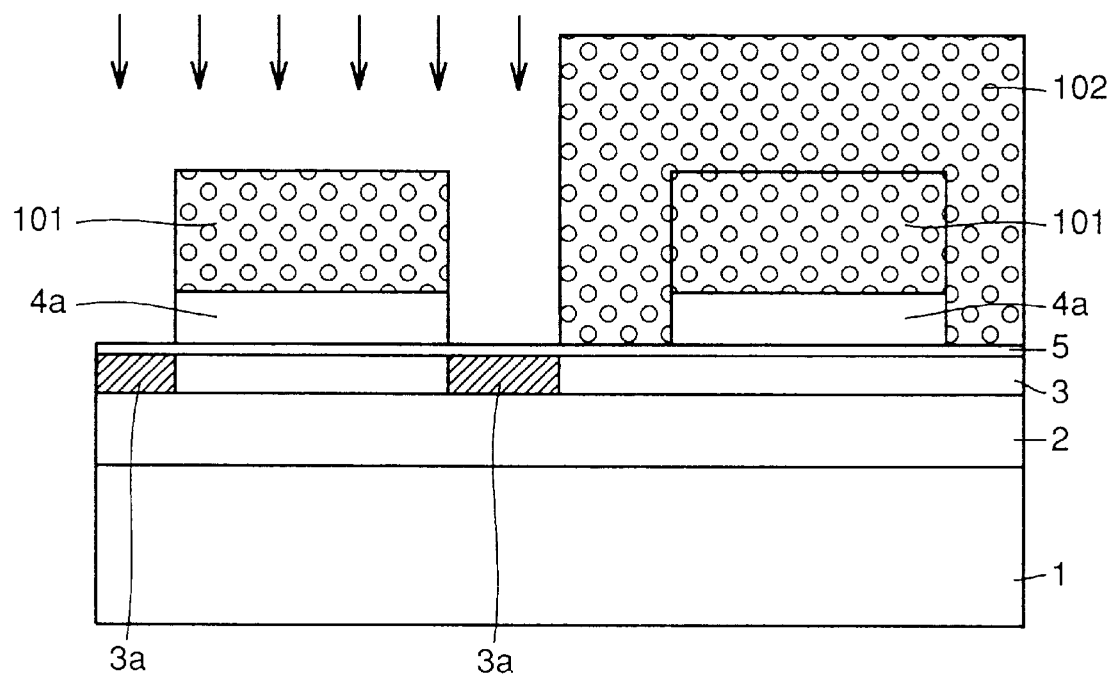

Then, a resist 102 covering the PMOS region is formed as shown in FIG. 2. Using resists 102 and 101 as a mask, boron ions are implanted into predetermined regions of the NMOS region of SOI layer 3 under the conditions of 20 kev and $3\times10^{13}$–$8\times10^{13}/cm^2$. Thereby, impurity implanted regions 3*a* for raising a threshold voltage of a parasitic transistor is formed. Thereafter, resists 101 and 102 are remove.

Figure 3:
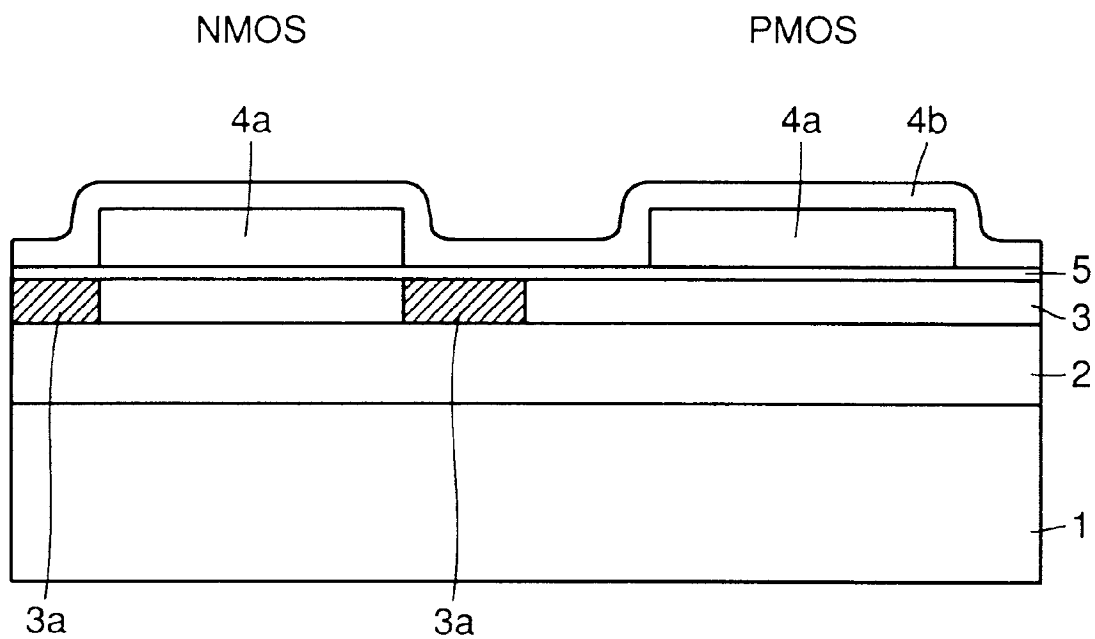
Figure 4:
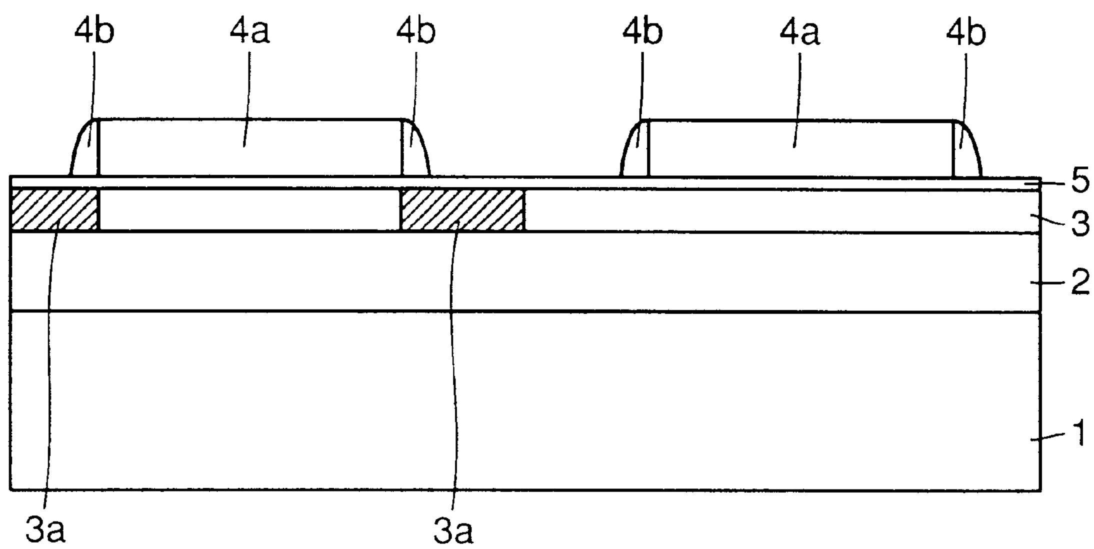
Figure 5:
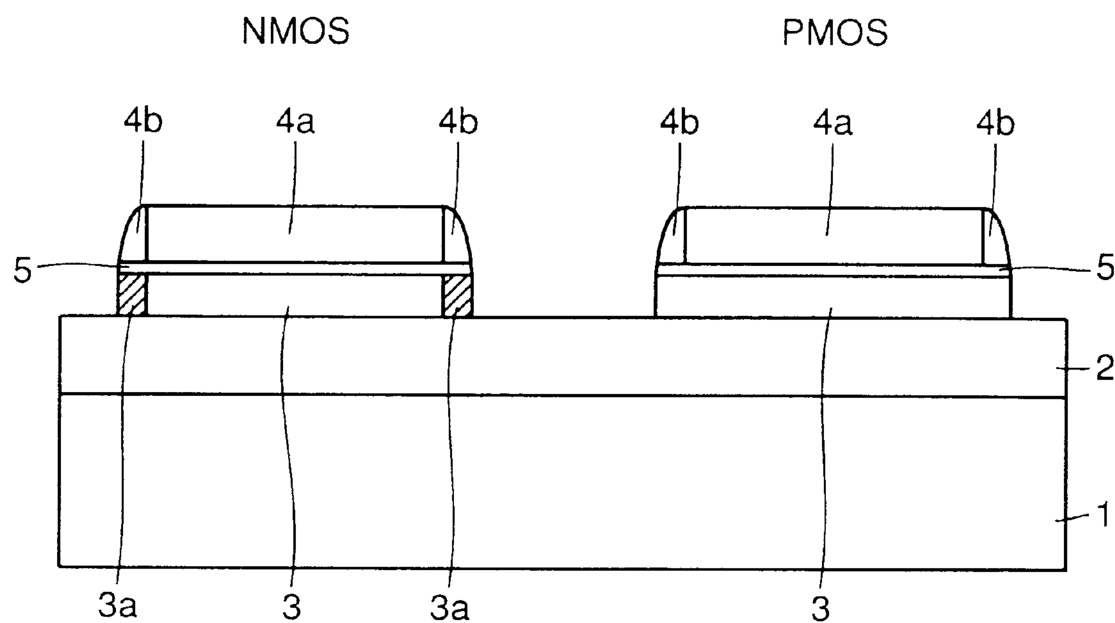

Then, as shown in FIG. 3, a nitride film 4*b* having a thickness of about 1000 Å is formed over oxide film 5 and nitride films 4*a*. Nitride film 4*b* is anisotropically etched to form side wall nitride films 4*b* which are in contact with opposite side surfaces of nitride film 4*a* as shown in FIG. 4. Using nitride films 4*a* and 4*b* as a mask, anisotropic etching is effected on oxide film 5 and SOI layer 3 to form the patterned SOI layer 3.

Figure 6:
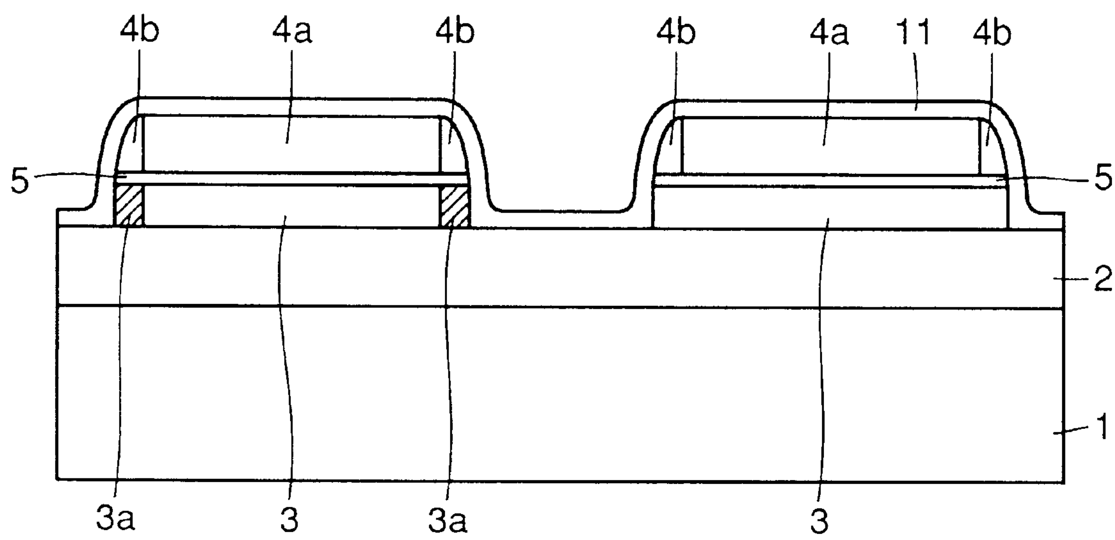
Figure 7:
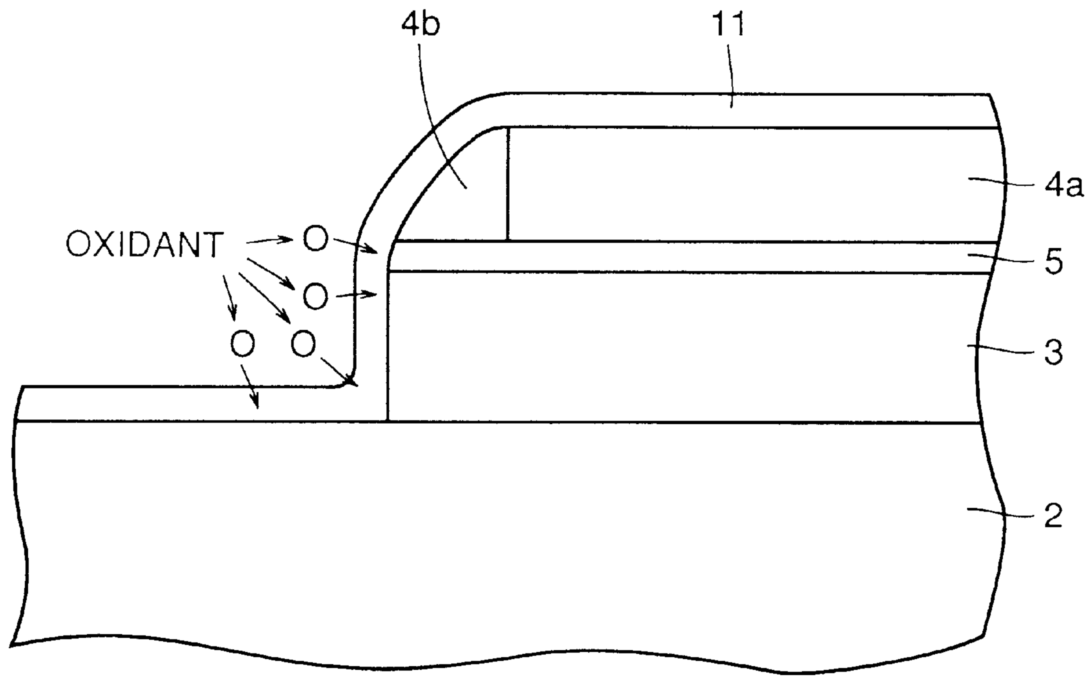
FIG. 7 is a fragmentary cross section showing, on an enlarged scale, a portion including an SOI layer at the step shown in FIG. 6.
Figure 8:
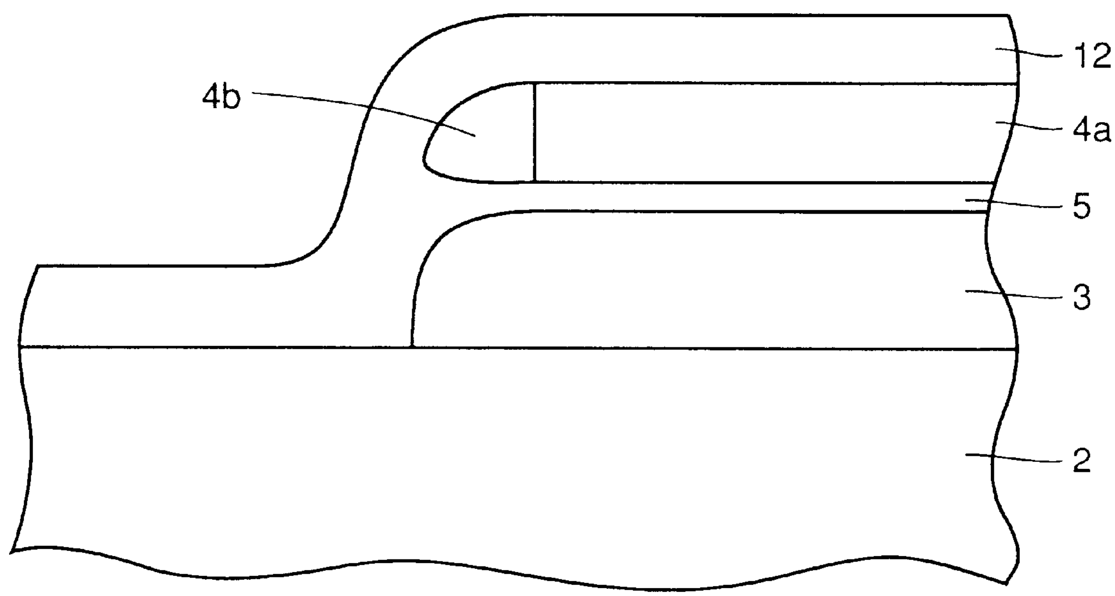
FIG. 8 is a fragmentary cross section showing, on an enlarged scale, a structure formed by oxidizing the structure shown in FIG. 7.

As shown in FIG. 6, a polycrystalline silicon film 11 having a thickness of about 50 Å–500 Å is formed over nitride films 4*a* and 4*b* and SOI layer 3 by the low pressure CVD method. Polycrystalline silicon film 11 is oxidized in a wet atmosphere under the temperature condition of 950° C. as shown in FIG. 7. In this processing, conditions are determined to oxidize entire polycrystalline silicon film 11. During oxidation of polycrystalline silicon film 11, when polycrystalline silicon film 11 on buried oxide film 2 and polycrystalline silicon film 11 on nitride films 4*a* and 4*b* are entirely oxidized, the oxide film in these regions does not extend any longer. However, side portions of SOI layer 3 are further oxidized even after regions of polycrystalline silicon film 11 which are in contact with the side surfaces of SOI layer 3 are entirely oxidized. Thereby, as shown in FIG. 8, each upper side portion of SOI layer 3 is rounded, and the lower portion of each side surface extends substantially perpendicularly to the main surface of buried oxide film 2. These portions are covered with oxide film 12. More specifically, since polycrystalline silicon film 11 is formed also on the surface of buried oxide film 2, oxidation of polycrystalline silicon film 11 on buried oxide film 2 consumes oxidant which tends to move up to a rear surface of SOI layer 3 during oxidation of polycrystalline silicon film 11. Thereby, it is possible to prevent movement of oxidant up to the lower surface of SOI layer 3, and thus oxidation of the rear surface of SOI layer 3 can be prevented. Thereby, the lower portion of side surface of SOI layer 3 extends substantially perpendicularly to the main surface of buried oxide film 2.

Meanwhile, movement of oxidant to the upper side portion of SOI layer 3 is suppressed by polycrystalline silicon film 11 to some extent. However, the oxidant can move to the upper side surface of SOI layer 3 more easily than the rear surface, because a distance from the oxidant to the upper side portion of SOI layer 3 is shorter than a distance from the oxidant to the rear surface of SOI layer 3. Therefore, the upper side portion of SOI layer 3 is oxidized to a higher extent and thus is rounded as shown in FIG. 8.

Figure 9:
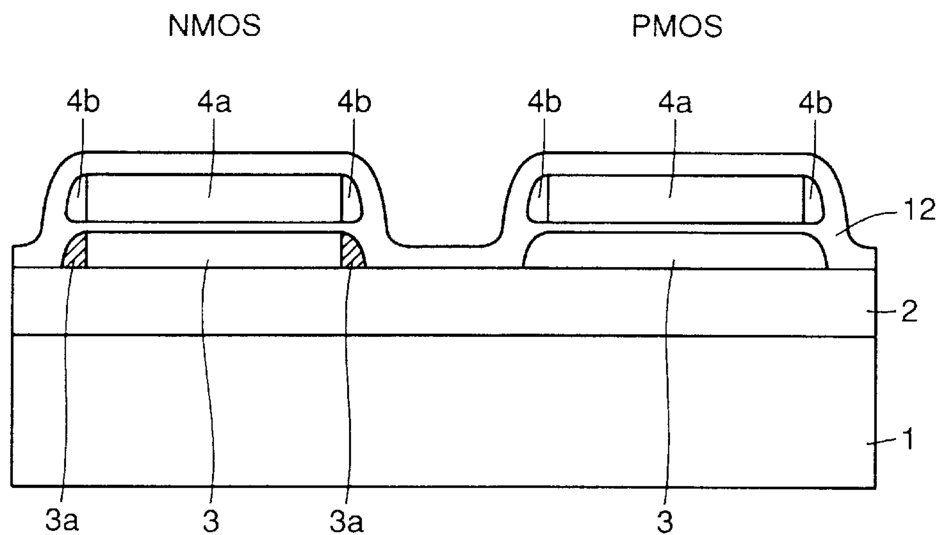
FIGS. 9 to 23 are cross sections showing 7th to 21st steps in the process of manufacturing the semiconductor device according to the first embodiment of the invention, respectively.
Figure 10:
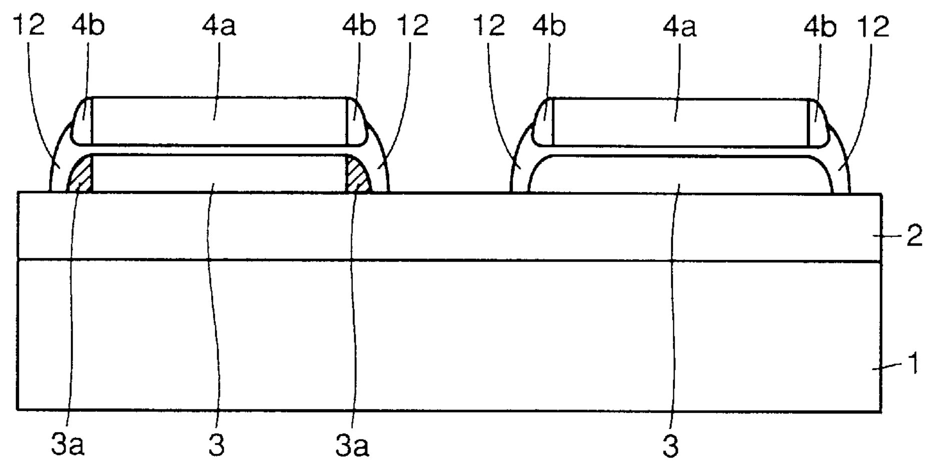
Figure 11:
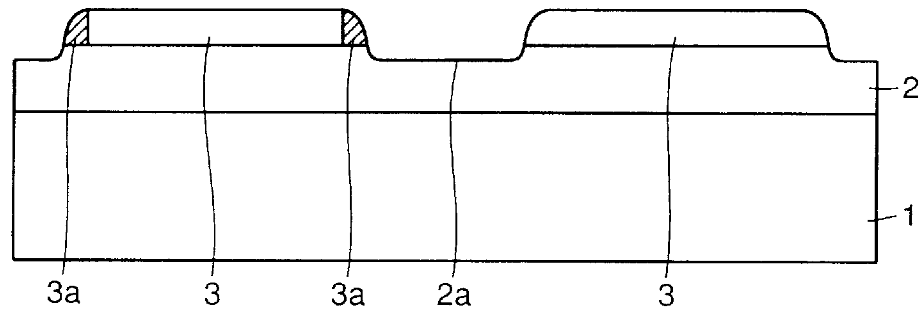

In this embodiment, as described above, polycrystalline silicon film 11 is formed to cover SOI layer 3 and buried oxide film 2, and subsequently is oxidized, whereby such SOI layer 3 can be formed that has the lower side surface portion extending substantially linearly and the upper side portion having a round section as shown in FIG. 8. FIG. 9 shows the NMOS and PMOS regions after polycrystalline silicon film 11 is oxidized. Thereafter, oxide film 12 is anisotropically etched to form oxide films 12 each having a side wall form as shown in FIG. 10. Then, nitride films 4*a* and 4*b* are removed, and oxide films 12 are removed. Wet etching for removing oxide films 12 forms U-shaped concavity 2*a* at the surface of buried oxide film 2 as shown in FIG. 11. The portion at and near the open end of concavity 2*a* is isotropically etched, so that it is rounded. Thereby, etching residue is effectively prevent from remaining near the lower end of the side surface of SOI layer 3 when patterning the gate electrode as will be described later.

Figure 12:
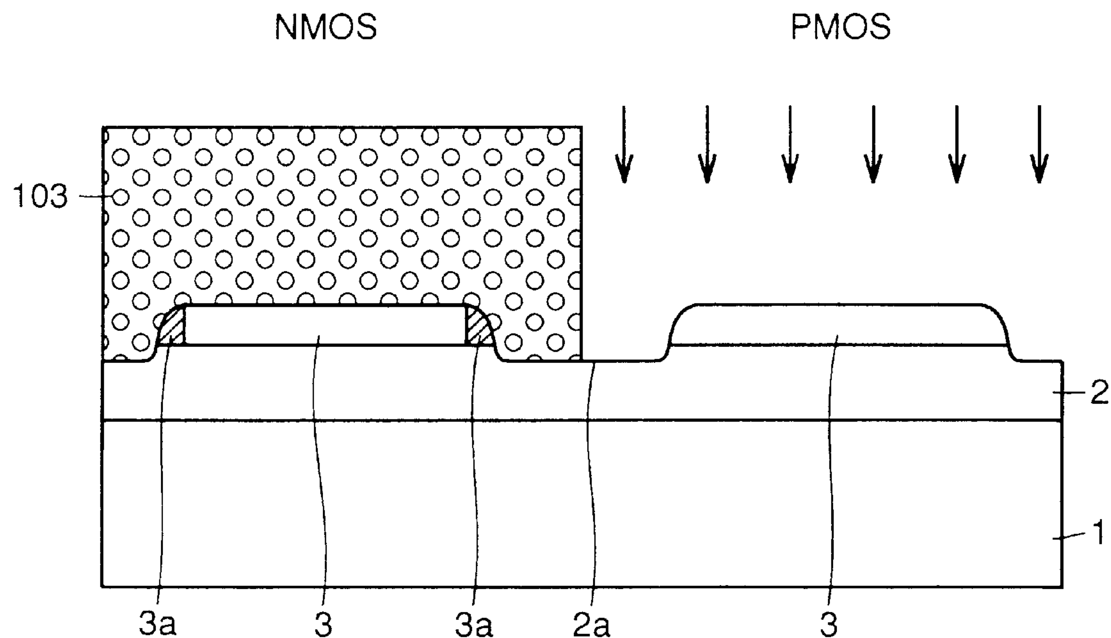

Then, as shown in FIG. 12, a resist 103 is formed over the NMOS region. Using resist 103 as a mask, boron ions ($B^+$) are implanted into SOI layer 3 at the PMOS region under the conditions of 20 kev and $1\times10^{11}$–$3\times10^{11}$/cm$^2$. This implantation serves as channel doping. Thereafter, resist 103 is removed. As ion species for the channel doping, phosphorus ions may be used.

Figure 13:
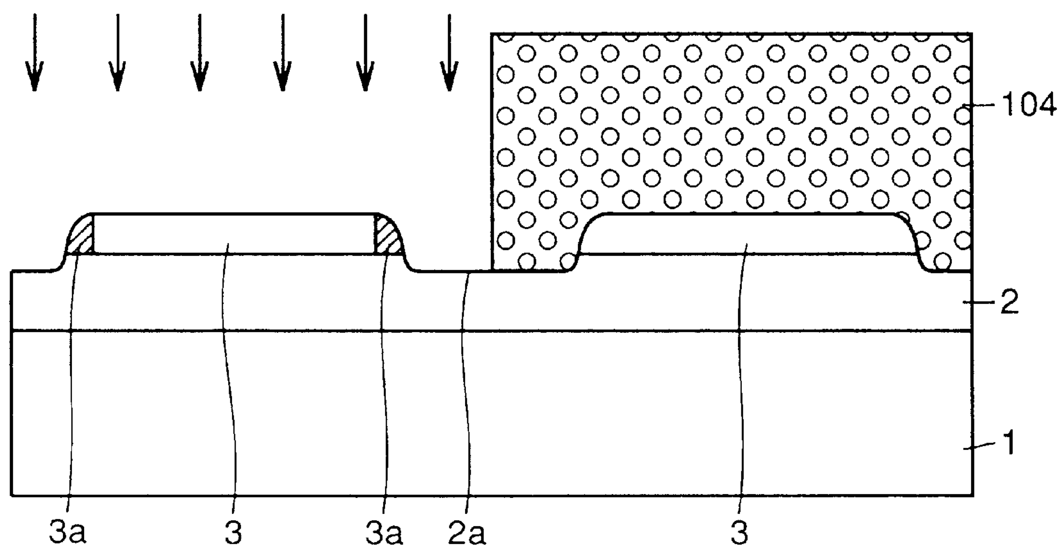

As shown in FIG. 13, a resist 104 is formed over the PMOS region. Using resist 104 as a mask, boron ions ($B^+$) are implanted into SOI layer 3 at the NMOS region under the conditions of 20 kev and $4\times10^{12}$–$6\times10^{12}$/cm$^2$. This implantation serves as channel doping. Thereafter, resist 104 is removed. As ion species for the channel doping, phosphorus ions may be used.

Figure 14:
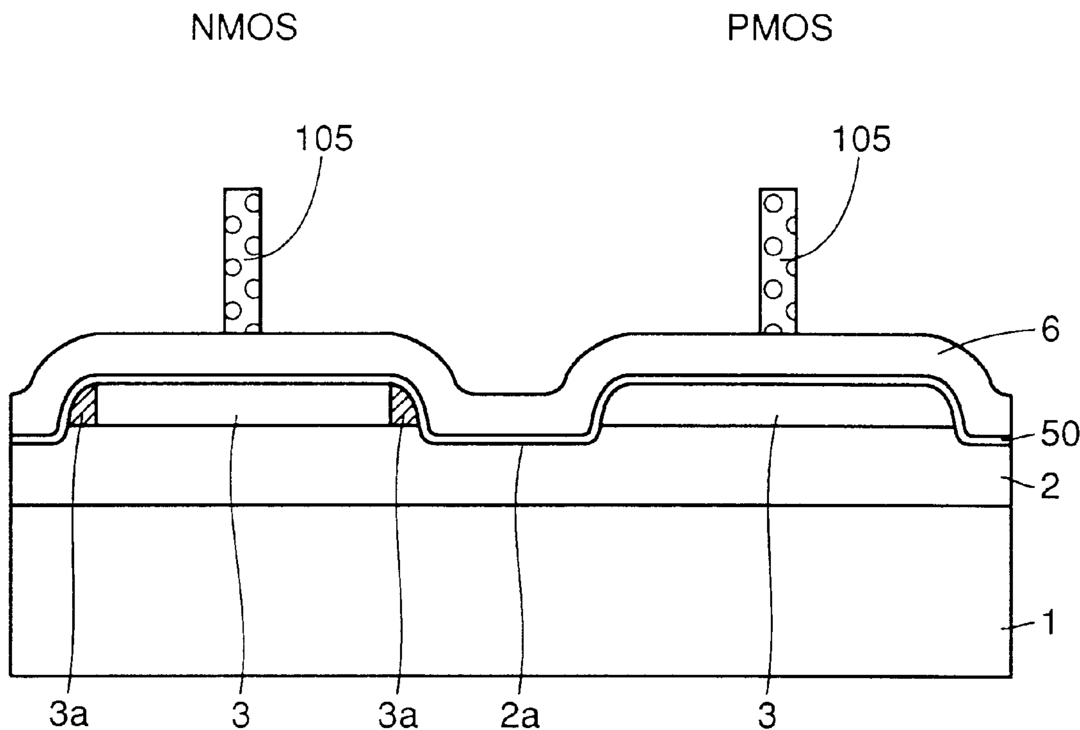
Figure 15:
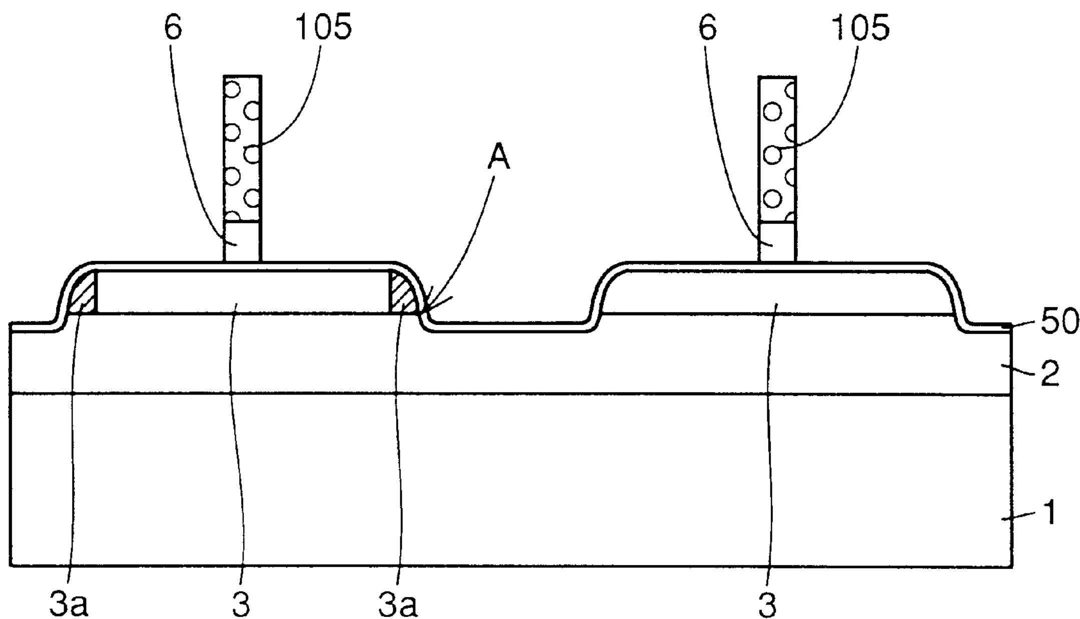

As shown in FIG. 14, gate oxide film 50 is formed over SOI layer 3 and concavity 2*a*. Polycrystalline silicon layer 6 which contains a large amount of phosphorus and having a thickness of about 2000 Å is formed over gate oxide film 50. A resist 105 is formed at predetermined regions on polycrystalline silicon layer 6. Using resist 105 as a mask, polycrystalline silicon layer 6 is anisotropically etched to form gate electrodes 6 of a form shown in FIG. 15. Thereafter, resist 105 is removed.

Figure 16:
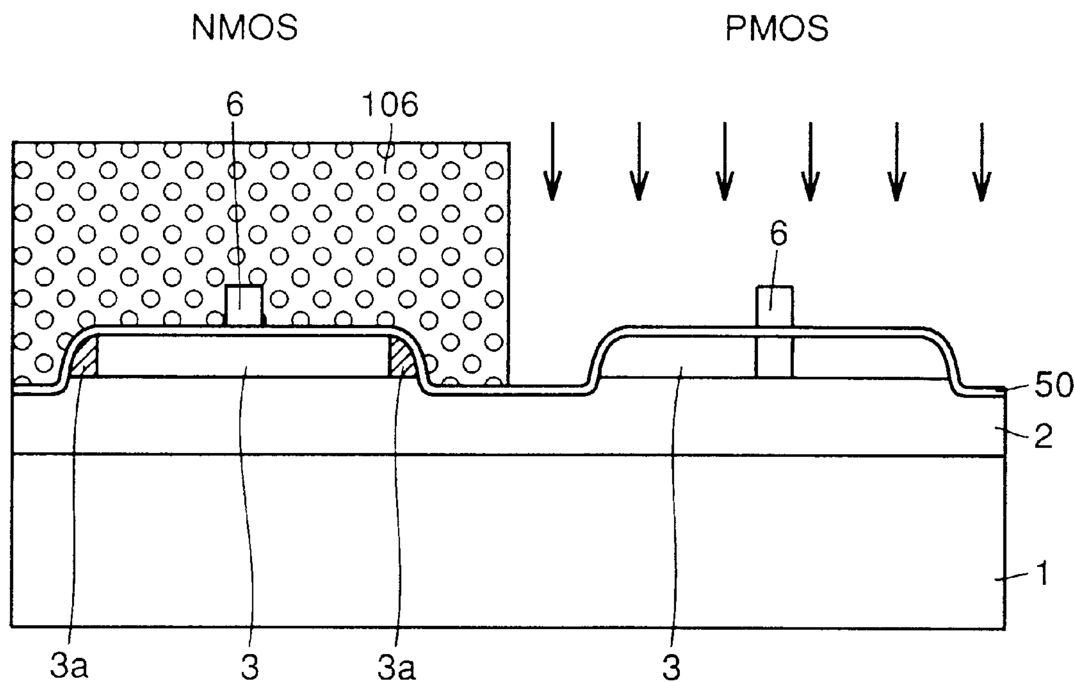

As shown in FIG. 16, a resist 106 is formed over the NMOS region. Using resist 106 and gate electrode 6 as a mask, boron ions ($B^+$) are implanted into SOI layer 3 at the PMOS region under the conditions of 20 kev and $1\times10^{13}$–$3\times10^{13}$/cm$^2$. This implantation is performed for forming a lightly doped region of the LDD structure of the PMOS transistor. Thereafter, resist 106 is removed.

Figure 17:
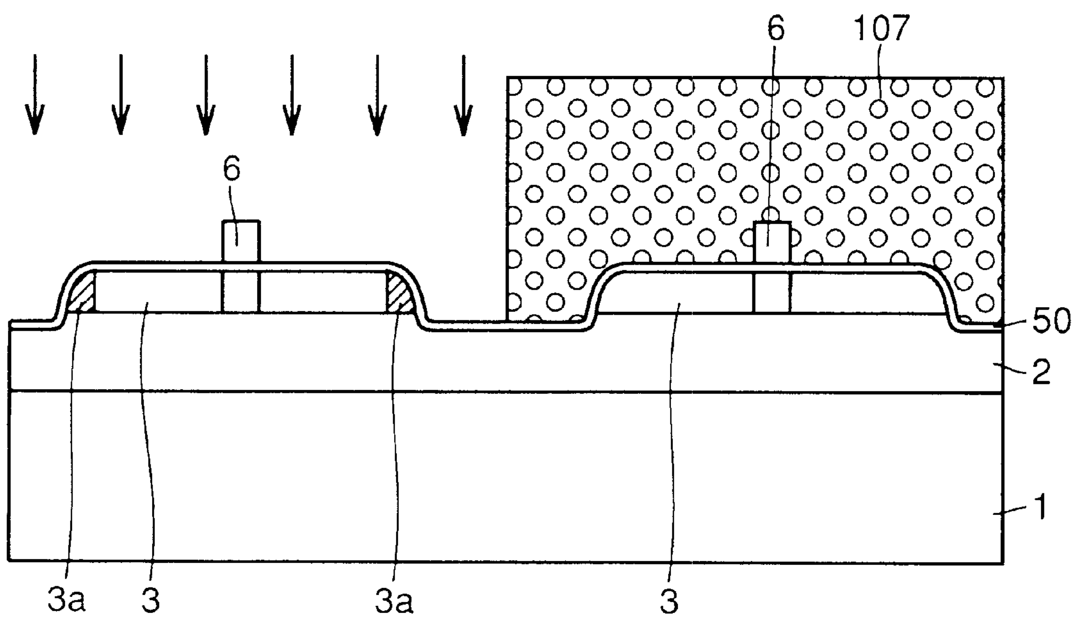

As shown in FIG. 17, a resist 107 is formed over the PMOS region. Using resist 107 and gate electrode 6 as a mask, phosphorus ions ($P^+$) are implanted into SOI layer 3 at the NMOS region under the conditions of 40 kev and $1\times10^{13}$–$3\times10^{13}$/cm$^2$. This implantation is performed for forming a lightly doped region of the LDD structure of the NMOS transistor. As an implantation method for forming the lightly doped region of the LDD structure, a continuous rotary implantation method may be used in which implantation is performed on a rotating semiconductor wafer inclined by 45 degrees. Thereafter, resist 107 is removed.

Figure 18:
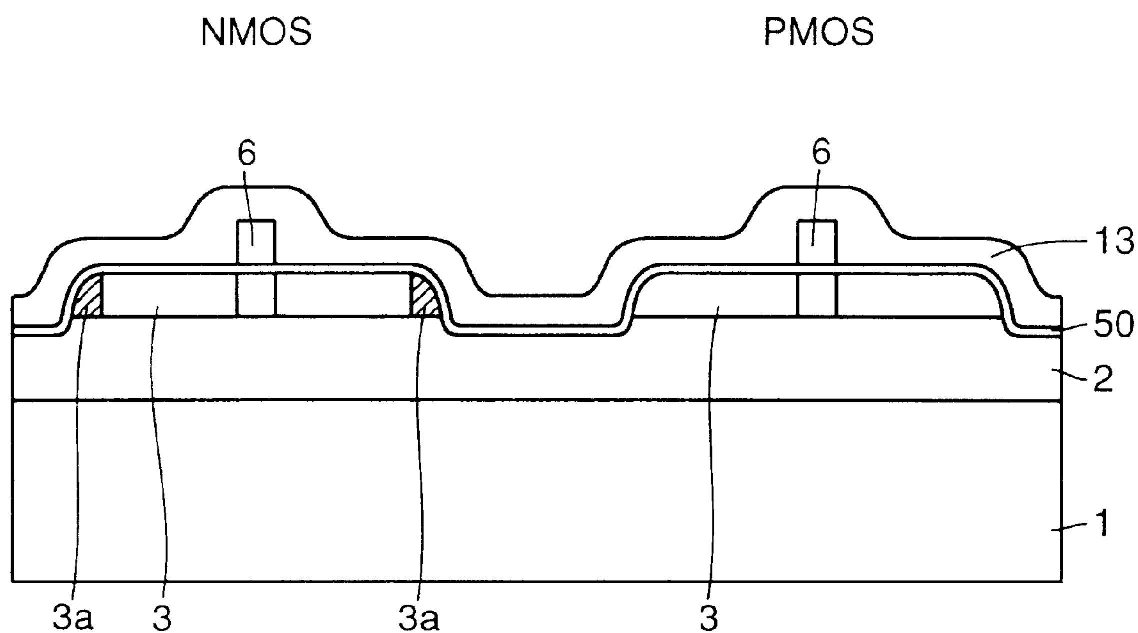
Figure 19:
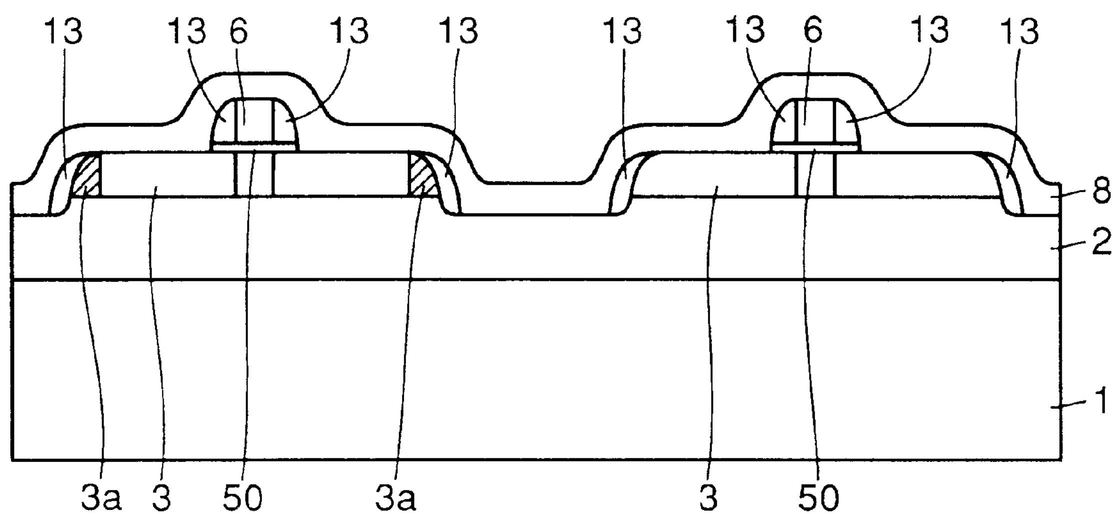
Figure 20:
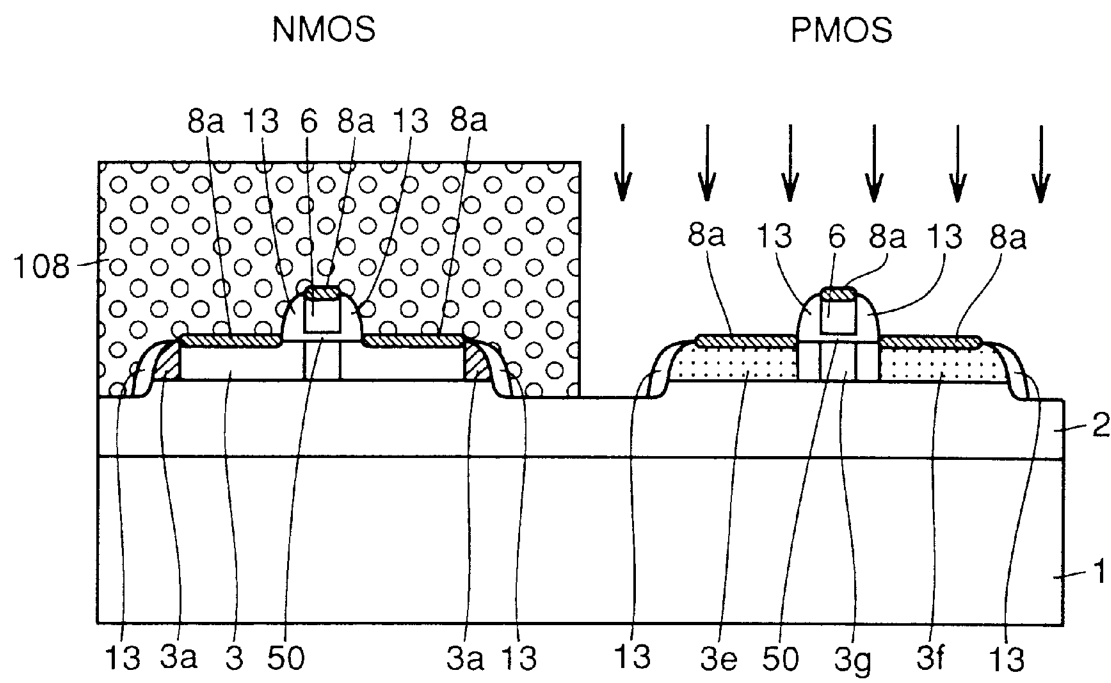

As shown in FIG. 18, a low pressure CVD method is performed to form oxide film 13 having a thickness of about 1500 Å and covering the whole surface. Oxide film 13 is anisotropically etched to form side wall oxide films 13 which are in contact with the opposite side surfaces of gate electrodes 6 as shown in FIG. 19. Side wall oxide films 13 remain also on the opposite side surfaces of SOI layer 3. Thereafter, a sputtering method is performed to form titanium layer 8 having a thickness of about 200 Å. Heat treatment is performed for 30 seconds in a nitrogen atmosphere under the temperature condition of 680° C., whereby titanium silicide layers 8*a* are formed only at regions of titanium layer 8 which are in contact with the silicon layer as shown in FIG. 20. Thereafter, the nitrided titanium layer (not shown) located on the insulating film is removed, and then heat treatment is performed again in the nitrogen atmosphere for 30 seconds under the temperature conditions of 850° C., whereby stable titanium silicide ($TiSi_2$) layers 8*a* are formed. Thereafter, a resist 108 is formed over the NMOS region. Using resist 108 as a mask, boron ions ($B^+$) are implanted into $SOI_2$ layer 3 at the PMOS region under the conditions of 20 kev and $4\times10^{15}$–$6\times10^{15}$/cm$^2$. This implantation is performed for forming a heavily doped region of the LDD structure of the PMOS transistor. Thereafter, resist 108 is removed.

Figure 21:
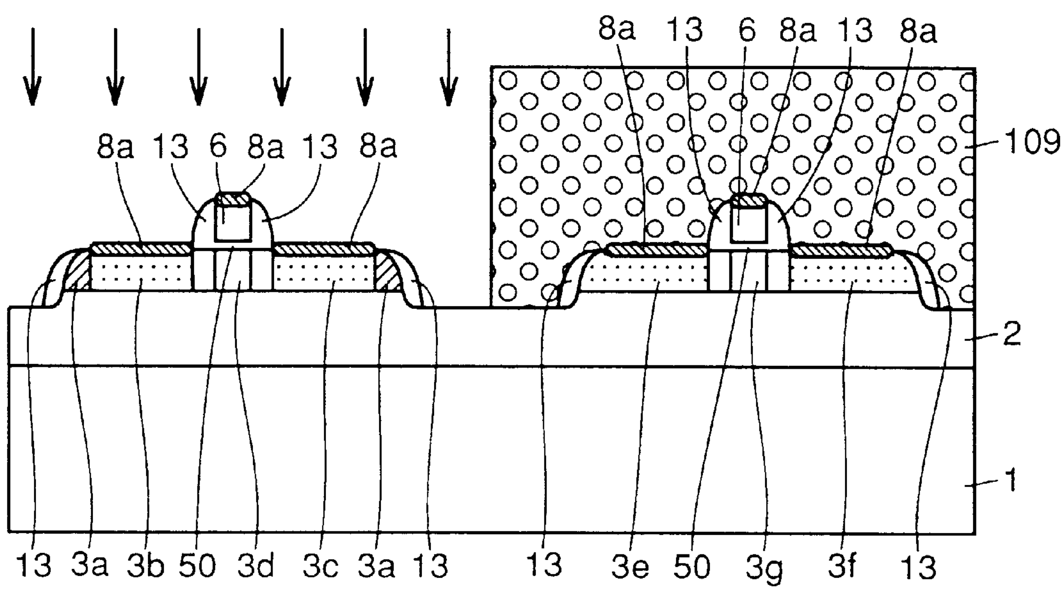

As shown in FIG. 21, a resist 109 is formed over the PMOS region. Using resist 109 as a mask, phosphorus ions ($P^+$) are implanted into SOI layer 3 at the NMOS region under the conditions of 40 kev and $4\times10^{15}$–$6\times10^{15}$/cm$^2$. This implantation is performed for forming a heavily doped region of the LDD structure of the NMOS transistor. The implanted ion species may be arsenic. Through the steps shown in FIGS. 20 and 21, source/drain regions 3*b* and 3*c* having the LDD structure of the NMOS transistor as well as source/drain regions 3*e* and 3*f* having the LDD structure of the PMOS transistor are formed.

Figure 22:
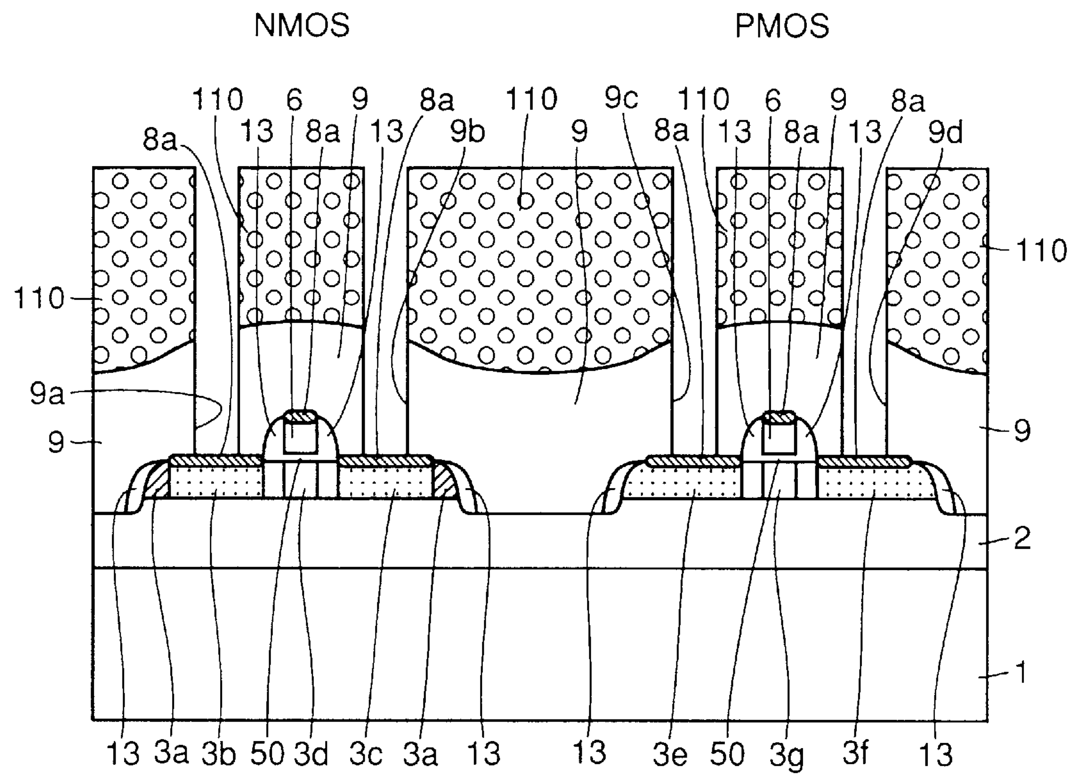

Thereafter, as shown in FIG. 22, an interlayer oxide film 9 having a thickness of about 7000 Å is formed over the whole surface, and then resist 110 is formed at predetermined regions on interlayer oxide film 9. Using resist 110 as a mask, interlayer oxide film 9 is anisotropically etched to form contact holes 9*a,* 9*b,* 9*c* and 9*d* located above source/drain regions 3*b,* 3*c,* 3*e* and 3*f,* respectively. Thereafter, resist 110 is removed.

Finally, as shown in FIG. 23, an interconnection layer (not shown) containing aluminum or copper as a major component is formed. The interconnection layer has portions filling contact holes 9*a,* 9*b,* 9*c* and 9*d,* and extends along the upper surface of interlayer oxide film 9. The interconnection layer thus formed is patterned to form metal interconnections 10*a,* 10*b,* 10*c* and 10*d.*

Figure 32:
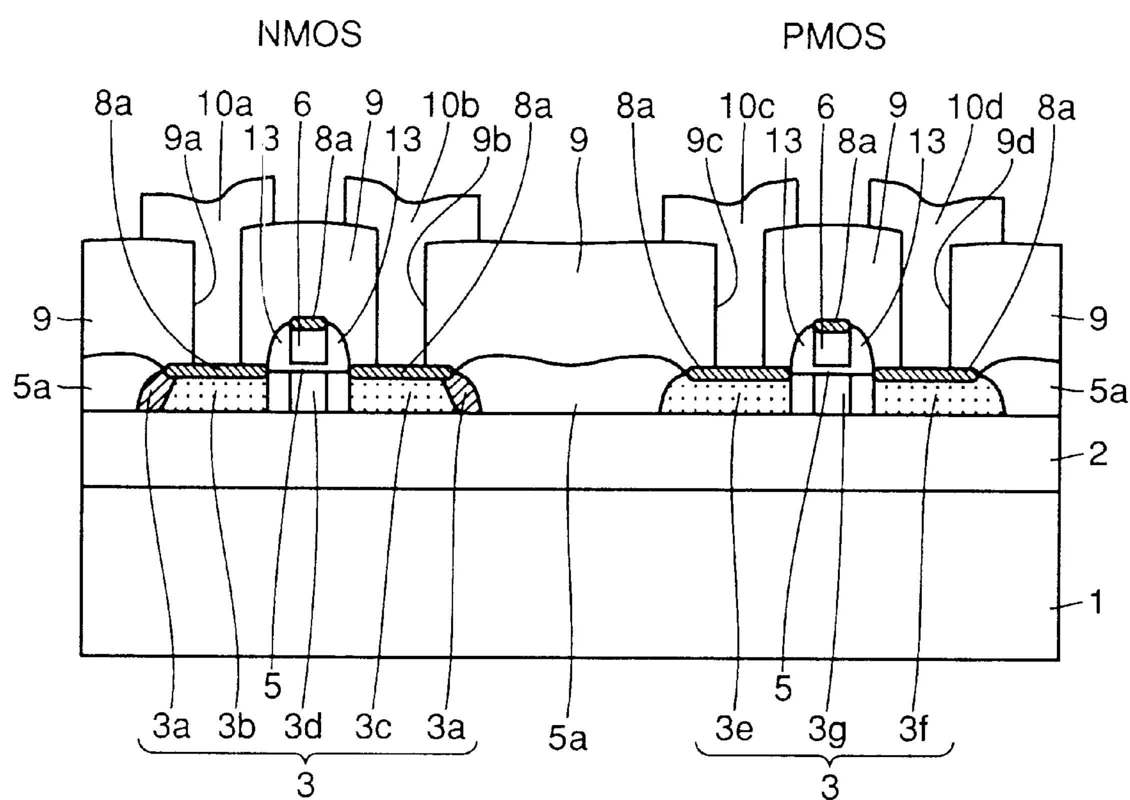
Figure 33:
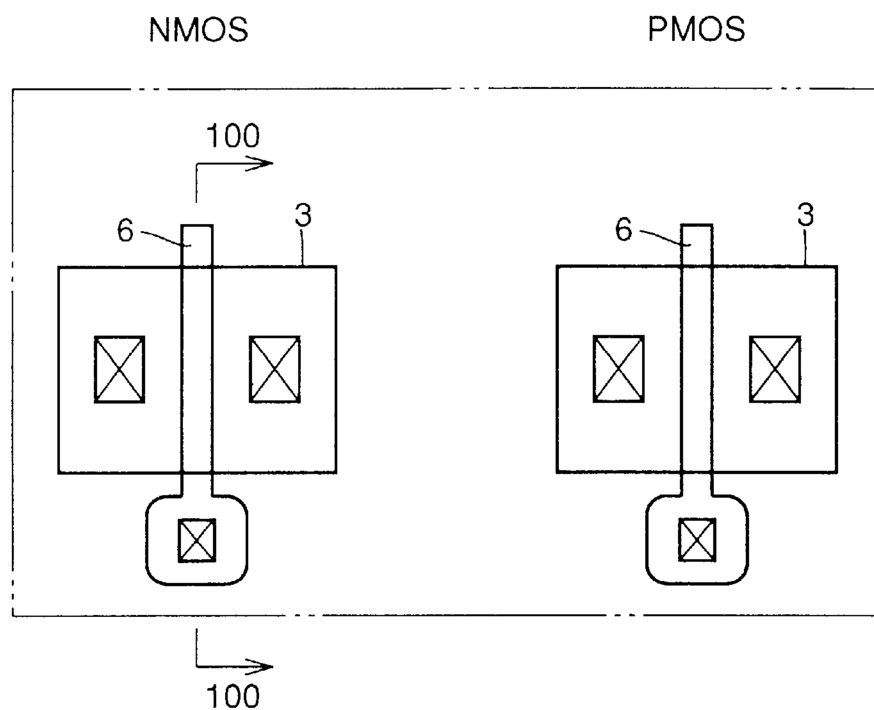
FIG. 33 is a plan of the semiconductor device of the second embodiment shown in FIG. 32.
Figure 34:
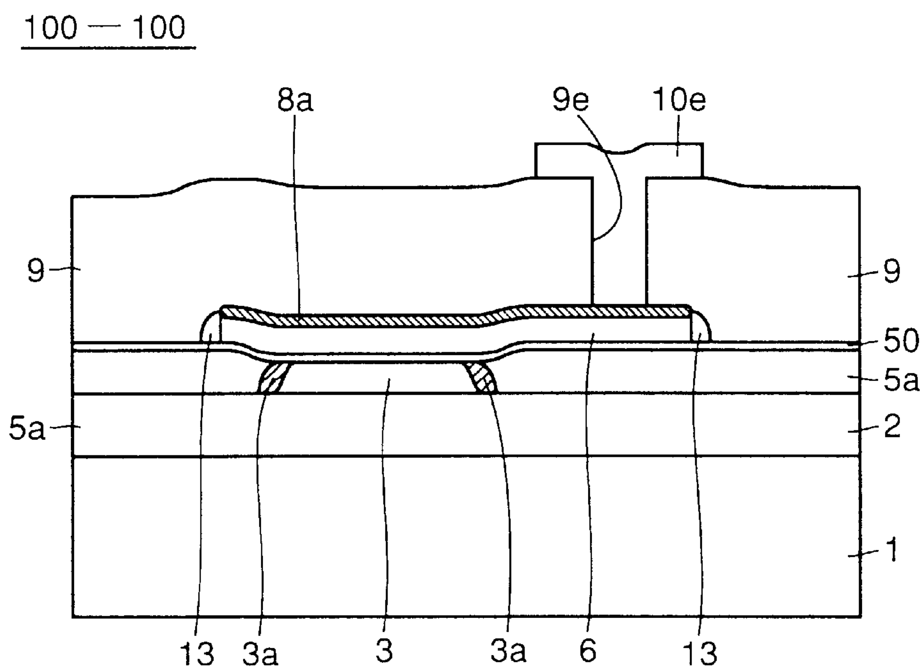
FIG. 34 is a cross section of the semiconductor device of the second embodiment taken along line 100—100 in FIG. 33.
Figure 35:
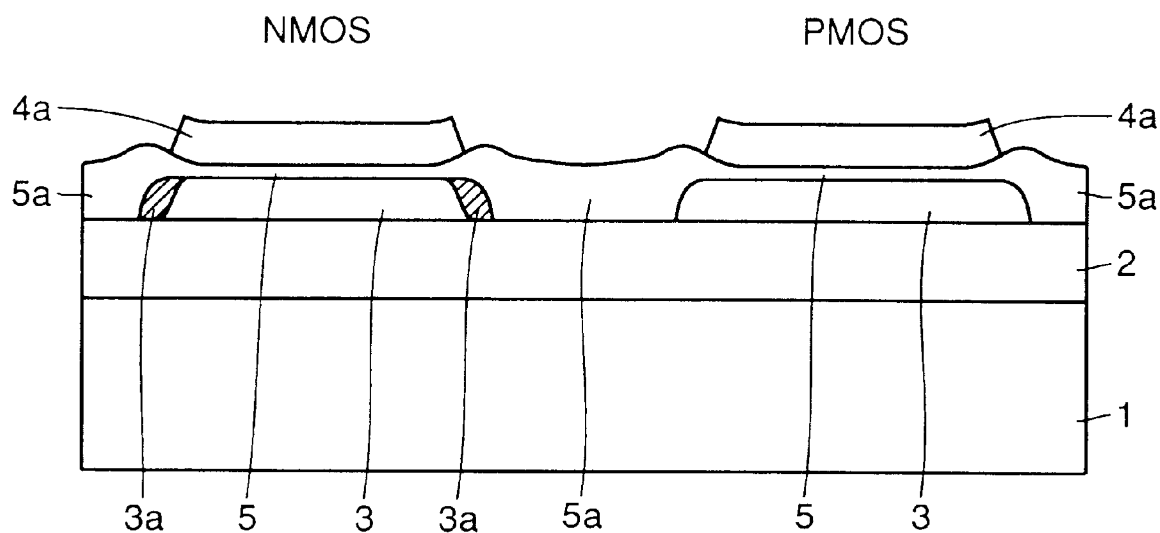
FIGS. 35 to 38 are cross sections showing 1st to 4th steps in a process of manufacturing a semiconductor device according to a third embodiment of the invention, respectively.

Referring to FIGS. 32 to 34, a structure of a semiconductor device of a second embodiment will be described below. In this second embodiment, as shown in FIG. 32, an LOCOS oxide film 5*a* is buried between SOI layer 3 at the NMOS region and SOI layer 3 at the PMOS region. Thereby, as shown in FIG. 34, gate electrode 6 has portions located over LOCOS oxide film 5*a.* This results in increase of a distance between the side surface of SOI layer 3 and the lower surface of gate electrode 6, and thus the threshold voltage of parasitic transistor can be increased. Thereby, the subthreshold characteristics of regular transistor are prevented from being adversely affected by the parasitic transistor. Since the side surface of SOI layer 3 has the rounded upper portion, concentration of the electric field at the upper side portion can be prevented. Since LOCOS oxide film 5*a* reduces a difference in level which is caused by SOI layer 3, the manufacturing process at a later step can be performed easily.

Referring to FIGS. 24 to 32, a process of manufacturing the semiconductor device of the second embodiment will be described below.

Figure 24:
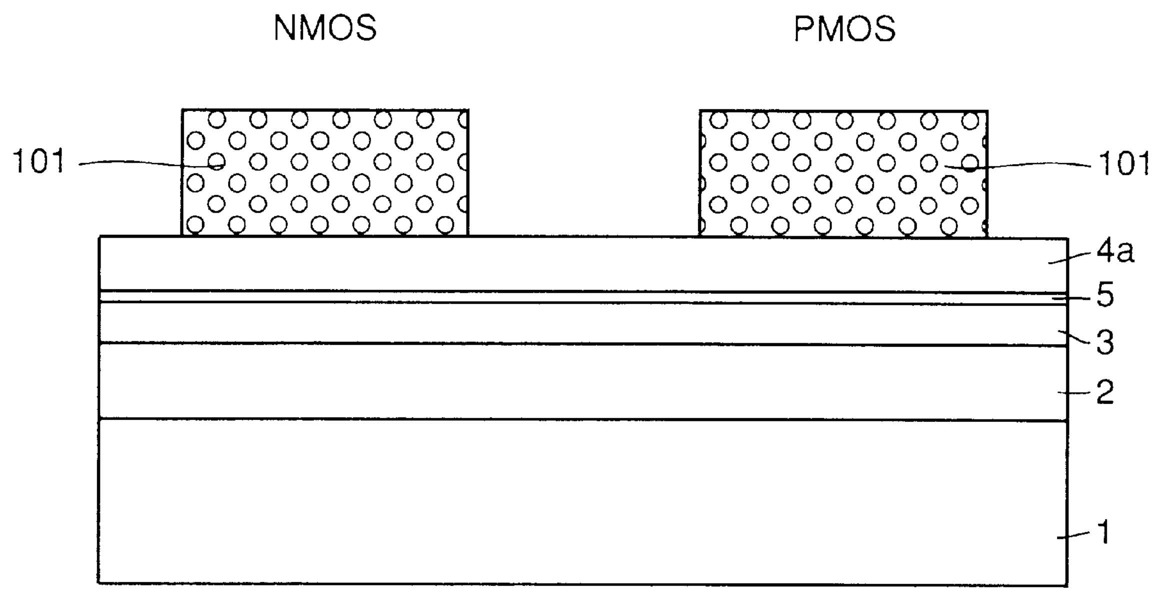
FIGS. 24 to 32 are cross sections showing 1st to 9th steps in a process of manufacturing a semiconductor device according to a second embodiment of the invention, respectively.

Referring first to FIG. 24, buried oxide film 2 is formed on silicon substrate 1, and then SOI layer 3 is formed on buried oxide film 2. Oxide film 5 having a thickness of about 100 Å is formed on SOI layer 3. Oxide film 5 may be formed by the CVD method under the temperature condition of about 800° C., or by oxidizing the surface of SOI layer 3 under the temperature condition of about 800° C. Nitride film 4*a* having a thickness of about 1000 Å is formed on oxide film 5 by the CVD method under the temperature condition of about 700° C. A resist 101 is formed at predetermined regions on nitride film 4*a.* Using resist 101 as a mask, nitride film 4*a* is etched to pattern the same.

Figure 25:
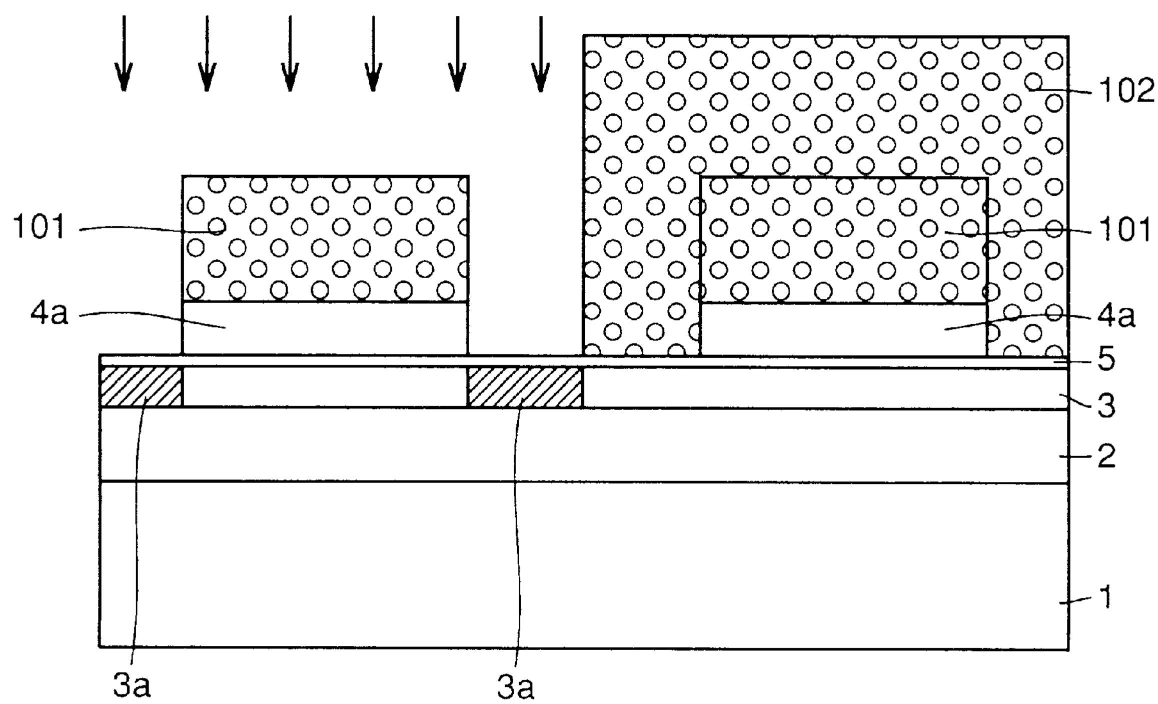

Then, resist 102 covering the PMOS region is formed as shown in FIG. 25. Using resists 102 and 101 as a mask, boron ions ($B^+$) are implanted into SOI layer 3 at the NMOS region under the conditions of 20 kev and $3\times10^{13}$–$8\times10^{13}/cm^2$. Thereby, impurity implanted regions 3*a* for raising the threshold voltage of parasitic transistor is formed. Thereafter, resists 101 and 102 are remove.

Figure 26:
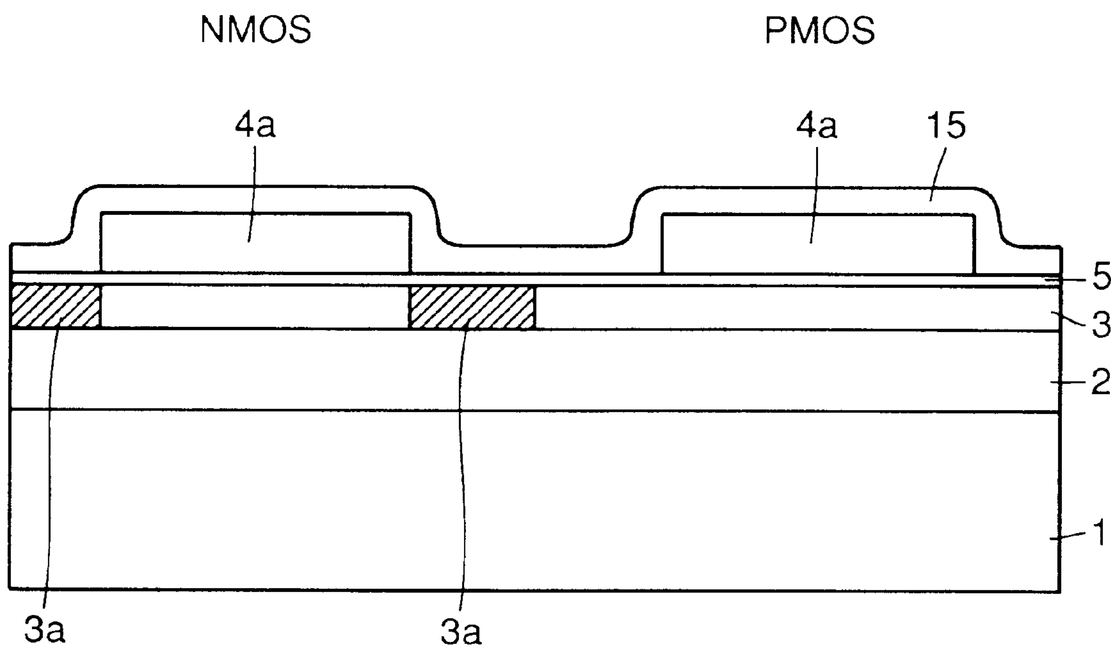
Figure 27:
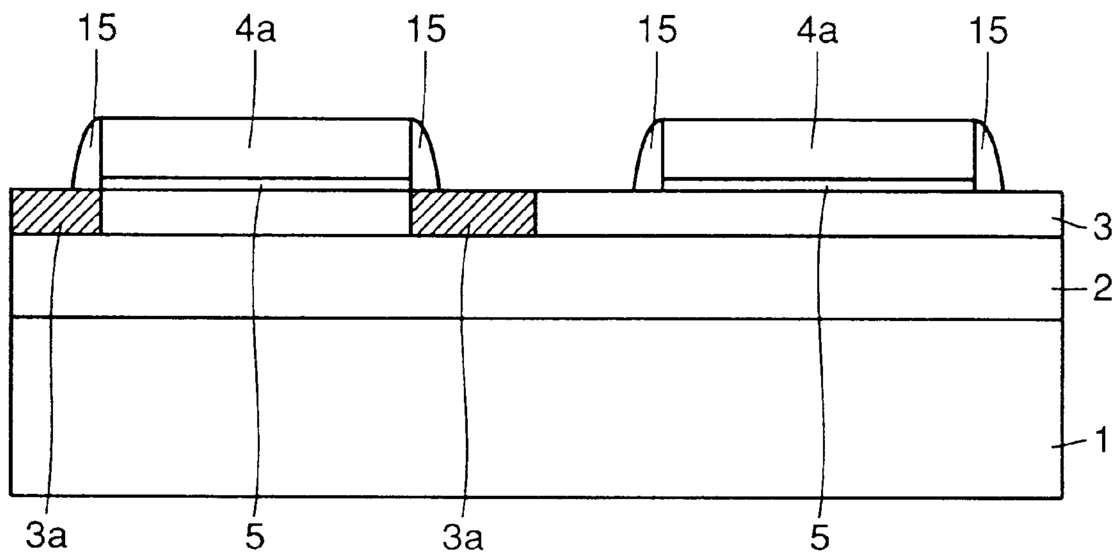

As shown in FIG. 26, oxide film 15 having a thickness of about 100 Å is formed over and nitride films 4*a* and oxide film 5*a,* and then is anisotropically etched to form side wall side wall oxide films 15 which are in contact with opposite side surfaces of each nitride film 4*a* as shown in FIG. 27.

Figure 28:
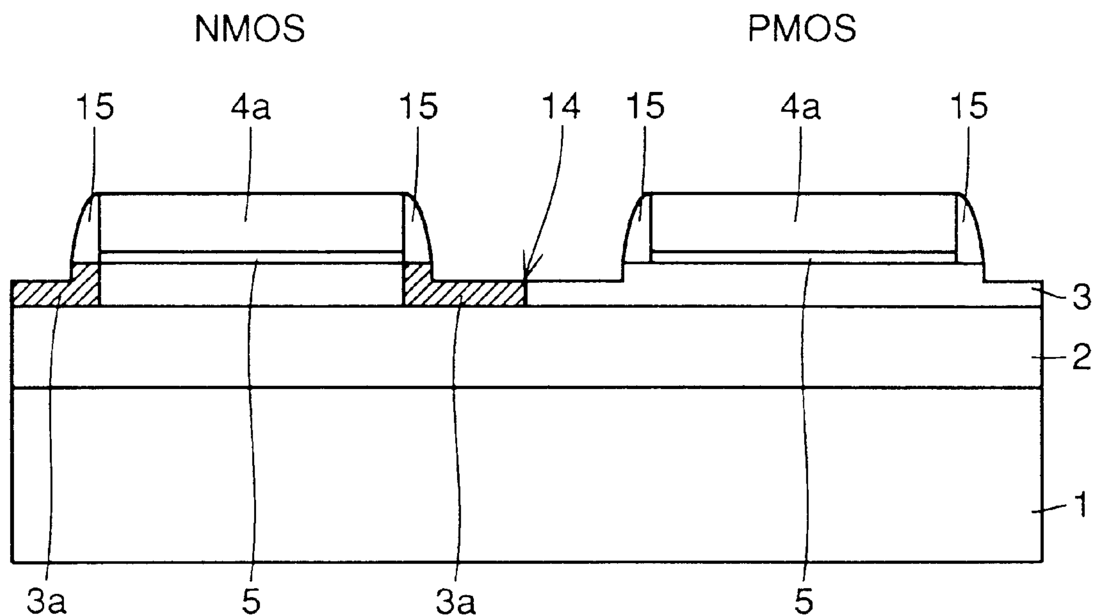
Figure 29:
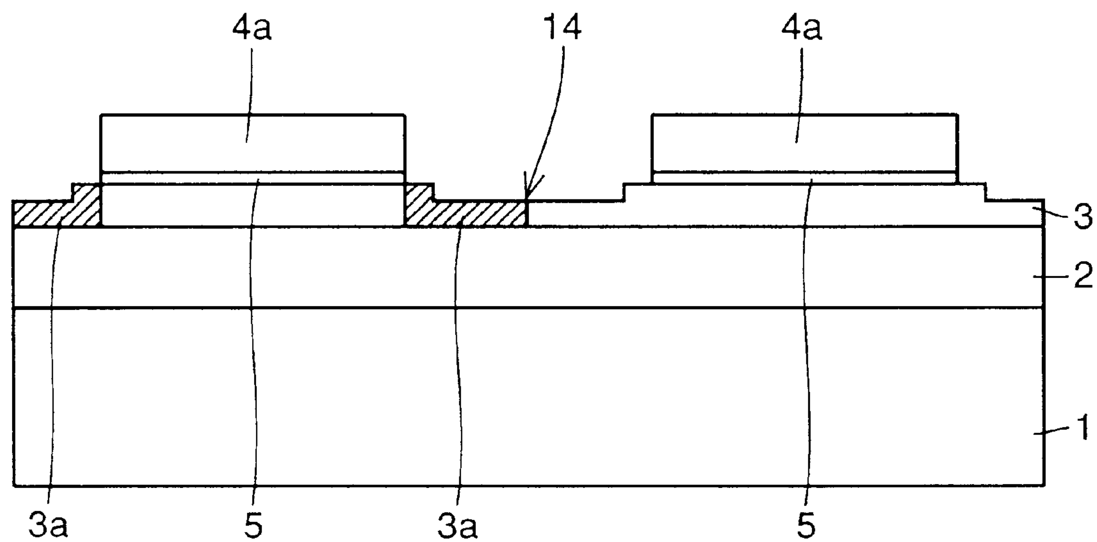

As shown in FIG. 28, using side wall oxide films 15 and nitride films 4*a* as a mask, a predetermined portion of SOI layer 3 is etched by a predetermined thickness to form a concavity 14. Then, side wall oxide films 15 are removed by the wet etching. Thereby, a form shown in FIG. 29 is obtained.

Figure 30:
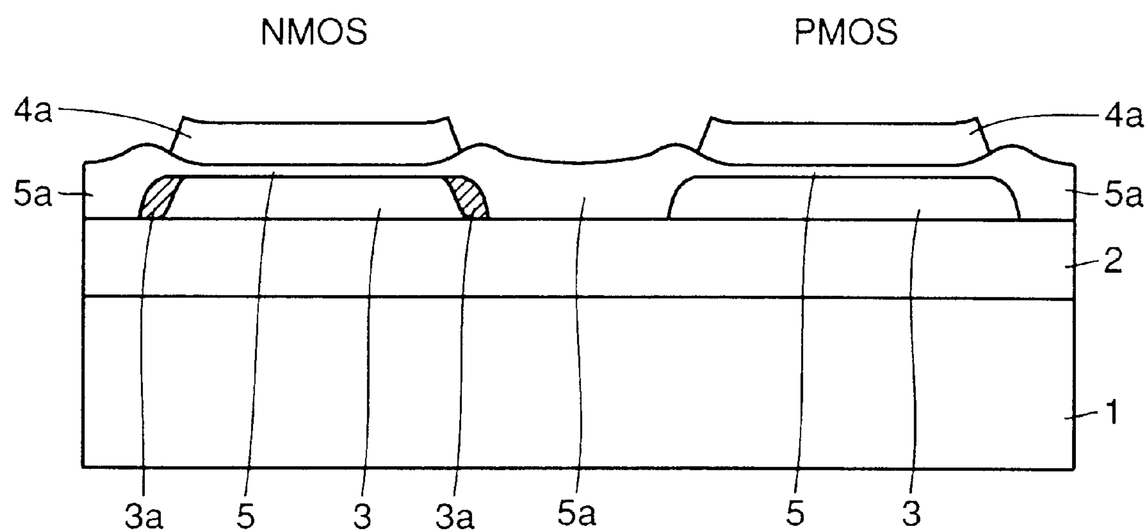
Figure 31:
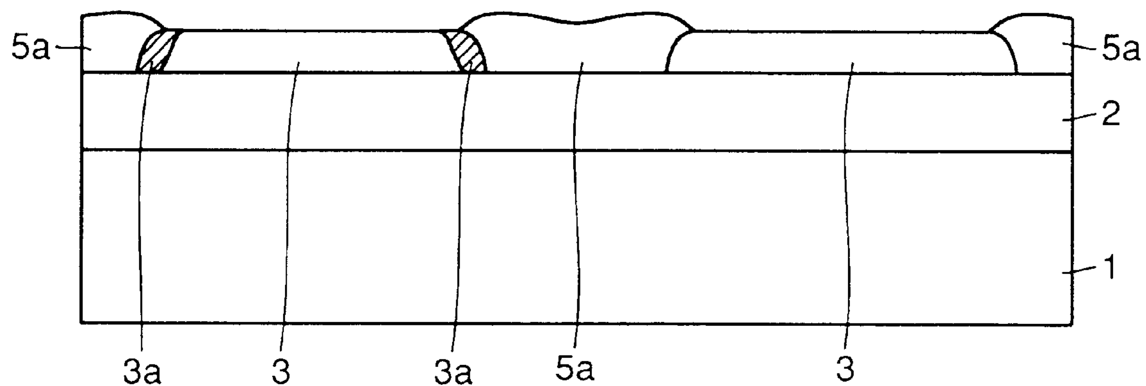

Thereafter, using nitride films 4*a* as a mask, SOI layers 3 is selectively oxidized by the LOCOS (Local Oxidation of Silicon) method. Thereby, LOCOS oxide film 5*a* is formed as shown in FIG. 30. Thereafter, nitride films 4*a* and oxide film 5 are removed, so that a form shown in FIG. 31 is obtained. Then, the semiconductor device of the second embodiment shown in FIG. 32 is completed through the same steps as those in the process of manufacturing the semiconductor device of the first embodiment shown in FIGS. 12 to 23.

Figure 38:
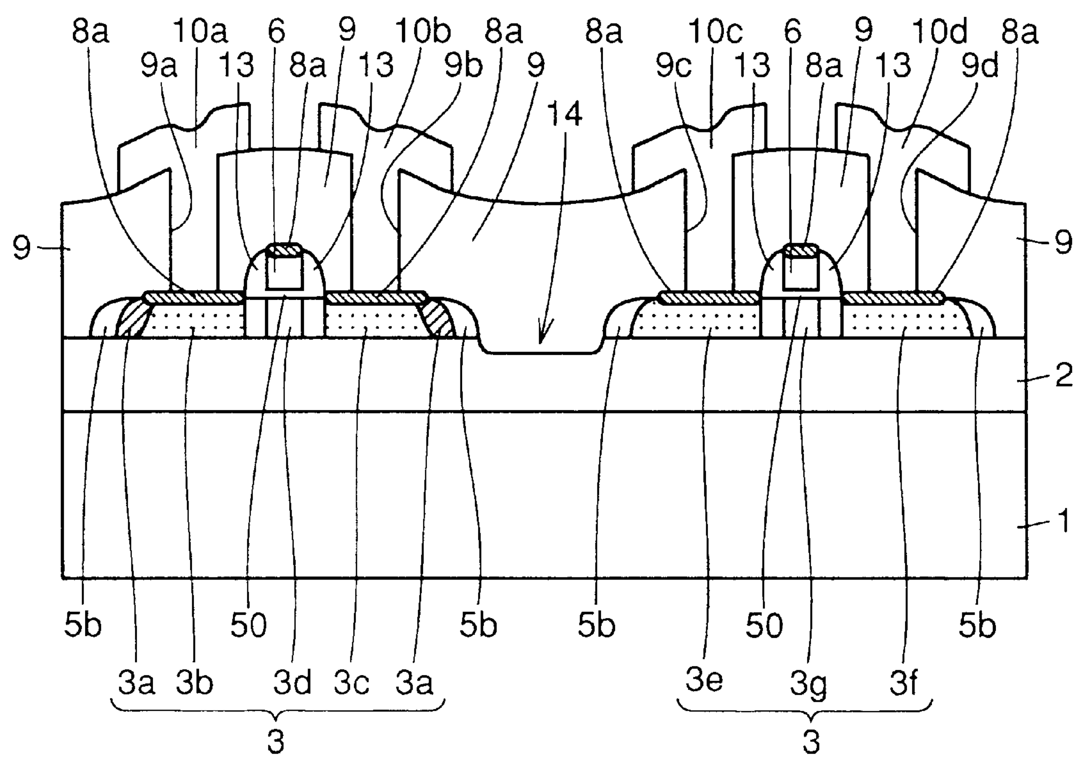
Figure 39:
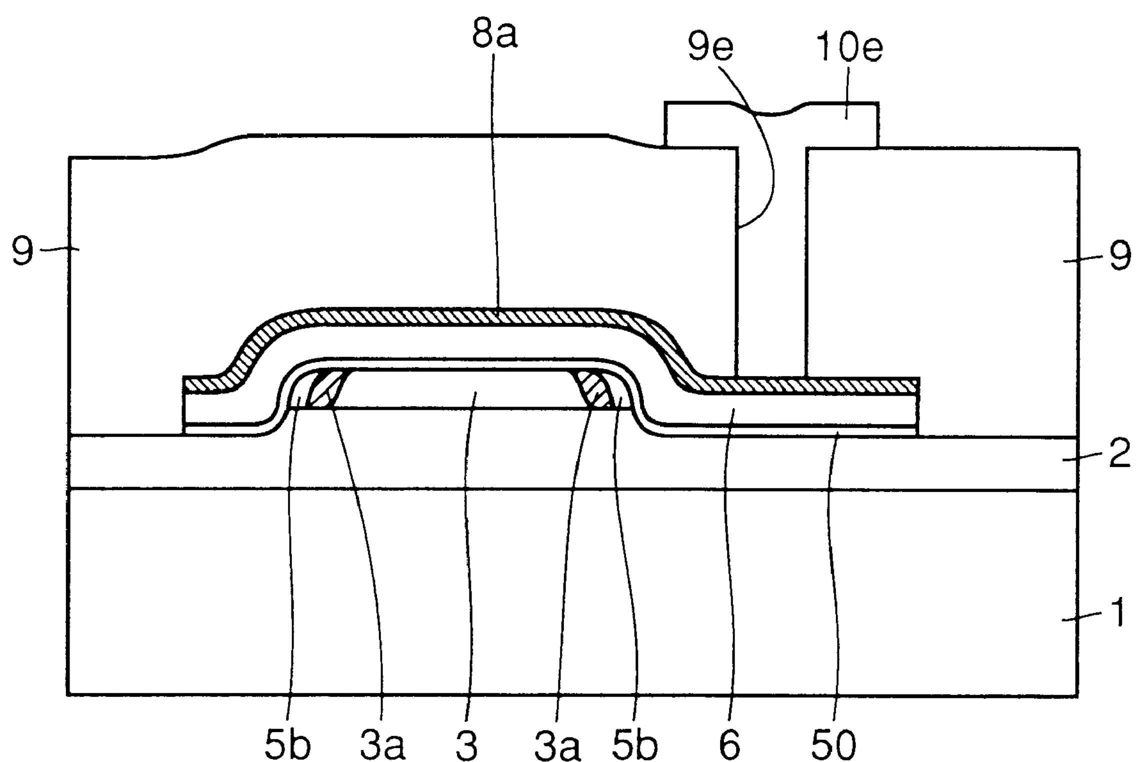
FIG. 39 is a cross section taken along line perpendicular to the section in FIG. 38.

Referring to FIGS. 38 and 39, a semiconductor device of a third embodiment differs from the second embodiment in that side wall oxide films 5*b* are formed in contact with the side surfaces of SOI layers 3. Therefore, as shown in FIG. 39, the side surface of SOI layer 3 is spaced from gate electrode 6 by a long distance, so that the threshold voltage of parasitic transistor can be large. Consequently, the subthreshold characteristics of regular transistor are prevented from being adversely affected by the parasitic transistor. Since the side surface of SOI layer 3 has the rounded upper portion, concentration of the electric field at the upper side portion can be prevented. Therefore, it is possible to prevent reduction of the threshold voltage of the parasitic transistor.

Figure 36:
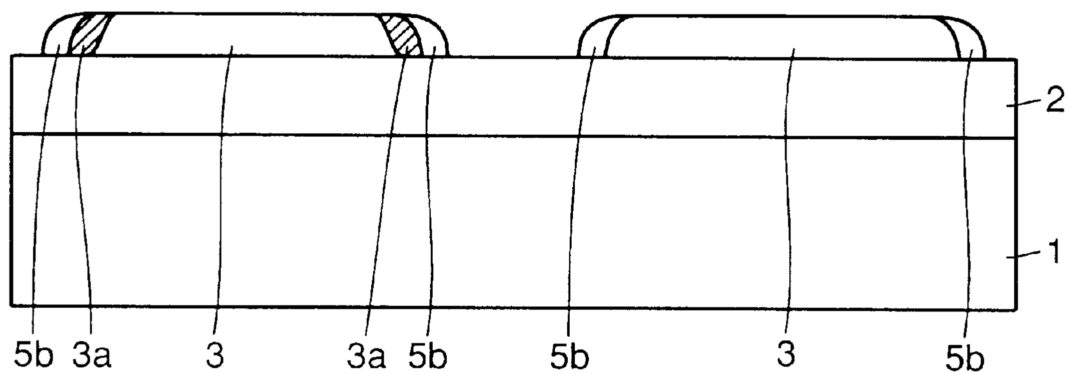
Figure 37:
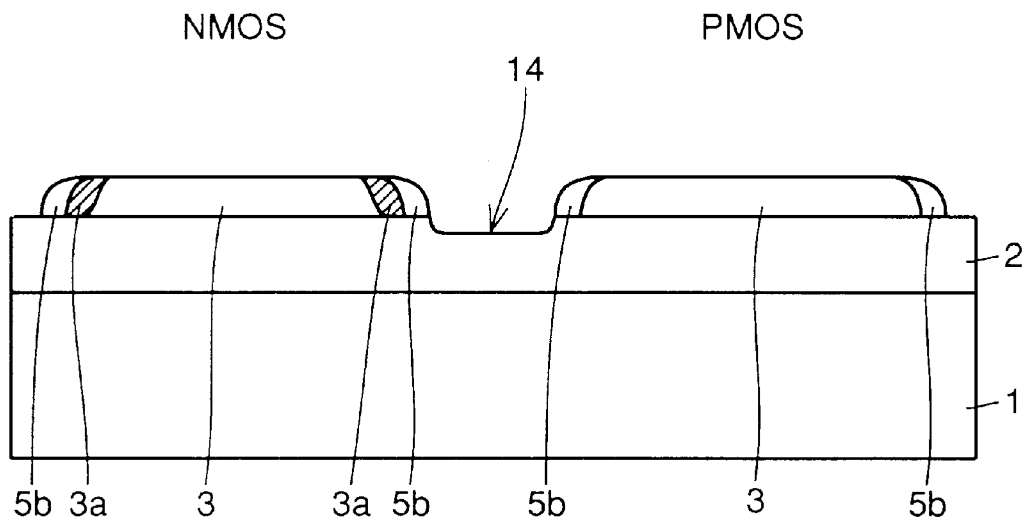

Referring to FIGS. 35 to 38, a process of manufacturing the semiconductor device of the third embodiment will be described below. Steps similar to those in the manufacturing process of the second embodiment shown in FIGS. 24 to 30 are performed to form a structure shown in FIG. 35. Then, nitride films 4*a* and oxide film 5 are removed. LOCOS oxide film 5*a* is anisotropically etched to form side wall oxide films 5*b* which are in contact with the side surfaces of SOI layers 3 as shown in FIG. 36. As shown in FIG. 37, wet etching is performed to form U-shaped concavity 14 at the surface of buried oxide film 2. Then, the semiconductor device of the third embodiment shown in FIG. 38 is completed through the same steps as those in the process of manufacturing the semiconductor device of the first embodiment shown in FIGS. 12 to 23.

Figure 47:
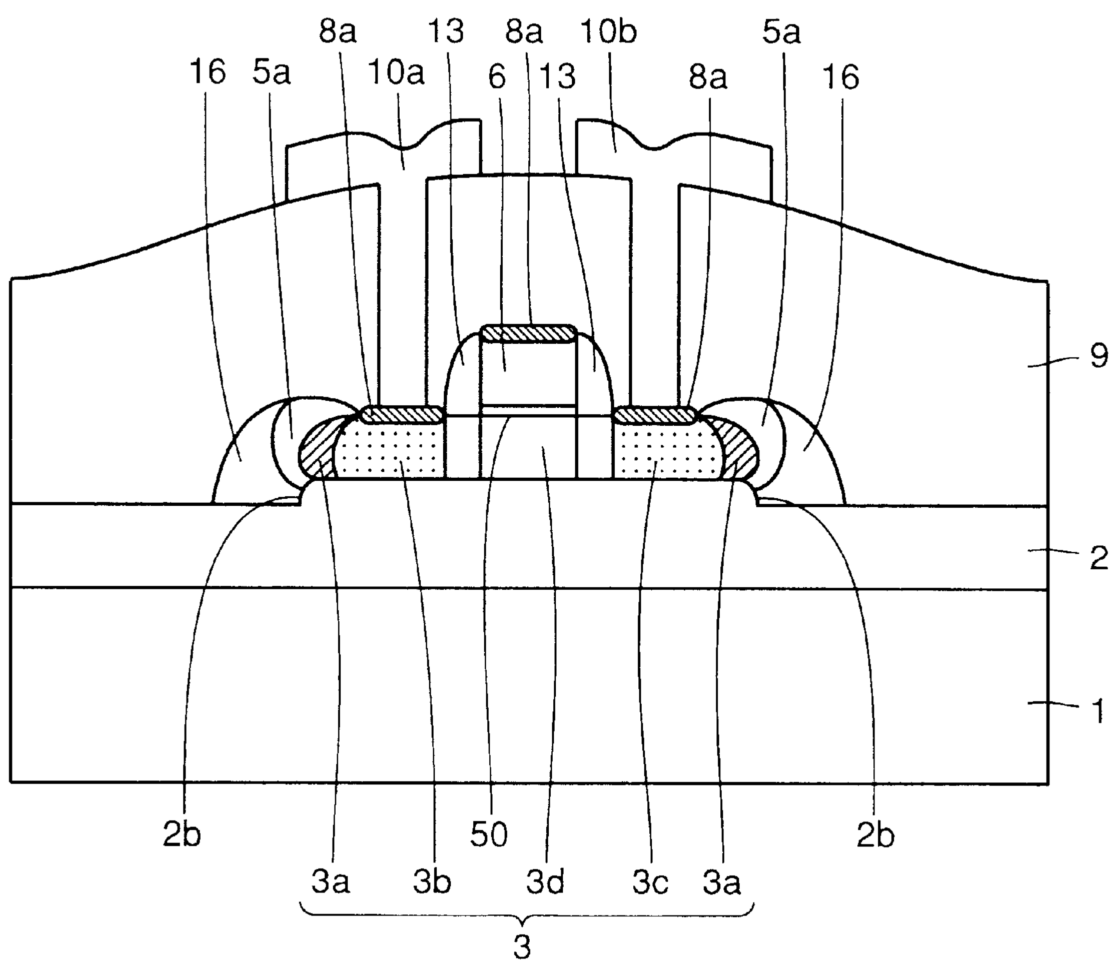
Figure 48:
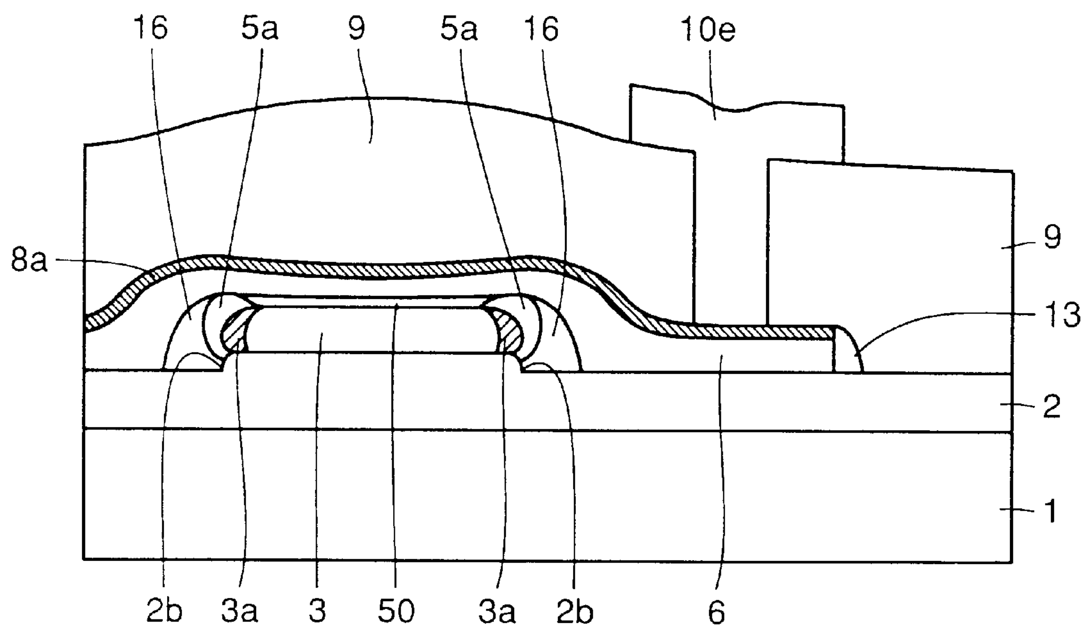
FIG. 48 is a cross section taken along line perpendicular to the section in FIG. 47.

Referring to FIGS. 47 and 48, a semiconductor device of a fourth embodiment is provided with thermal oxidation films 5*a* covering side surfaces of SOI layer 3. There are formed oxide films 16 which are in contact with side surfaces of thermal oxidation films 5*a* and cover end surfaces of concavities 2*b* in buried oxide film 2. Thereby, it is possible to prevent such a disadvantage that gate electrode 6 extends up to the lower surface of SOI layer 3 due to formation of gate electrode 6 at the end of concavity 2*b* during the manufacturing process. As a result, it is possible to prevent concentration of an electric field which may be caused by the above extension of gate electrode 6.

Figure 40:
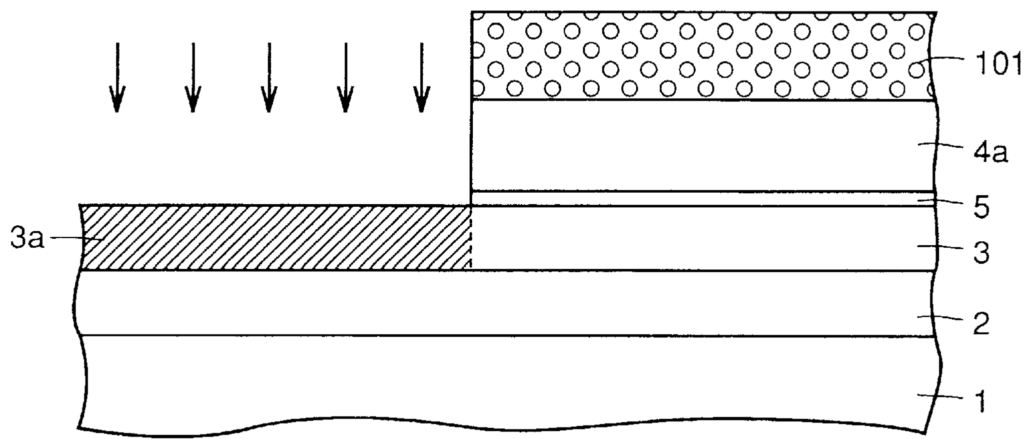
FIGS. 40 to 47 are cross sections showing a 1st to 8th steps in a process of manufacturing a semiconductor device according to a fourth embodiment of the invention, respectively.
Figure 41:
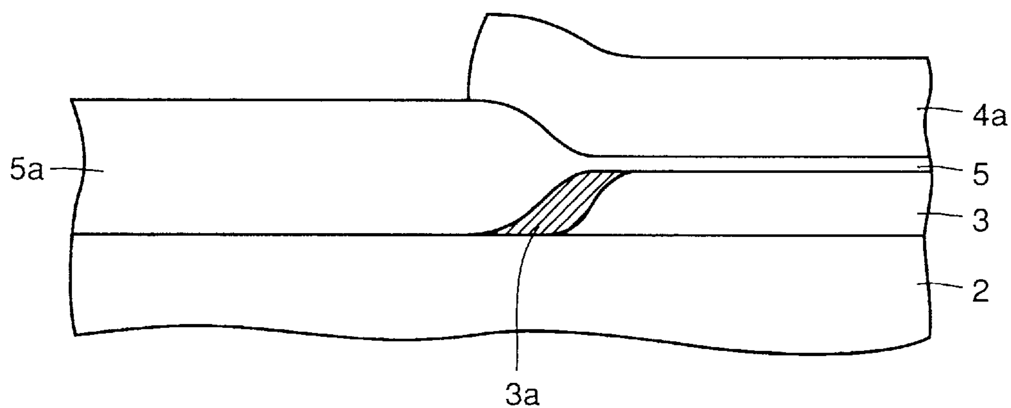

Referring to FIGS. 40 to 47, a process of manufacturing the semiconductor device of the fourth embodiment will be described below. Referring to FIG. 40, buried oxide film 2 is formed on silicon substrate 1, and then SOI layer 3 is formed on buried oxide film 2. Oxide film 5 is formed on SOI layer 3 by the CVD method or thermal oxidation method. Nitride film 4*a* having a thickness of about 1000 Å is formed on oxide film 5 under the temperature condition of about 700° C. Resist 101 is formed at predetermined regions on nitride film 4*a,* and then nitride film 4*a* and oxide film 5 are patterned. Using resist 101 as a mask, boron ions are implanted into SOI layer 3 under the conditions of 20 kev and $3\times10^{13}$–$8\times10^{13}/cm^2$. Thereby, impurity implanted regions 3*a* for raising the threshold voltage of parasitic transistor is formed. Thereafter, resist 101 is removed. Using nitride film 4*a* as a mask, the LOCOS method is performed to oxidize SOI layer 3. Thereby, LOCOS oxide film 5*a* reaching buried oxide film 2 is formed as shown in FIG. 41. Impurity implanted layer 3*a* remains at a region of SOI layer 3 near a boundary between LOCOS oxide film 5*a* and SOI layer 3.

Figure 42:
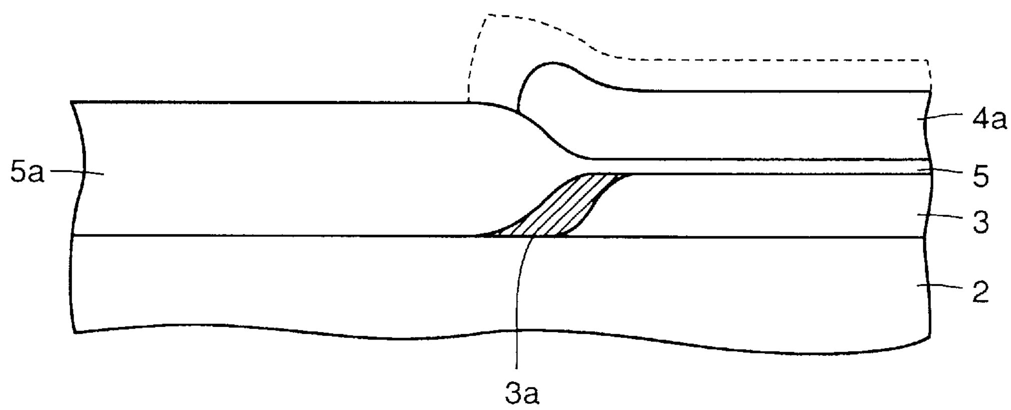
Figure 43:
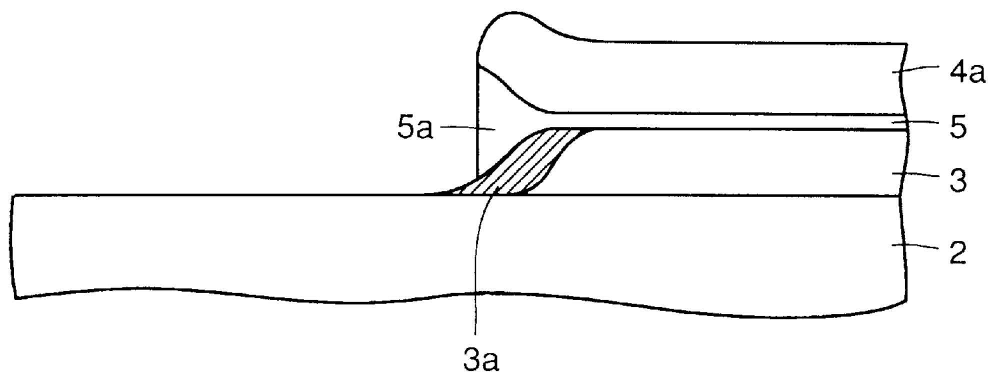
Figure 44:
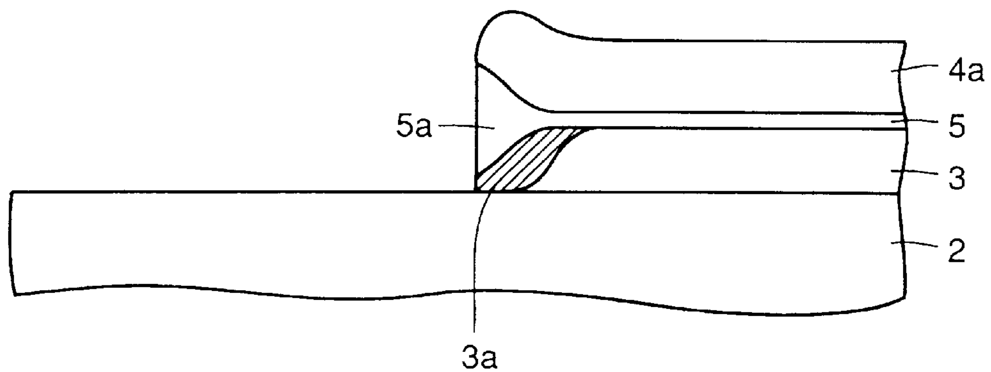
Figure 45:
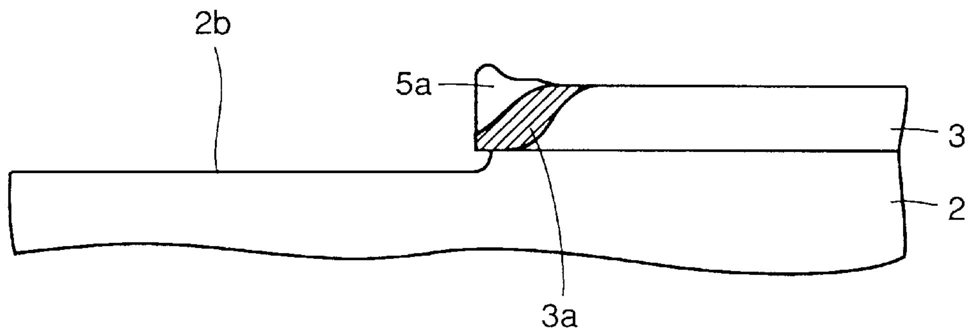

As shown in FIG. 42, isotropic dry etching is effected on nitride film 4*a* to remove upper and side surfaces of nitride film 4*a* by a predetermined thickness. Using nitride film 4*a* as a mask, LOCOS oxide film 5*a* is etched to obtain the form shown in FIG. 43. Using nitride film 4*a* and LOCOS oxide film 5*a* as a mask, etching is effected to remove a thin portion of SOI layer 3. Thereafter, nitride film 4*a* and underlaying oxide film 5 are removed by wet etching. By this etching, an exposed surface of buried oxide film 2 is etched. Thereby, concavity 2*b* is formed at the surface of buried oxide film 2. If the gate electrode were formed in this state, the gate electrode would extend up to the lower surface of SOI layer 3 in some cases. In this case, the electric field would unpreferably concentrate at the lower side portion of SOI layer 3.

Figure 46:
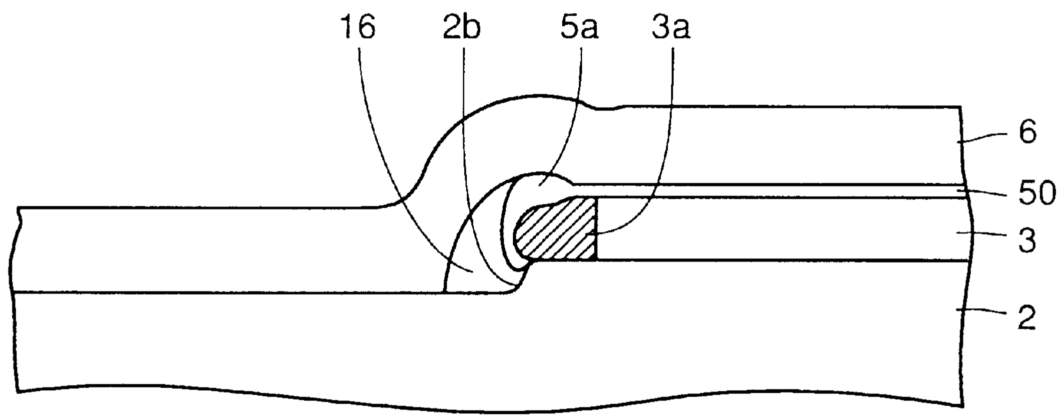

In this embodiment, therefore, the side surface of SOI layer 3 is oxidized by about 200 Å to form oxide film 5*a,* and then side wall oxide film 16 is formed in contact with the side surface of oxide film 5*a* and the upper surface of concavity 2*b* as shown in FIG. 46, before forming gate electrode 6. Thereafter, gate oxide film 5 and gate electrode 6 are formed. The transistor formed by the above process has a section along the channel length direction shown in FIG. 47 and a section along a channel width direction shown in FIG. 48.

Figure 49:
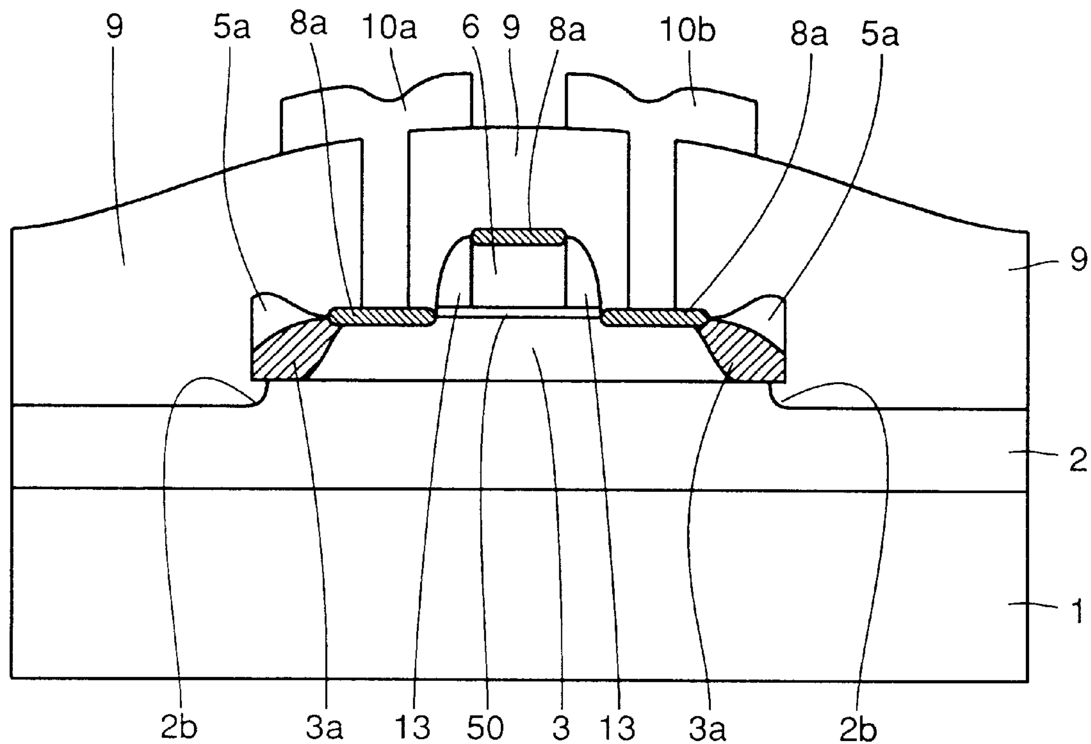
FIG. 49 is a cross section showing a semiconductor device according to a fifth embodiment of the invention.

Referring to FIG. 49, a fifth embodiment differs from the fourth embodiment in FIG. 47 shown in FIG. 47 in that it is not provided with thermal oxidation films and side wall oxide films covering the side surfaces of SOI layer 3. Even in this structure, the side surfaces of SOI layer 3 have rounded upper portions, so that concentration of the electric field at the upper side portions can be effectively prevented. Consequently, the subthreshold characteristics of regular transistor are prevented from being adversely affected by the parasitic transistor.

Figure 54:
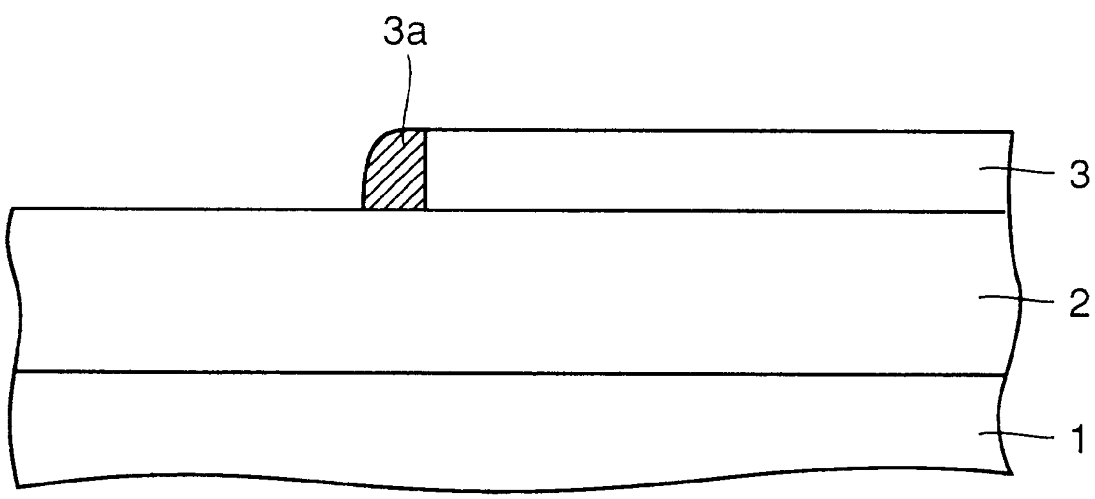

Referring to FIG. 54, a semiconductor device of a sixth embodiment includes SOI layer 3 having a side surface, which has a rounded upper portion and a lower portion extending perpendicularly to the main surface of buried oxide film 2. Thereby, concentration of the electric field at the upper side portion of SOI layer 3 can be prevented. Since formation of a thin portion at the lower side portion of SOI layer 3 is prevented, it is possible to prevent reduction of the threshold voltage of parasitic transistor.

Figure 50:
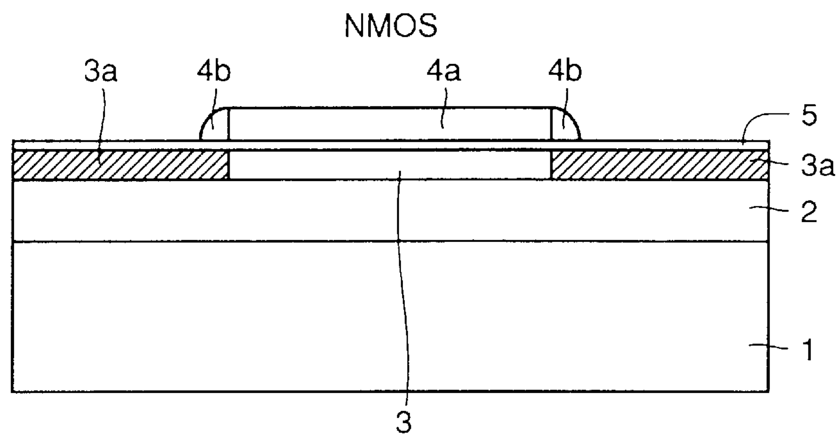
FIGS. 50 to 54 are cross sections showing 1st to 5th steps in a process of manufacturing a semiconductor device according to a sixth embodiment of the invention, respectively.
Figure 51:
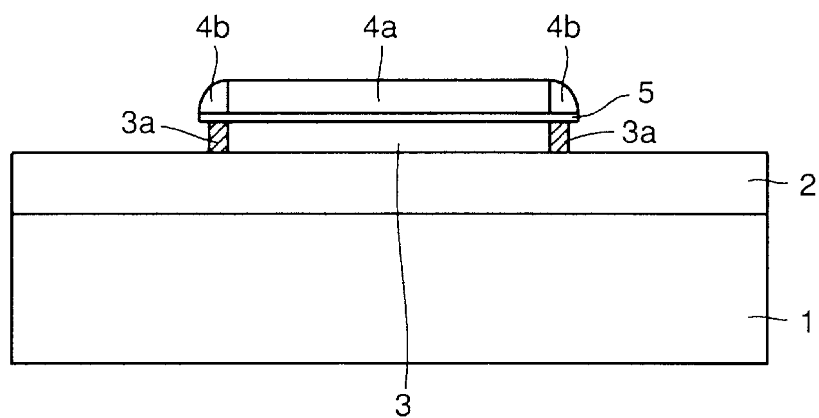

Referring to FIGS. 50 to 54, a process of manufacturing a semiconductor device of a sixth embodiment will be described below. The process from the initial step to the step of forming nitride films 4*a* and 4*b* as shown in FIG. 50 is performed in a manner similar to the process of manufacturing the semiconductor device of the first embodiment already described with reference to FIGS. 1 to 4. Thereafter, SOI layer 3 is isotropically etched using nitride films 4*a* and 4*b* as a mask. Thereby, the side surfaces of SOI layer 3 are located laterally inside the lower side ends of nitride films 4*b* as shown in FIG. 51.

Figure 52:
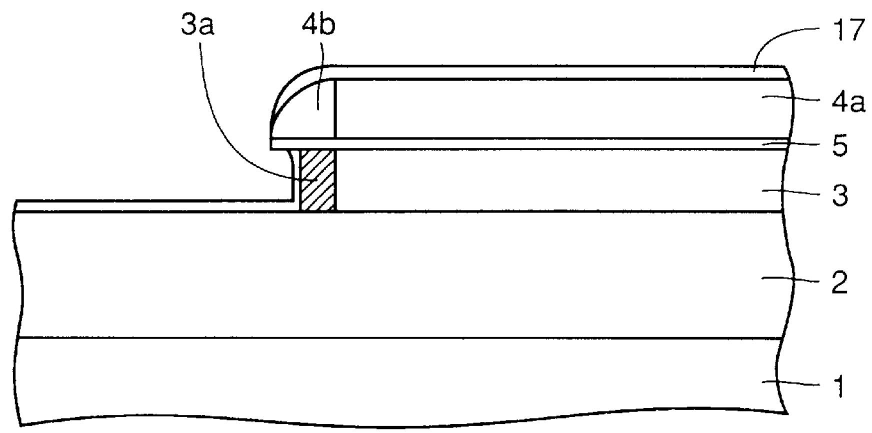
Figure 53:
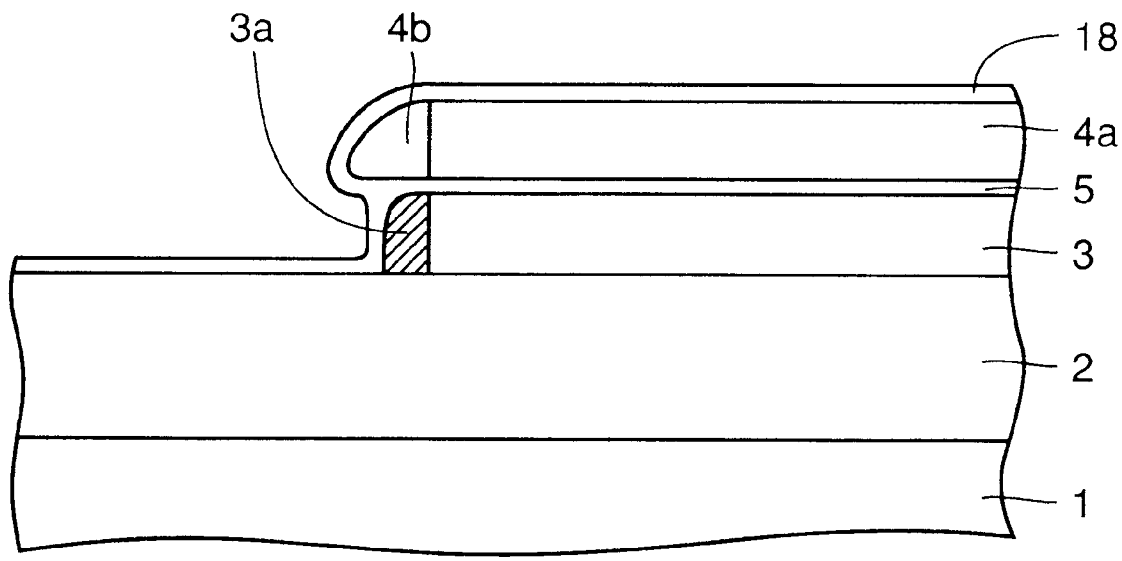

As shown in FIG. 52, a polycrystalline silicon layer 17 is formed as shown in FIG. 52. Polycrystalline silicon layer 17 thus formed has a portion, which is located near the side surface of SOI layer 3 and is thinner than the other portion. The reason of this is that the sputtering method does not efficiently deposit polycrystalline silicon film 17 on the side surface of SOI layer 3 hollowed with respect to the overlaid nitride film 4*b*. In this state, polycrystalline silicon film 17 is oxidized. Thereby, an oxide film 18 is formed as shown in FIG. 53. In this step of oxidizing polycrystalline silicon film 17, the side portion of SOI layer 3 which was damaged by the etching is also oxidized, because the portion of polycrystalline silicon film 17 located on the side surface of SOI layer 3 is thin. In the processing, oxidant diffuses into the upper side portion of SOI layer 3 through oxide film 5, so that oxidation progresses rapidly. Thereby, the concentration of electric field at the upper side portion of SOI layer 3 can be prevented. Thereafter, oxide film 18, nitride films 4*a* and 4*b* and oxide film 5 are removed. Thereby, the structure shown in FIG. 54 is completed.

A seventh embodiment will be described below. A completed structure of a semiconductor device of the seventh embodiment is the substantially same as that of the sixth embodiment described before. More specifically, the side surface of SOI layer 3 has a rounded upper portion, and has a lower portion extending substantially perpendicularly to the main surface of buried oxide film 2.

Figure 55:
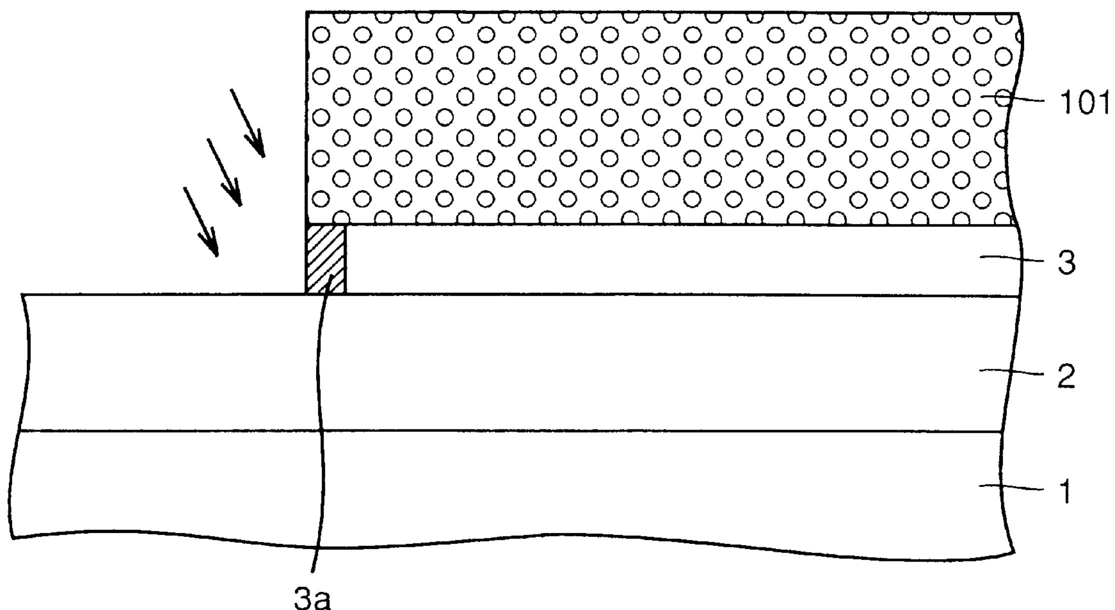
FIGS. 55 to 57 are cross sections showing 1st to 3rd steps in a process of manufacturing a semiconductor device according to a seventh embodiment of the invention, respectively.
Figure 56:
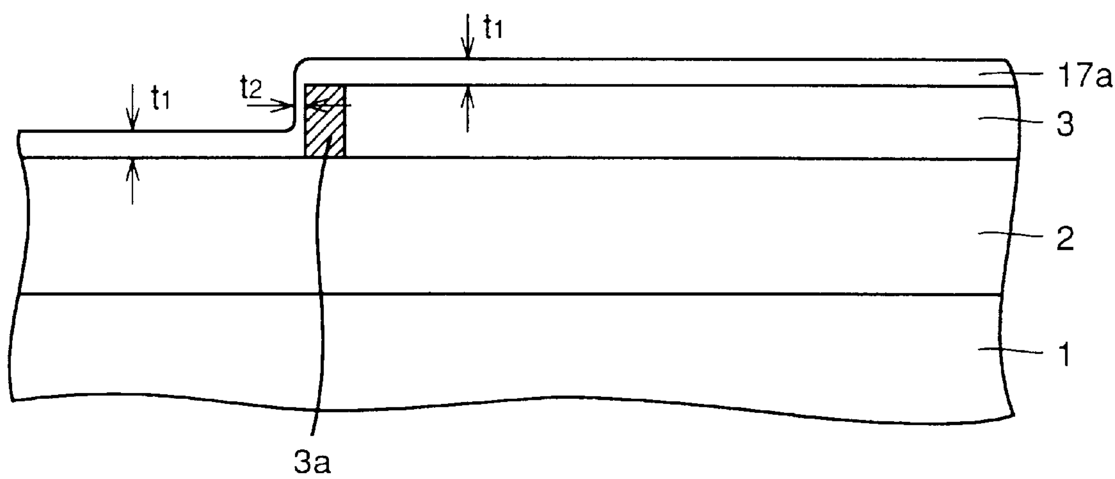
Figure 57:
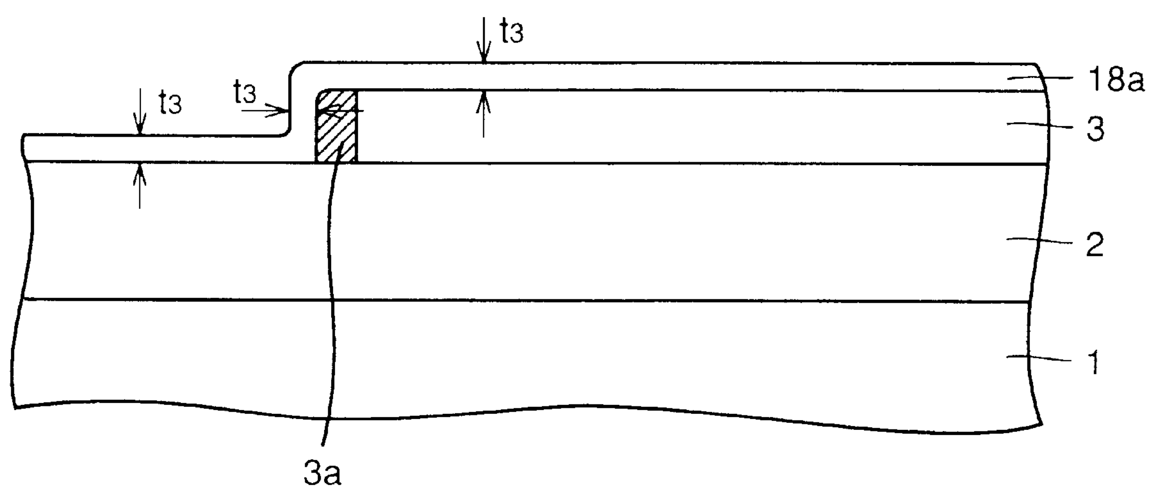

Referring to FIGS. 55 to 57, a process of manufacturing the semiconductor device of the seventh embodiment will be described below. Referring first to FIG. 55, buried oxide film 2 is formed on silicon substrate 1, and then SOI layer 3 is formed on buried oxide film 2. After forming resist 101 at a predetermined region on SOI layer 3, SOI layer 3 is etched using resist 101 as a mask. Then, using resist 101 as a mask, boron ions ($B^+$) are implanted into to a side portion of SOI layer 3 by the continuous rotary implantation method under the conditions of 30–40 keV and $3\times10^{13}$–$15\times10^{13}$/cm$^2$. This forms impurity implanted region 3*a* for preventing lowering of the threshold voltage of parasitic transistor. Thereafter, resist 101 is removed.

As shown in FIG. 56, the sputtering method is performed to form a polycrystalline silicon layer 17*a* covering SOI layer 3 and buried oxide film 2. In polycrystalline silicon layer 17*a* formed by the sputtering method, a portion located on the side surface of SOI layer 3 has a thickness $t_2$ smaller than a thickness $t_1$ of a portion located on the upper surfaces of SOI layer 3 and buried oxide film 2. Polycrystalline silicon layer 17*a* thus formed is oxidized, whereby such an oxide film 18*a* is formed that a portion located on the side surface of SOI layer 3 has the same thickness as a portion located on the upper surface of SOI layer 3 as shown in FIG. 57. This means that the side surface of SOI layer 3 is also oxidized. In general, a corner is oxidized more rapidly than a flat portion, so that the upper side portion of SOI layer 3 is rapidly oxidized. Therefore, the upper side portion of SOI layer 3 is rounded.

Although polycrystalline silicon layers 17 and 17*a* are oxidized in the sixth and seventh embodiments described above, the invention is not restricted to this, and oxidation may be performed after depositing an amorphous silicon film or a film of metal such as Ti, Mo, W, Al, Ta, Cu or Fe.

Figure 60:
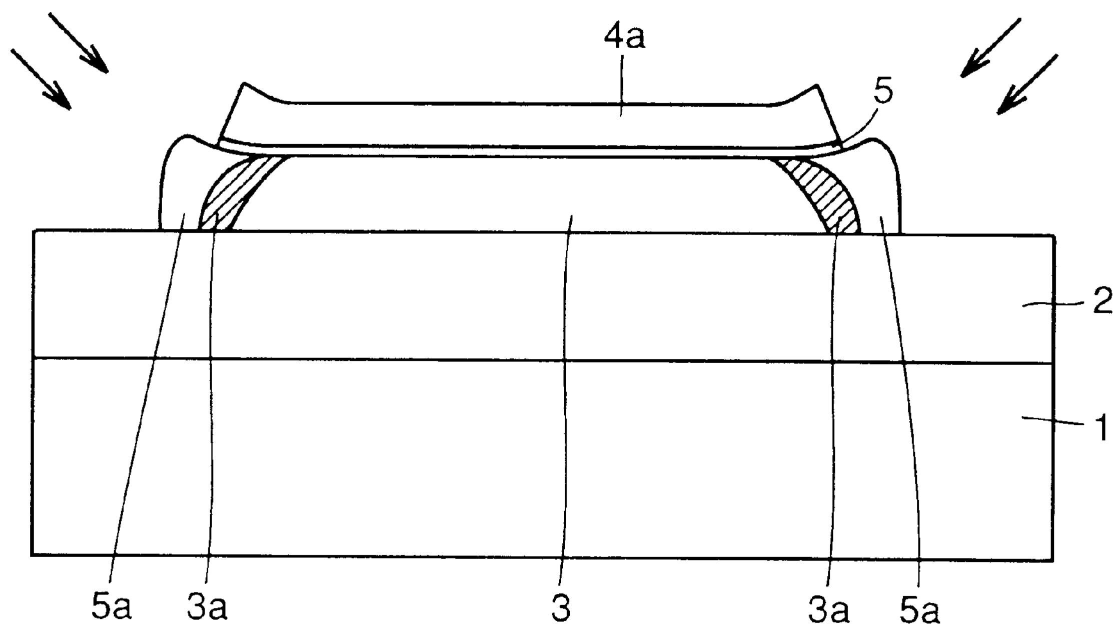

Referring to FIG. 60, a semiconductor device of an eighth embodiment has such a final structure that the side surface of SOI layer 3 has a rounded upper portion and a lower portion extending substantially perpendicularly to the main surface of buried oxide film 2. Oxide films 5*a* are formed in contact with side surfaces of the SOI layer. Further, in this eighth embodiment, metal contaminant which existed in the SOI layer is taken into oxide film 5*a* owing to a manufacturing process which will be described later. This effectively prevents generation of crystal defect in the SOI layer. Since SOI layer 3 has the side surface of the formed already, an effect similar to that by the first to seventh embodiments can be obtained.

Figure 58:
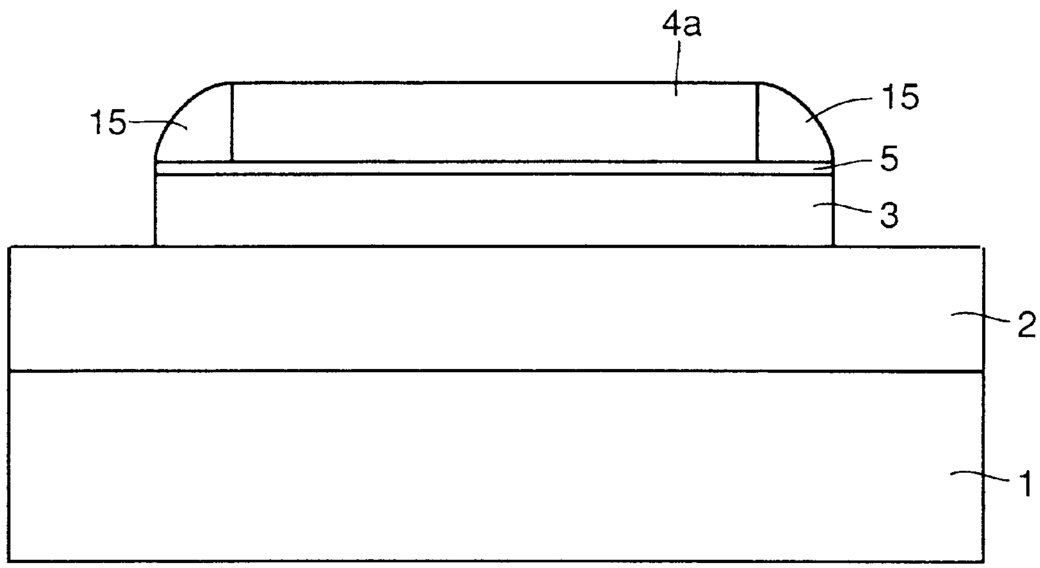
FIGS. 58 to 60 are cross sections showing 1st to 3rd steps in a process of manufacturing a semiconductor device according to an eighth embodiment of the invention, respectively.

A process of manufacturing a semiconductor device of an eighth embodiment will be described below with reference to FIGS. 58 to 60. A process similar to the process of manufacturing the semiconductor device of the second embodiment already described with reference to FIGS. 24 to 27 is performed to form side wall oxide films 15 as shown in FIG. 58. Using side wall oxide films 15 as a mask, oxide film 5 and SOI layer 3 are anisotropically etched to pattern the same. Thereafter, side wall oxide films are removed. However, implantation of boron ions shown in FIG. 25 has not been performed.

Figure 59:
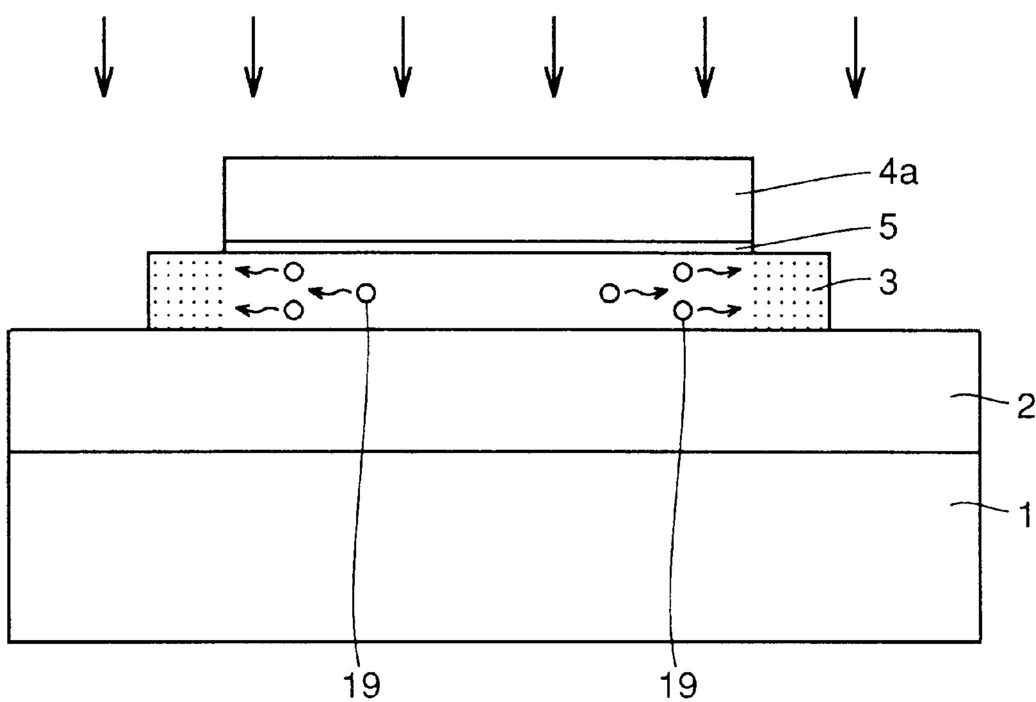

As shown in FIG. 59, using nitride film 4*a* as a mask, silicon ions are implanted into a region near the side surface of SOI layer 3 under the implantation conditions of 30–100 keV and $4\times10^{15}$–$6\times10^{15}$/cm$^2$. This changes a region of SOI layer 3 near its side surface, which was damaged by the etching, into amorphism. Thereafter, heat treatment is performed for 30–180 minutes under the temperature condition of 700°–900° C. Thereby, metal contaminant is gathered into the amorphous region of SOI layer 3 (i.e., gettering is performed).

Thereafter, the side portion of SOI layer 3 is oxidized under the temperature condition of 900° C. using nitride film 4a as a mask. Metal contaminant 19 gathered into the amorphous region is taken into oxide films 5a which are formed by this oxidation. Consequently, it is possible to prevent the metal contaminant from remaining near the side surface of SOI layer 3. Thereafter, using nitride film 4a as a mask, boron ions ($B^+$) are implanted into the side portions of SOI layer 3 under the conditions of 30–60 keV and $3\times10^{13}$–$15\times10^{13}$/cm$^2$. This forms impurity implanted layers 3 for preventing lowering of the threshold voltage of parasitic transistor. Thereafter, nitride film 4a and oxide film 5 are removed. In this manner, a basic structure of the semiconductor device of the eighth embodiment of the invention is completed.

Figure 64:
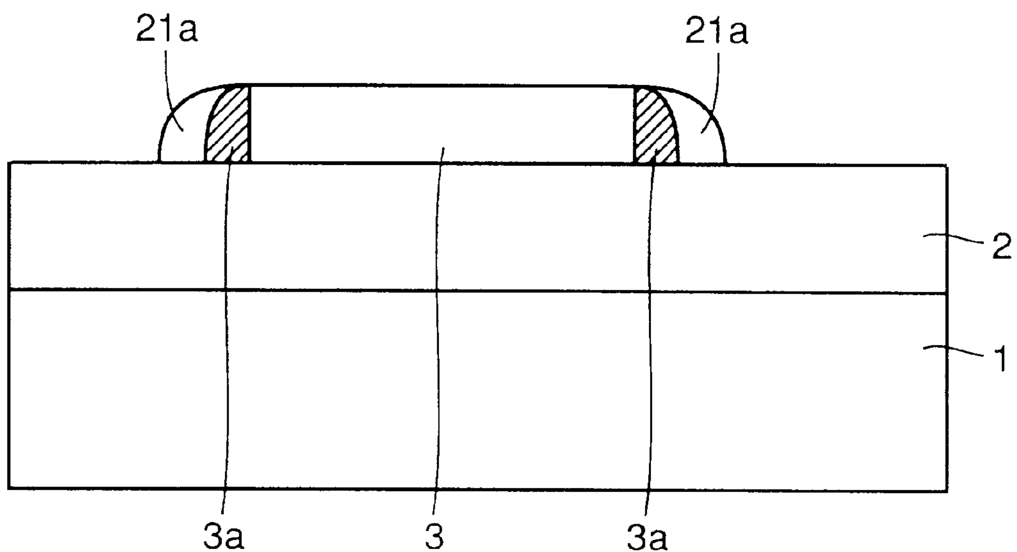

Referring to FIG. 64, a ninth embodiment is similar to the eighth embodiment in that the side surface of SOI layer 3 has a round upper portion and a lower portion extending substantially perpendicularly to the main surface of buried oxide film 2. Also, side wall oxide films 21a are formed in contact with the side surfaces of SOI layer 3. Further, this ninth embodiment is similar to the eighth embodiment in that the metal contaminant which existed in SOI layer 3 is finally taken into side wall oxide films 21a. This can prevent generation of crystal defect in SOI layer 3. Since the side surface of SOI layer 3 has the round upper portion, concentration of the electric field at this portion can be prevented.

Figure 61:
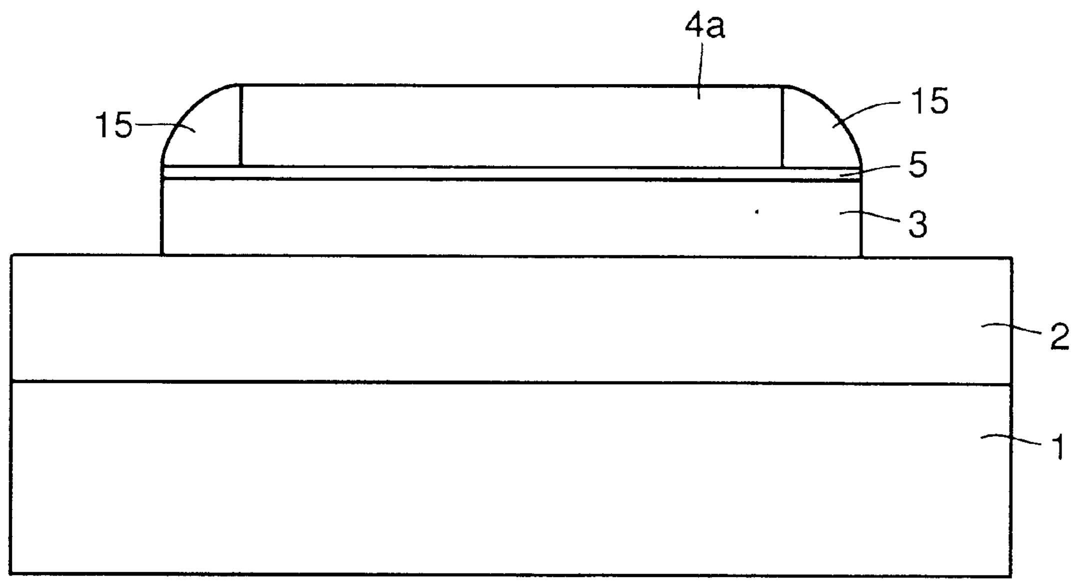
FIGS. 61 to 64 are cross sections showing 1st to 4th steps in a process of manufacturing a semiconductor device according to a ninth embodiment of the invention, respectively.

Referring to FIGS. 61 to 64, a process of manufacturing the semiconductor device of the ninth embodiment will be described below. The process from the initial step to the step of forming side wall oxide films 15 are performed similarly to the process of manufacturing the semiconductor device of the second embodiment already described with reference to FIGS. 24 to 27. Using side wall oxide films 15 as a mask, underlying oxide film 15 and SOI layer 3 are etched to form patterned SOI layer 3 as shown in FIG. 61. Thereafter, side wall oxide films 15 are removed by the etching.

Figure 62:
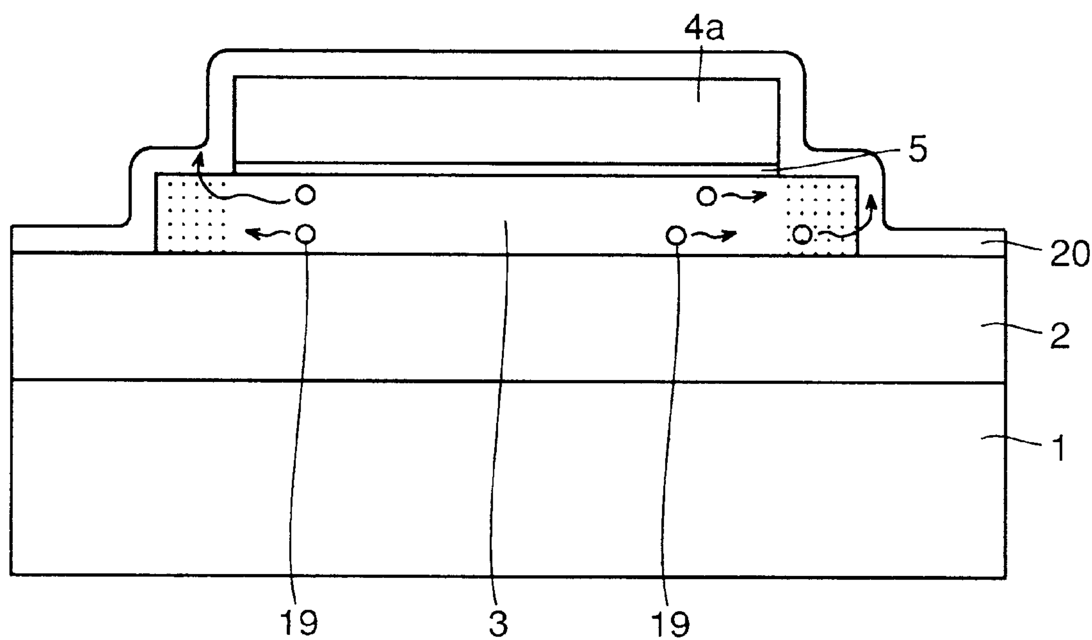

As shown in FIG. 62, using nitride film 4a as a mask, silicon ions are implanted into a portion near the side surface of SOI layer 3 under the conditions of 30–100 keV and $4\times10^{15}$–$6\times10^{15}$/cm$^2$.Thereby, a region near the side surface of SOI layer 3 damaged by the etching is changed into amorphism. Thereafter, a polycrystalline silicon film 20 having a thickness of about 50 Å is formed over nitride film 4a and SOI layer 3. Heat treatment is performed for 30–180 minutes under the temperature condition of 700–900° C., so that metal contaminant 19 in SOI layer 3 is gathered into the amorphous region (i.e., gettering is performed). Polycrystalline silicon film 20 serves to further increase this gettering effect.

Figure 63:
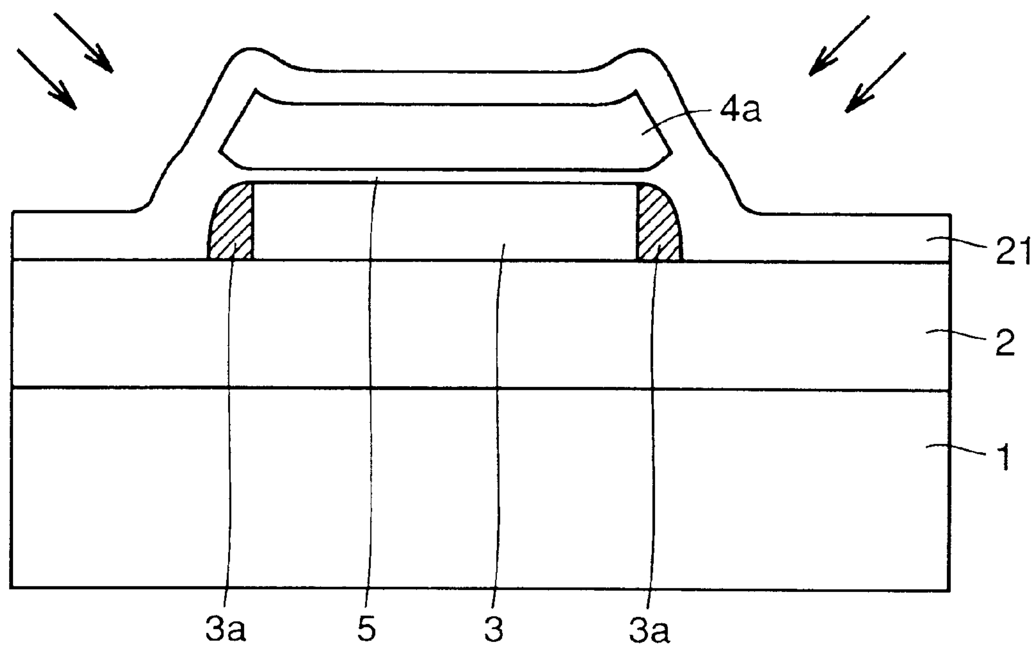

Thereafter, polycrystalline silicon film 20 is oxidized to form an oxide film 21 as shown in FIG. 63. Owing to formation of oxide film 21, the side surface of SOI layer 3 has a round upper portion. Thereafter, boron ions ($B^+$) are implanted into the side portion of SOI layer 3 through oxide film 21 by the continuous rotary implantation method under the conditions of 30–60 keV and $3\times10^{13}$–$15\times10^{13}$/cm$^2$. This forms impurity implanted layers 3a for raising the threshold voltage of parasitic transistor. Thereafter, oxide film 21 is anisotropically etched, and nitride film 4a and oxide film 5 are removed, so that side wall oxide films 21a are formed as shown in FIG. 64. Side wall oxide film 21a increases a distance between the side surface of SOI layer 3 and the gate electrode which will be formed at a later step, so that the threshold voltage of parasitic transistor can be raised. Consequently, the subthreshold characteristics of regular transistor are prevented from being adversely affected by the parasitic transistor.

Figure 67:
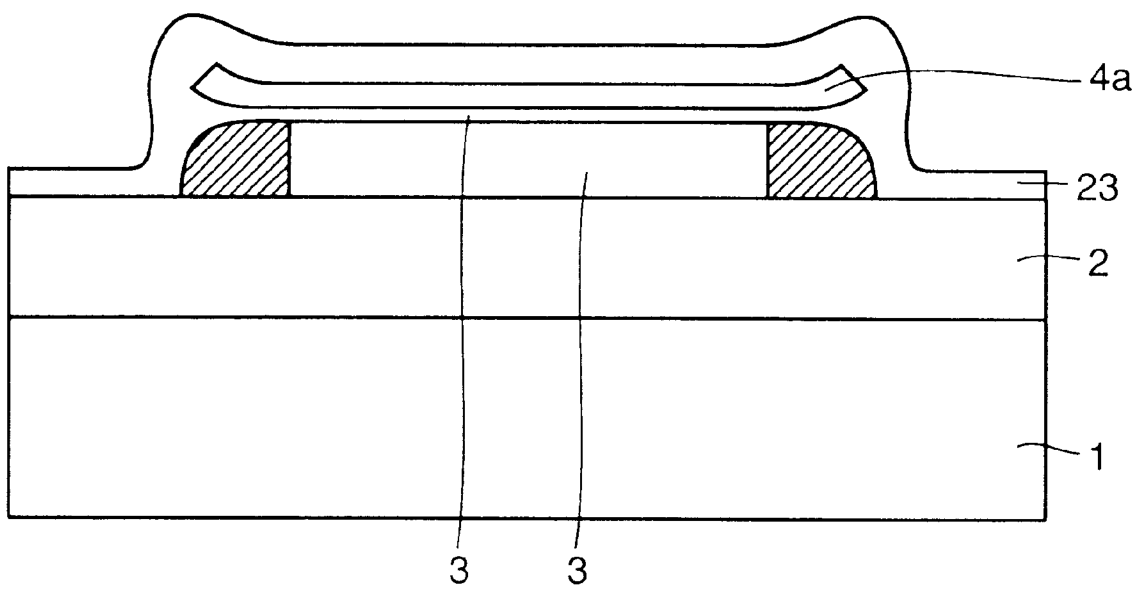

Referring to FIG. 67, a tenth embodiment is similar to the embodiments already described in that the side surface of SOI layer 3 has a round upper portion and a lower portion extending substantially perpendicularly to the main surface of buried oxide film 2. Also, the metal contaminant which existed in SOI layer 3 is finally taken into oxide film 23. This can prevent generation of electrically active crystal defect in SOI layer 3.

Figure 65:
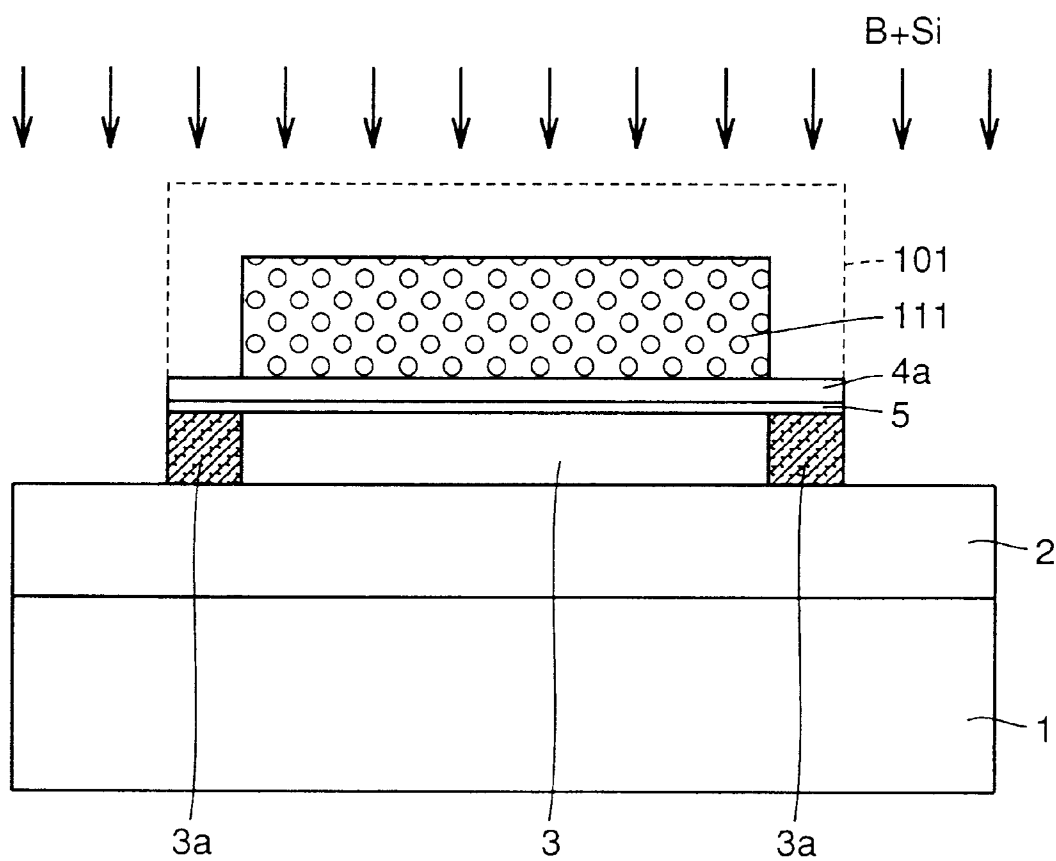
FIGS. 65 to 67 are cross sections showing 1st to 3rd steps in a process of manufacturing a semiconductor device according to a tenth embodiment of the invention, respectively.
Figure 66:
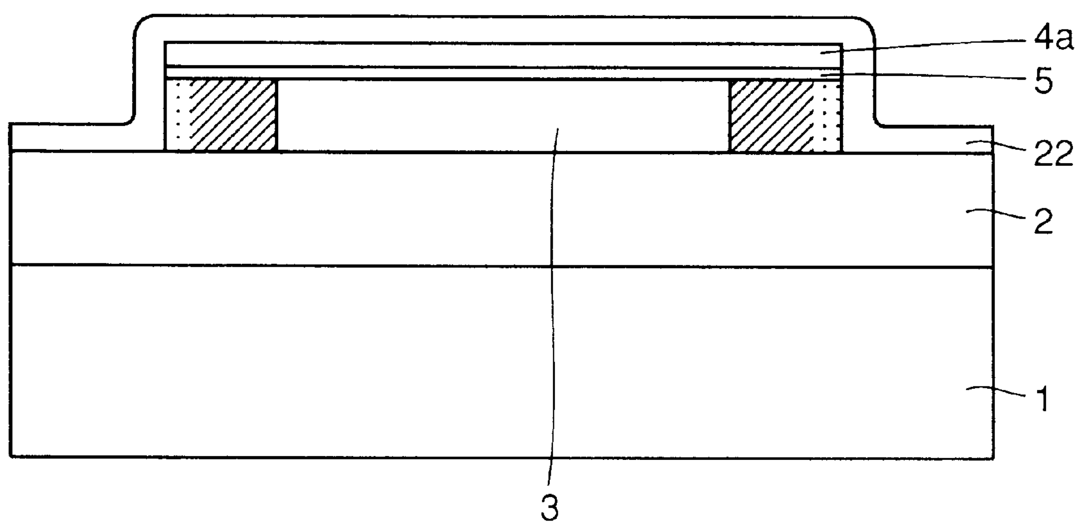

Referring to FIGS. 65 to 67, a process of manufacturing the semiconductor device of the tenth embodiment will be described below. As shown in FIG. 65, buried oxide film 2 is formed on silicon substrate 1. After forming the SOI layer, oxide film and nitride film (all of which are not shown) on buried oxide film 2, a resist 101 is formed at a predetermined region on the nitride film. Using resist 101 as a mask, the nitride film, oxide film and SOI layer are etched to form patterned SOI layer 3, oxide film 5 and nitride film 4a. Oxide film 5 has a thickness of about 100 Å, and nitride film 4a has a thickness of about 1000 Å.

Isotropic etching is effected on resist 101 to etch partially the upper and side surfaces of resist 101 for forming a resist 111. Using resist 111 as a mask, silicon ions are implanted under the conditions of 30–100 kev and $4\times10^{15}$–$6\times10^{15}$/cm$^2$ so as to change the etching-damaged region of the side surface of SOI layer 3 into amorphism. Using resist 111 as a mask, boron ions are implanted to form impurity implanted layers 3a for raising the threshold voltage of parasitic transistor. Thereafter, resist 111 is removed.

As shown in FIG. 66, polycrystalline silicon film 22 of about 50 Å–100 Å in thickness is formed over nitride film 4a, SOI layer 3 and buried oxide film 2, and then is oxidized. Thereby, an oxide film 23 is formed as shown in FIG. 67. In this step of oxidation, heat treatment may be performed for 10–30 minutes under the temperature condition of 700–850° C. Thereafter, oxide film 23, nitride film 4a and oxide film 5 are removed. In this manner, the basic structure of the semiconductor device of the tenth embodiment is completed.

Figure 70:
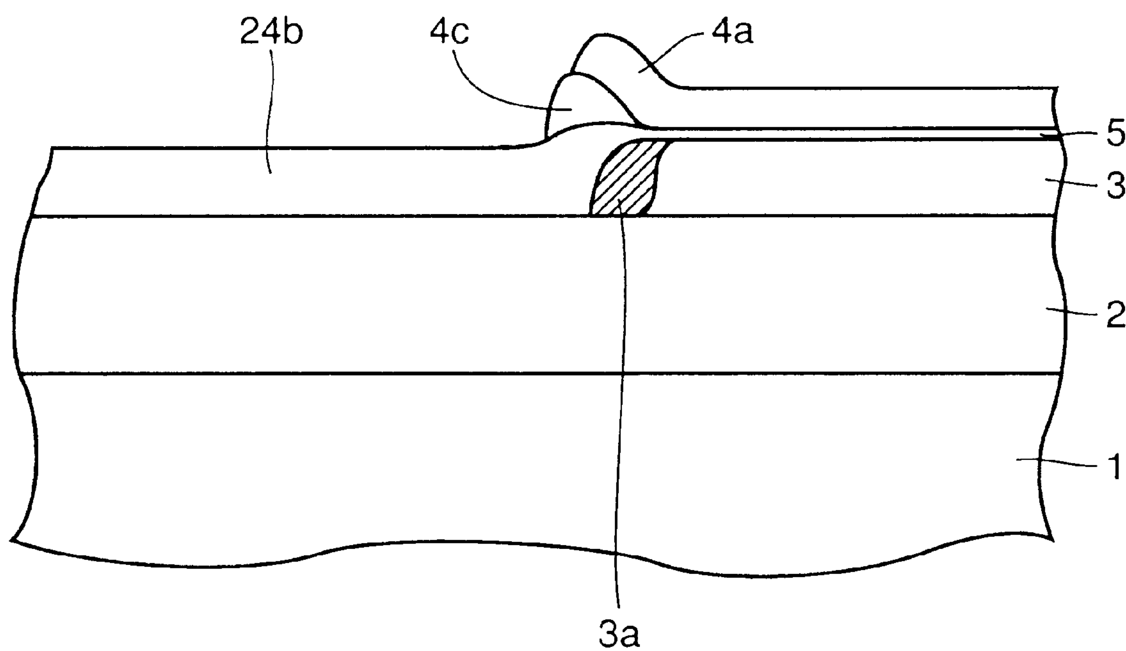

According to an eleventh embodiment shown in FIG. 70, the side surface of SOI layer 3 has a round upper portion and a lower portion substantially perpendicular to buried oxide film 2. Near the side surface of SOI layer 3, there is provided impurity implanted layer 3a for preventing lowering of the threshold voltage of parasitic transistor.

Figure 68:
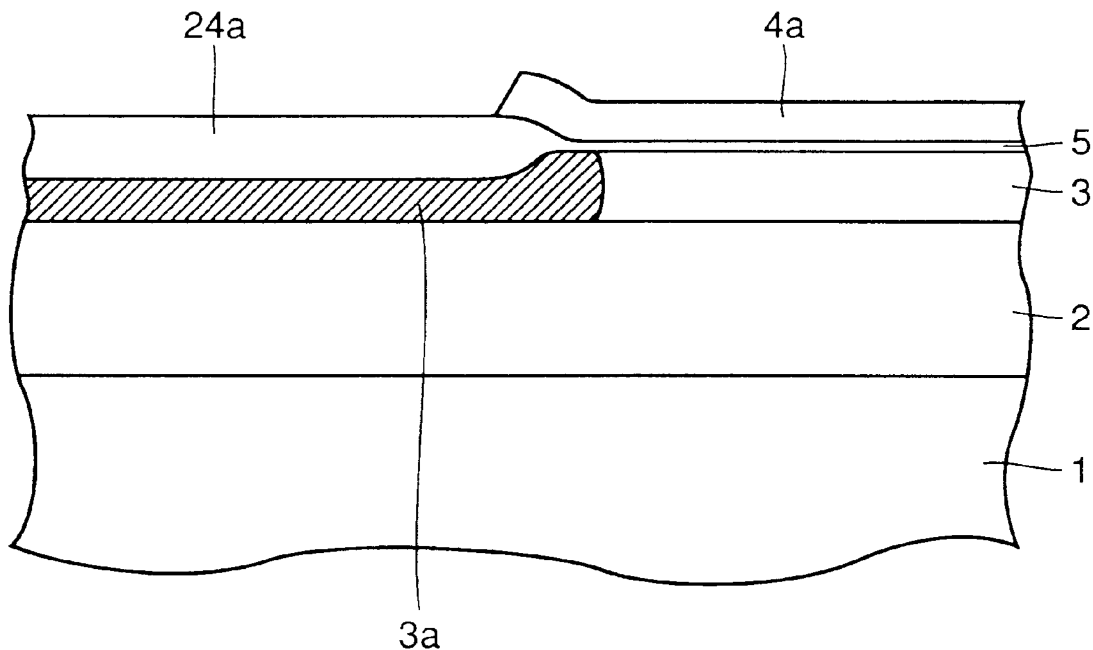
FIGS. 68 to 70 are cross sections showing 1st to 3rd steps in a process of manufacturing a semiconductor device according to an eleventh embodiment of the invention, respectively.
Figure 69:
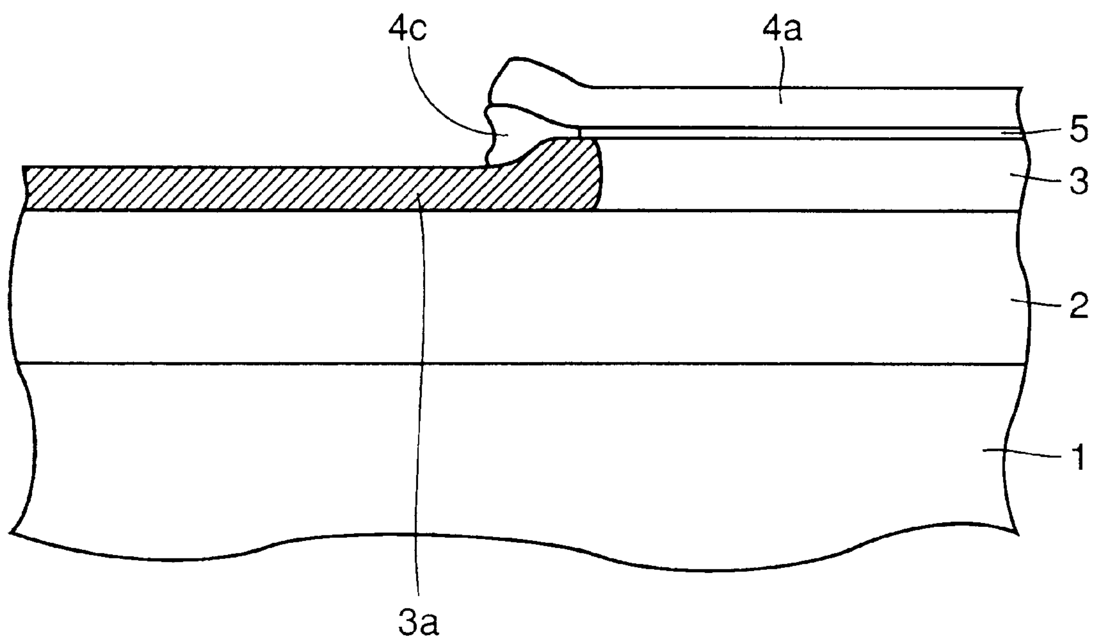

Referring to FIGS. 68 to 70, a process of manufacturing the semiconductor device of the eleventh embodiment will be described below. As shown in FIG. 68, buried oxide film 2 is formed on silicon substrate 1. SOI layer 3, oxide film 5 having a thickness of about 100 Å and nitride film 4a having a thickness of about 1000 Å are successively formed on buried oxide film 2. After forming a resist (not shown) at a predetermined region on nitride film 4a, nitride film 4a is patterned using the resist as a mask.

Using the resist as a mask, boron ions are implanted into SOI layer 3 under the conditions of 20–30 keV and $1\times10^{13}$–$15\times10^{13}$/cm$^2$. Then, the resist is removed. Using nitride film 4*a* as a mask, the portion of SOI layer 3 not covered with nitride film 4*a* is oxidized over about half a thickness. Thereby, an LOCOS oxide film 24*a* is formed. LOCOS oxide film 24*a* is removed by the wet etching, and subsequently a nitride film of about 500 Å in thickness is deposited. Then, anisotropic etching is performed to leave a nitride film 4*c* at an end of nitride film 4*a* as shown in FIG. 69. Thereafter, using nitride films 4*a* and 4*c* as a mask, a portion of SOI layer 3 of the remaining thickness is oxidized. Thereby, an LOCOS film 24*b* is formed as shown in FIG. 70. Owing to formation of LOCOS oxide film 24*b*, the upper side surface of SOI layer 3 is rounded, and the lower side surface extends substantially perpendicularly to the main surface of buried oxide film 2. Thereafter, nitride film 4*a* and oxide film 5 are removed.

In this embodiment, since LOCOS oxide films 24*a* and 24*b* are formed at independent two steps, a length of bird's beak can be reduced as compared with the case where only single step of oxidation is performed. It is also possible to improve perpendicularity of the lower side surface of SOI layer 3 with respect to the main surface of buried oxide film 2. Thereby, it is possible to overcome such a disadvantage that a parasitic transistor is liable to generate due to reduction of the thickness of the lower side portion of SOI layer 3.

Figure 79:
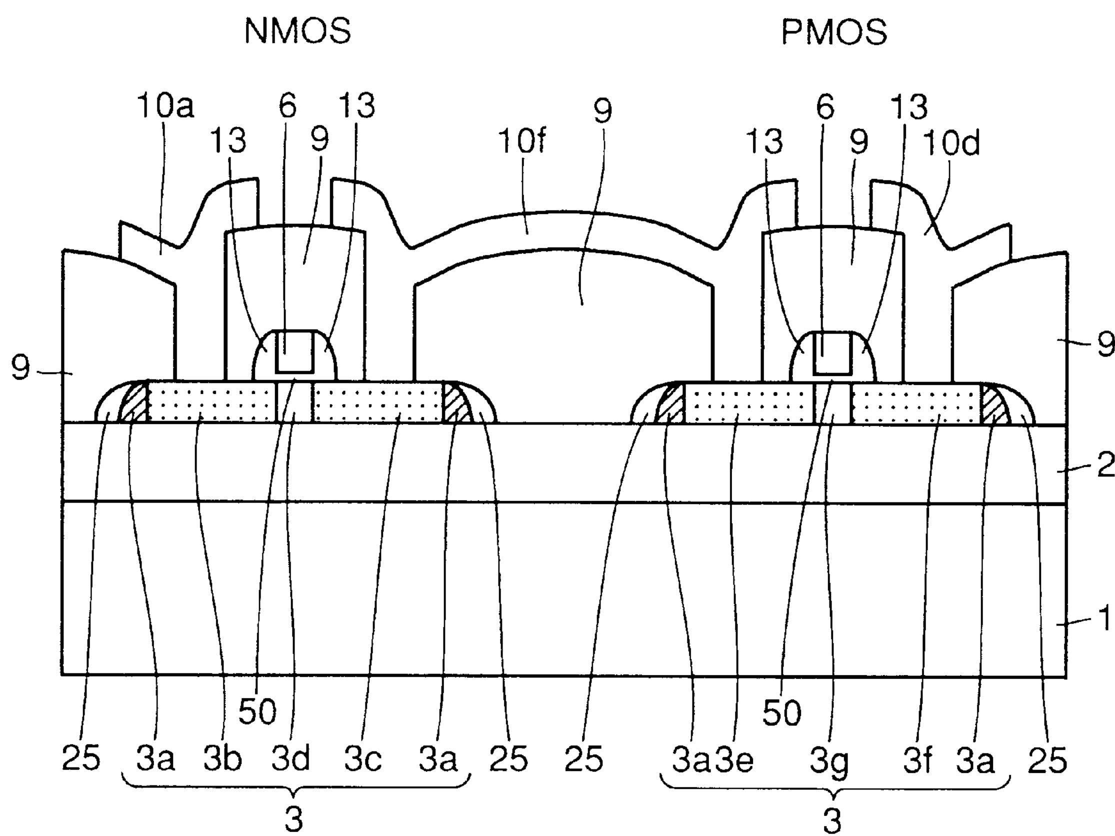

Referring to FIG. 79, a twelfth embodiment includes SOI layers 3 each having round upper side surfaces similarly to first to eleventh embodiments. Also, side wall oxide films 25 are formed in contact with the side surfaces of SOI layers. In this twelfth embodiment, a metal interconnection 10*f* is formed in contact with source/drain regions 3*c* and 3*e*. In the twelfth embodiment, since ion implantation is performed for forming impurity implanted region 3*a* after forming side wall oxide films 25 as will be described later, such a disadvantage is not caused that oxidation for forming side wall oxide films 25 does not lower the impurity concentration of impurity implanted region 3*a*. As a result, lowering of the threshold voltage of parasitic transistor can be effectively prevented.

Figure 71:
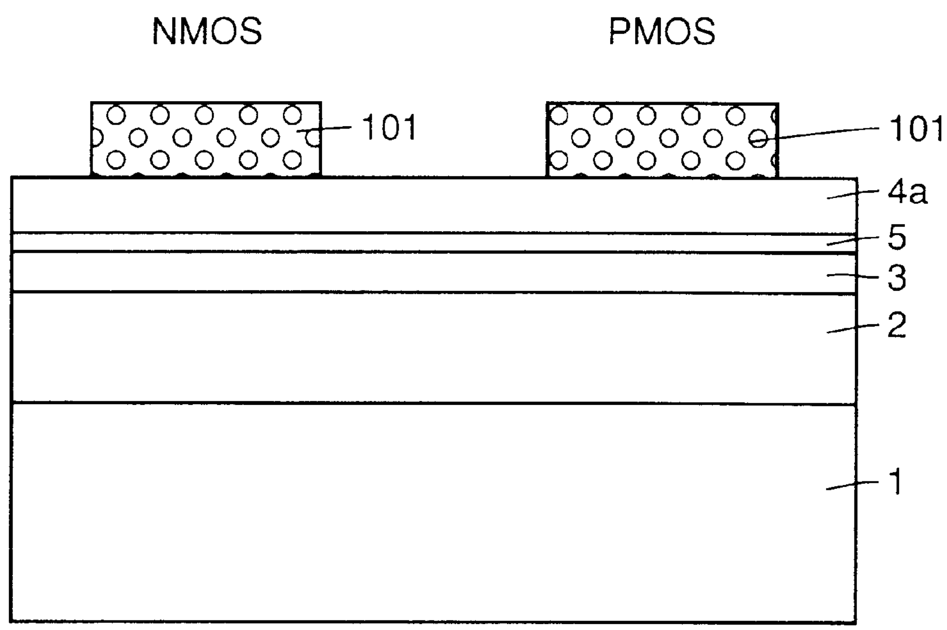
FIGS. 71 to 79 are cross sections showing 1st to 9th steps in a process of manufacturing a semiconductor device according to a twelfth embodiment of the invention, respectively.
Figure 72:
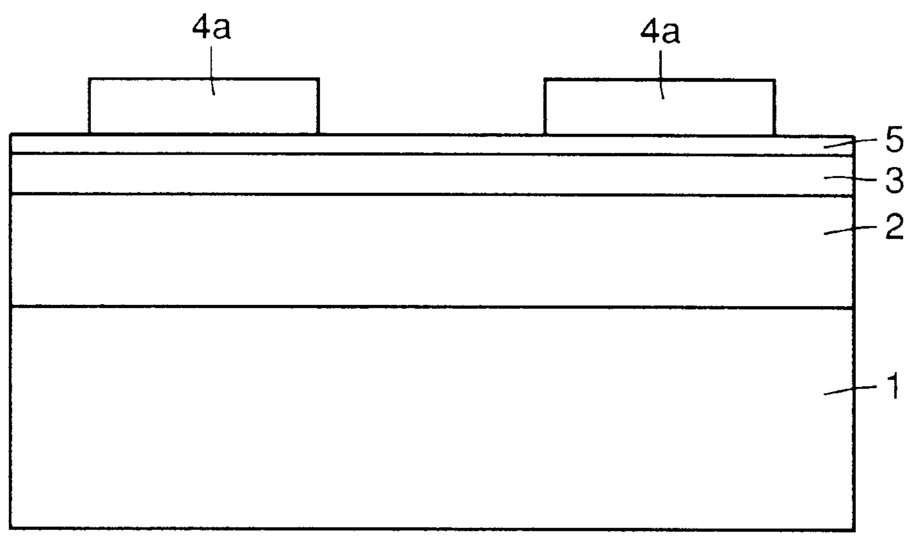

Referring to FIGS. 71–79, a process of manufacturing the semiconductor device of the twelfth embodiment will be described below. As shown in FIG. 71, buried oxide film 2 is formed on silicon substrate 1, and SOI layer 3 is formed on buried oxide film 2. After forming oxide film 5 on SOI layer 3, thick nitride film 4*a* having a thickness of about 2000 Å is formed on oxide film 5. Resist 101 is formed at predetermined regions 101 on nitride film 4*a*. Using resist 101 as a mask, nitride film 4*a* is etched to pattern nitride film 4*a*. Thereby, patterned nitride films 4*a* are completed as shown in FIG. 72.

Figure 73:
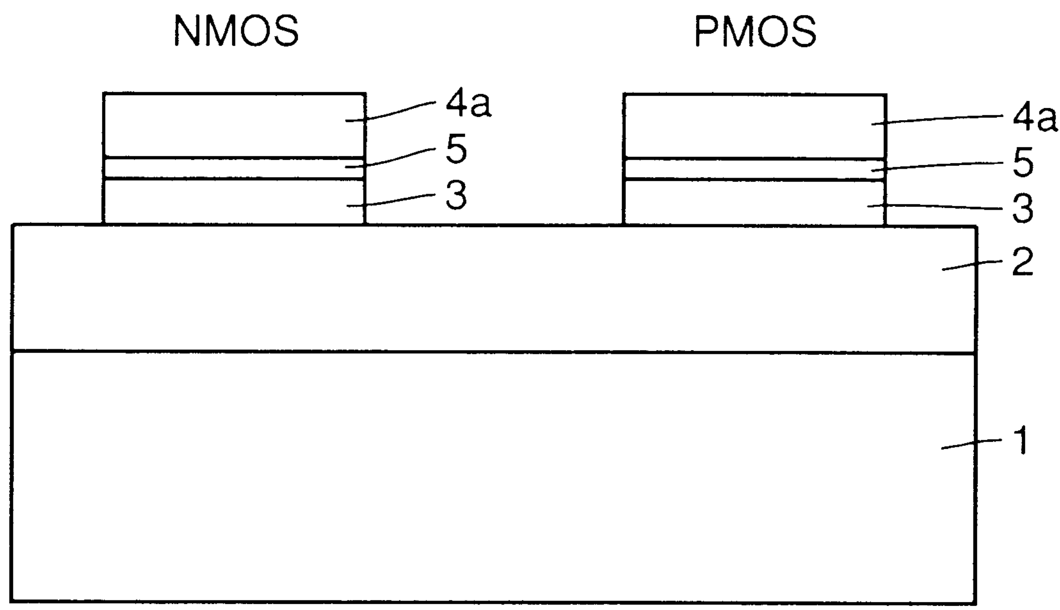
Figure 74:
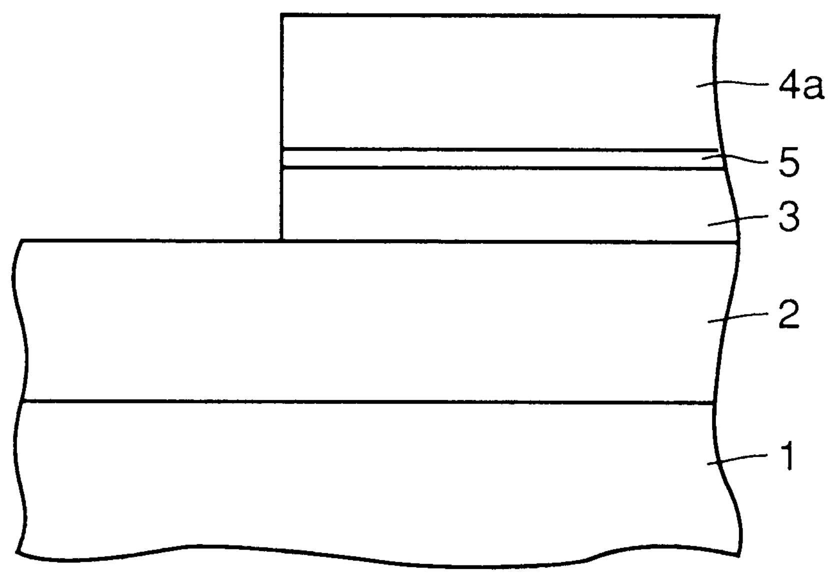
Figure 75:
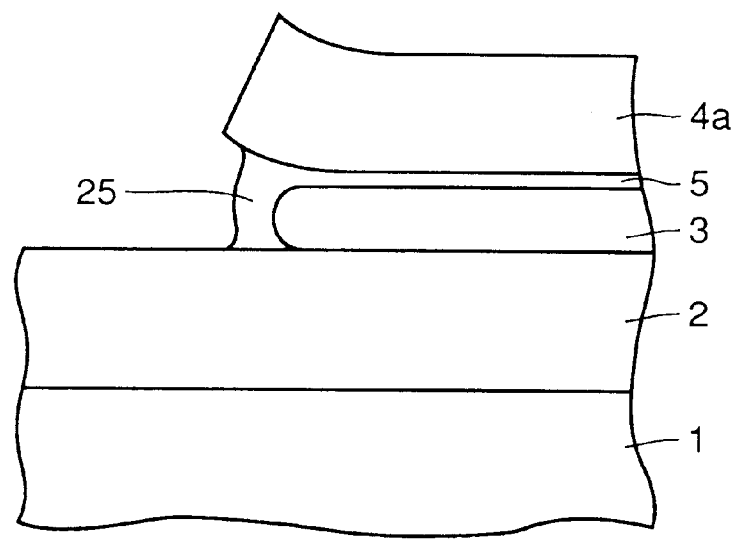

Using nitride films 4*a* as a mask, oxide film 5 and SOI layer 3 are etched. Thereby, patterned SOI layers 3 and oxide films 5 are formed as shown in FIG. 73. FIG. 74 shows, on an enlarged scale, a side wall portion of SOI layer 3. In this state, SOI layer 3 is oxidized as shown in FIG. 75 using nitride film 4*a* as a mask. This oxidation is performed for removing defects at the side surface of SOI layer 3, which are caused by the etching, and suppressing concentration of the electric field at the upper side portion of SOI layer 3. This oxidation forms side a wall oxide film 25.

Figure 76:
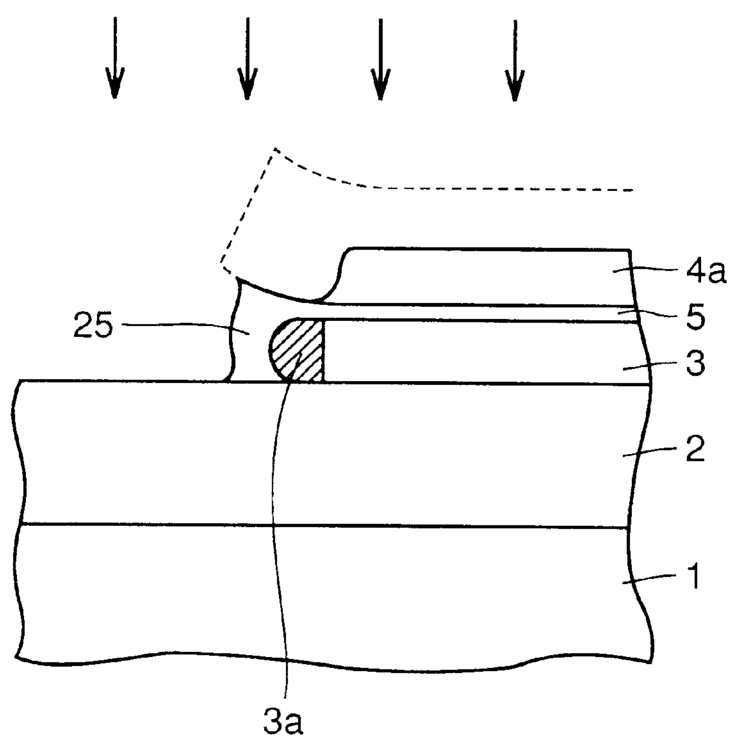
Figure 77:
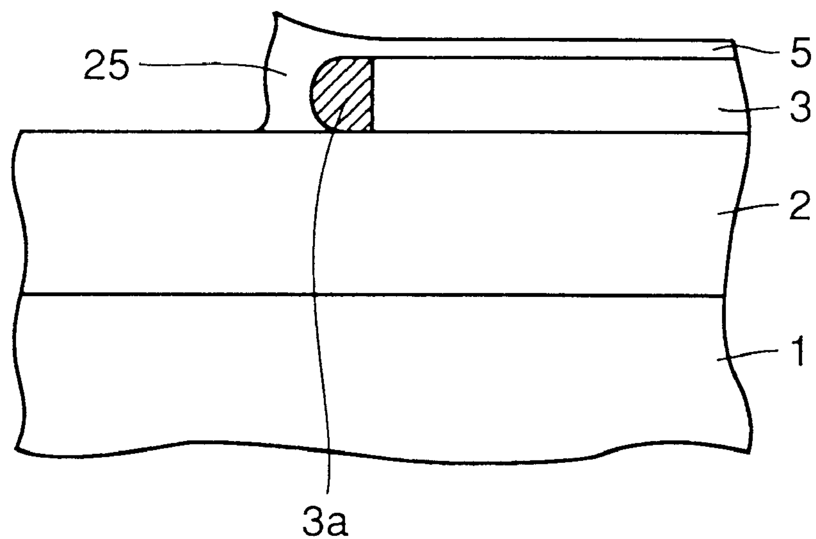
Figure 78:
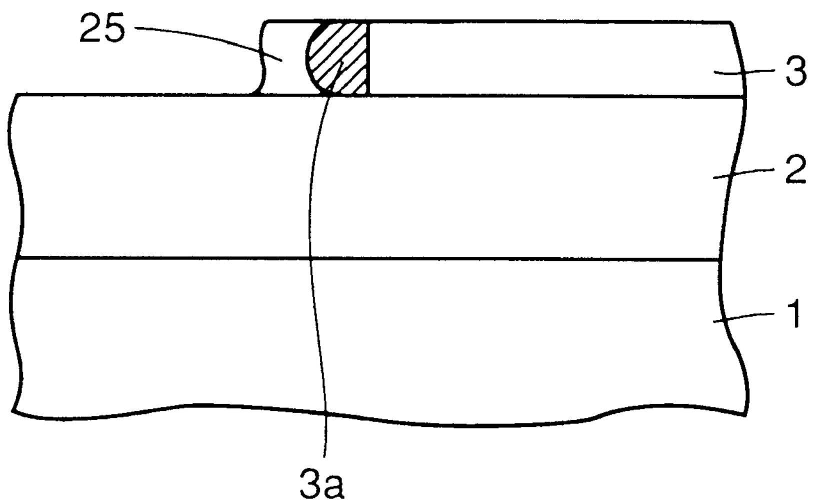

Thereafter, nitride film 4*a* is isotropically etched by the wet etching with thermo-phosphoric acid as shown in FIG. 76. Thereby, nitride film 4*a* located near the side surface of SOI layer 3 is removed as shown in FIG. 76. Using nitride film 4*a* as a mask, P-type impurity is ion-implanted into the portion near the side surface of SOI layer 3 using nitride film 4*a* as a mask. This forms impurity implanted region 3*a* of a high concentration for raising the threshold voltage of parasitic transistor. Thereafter, nitride film 4*a* is removed so that the structure shown in FIG. 77 is obtained. Anisotropic etching is performed for removing oxide film 5. Thereby, oxide film 5 is removed, and the upper portion of side surface of side wall oxide film 25 is rounded. Thereafter, the structure shown in FIG. 79 is completed by a process similar to the process of manufacturing the semiconductor device of the first embodiment shown in FIGS. 12 to 23.

Figure 87:
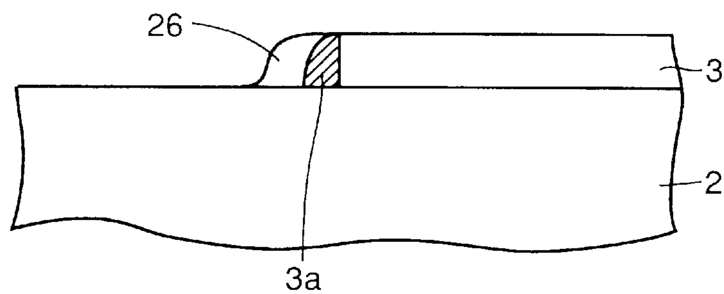

In a structure of a thirteenth embodiment shown in FIG. 87, the side surface of SOI layer 3 likewise has a round upper portion and a lower portion substantially perpendicular to the main surface of buried oxide film 2. Thereby, it is possible to prevent concentration of the electric field at the upper side portion of SOI layer 3. Also, it is possible to prevent such a disadvantage that a parasitic transistor is liable to generate due to reduction of the thickness at the lower side portion of SOI layer 3.

Figure 80:
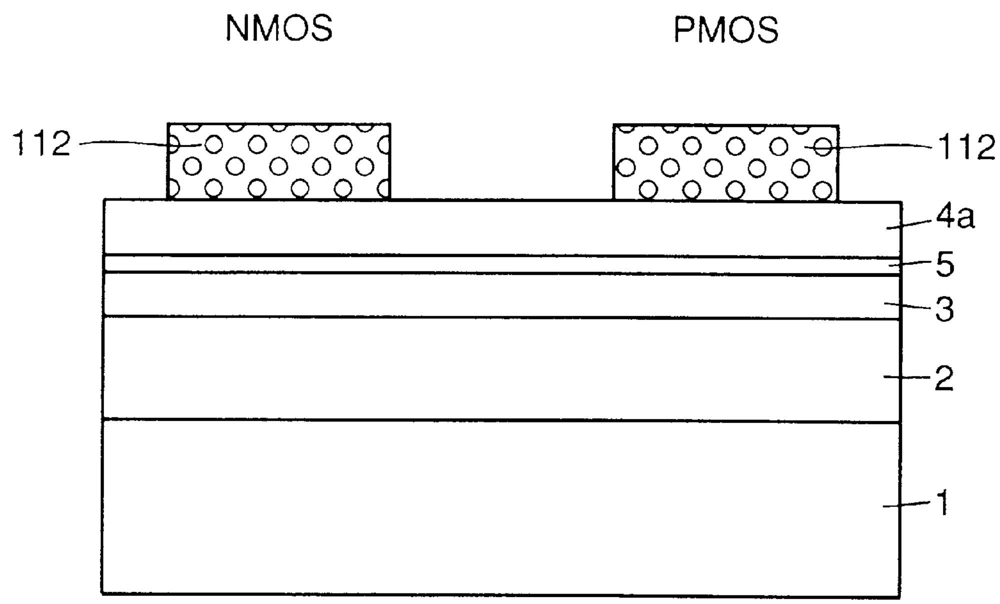
FIGS. 80 to 87 are cross sections showing 1st to 8th steps in a process of manufacturing a semiconductor device according to thirteenth embodiment of the invention, respectively.
Figure 81:
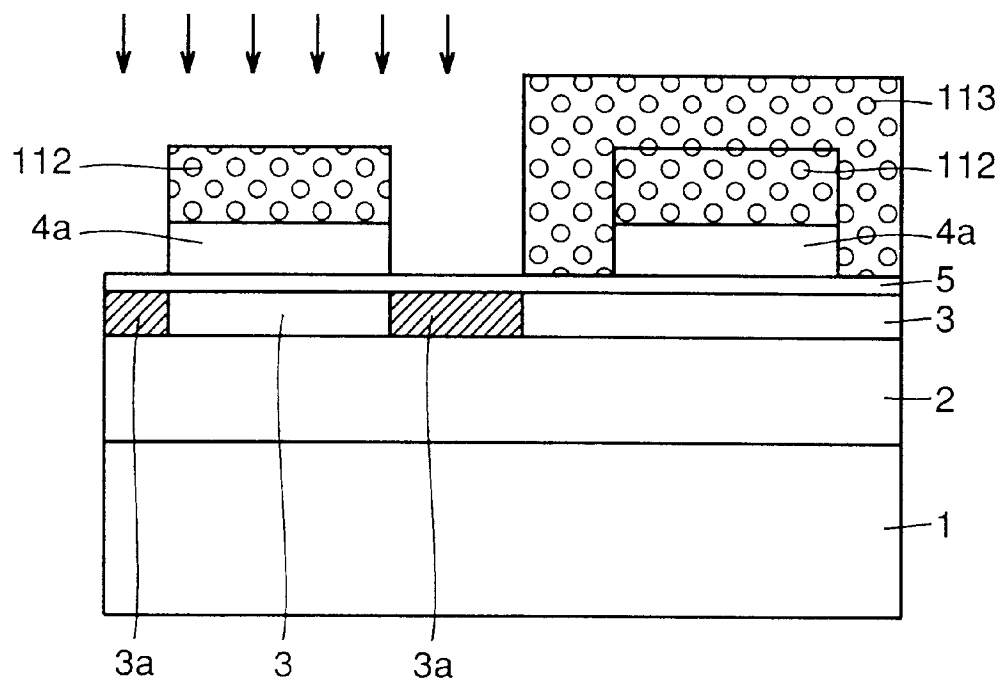

Referring to FIGS. 80 to 91, a process of manufacturing a semiconductor device of a thirteenth embodiment will be described below. As shown in FIG. 80, buried oxide film 2 is formed on silicon substrate 1, and SOI layer 3 is formed on buried oxide film 2. Oxide film 5 is formed on SOI layer 3, and nitride film 4*a* is formed on oxide film 5. A resist 112 is formed at predetermined regions on nitride film 4*a*, and then a nitride film 4*a* is etched using resist 112 as a mask. Thereby, patterned nitride films 4*a* are formed as shown in FIG. 81. Thereafter, a resist 113 is formed over the PMOS region. Using resists 113 and 112 as a mask, P-type impurity is ion-implanted into a portion of SOI layer 3 located at the NMOS region. Thereby, impurity implanted regions 3*a* for raising the threshold voltage of parasitic transistor is formed.

Figure 82:
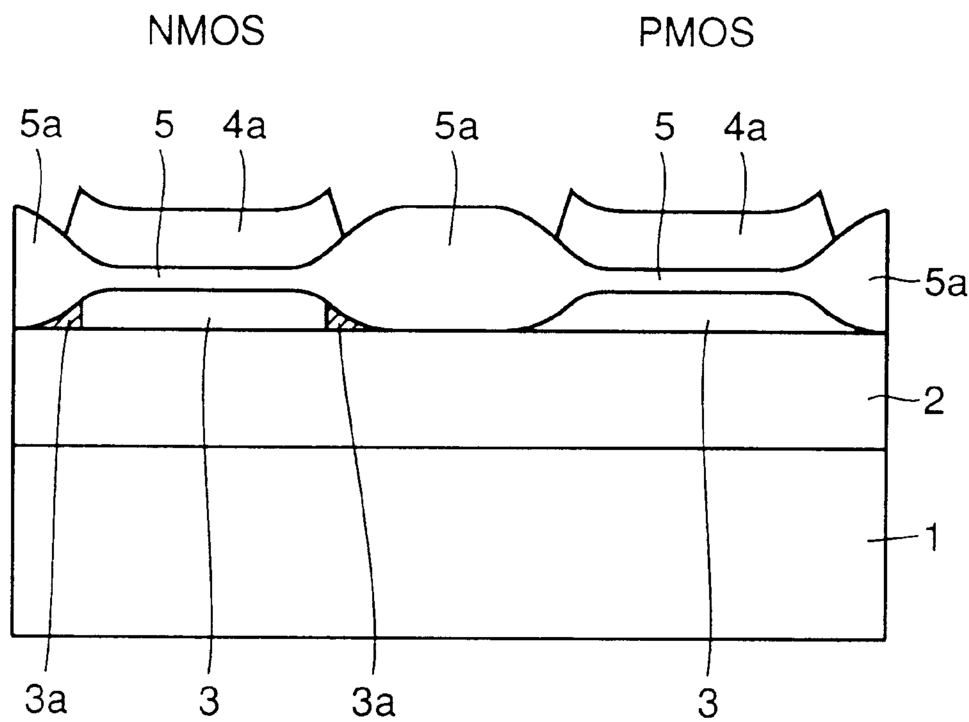
Figure 83:
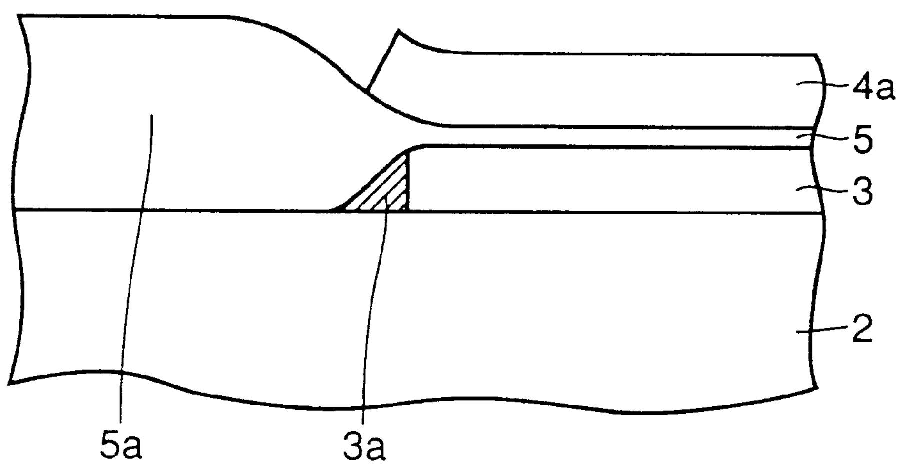
Figure 84:
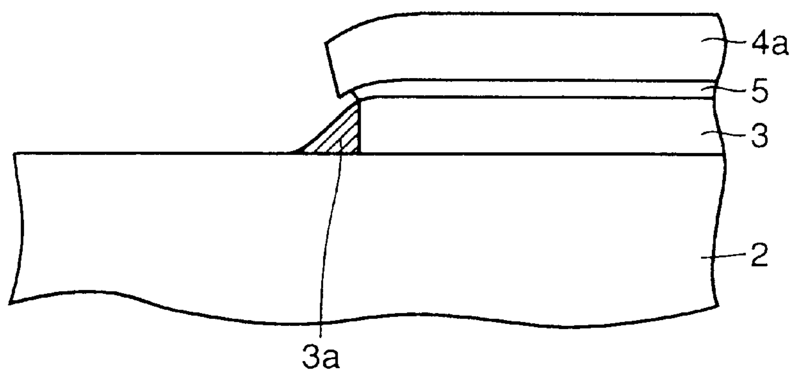
Figure 85:
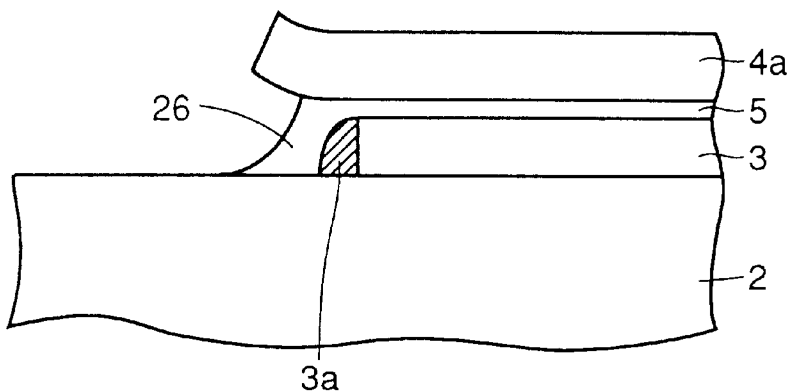

Thereafter, resists 112 and 113 are removed. Using nitride film 4*a* as a mask, SOI layer 3 is oxidized by the LOCOS method. Thereby, LOCOS oxide films 5*a* are formed as shown in FIG. 82. FIG. 83 shows, on an enlarged scale, a portion near the side surface of SOI layer 3. In this state, LOCOS oxide film 5*a* is removed by the wet etching. Thereby, a form shown in FIG. 84 is obtained. Oxidation is effected on a side portion of SOI layer 3 which is exposed by the etching effected on LOCOS oxide film 5*a*. This oxidation changes the acute form of the region near the side surface of SOI layer 3 into a round form as shown in FIG. 85. This oxidation forms an oxide film 26.

Figure 86:
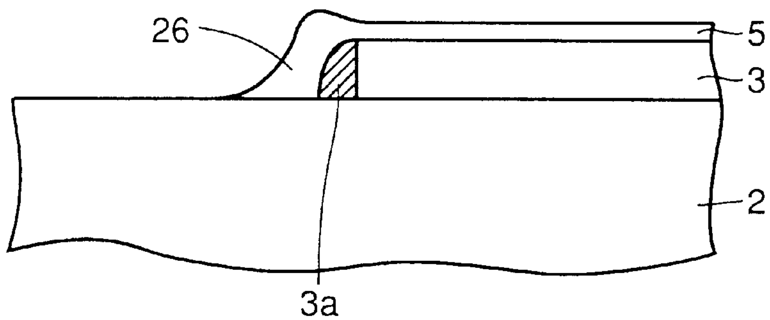

Thereafter, nitride film 4*a* is removed to obtain the structure shown in FIG. 86. Oxide films 5 and 26 are anisotropically etched to remove oxide film 5. This etching substantially flattens the top of oxide film 26 as shown in FIG. 87. Thereafter, a process similar to the process of manufacturing the semiconductor device of the first embodiment shown in FIGS. 12 to 23 is performed to complete the semiconductor device of the thirteenth embodiment.

Figure 88:
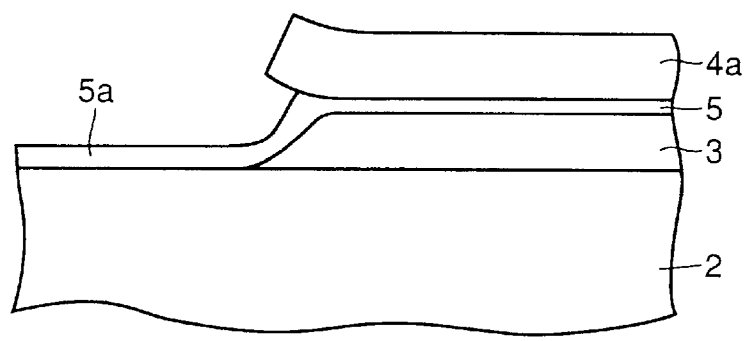
FIG. 88 is a cross section showing a case where etching was not performed sufficiently in a step of removing an LOCOS oxide film shown in FIG. 87.
Figure 89:
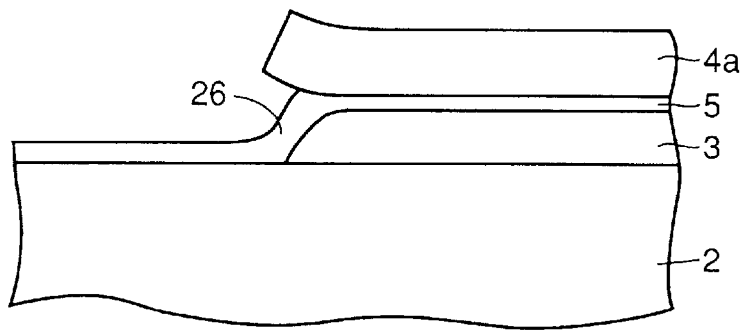
FIG. 89 is a cross section showing a structure where oxidation is performed on the structure shown in FIG. 88.
Figure 90:
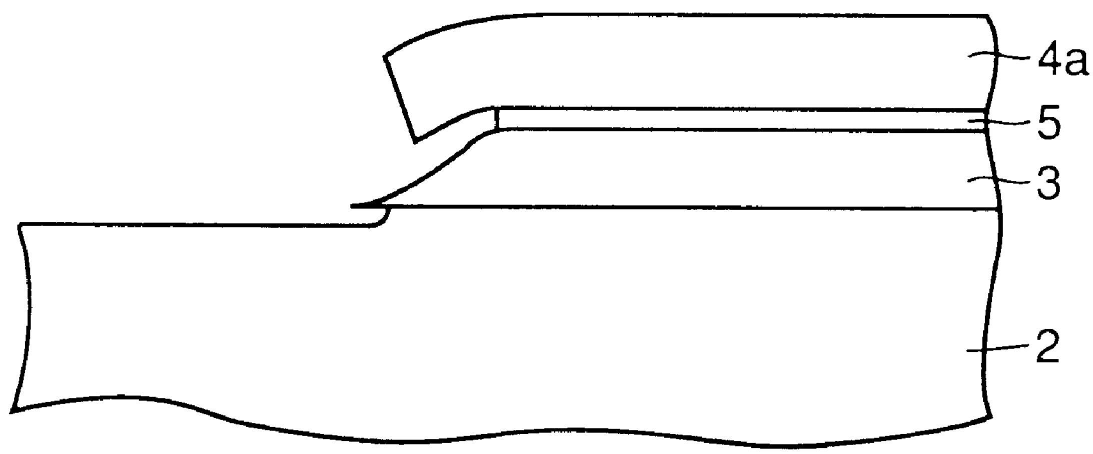
FIG. 90 is a cross section showing a case where over-etching was performed at the step of removing an LOCOS oxide film shown in FIG. 84.
Figure 91:
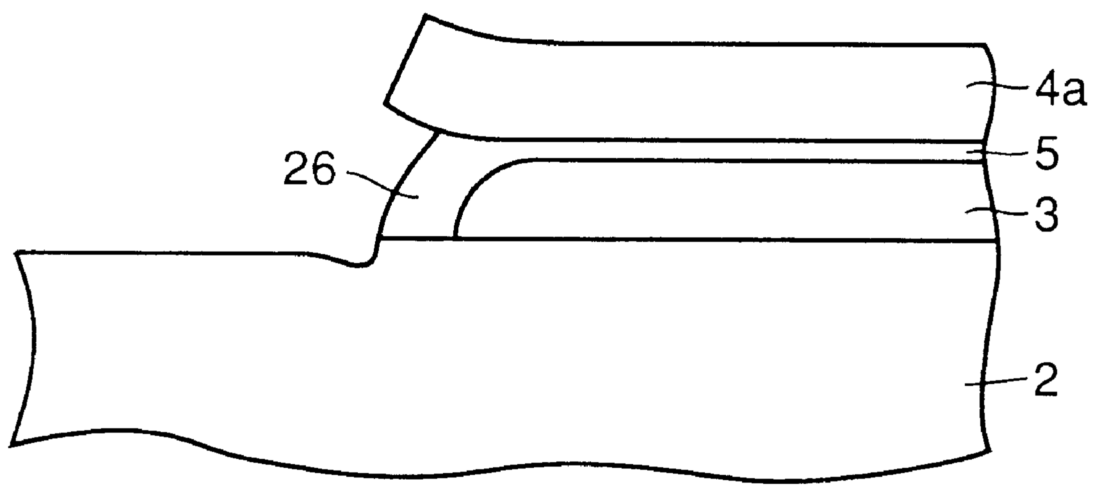
FIG. 91 is a cross section showing a structure where oxidation is performed on the structure shown in FIG. 90.

In the step of etching LOCOS oxide film 5*a* shown in FIGS. 83 and 84, if the etching is not performed sufficiently, the structure shown in FIG. 88 is formed. Even in this case, however, SOI layer 3 which is oxidized using nitride film 4*a* as a mask can have the rounded side portion as shown in FIG. 89. Therefore, no problem arise from insufficient etching of LOCOS oxide film 5*a*. If LOCOS oxide film 5*a* is over-etched, a structure shown in FIG. 90 is formed. Even in this case, oxidation of SOI layer 3 can provide SOI layer 3 having a round form as shown in FIG. 91. Therefore, over-etching of LOCOS oxide film 5*a* does not cause a problem.

Figure 92:
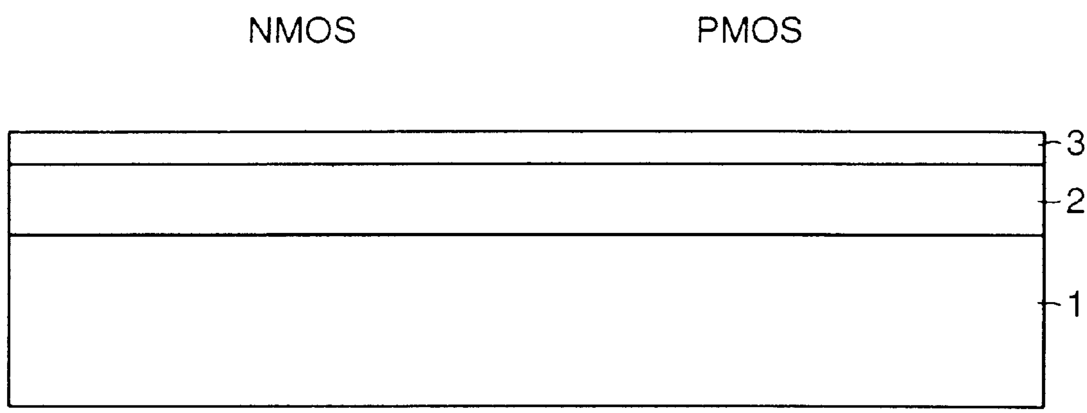
FIGS. 92 to 98 are cross sections showing 1st to 7th steps in a process of manufacturing a semiconductor device according to a fourteenth embodiment of the invention, respectively.

Referring to FIGS. 92 to 98, a process of manufacturing a semiconductor device of a fourteenth embodiment will be described below. Referring to FIG. 92, buried oxide film 2 is formed on silicon substrate 1. SOI layer 3 is formed on buried oxide film 2. Silicon substrate 1, buried oxide film 2 and SOI layer 3 form the SOI substrate. The SOI substrate is formed by a method such as the SIMOX method or the wafer bonding method.

Figure 93:
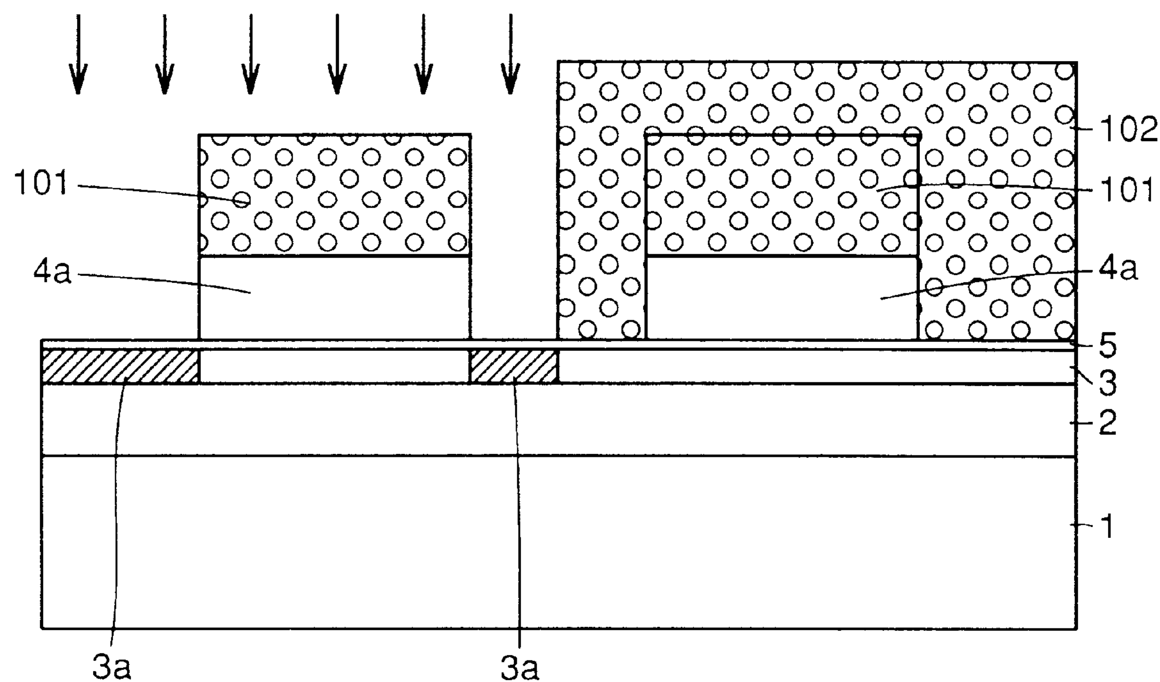

As shown in FIG. 93, the CVD method is performed under the temperature condition of 800° C. to form oxide film 5 on SOI layer 3. Oxide film 5 may be formed by oxidizing the surface of SOI layer 3 under the temperature condition of about 800° C. Oxide film 5 thus formed has a thickness of about 100 Å. A nitride film (not shown) is formed on oxide film 5 under the temperature condition of about 700 Å, and then resist 101 is formed at predetermined regions on the nitride film. Using resist 101 as a mask, dry etching is effected on the nitride film to form nitride films 4*a* of a predetermined configuration. Resist 102 is formed over the PMOS region. Using resists 101 and 102 as a mask, boron ions are implanted into the NMOS region under the conditions of 20 keV and $3\times10^{13}$–$8\times10^{13}$/cm$^2$. This implantation is the channel implantation into the isolation region. Thereafter, resists 101 and 102 are removed.

Figure 94:
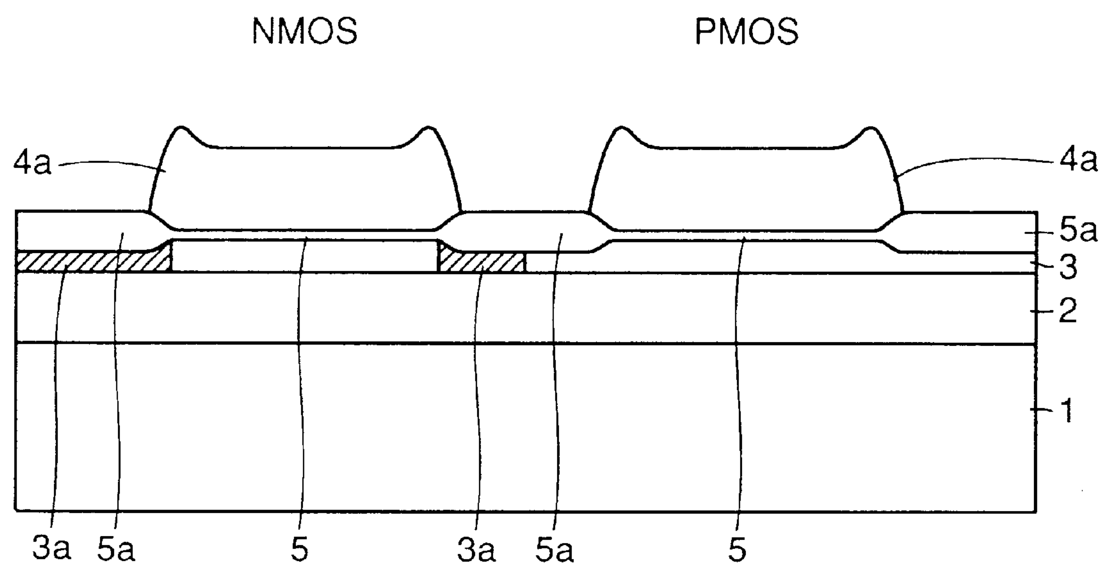

As shown in FIG. 94, SOI layer 3 is oxidized by the LOCOS method using nitride films 4*a* as a mask, so that LOCOS oxide films 5*a* are formed. Using nitride films 4*a* as a mask, dry etching is effected on predetermined portions of LOCOS oxide film 5*a* to remove them.

Figure 95:
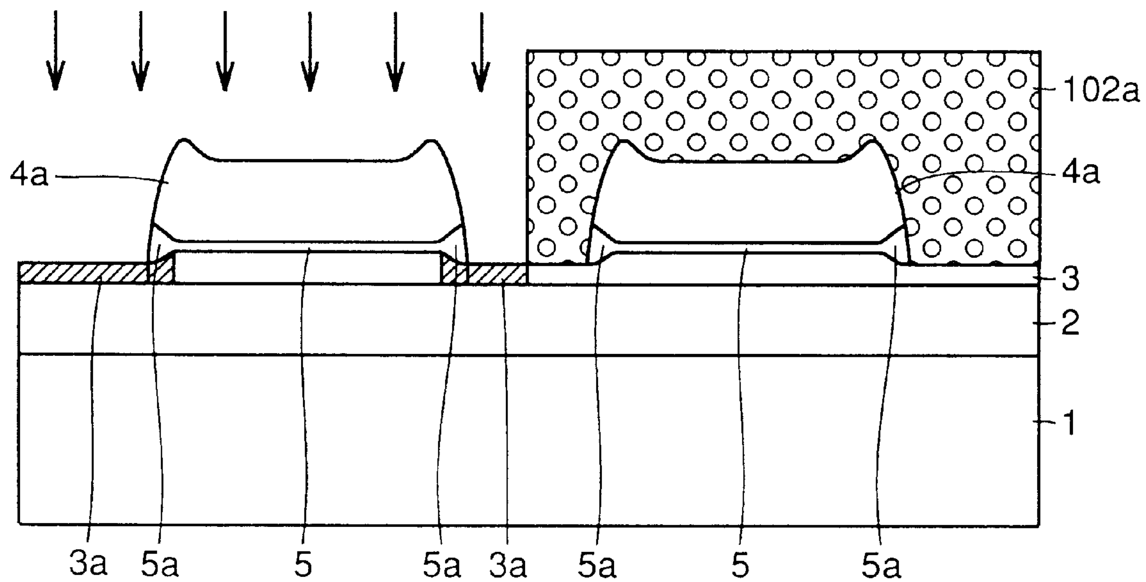

Referring to FIG. 95, resist 102*a* is formed again over the PMOS region. Using resist 102*a* as a mask, boron ions are implanted into the NMOS region under the conditions of 20 keV and $3\times10^{13}$–$8\times10^{13}$/cm$^2$. This implantation is the channel implantation into the isolation region. Since the same implantation as this was already performed once in the step shown in FIG. 93, this implantation is not essential. Implantation of boron ions may be performed at either or both of the steps shown in FIGS. 93 and 95. Thereafter, resist 102*a* is removed.

Figure 96:
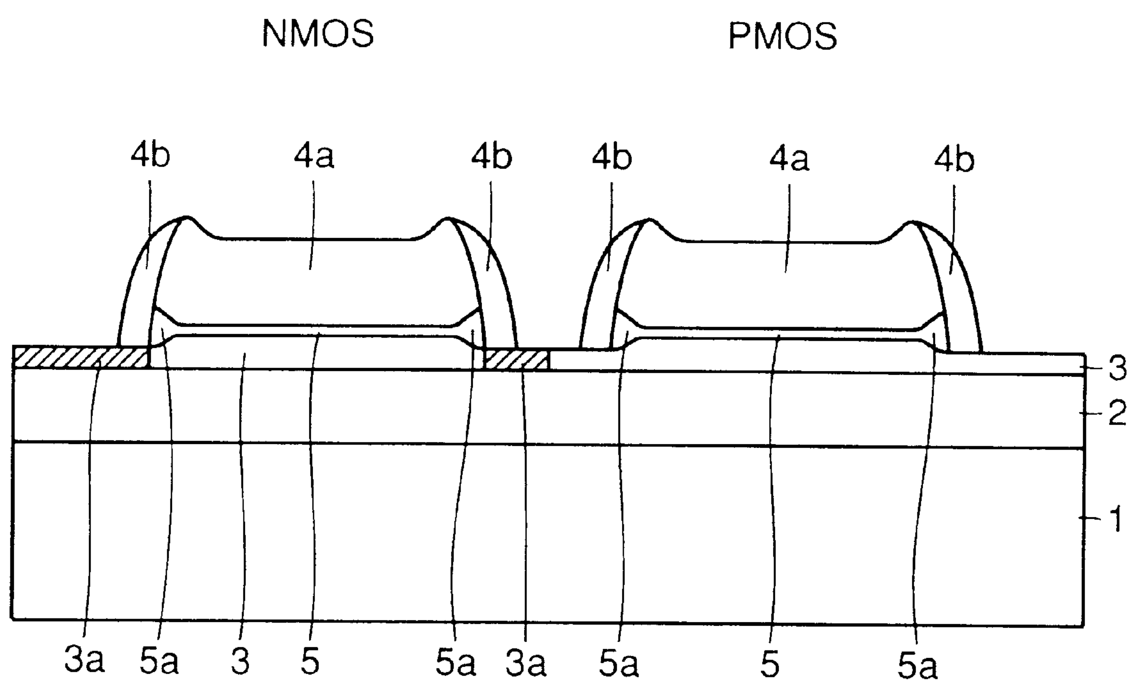
Figure 97:
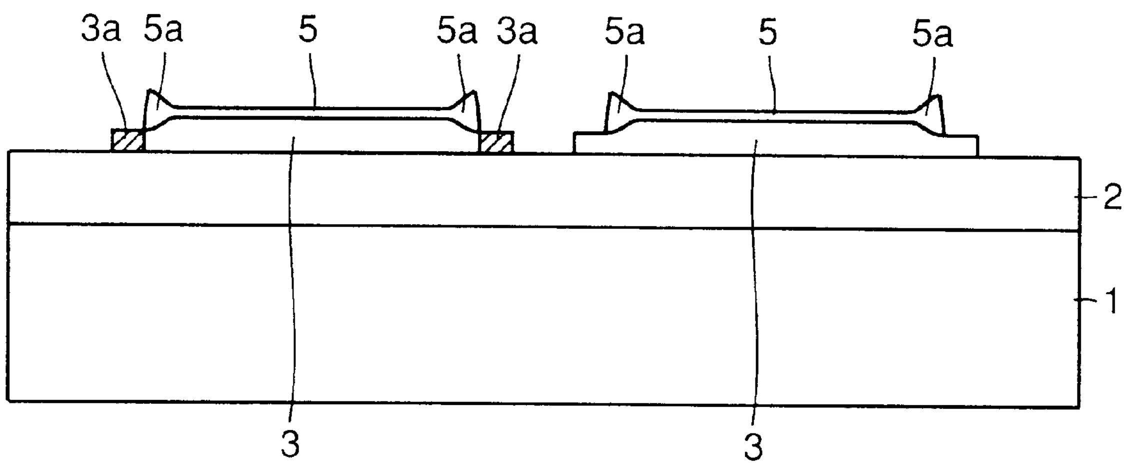
Figure 98:
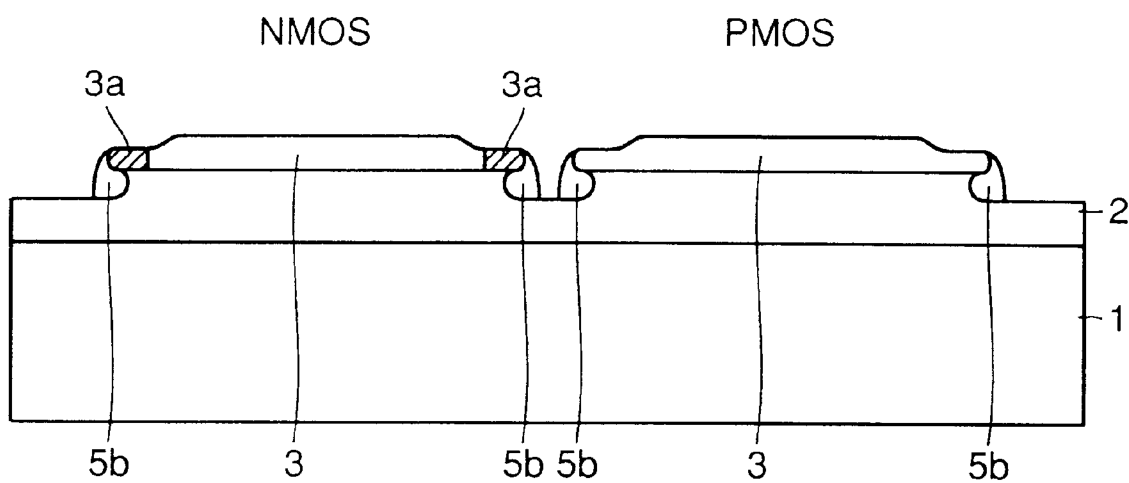
Figure 99:
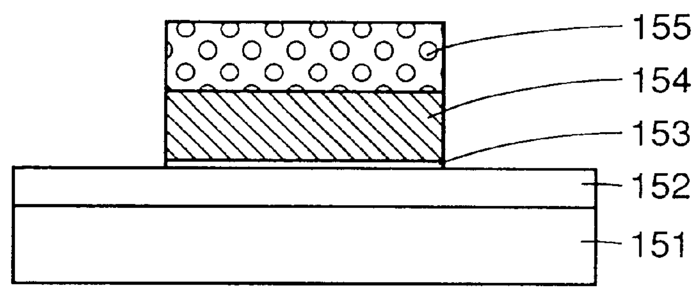
FIGS. 99 to 105 are cross sections showing 1st to 7th steps in a process of manufacturing a semiconductor device according to a fifteenth embodiment of the invention, respectively.

As shown in FIG. 96, side wall nitride films 4*b* are formed in a self-aligned manner on the side surfaces of nitride films 4*a* and remaining LOCOS oxide films 5*a*. Side wall nitride film 4*b* thus formed has a lower end, of which length along the main surface of buried oxide film 2 is substantially in a range from 100 Å to 2000 Å. Thereafter, using side wall nitride films 4*b* as a mask, SOI layer 3 is anisotropically etched. This forms, in a self-aligned manner, isolated or insular SOI layers 3 having side walls into which boron ions are implanted at a high concentration. Thereafter, nitride films 4*a* and 4*b* are removed by thermo-phosphoric acid. Thereafter, SOI layers 3 are oxidized over a thickness from about 100 Å to about 300 Å in the wet atmosphere under the temperature condition of 950° C.–1000° C. Thereby, both the upper and lower portions of each side end of SOI layer 3 are rounded. These round forms can advantageously prevent concentration of the gate electric field in the transistor which will be completed later. In the step shown in FIG. 94, the LOCOS oxide film is formed, whereby the upper portion of each side surface of SOI layer 3 is rounded. This likewise prevent concentration of the gate electric field. Owing to patterning of the SOI layer using side wall nitride films 4*b* as a mask, SOI layer 3 can be formed to have a size larger than the design size by a value corresponding to the width of side wall nitride film. Thereby, oxidation of the side surfaces of SOI layer 3 does not reduce an effective channel width.

After the oxidation of SOI layers 3, the oxide films are removed by the wet etching. This etching removes buried oxide film 2 to some extent and thus forms a concavity. Side wall oxide films 5*b* which partially fill the concavity are formed in contact with side surfaces of SOI layers 3. Thereafter, the semiconductor device of the fourteenth embodiment is completed after the steps such as channel doping at SOI layers 3 and formation of the gate electrodes.

In a fifteenth embodiment shown in FIGS. 99 to 105, a mask for patterning an SOI layer 152 having a mesa isolating structure has a two-layer structure formed of a nitride film 154 and a side wall nitride film 158 as well as oxide films 153 and 156. Oxide films 153 and 156 can prevent removal of the top surface of SOI layer 152 by thermo-phosphoric acid when removing nitride film 154 and side wall nitride film 158 by the thermo-phosphoric acid after patterning of SOI layer 152.

Figure 100:
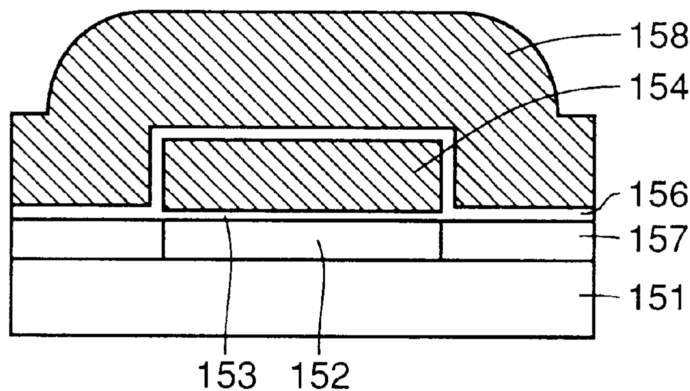
Figure 101:
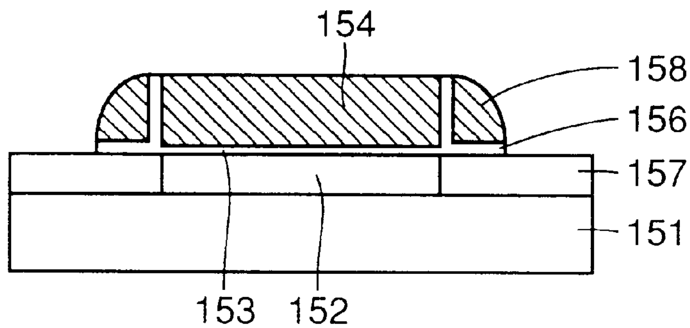
Figure 102:
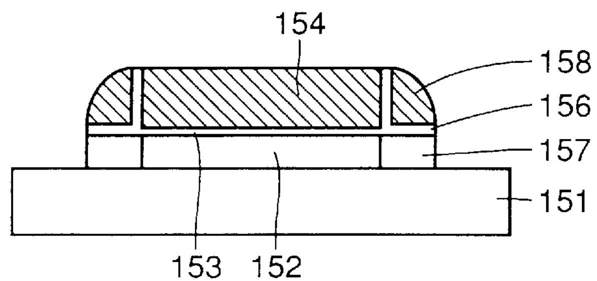

Referring to FIGS. 99 to 105, a process of manufacturing the semiconductor device of this fifteenth embodiment will be specifically described below. SOI layer 152 having a thickness of about 1000 Å is formed on a support substrate 151 made of a silicon oxide film by the SIMOX method. After forming a silicon oxide film and a silicon nitride film (not shown) on SOI layer 152, a photoresist 155 is formed at a predetermined region on the silicon nitride film. Using photoresist 155 as a mask, the nitride film and oxide film are patterned to form silicon nitride film 154 and silicon oxide film 153 having a predetermined configuration. Using photoresist 155 or silicon nitride film 154 as a mask, element isolating implantation is effected on SOI layer 152 to form an isolation region 157. Generally, this implantation is performed by implanting boron ions with the conditions of 20 keV and about $1\times10^{13}$/cm$^2$. Thereafter, photoresist 155 is removed. As shown in FIG. 100, the CVD method is performed to form silicon oxide film 156 having a thickness of about 300 Å. Further, the CVD method is performed to form silicon nitride film 158 having a thickness of about 2000 Å. Silicon nitride film 158 is anisotropically etched to form on the side surfaces of silicon nitride film 154 the side wall spacers formed of composite films including silicon oxide films 156 and silicon nitride films 158. Using silicon nitride film 154 and the side wall spacers as a mask, SOI layer 152 is anisotropically etched to form isolated SOI layer 152 having isolation regions 157 at its side ends as shown in FIG. 102.

Figure 103:
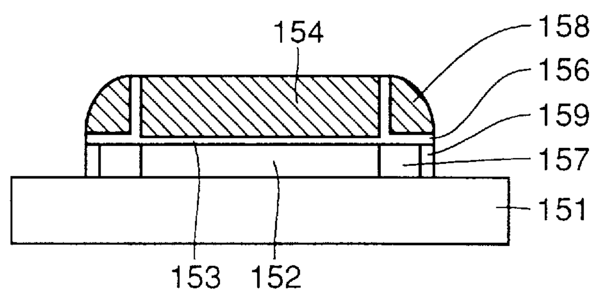
Figure 104:
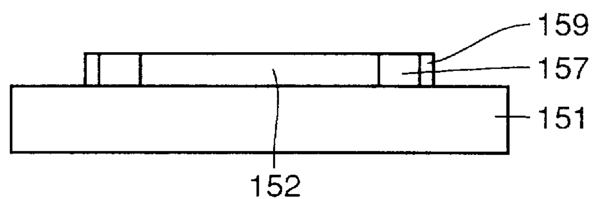

Thereafter, using silicon nitride film 154 and the side wall spacers as a mask, etching-damaged layers at the side ends of isolation regions 157 are oxidized. Thereby, oxide films 159 are formed as shown in FIG. 103. Thereafter, silicon nitride film 154 and side wall nitride films 158 are removed with thermo-phosphoric acid. Thereafter, oxide films 153 and 156 are removed with hydrofluoric acid. Thereby, the structure shown in FIG. 104 is formed.

Figure 105:
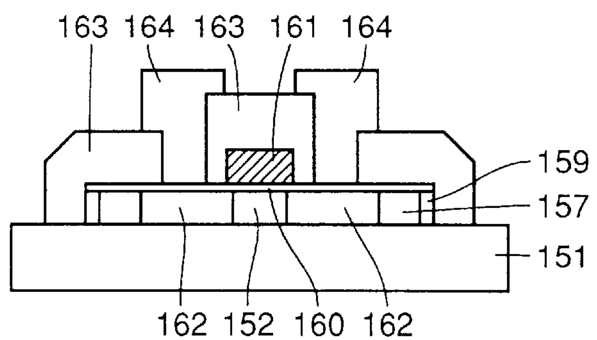

As shown in FIG. 105, after forming a gate oxide film 160 having a thickness of about 100 Å and a gate electrode 161 having a thickness of about 1500 Å, ion implantation is performed with the impurity concentration of $4\times10^{15}$/cm$^2$ using gate electrode 161 as a mask, so that source/drain regions 162 are formed. After forming interlayer insulating film 163 covering gate electrode 161 and gate oxide film 160, contact holes are formed at predetermined regions in interlayer insulating film 163. Interconnection layers 164 of a low resistance made of, e.g., aluminum are formed. Interconnection layers 164 have portions located in the contact holes and electrically connected to source/drain regions 162. In this manner, the SOI-MOSFET of the fifth embodiment is obtained.

A manufacturing process of sixteenth embodiment will be described below with reference to FIGS. 106 to 111.

Figure 106:
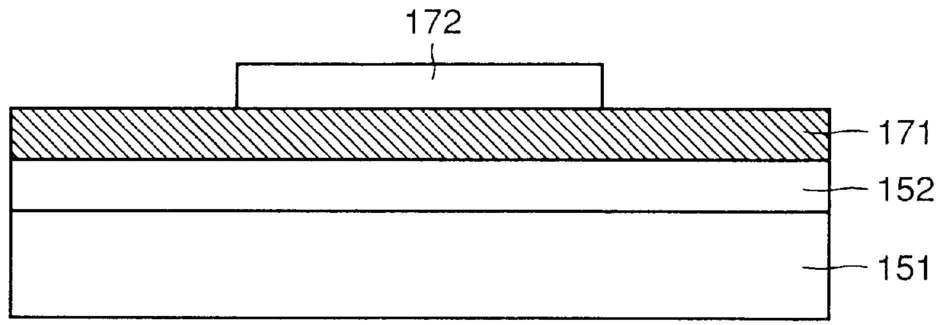
FIGS. 106 to 111 are cross sections showing 1st to 6th steps in a process of manufacturing a semiconductor device according to a sixteenth embodiment of the invention, respectively.
Figure 107:
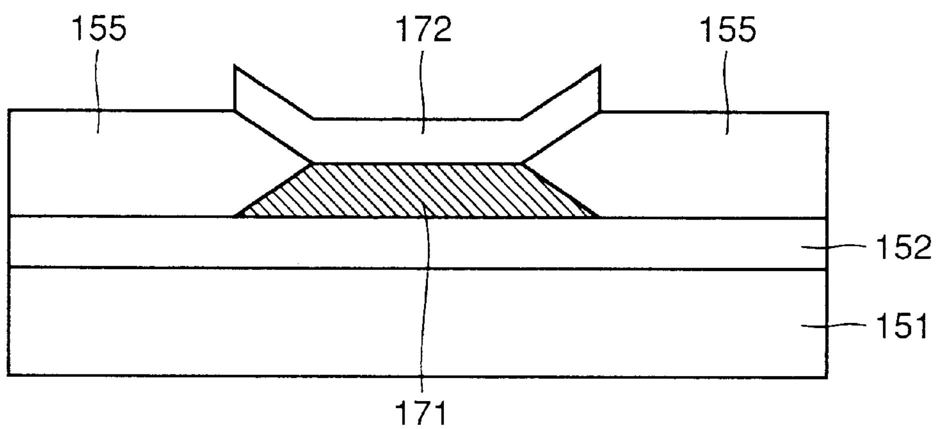
Figure 108:
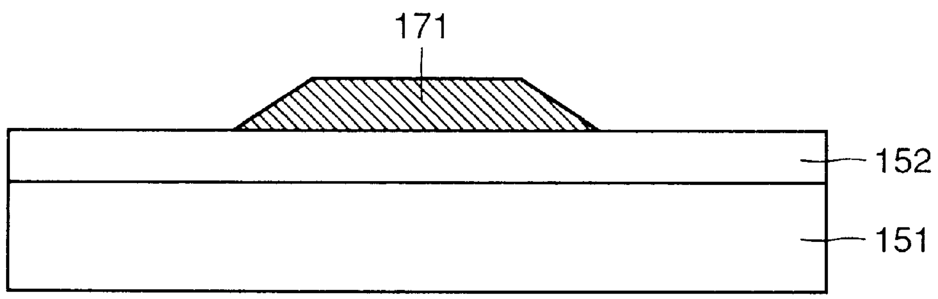
Figure 109:
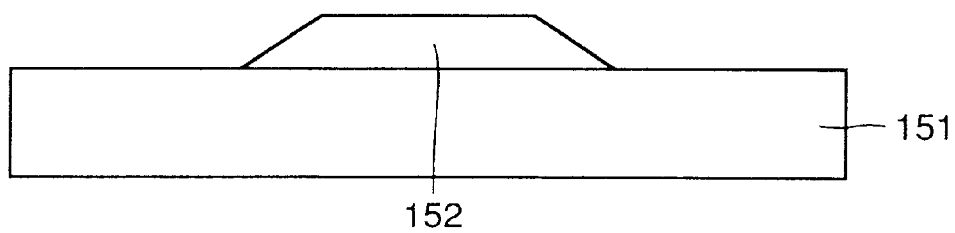

As shown in FIG. 106, SOI layer 152 having a thickness of about 1000 Å is formed on the support substrate 151 made of a silicon oxide film by the SIMOX method. A polycrystalline silicon layer 171 having a thickness of about 100 Å is formed on SOI layer 152. A silicon nitride film 172 having a thickness of about 2000 Å is formed at a region of polycrystalline silicon layer 171 corresponding to the active region. Using silicon nitride film 172 as a mask, polycrystalline silicon layer 171 is selectively oxidized to form LOCOS oxide films 155 having a thickness of about 2000 Å as shown in FIG. 107. Thereafter, silicon nitride film 172 is removed with thermo-phosphoric acid, and LOCOS oxide films 155 are removed with hydrofluoric acid. Thereby, isolated polycrystalline silicon layer 171 is obtained as shown in FIG. 108. In this state, polycrystalline silicon layer 171 and SOI layer 152 are anisotropically etched to form isolated SOI layer 152 having a trapezoidal section as shown in FIG. 109.

Figure 110:
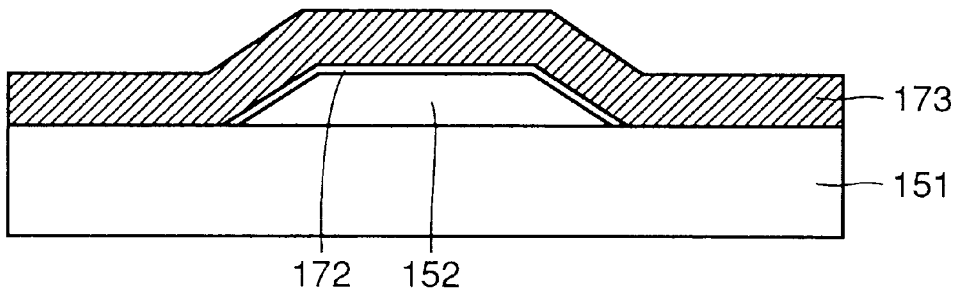
Figure 111:
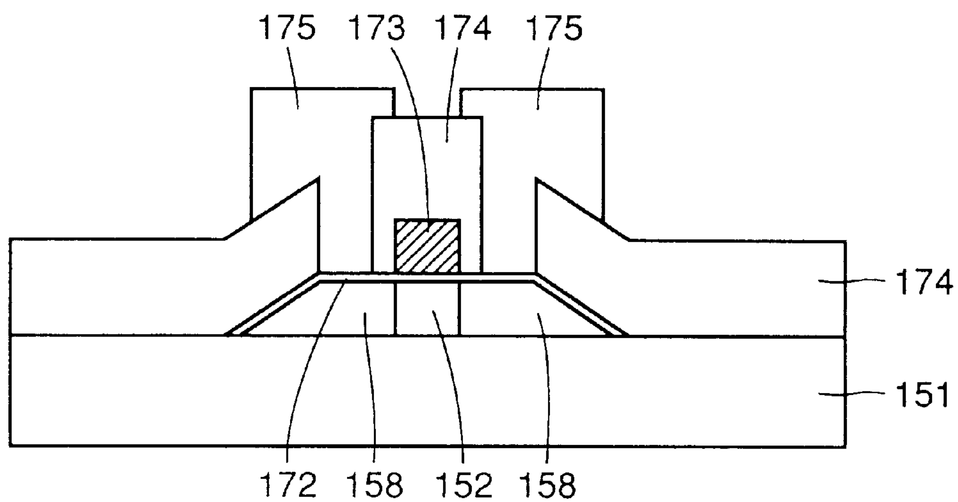

Thereafter, as shown in FIG. 110, gate oxide film 172 having a thickness of about 100 Å and a gate electrode layer 173 having a thickness of about 2000 Å and made of a polycrystalline silicon layer are formed over SOI layer 152. Gate electrode layer 173 is patterned to form gate electrode 173 as shown in FIG. 111. Using gate electrode 173 as a mask, ion implantation is effected on SOI layer 152 with an impurity concentration of about $4\times10^{15}/cm^2$ to form source/drain regions 158. After forming an interlayer insulating film 174 covering gate electrode 173, gate oxide film 172 and support substrate 151, contact holes are formed at predetermined regions in interlayer insulating film 174. Interconnection layers 175 made of, e.g., aluminum are formed. Interconnections layers 175 have portions filling the contact holes and electrically connected to source/drain regions 172 and gate electrode 173.

According to the manufacturing process of the sixteenth embodiment, as described above, the mesa isolated SOI layer has a trapezoidal section in contrast to a square section in the prior art, so that it is possible to suppress concentration of the electric field at the upper side portion of the SOI layer. Thereby, reliability of the gate oxide film can be improved, and influence by the parasitic transistor can be suppressed. As a result, a leak current can be reduced.

A process of manufacturing a semiconductor device of a seventeenth embodiment will be described below with reference to FIGS. 112 to 117.

Figure 112:
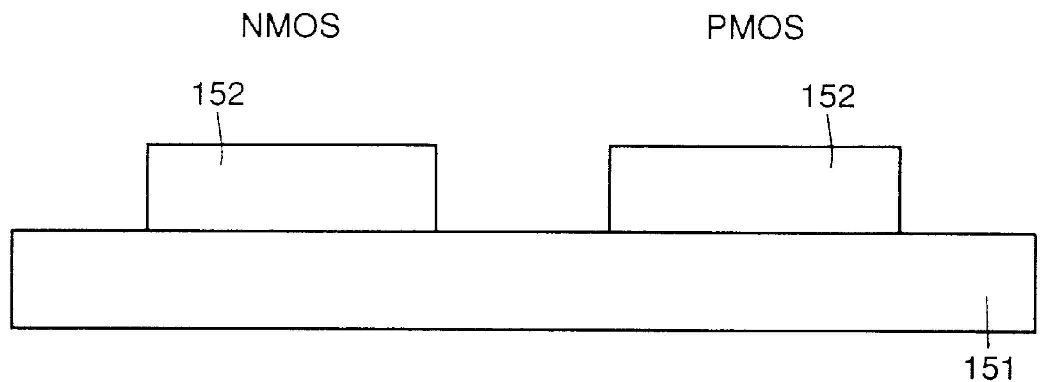
FIGS. 112 to 117 are cross sections showing 1st to 6th steps in a process of manufacturing a semiconductor device according to a seventeenth embodiment of the invention, respectively.
Figure 113:
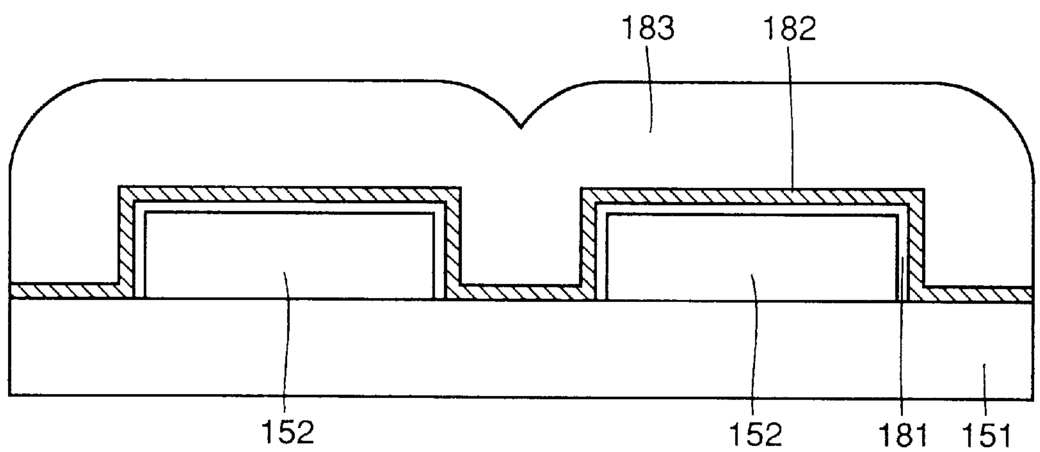
Figure 114:
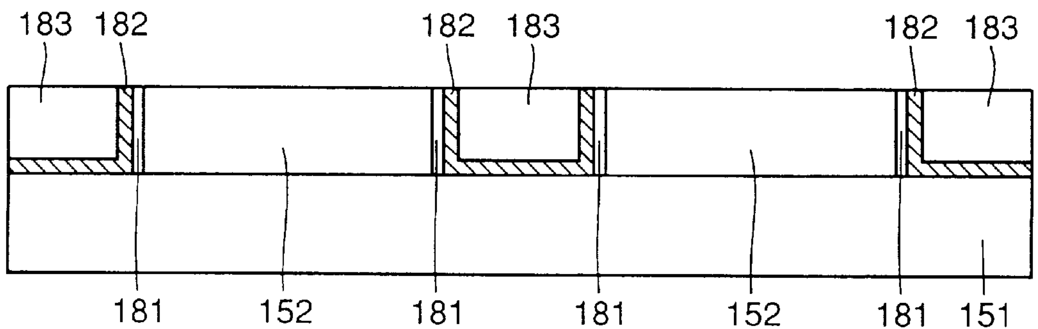

As shown in FIG. 112, SOI layer 152 having a thickness of about 1000 Å is formed and processed into isolated forms located at predetermined regions on support substrate 151 made of a silicon oxide film. Then, as shown in FIG. 113, a silicon oxide film 181 having a thickness of about 100 Å, a silicon nitride film 182 having a thickness of about 500 Å and a silicon oxide film 183 having a thickness of about 1500 Å are successively formed. The CMP method or etch-back method using a photoresist is performed to form a structure shown in FIG. 114. SOI layers 152 are used as a stopper during the CMP or etch-back described above. Silicon nitride films 182 and silicon oxide films 183 may be used as the above etching stopper, and thereafter silicon nitride films 182 may be removed, if necessary.

Figure 115:
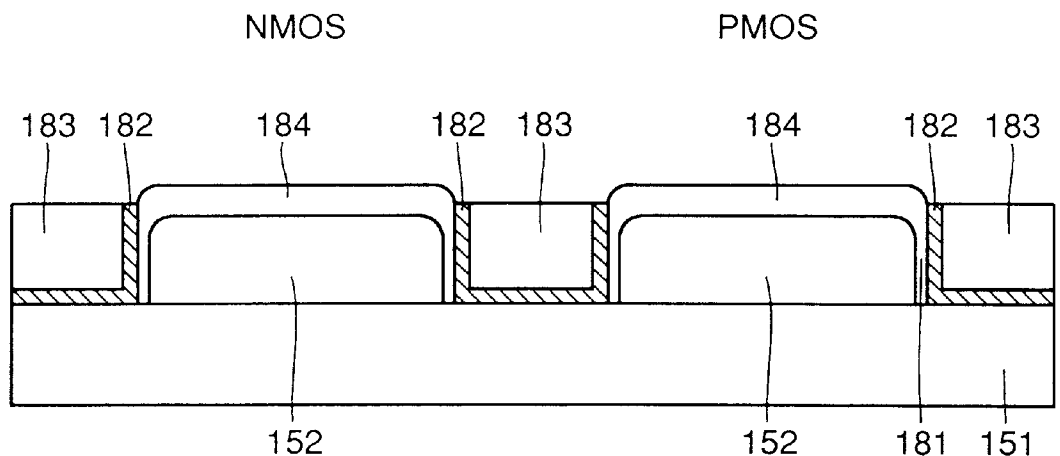

As shown in FIG. 115, the top surfaces of SOI layers 152 are oxidized to form select oxide films 184 using silicon nitride films 182 as a mask. The temperature for this oxidation is preferably not lower than 1100° C. Owing to formation of select oxide films 184, upper side surfaces of SOI layers 152 are rounded. Owing to existence of silicon nitride films 182, oxidant is prevent from moving up to the lower surfaces of SOI layers 152 when forming select oxide films 184. Thereby, such a disadvantage can be prevented that ends of the lower surfaces of SOI layers 152 are raised or lifted.

Figure 116:
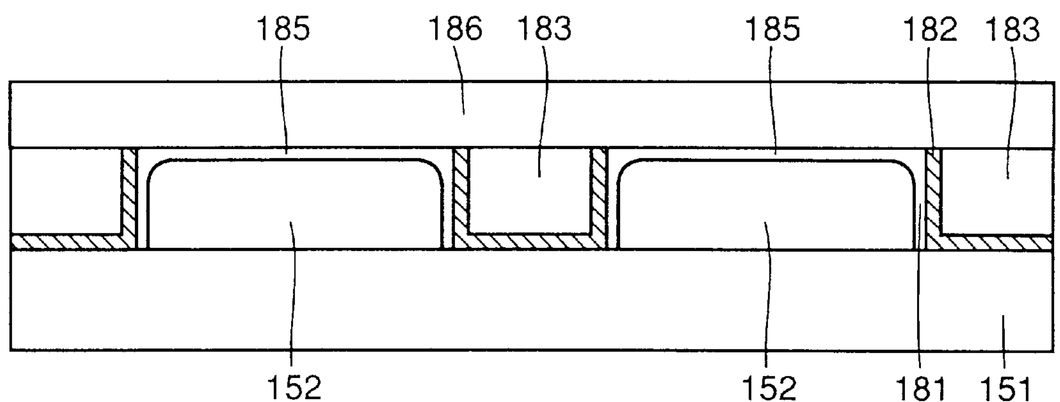
Figure 117:
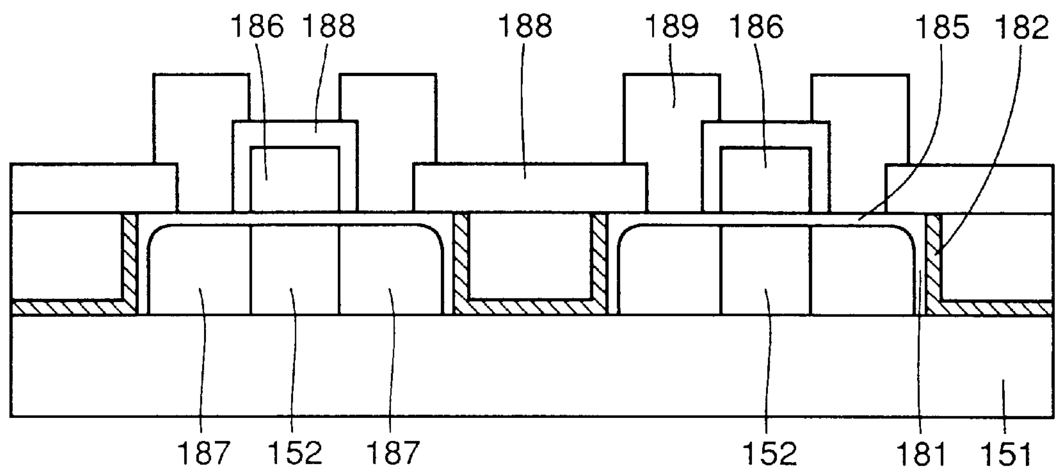

Thereafter, select oxide films 184 are removed, and then gate oxide films 185 having a thickness of about 100 Å are formed on the upper surfaces of SOI layers 152 as shown in FIG. 116. A gate electrode layer 186 made of a polycrystalline silicon layer and having a thickness of about 2000 Å is formed on gate oxide films 185. Gate electrode layer 186 is patterned to form gate electrodes 186 as shown in FIG. 117, and then impurity is ion-implanted into SOI layers 152 with the impurity concentration of $4\times10^{15}/cm^2$ using gate electrodes 186 as a mask. Thereby, source/drain regions 187 are formed.

After forming an interlayer insulating film 188 over the whole surface, contact holes are formed at predetermined regions. Interconnection layers 189 made of, e.g., aluminum and having portions located in the contact holes are formed. Interconnection layers 189 are connected to source/drain regions 187 and gate electrodes 186. In this manner, the semiconductor device of the seventeenth embodiment is completed. In the semiconductor device of this seventeenth embodiment, silicon nitride films 182 are buried in the isolation regions, so that oxidant is prevented from moving up to the lower surfaces of SOI layers 152. Consequently, edges of SOI layers 152 are not raised.

Figure 118:
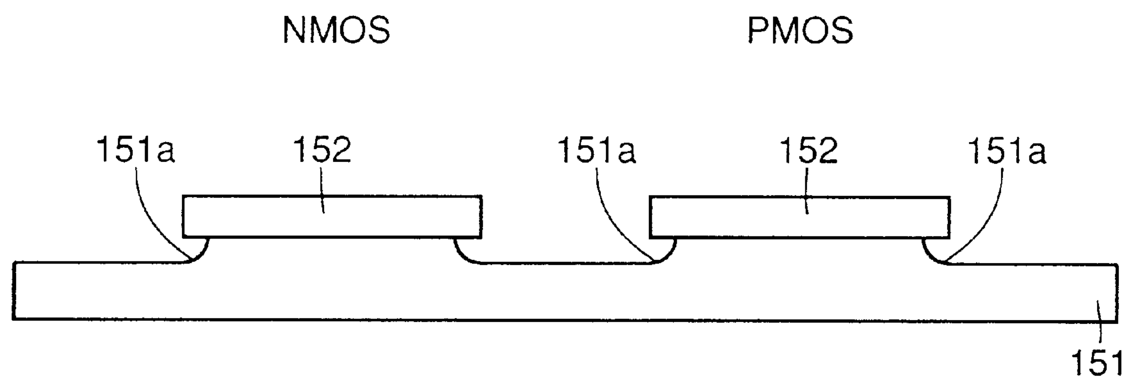
FIGS. 118 to 125 are cross sections showing 1st to 7th steps in a process of manufacturing a semiconductor device according to an eighteenth embodiment of the invention, respectively.
Figure 119:
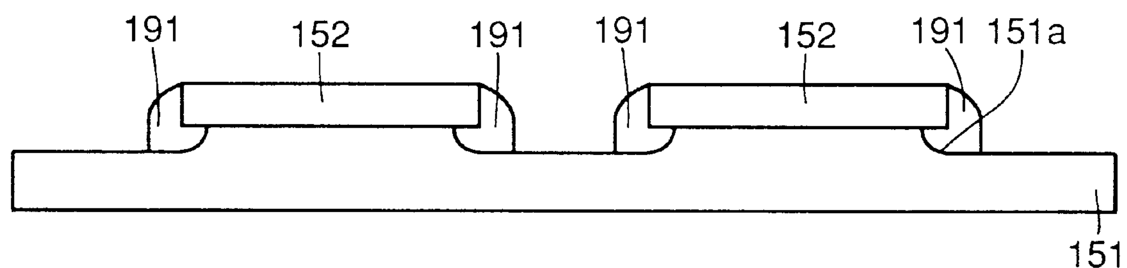
Figure 120:
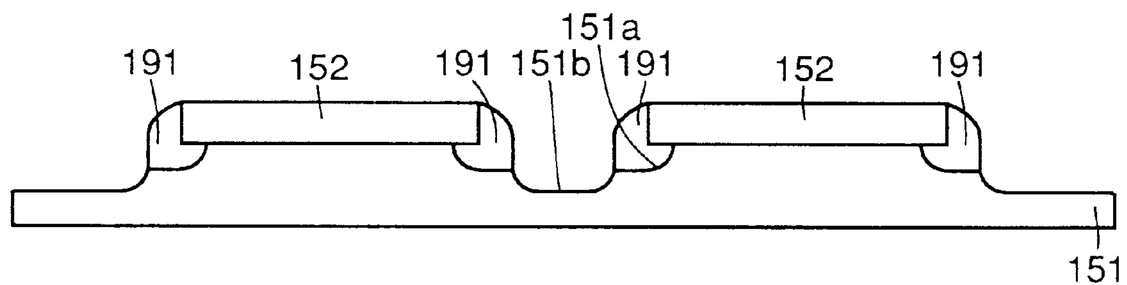

Referring to FIGS. 118 to 125, a process of manufacturing a semiconductor device of an eighteenth embodiment will be described below As shown in FIG. 118, SOI layers 152 which are isolated from each other and have a thickness of about 1000 Å are formed on support substrate 151 made of a silicon oxide film which is formed, e.g., by the SIMOX method. Since pad oxide films (not shown) are formed on SOI layers 152, concavities **151*a* are formed at support substrate 151 when removing the pad oxide films. If concavity 151*a* were filled with the gate electrode which will be formed later, the electric field would disadvantageously concentrate at the filled portion. In order to avoid this disadvantage, as shown in FIG. 119, side wall oxide films 191 made of silicon oxide films are, formed on side surfaces of SOI layers 152 and inner surface portions of concavities 151*a***.

Figure 121:
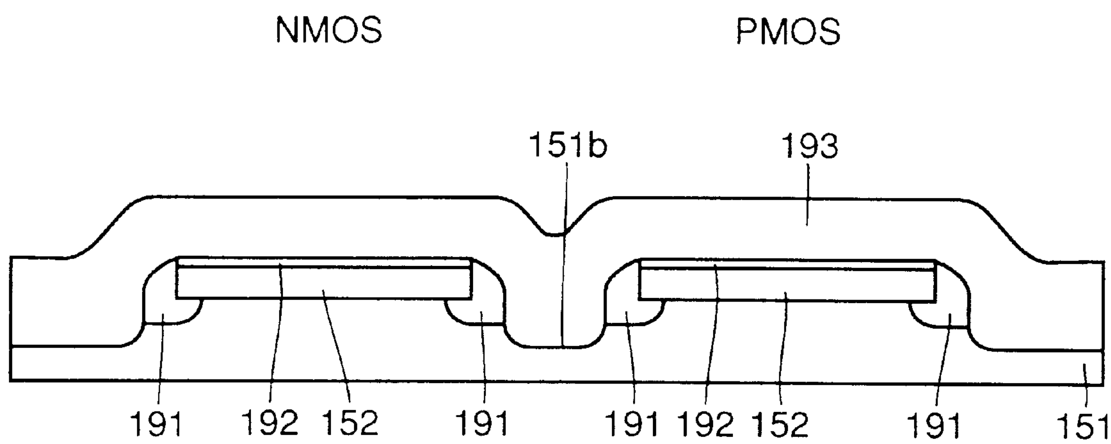
Figure 122:
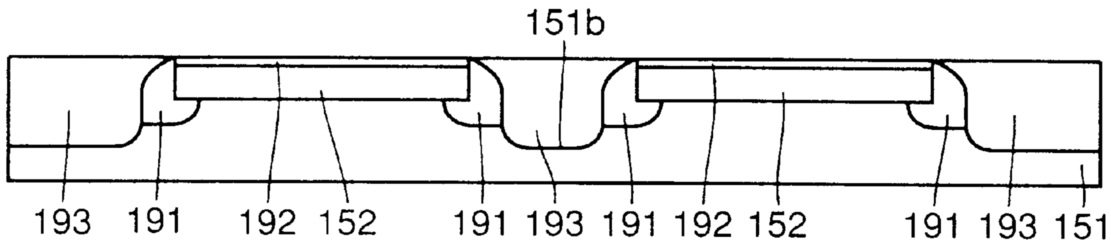
Figure 123:
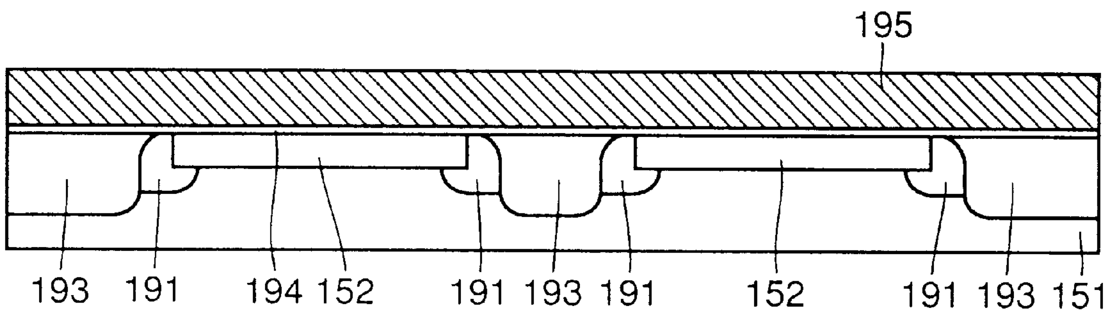

When forming side wall oxide films 191, additional concavities **151*b* are formed at support substrate 151 due to over-etching. This may result in disadvantageous increase of the difference in level. In order to avoid this disadvantage, the concavities are filled as described below in the embodiment. As shown in FIG. 121, silicon oxide films 192 are formed on the upper surfaces of SOI layers 152, and then a polycrystalline silicon layer 193 having a thickness of about 1500 Å is formed over the whole surface. Polysilicon layer 193 is polished by the CMP method using silicon oxide films 192 as stopper layers. Thereby, a structure shown in FIG. 122 is obtained. After removing silicon oxide films 192, a gate oxide film 194 having a thickness of about 100 Å is formed as shown in FIG. 123. A gate electrode layer 195 having a thickness of about 1500 Å is formed on gate oxide film 194**.

Figure 124:
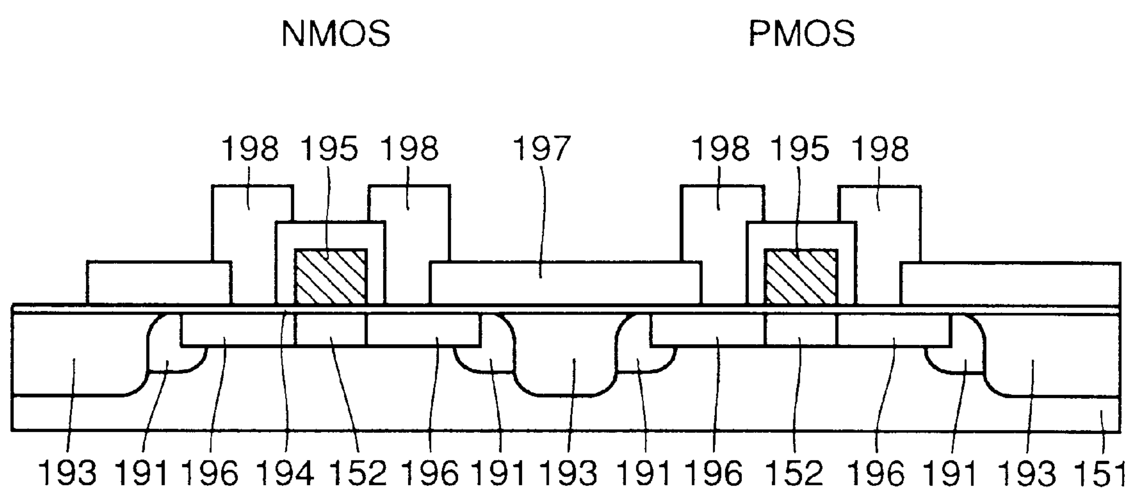
Figure 125:
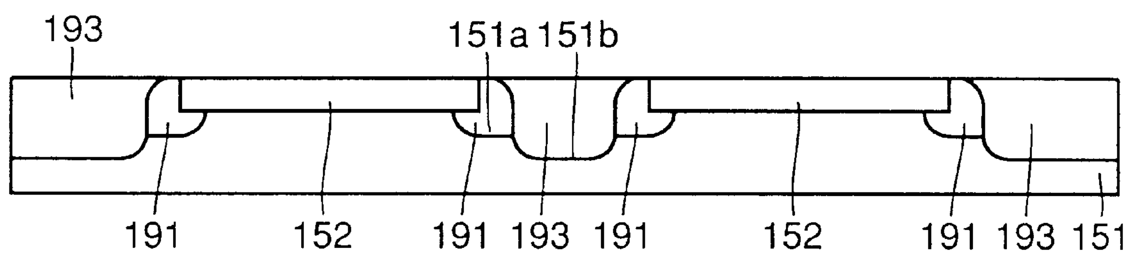

Thereafter, gate electrode layer 195 is patterned by photolithography and dry etching technique to form gate electrodes 195 as shown in FIG. 124. Using gate electrodes 195 as a mask, impurity is ion-implanted into SOI layers 152 with an impurity concentration of about $4\times10^{15}/cm^2$, so that source/drain regions 196 are formed. An interlayer insulating film 197 is formed over the whole surface, and then contact holes are formed at predetermined regions. Interconnection layers 198 made of, e.g., aluminum are formed. Interconnection layers 198 have portions located in the contact holes and electrically connected to gate electrodes 195 and source/drain regions 196. In the embodiment described above, silicon oxide film 192 formed on SOI layer 152 is used as the polishing stopper layer, the invention is not restricted to this, and a similar effect can be obtained even if side wall oxide films 191 are used as the polishing stopper layers as shown in FIG. 125 without forming silicon oxide film 192.

In this eighteenth embodiment, as described above, the concavities (removed portions) formed at the lower side portions of SOI layers 152 are filled with side wall oxide films 191, and concavities 151*b* are filled with polycrystalline silicon layers 193, so that the isolation regions can have flat top surfaces, and thus it is possible to prevent deterioration of the gate oxide films which may be caused by concentration of the electric field near the side surfaces of SOI layers 152. By flattening the isolation regions, the produced SOI structure is suitable to microscopic processing Since polycrystalline silicon layer 193 buried at the isolation region has the thermal expansion coefficient equal to that of SOI layer 152, application of a thermal stress is suppressed. Thereby, a leak current which may be caused by the thermal stress can be prevented Instead of polycrystalline silicon layer 193, insulator such as a silicon oxide film or a silicon nitride film may be buried.

Referring to FIGS. 126 to 129, a process of manufacturing a semiconductor device of a nineteenth embodiment will be described below. In this nineteenth embodiment, SOI layer 3 (see FIG. 129) has a trapezoidal section, so that an angle of a corner 3*a* of SOI layer 3 is larger than that of SOI layer 3 having a square section. Therefore, concentration of the electric field can be suppressed more effectively that the case where SOI layer 3 has a square section. Consequently, generation of the parasitic transistor can be prevented further effectively.

Figure 126:
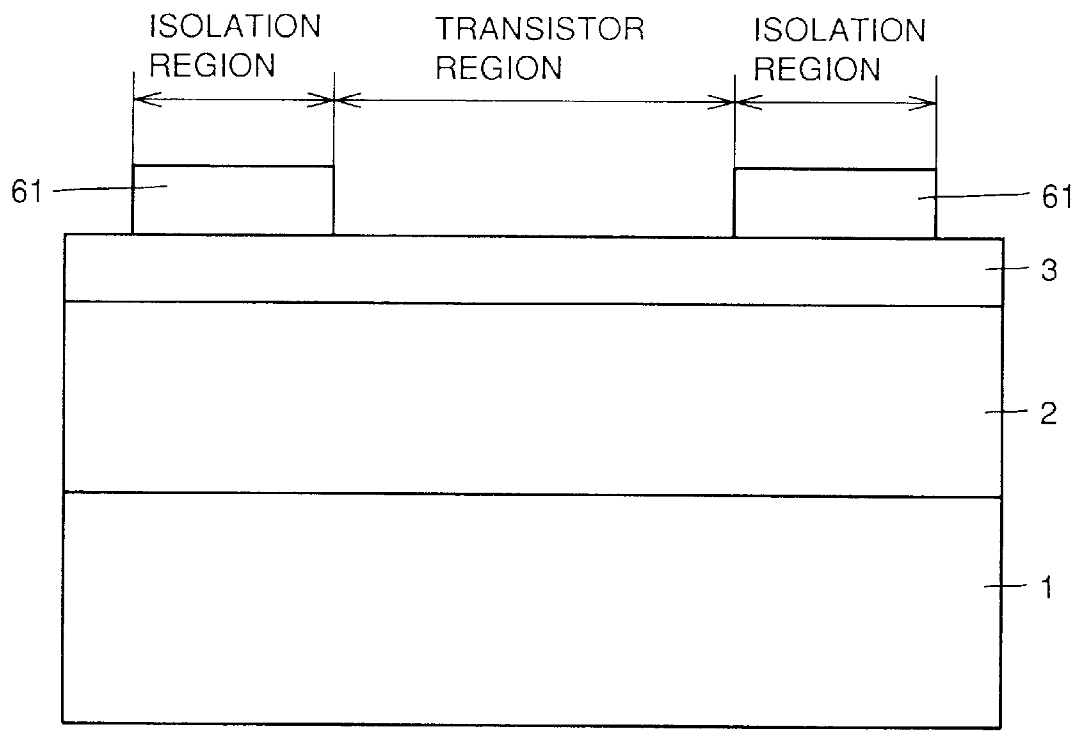
FIGS. 126 to 129 are cross sections showing 1st to 4th steps in a process of manufacturing a semiconductor device according to a nineteenth embodiment of the invention, respectively.
Figure 127:
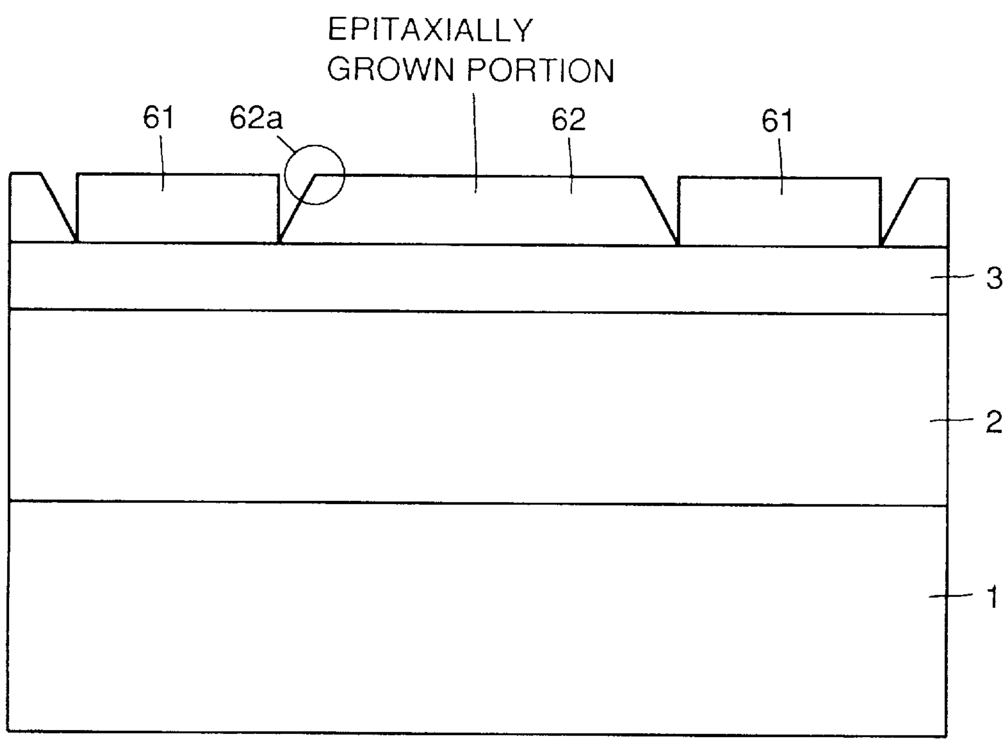

In this nineteenth embodiment, buried oxide film 2 is formed on silicon substrate 1 as shown in FIG. 126. SOI layer 3 is formed on buried oxide film 2. Silicon oxide films 61 are formed at regions on SOI layer 3 corresponding to isolation regions. Then, heat treatment is performed in an hydrogen atmosphere under the condition of about 900° C., so that the surface of SOI layer 3 is cleaned in situ. As shown in FIG. 127, epitaxial grown is performed with an $Si_2$ gas, $H_6$ gas or $SiH_4$ gas. This epitaxial growth forms epitaxial growth layers 62 having a trapezoidal section. Thereby, a corner 62*a* of epitaxial growth layer 62 has an obtuse angle. Cleaning of SOI layer 3 for the epitaxial growth may be performed in another manner.

Figure 128:
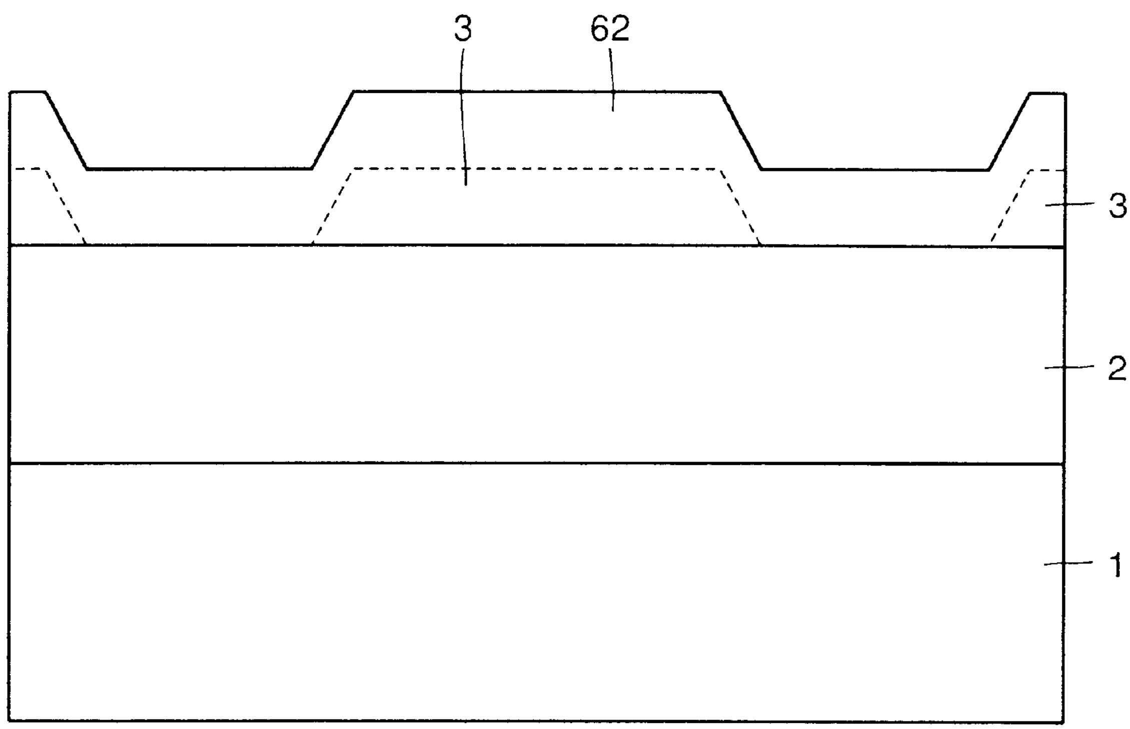
Figure 129:
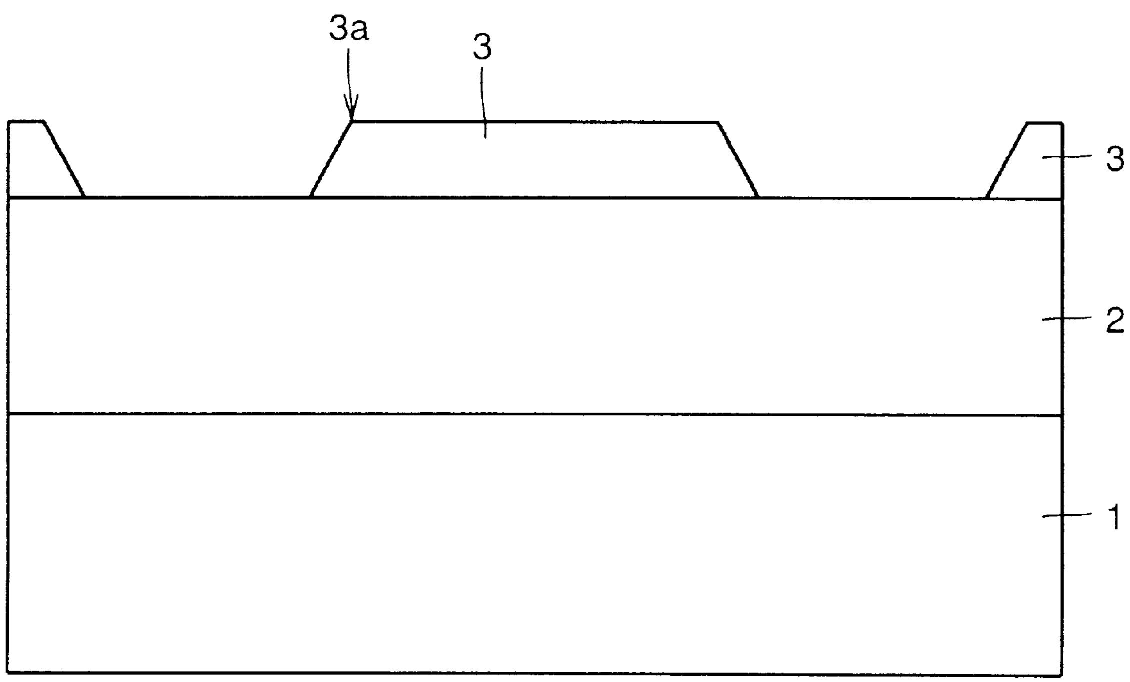

Thereafter, silicon oxide films 61 are removed. Since SOI layer 3 exists under silicon oxide films 61, such a disadvantage does not arise that buried oxide film 2 is etched when etching and removing silicon oxide films 61. Therefore, a concavity is not formed at buried oxide film 2. Then, etching is effect on the whole surfaces of epitaxial growth layer 62 and SOI layer 3 as shown in FIG. 128, so that the trapezoidal shape of epitaxial growth layer 62 is transferred to SOI layer 3 as it is as shown in FIG. 129. Thereby, SOI layer 3 having obtuse corners can be formed, and the concavity is not formed at buried oxide film 2. As a result, it is possible to provide the SOI-MOSFET which can prevent generation of a parasitic MOS transistor and can reduce a leak current.

Figure 130:
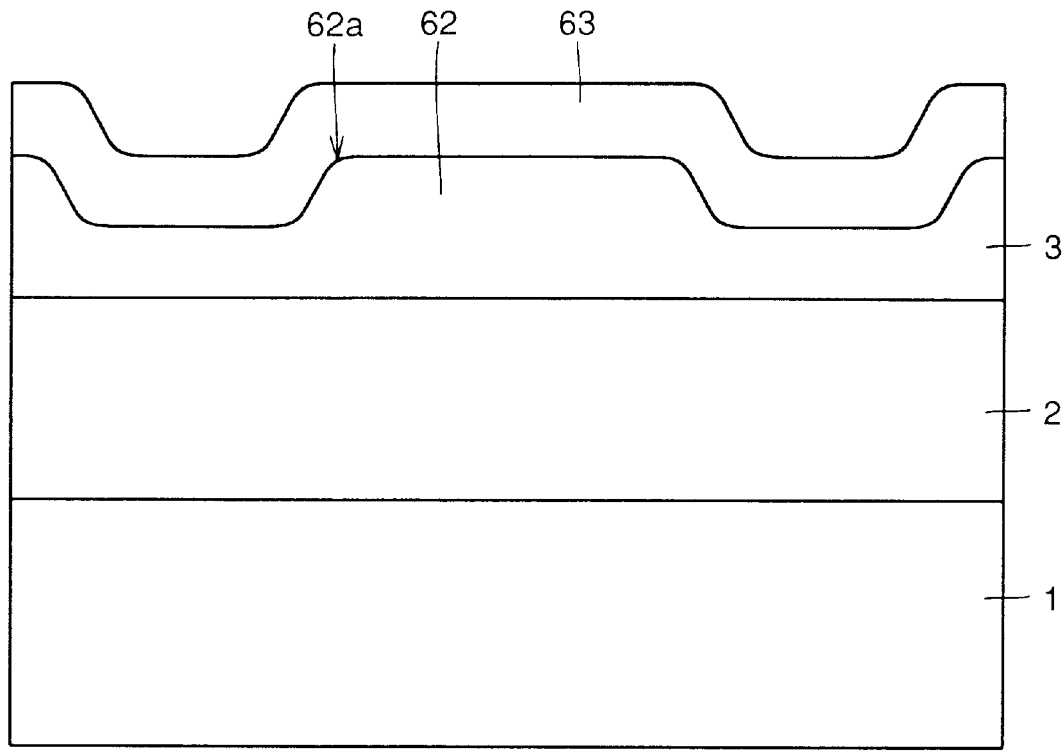
FIGS. 130 to 132 are cross sections showing 1st to 3rd steps in a process of manufacturing a semiconductor device according to a twentieth embodiment of the invention, respectively.
Figure 131:
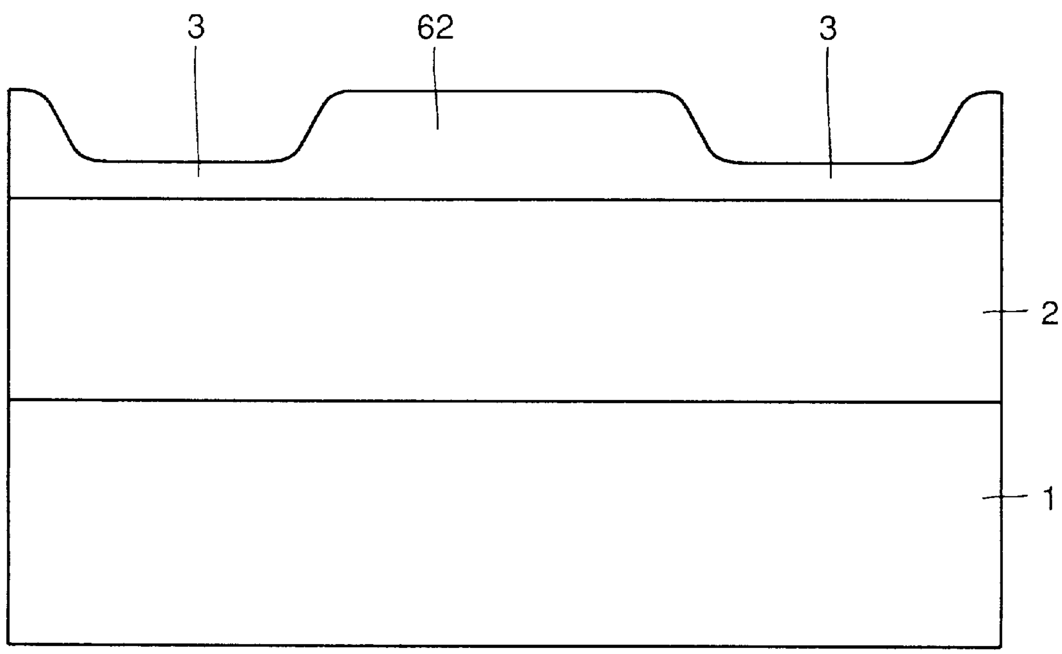
Figure 132:
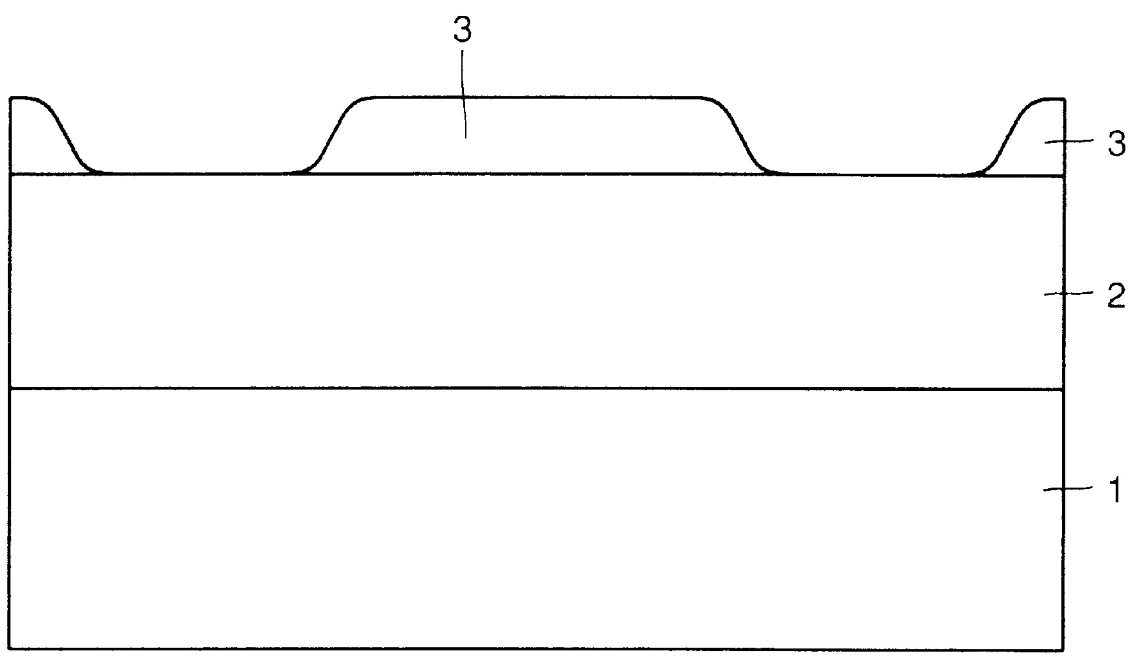

According to a twentieth embodiment, as shown in FIGS. 130 to 132, a process similar to the manufacturing process of the nineteenth embodiment shown in FIG. 127 is performed to form epitaxial growth layer 62, and then silicon oxide films 61 are removed. Epitaxial growth layer 62 is oxidized to form oxide film 63. Thereby, corners 62*a* of epitaxial growth layer 62 can be further rounded as compared with the nineteenth embodiment. Thereafter, oxide film 63 is removed to form a structure shown in FIG. 131. At this state, etching is effected on the whole surfaces of epitaxial growth layer 62 and SOI layer 3 to form isolated SOI layers 3 having a further rounded trapezoidal section as shown in FIG. 132. Oxidation of epitaxial growth layer 62 is preferably performed at a wet atmosphere not lower than 1100° C. However, oxidation under another condition may be performed, because epitaxial growth layer 62 originally has a trapezoidal section. Oxide film 63 may be formed before removal of silicon oxide films 61 (see FIG. 127).

Referring to FIGS. 133 to 136, a manufacturing process of the twenty-first embodiment is a modification of the manufacturing process of the twentieth embodiment. More specifically, a slightly larger amount of impurity of the same conductivity type as the channel region is implanted only into the regions near the side surfaces of SOI layers 3, so that generation of a parasitic MOS transistor is suppressed. The manufacturing process of this twenty-first embodiment will be described in connection with the case where the SOI transistor is the N-channel MOS transistor. The case where it is a p-channel MOS transistor can be coped with by employing the impurity of the opposite type.

Figure 133:
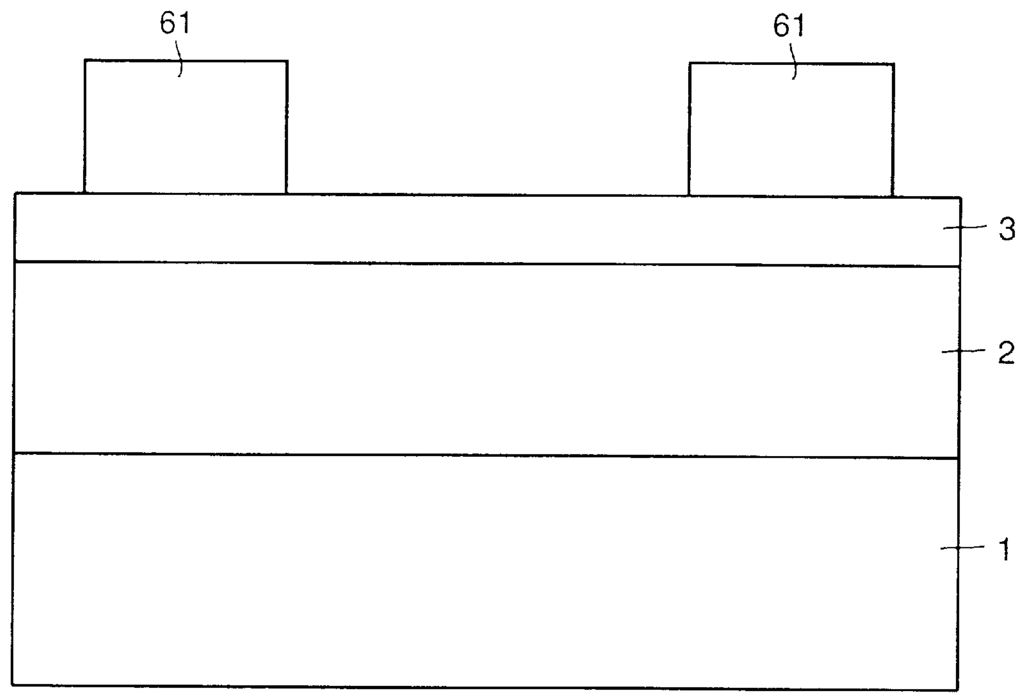
FIGS. 133 to 136 are cross sections showing 1st to 4th steps in a process of manufacturing a semiconductor device according to a twenty-first embodiment of the invention, respectively.
Figure 134:
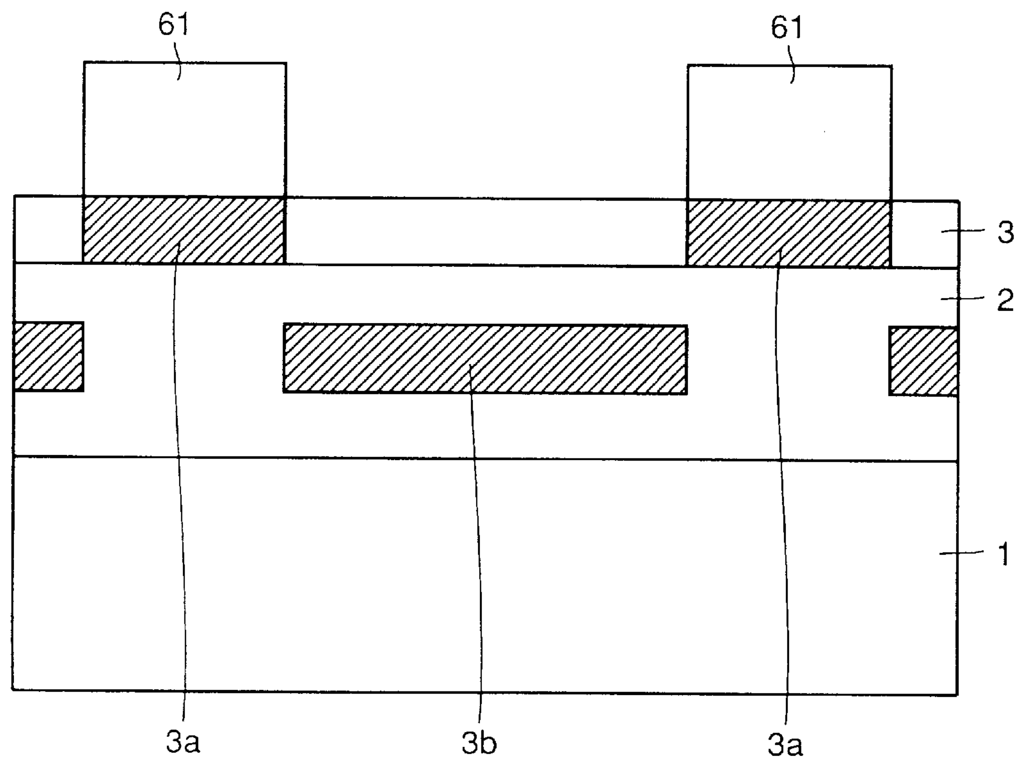
Figure 135:
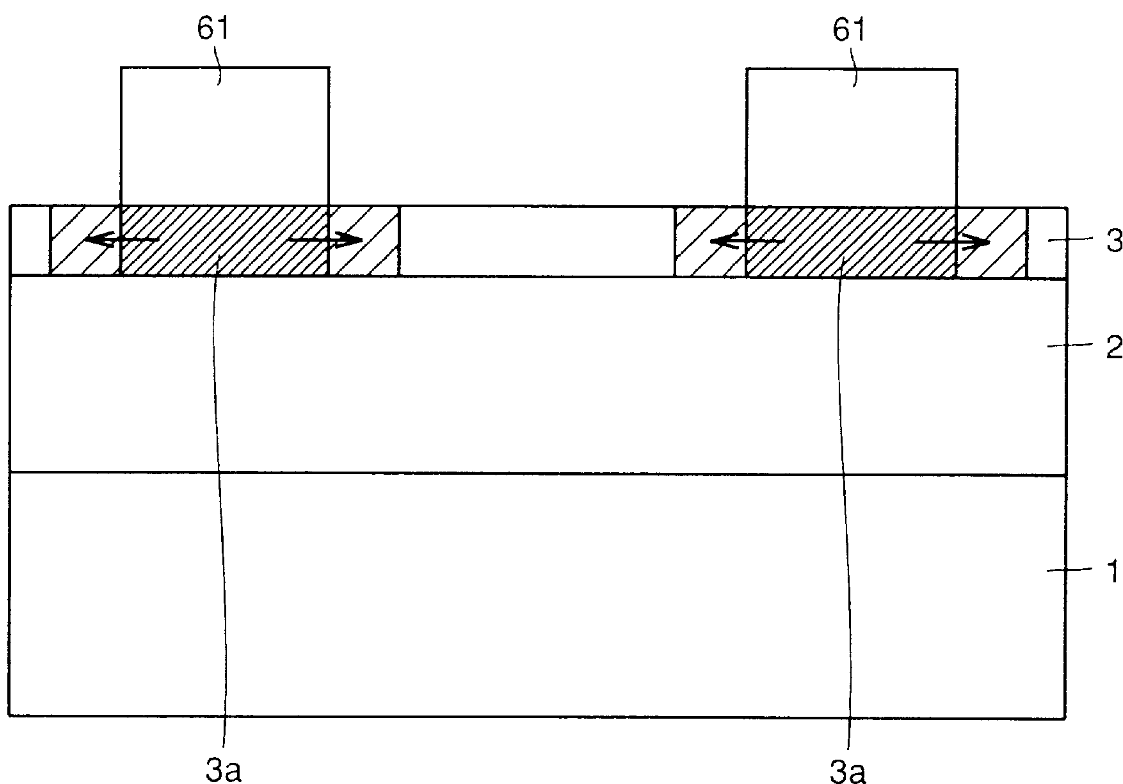
Figure 136:
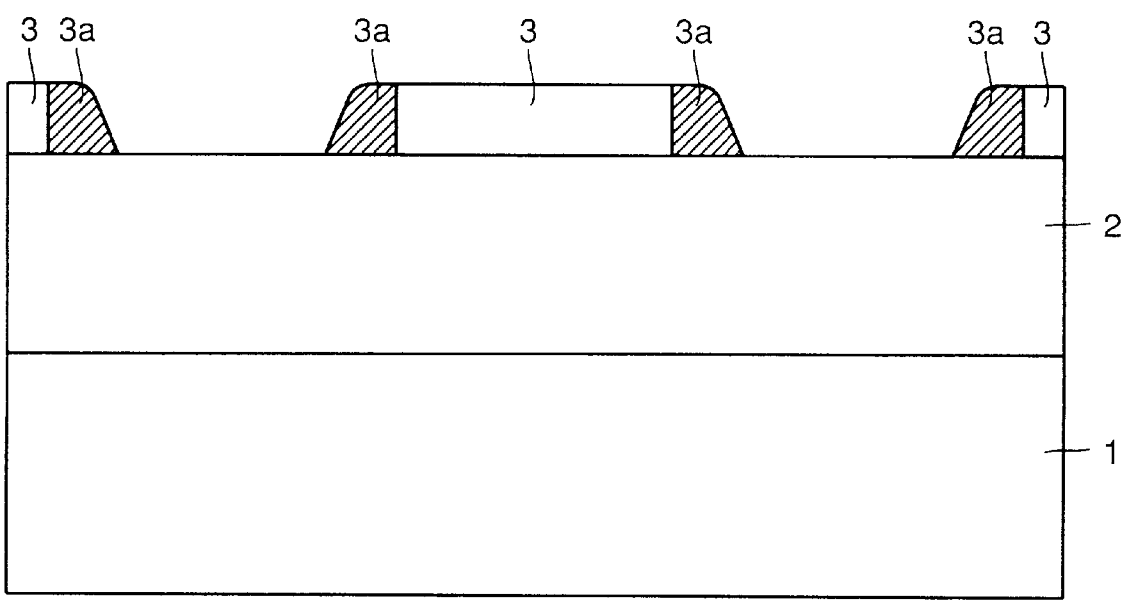

First, the manufacturing process from the initial step to the step of forming silicon oxide film 61 shown in FIG. 133 is performed in a manner similar to that in the nineteenth embodiment shown in FIG. 126. Boron is implanted at the impurity concentration of about $1\times10^{13}$–$1\times10^{14}/cm^2$ with such an implantation energy that a projection range is located inside SOI layer 3 when the impurity moves through the silicon oxide film 61. For example, if silicon oxide film 61 has a film thickness of 2000 Å and SOI layer 3 has a film thickness of 1000 Å, boron is implanted with the implantation energy of about 90 keV. The projection range in this case is about 2700 Å. Thereby, as shown in FIG. 134, $P^+$-isolation implanted layers 3*a* are formed only at portions of SOI layer 3 located under silicon oxide films 61. The impurity implanted into portions above which silicon oxide film does not exist is implanted up to buried oxide film 2. Thereby, a $P^+$-isolation implanted region 3*b* is formed in buried oxide film 2. Since $P^+$-isolation oxide film in buried oxide film 2 does not adversely affect the electric characteristics of the SOI-MOSFET, existence of $P^+$-isolation implanted region 3*b* does not cause any problem Thereafter, as shown in FIG. 135, heat treatment is performed, for example, under the temperature condition of 800° C. for about 30 minutes, so that $P^+$-isolation implanted layer 3*a* is laterally diffused. Thereafter, a manufacturing process similar to that in the twentieth embodiment already described is performed to form SOI layers 3 each of which has a trapezoidal section and is provided at the portions near the side surfaces with $P^+$-isolation implanted layers 3*a* as shown in FIG. 136. Thereby, generation of the parasitic MOS transistor can be further suppressed.

Figure 137:
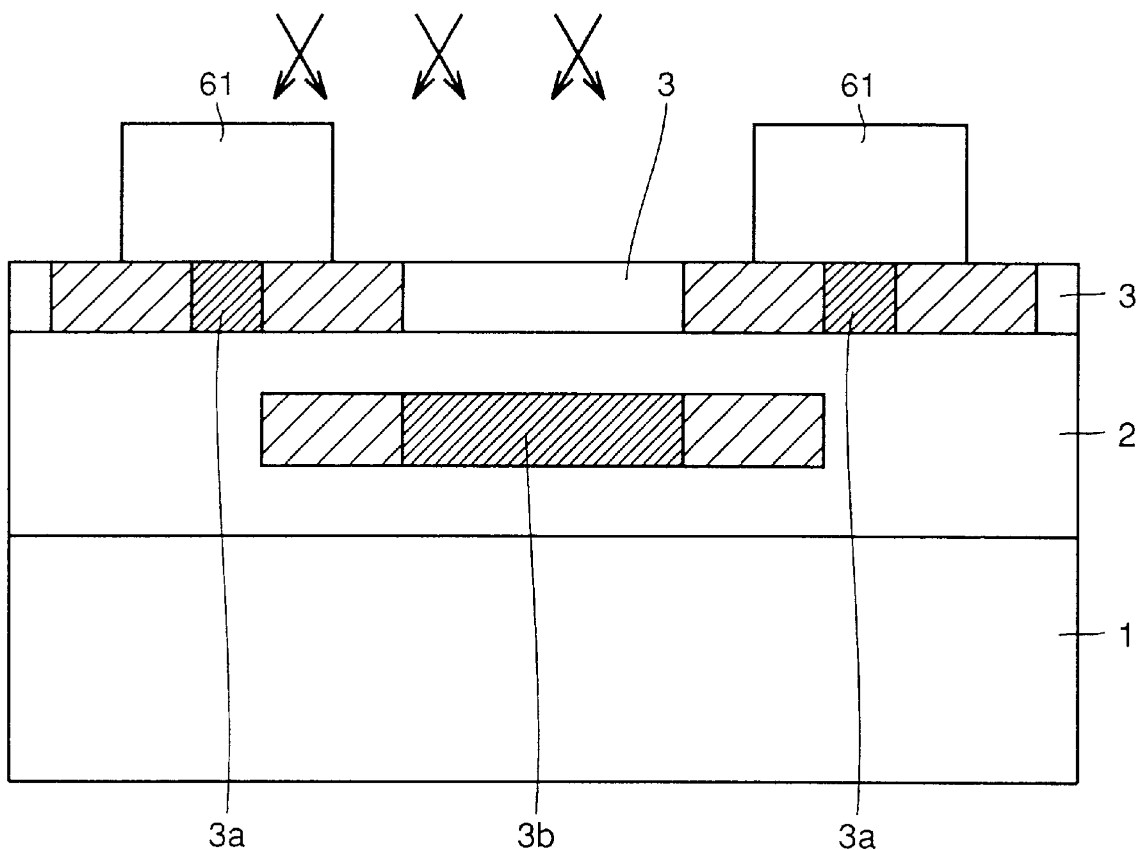
FIG. 137 is cross section showing a process of manufacturing a semiconductor device according to a twenty-second embodiment of the invention.

In a twenty-second embodiment, as shown in FIG. 137, the $P^+$-isolation implantation in the manufacturing process of the twenty-first embodiment is performed by an oblique rotary implanting method. More specifically, as shown in FIG. 137, the $P^+$-isolation implantation by the oblique rotary implantation method can introduce the impurity also into a region of SOI layer 3 not located under the silicon oxide film 61 without performing heat treatment. In each of $P^+$-isolation implanted layers 3a and 3b thus formed, a central portion has a higher impurity concentration, and portions located at opposite sides of the high concentration portion have a lower impurity concentration. According to the manufacturing process in this twenty-second embodiment, heat treatment step can be eliminated, so that the manufacturing process can be simplified as compared with the twenty-first embodiment already described.

Figure 138:
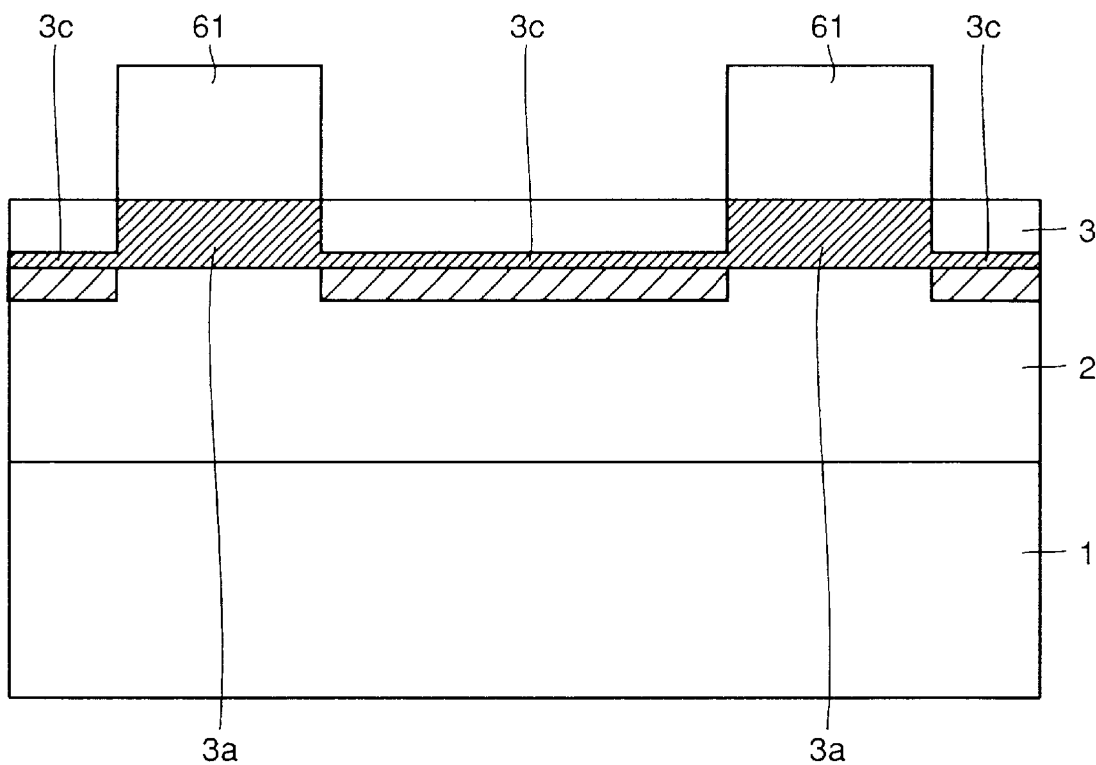
FIG. 138 is cross section showing a process of manufacturing a semiconductor device according to a twenty-third embodiment of the invention.

Referring to FIG. 138, a twenty-third embodiment is an example of the invention applied to a partially depleted SOI-MOSFET. The partially depleted SOI-MOSFET is an SOI-MOSFET in which SOI layer 3 is not entirely depleted but is partially depleted because SOI layer 3 is thick. The partially depleted SOI-MOSFET does not have a sufficient resistance against the punch-through phenomenon.

In this twenty-third embodiment, therefore, a punch-through stopper layer 3c is formed near a lower surface of a region forming the active region of SOI layer 3 at the same time as $P^+$-isolation implanted layer 3a is formed under silicon oxide film 61. More specifically, owing to reduction of the film thickness of silicon oxide film 61, punch-through stopper layer 3c can be simultaneously formed at the lower portion of SOI layer 3 by the same ion implantation for forming $P^+$-isolation implanted layer 3a at the lower portion of silicon oxide film 61. Thereafter, the same process as that in the twenty-first embodiment already described is performed to form SOI layer 3 of a trapezoidal section. Thereby, it is possible to form the partially depleted SOI-MOSFET which can suppress the punch-through phenomenon and generation of a parasitic transistor. The implantation energy for the $P^+$-isolation implantation described above is preferably about 50 keV when silicon oxide film 61 is about 1000 Å in thickness, SOI layer 3 is about 1000 Å in thickness and the impurity is boron. If the implantation is performed by the oblique rotary implantation, the heat treatment step can be eliminated.

Figure 139:
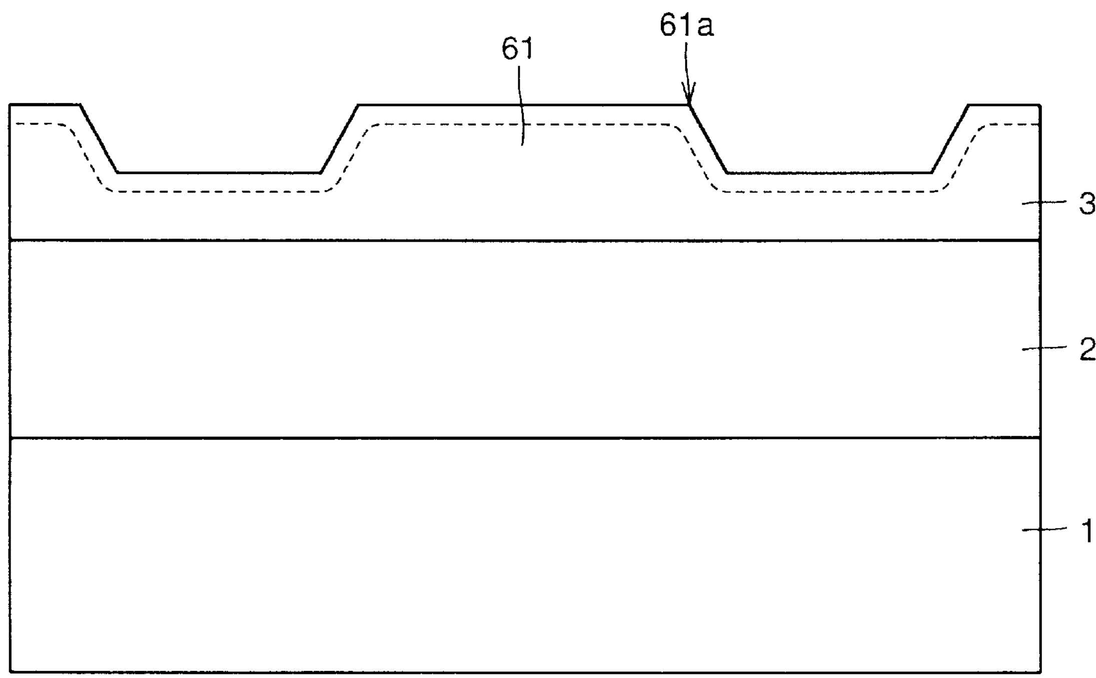
FIG. 139 is cross section showing a process of manufacturing a semiconductor device according to a twenty-fourth embodiment of the invention.

In a manufacturing process of a twenty-fourth embodiment, as shown in FIG. 139, epitaxial growth layer 61 is formed by a manufacturing process similar to that in the nineteenth embodiment shown in FIG. 127, and then mechanical-chemical polishing (CMP) is performed so that corners 61a of epitaxial growth layer 61 are further rounded. The chemical-mechanical polishing may be performed either before or after elimination of the mask, i.e., silicon oxide film 61 (see FIG. 127). This mechanical-chemical polishing may be combined with oxidation of the twentieth embodiment, whereby corners 61a are rounded to a further extent.

Referring to FIGS. 140 to 145, a twenty-fifth embodiment has a purpose of removing fixed charges existing at an interface between SOI layer 3 and buried oxide film 2. Existence of fixed charges may cause generation of a parasitic transistor. Therefore, generation of the parasitic transistor can be suppressed by removing the fixed charges.

Figure 140:
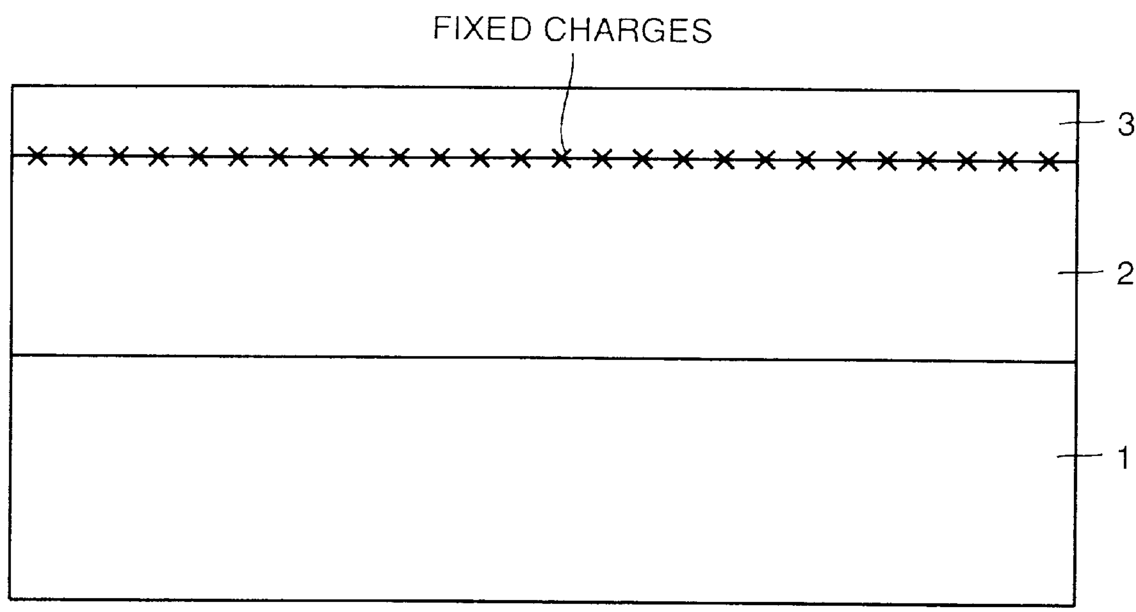
FIGS. 140 to 145 are cross sections showing 1st to 6th steps in a process of manufacturing a semiconductor device according to a twenty-fifth embodiment of the invention, respectively.
Figure 141:
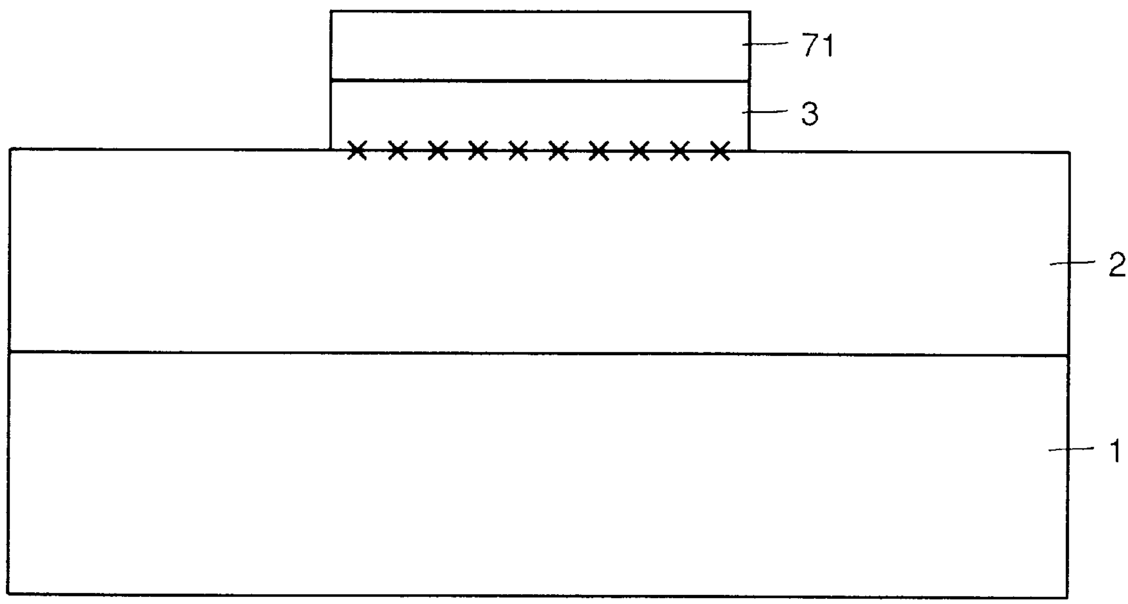
Figure 142:
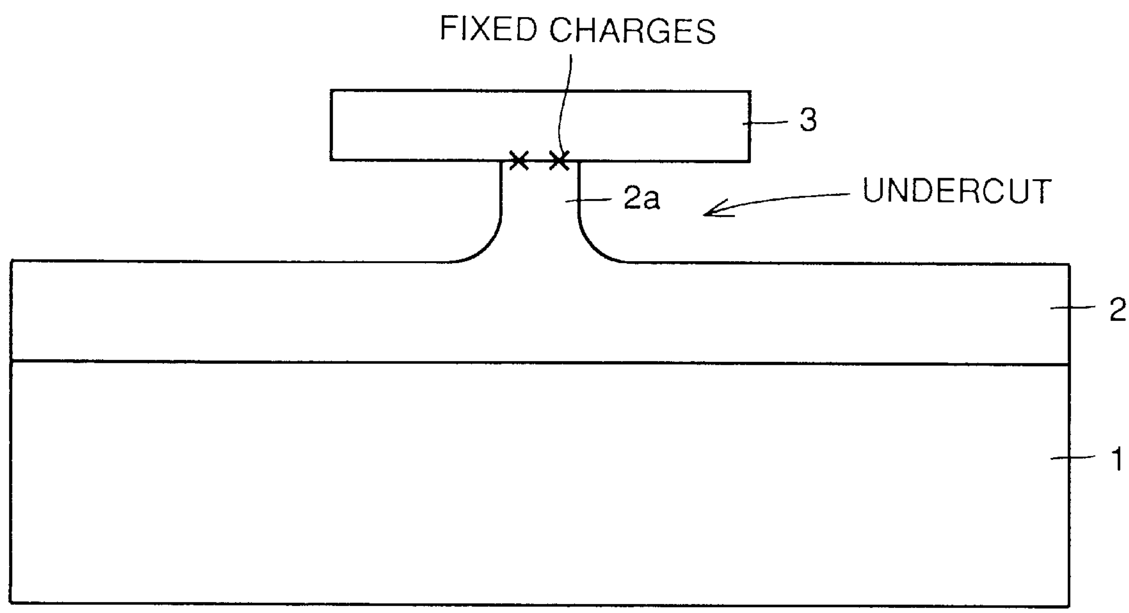
Figure 143:
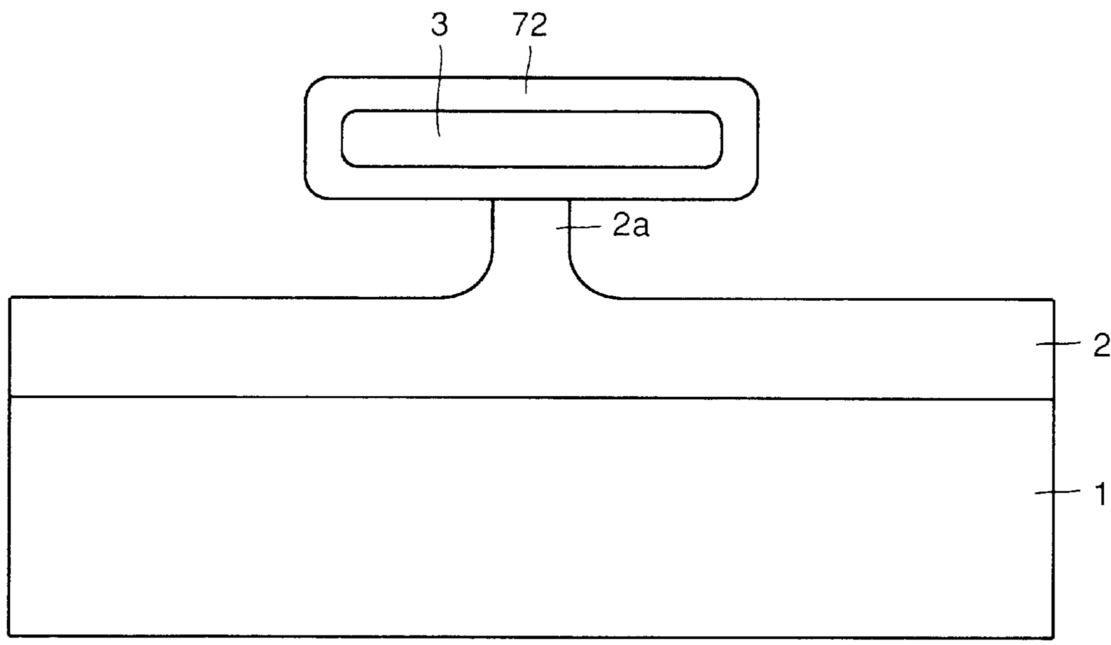

More specifically, if SOI layer 3 is formed on buried oxide film 2 formed on silicon substrate 1 as shown in FIG. 140, fixed charges exist at the interface between SOI layer 3 and buried oxide film 2. In this case, a silicon oxide film 71 is formed at a predetermined region on the main surface of SOI layer 3 as shown in FIG. 141, and then SOI layer 3 is patterned using silicon oxide film 71 as a mask. Thereafter, silicon oxide film 71 is removed by wet etching. By the wet etching for removing silicon oxide film 71, undercut portions are formed at buried oxide film 2 as shown in FIG. 142. Thereby, buried oxide film 2 has a convexity 2a. Thereafter, SOI layer 3 is oxidized in a wet atmosphere at 1100° C. or more to form an oxide film 72 as shown in FIG. 143. Formation of oxide film 72 rounds off the corners of SOI layer 3, and can remove the fixed charges existing between convexity 2a of buried oxide film 2 and SOI layer 3. Since convexity 2a of buried oxide film 2 is only in slightly contact with SOI layer 3, oxidation of SOI layer 3 does not cause a stress between SOI layer 3 and convexity 2a of buried oxide film 2.

Figure 144:
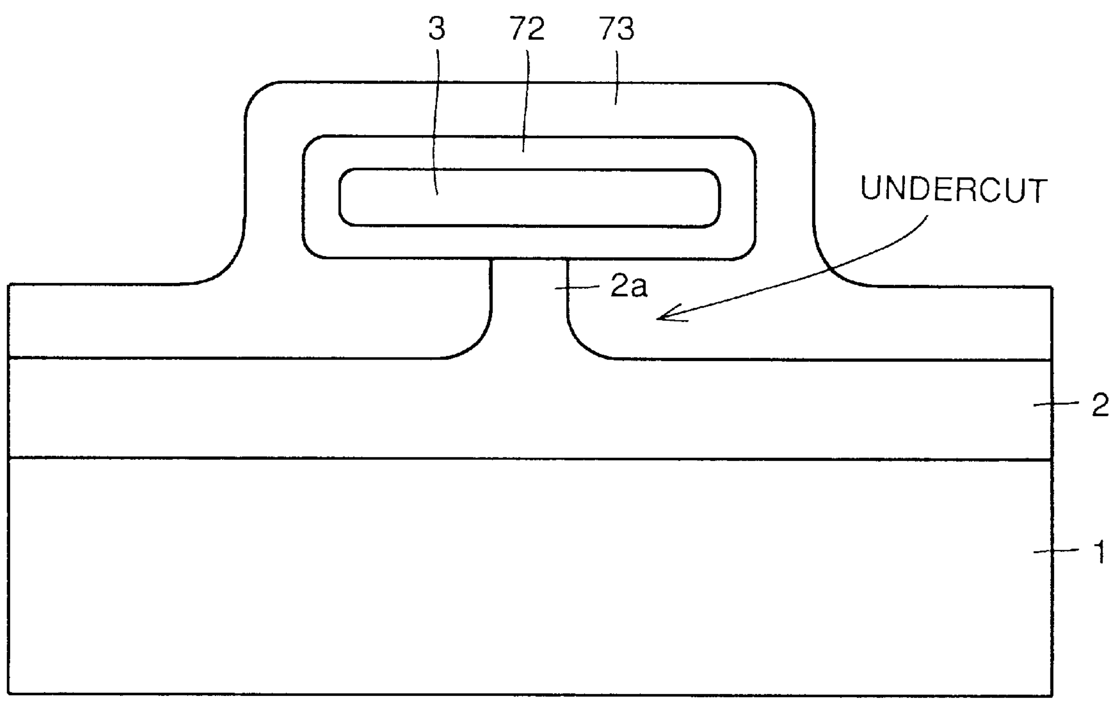
Figure 145:
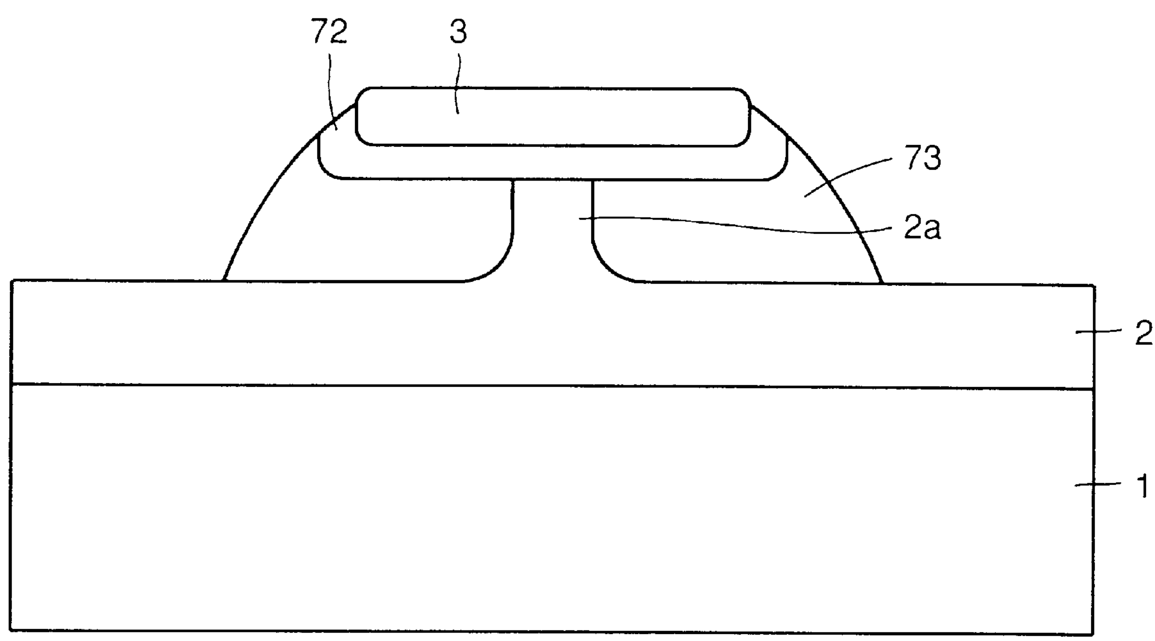

As shown in FIG. 144, a silicon oxide film 73 is formed on the whole surface to fill the undercuts. Finally, wet etching or dry etching is performed to etch back silicon oxide film 73 so that the upper surface of SOI layer 3 is exposed as shown in FIG. 145. In this case, wet etching applies less damage to the surface of SOI layer 3 than the dry etching. Even if the dry etching is performed, the problem can be prevented by performing oxidation after the dry etching. In this manner, SOI layer 3 having round corners can be formed, and also the SOI structure in which fixed charges do not exist at the interface between SOI layer 3 and buried oxide film 2 can be easily formed. Thereby, the SOI-MOSFET which can suppress generation of a parasitic transistor can be obtained. A silicon nitride film may be used instead of silicon oxide film 73.

Referring to FIGS. 146 to 153, a process of manufacturing a semiconductor device of a twenty-third embodiment will be described below.

Figure 146:
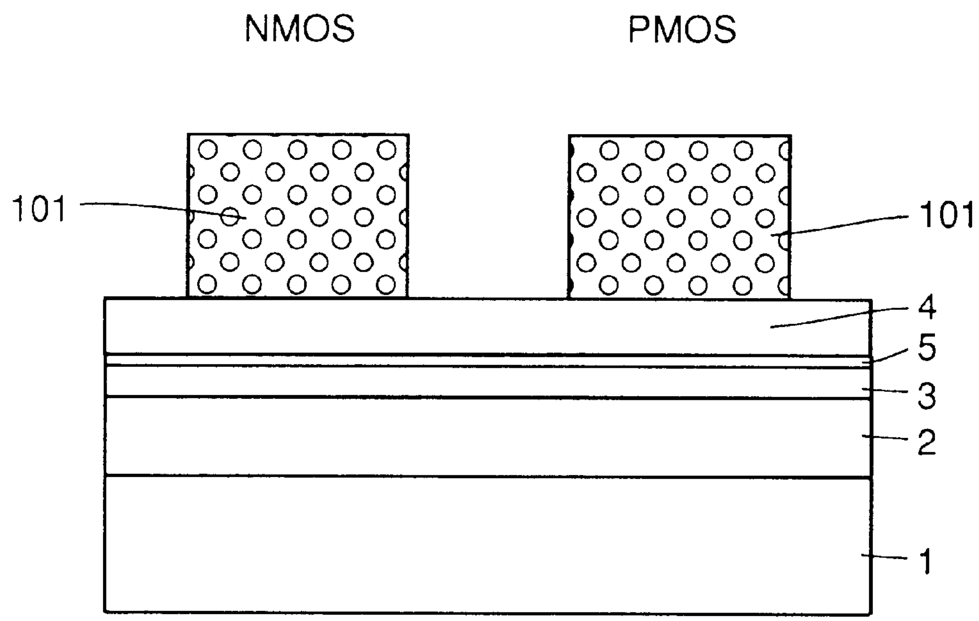
FIGS. 146 to 151 are cross sections showing 1st to 6th steps in a process of manufacturing a semiconductor device according to a twenty-sixth embodiment of the invention, respectively.
Figure 147:
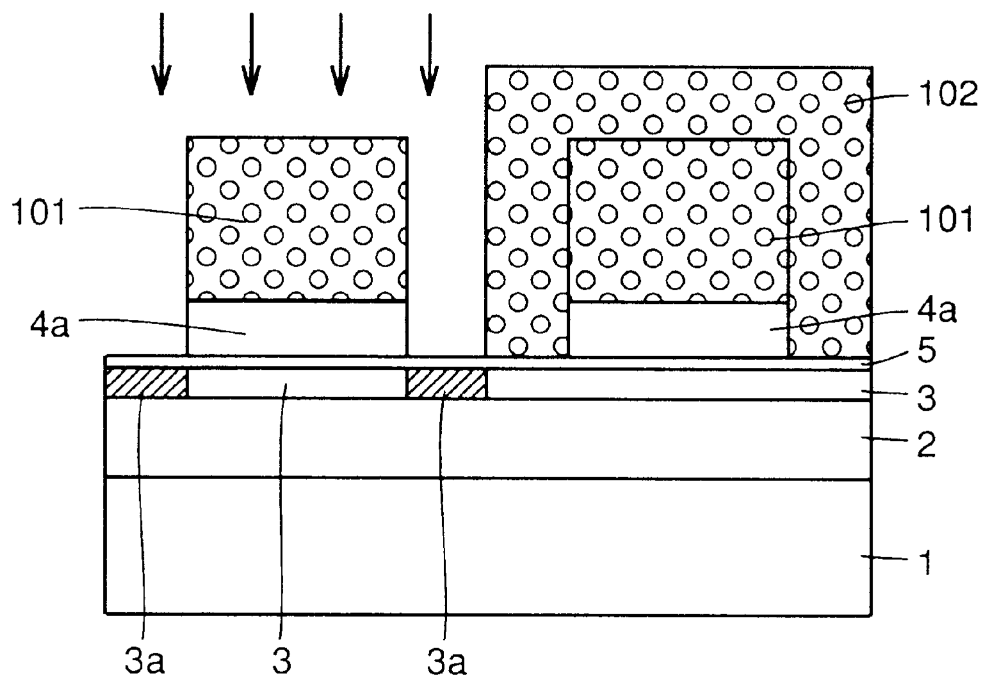

First, buried oxide film 2 is formed on silicon substrate 1 as shown in FIG. 146. SOI layer 3 is formed on buried oxide film 2. Silicon oxide film 1, buried oxide film 2 and SOI layer 3 form the SOI substrate. This SOI substrate is formed by the SIMOX method or the wafer bonding method. Oxide film 5 of about 100 Å in thickness is formed on SOI layer 3. Oxide film 5 may be formed by the CVD method under the temperature condition of about 800° C. or by oxidizing SOI layer 3 under the temperature condition of about 800° C. Nitride film 4 of about 1000 Å in thickness is formed on oxide film 5 under the temperature condition of about 700° C. Thereafter, resist 101 is formed at a region corresponding to the active region on silicon nitride film 4. Using resist 101 as a mask, anisotropic etching is effected on silicon nitride film 4 to form silicon nitride films 4a as shown in FIG. 147. Resist 102 is formed over the PMOS region, and then boron ions are implanted into the NMOS region with the implantation energy of 20 keV and the impurity concentration of $3\times10^{13}$–$8\times10^{13}/cm^2$ using resists 101 and 102 as a mask. Thereby, isolation regions 3a are formed. Thereafter, resists 101 and 102 are removed.

Figure 148:
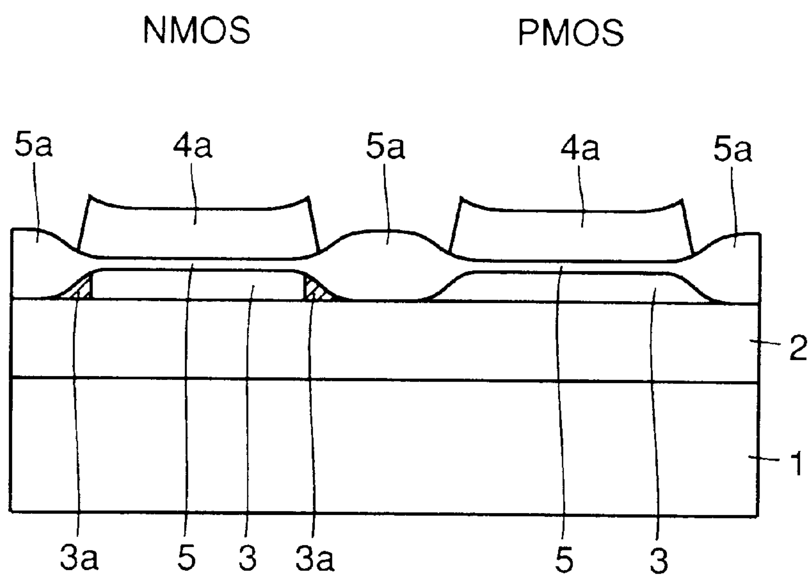

As shown in FIG. 148, SOI layer 3 is selectively oxidized under the temperature condition of about 950° C. using nitride films 4a as a mask, so that LOCOS oxide films 5a are formed. LOCOS oxide films 5a have lower surfaces extended up to the upper surface of buried oxide film 2.

Figure 149:
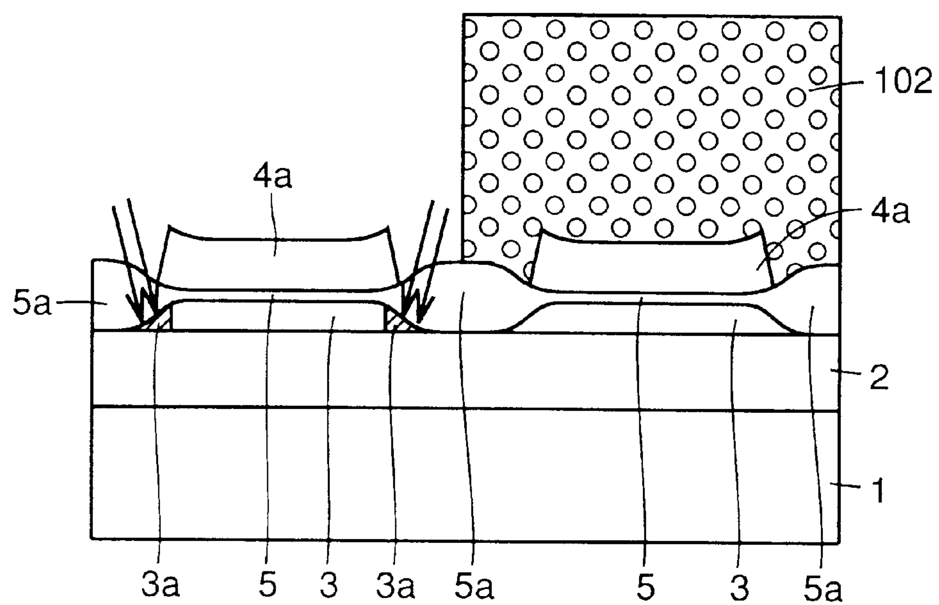
Figure 150:
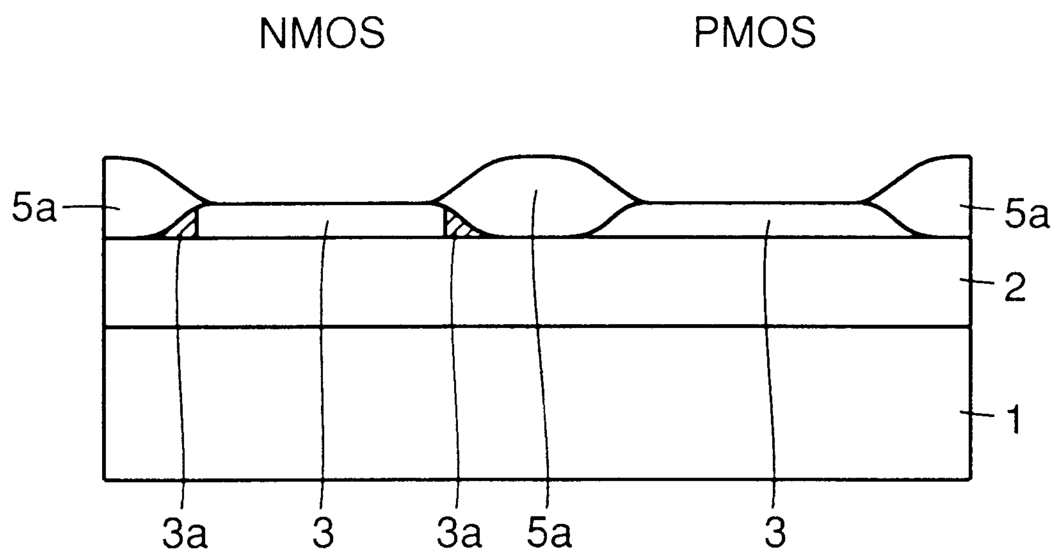

Then, as shown in FIG. 149, resist 102 is formed again over the PMOS region. Using resist 102 and nitride films 4a as a mask, boron ions are implanted into the NMOS region with the implantation energy of 50–60 keV and impurity concentration of $3\times10^{13}$–$15\times10^{13}/cm^2$ using the continuous rotary implantation method. Thereby, it is possible to prevent reduction of the boron concentration at isolation regions 3a which may be caused by the fact that impurity implanted as already described with reference to FIG. 147 is absorbed into LOCOS oxide film 5a during formation of LOCOS oxide film 5a. Consequently, generation of the parasitic transistor can be prevented effectively. Thereafter, resist 102 is removed. Subsequently, nitride films 4a and oxide films 5a are removed, so that a structure shown in FIG. 150 is formed.

Figure 151:
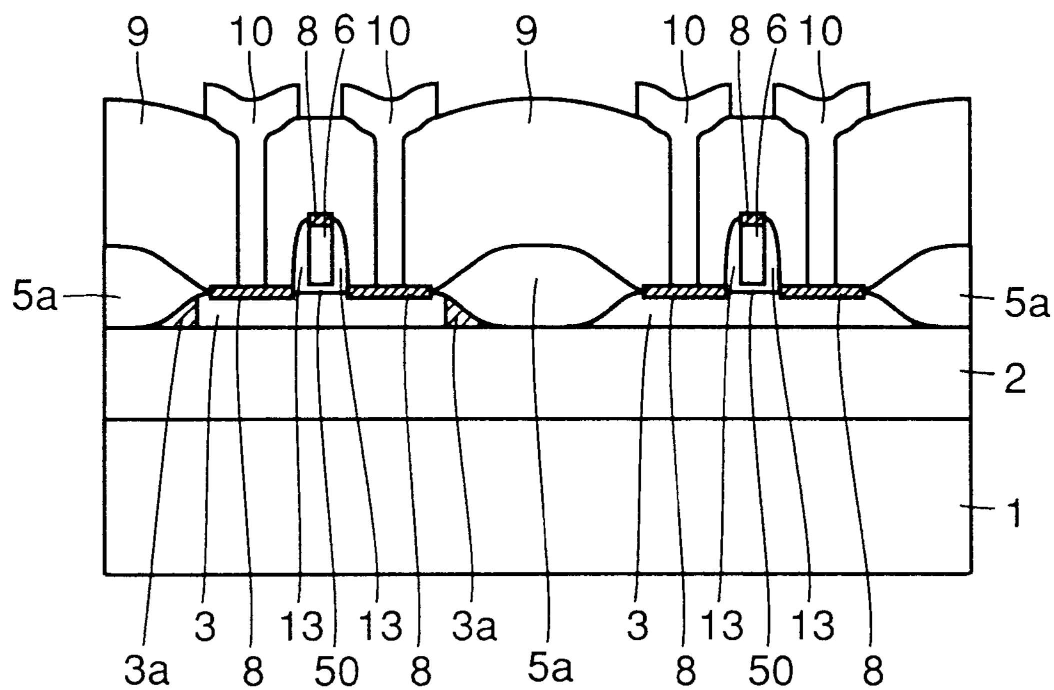
Figure 152:
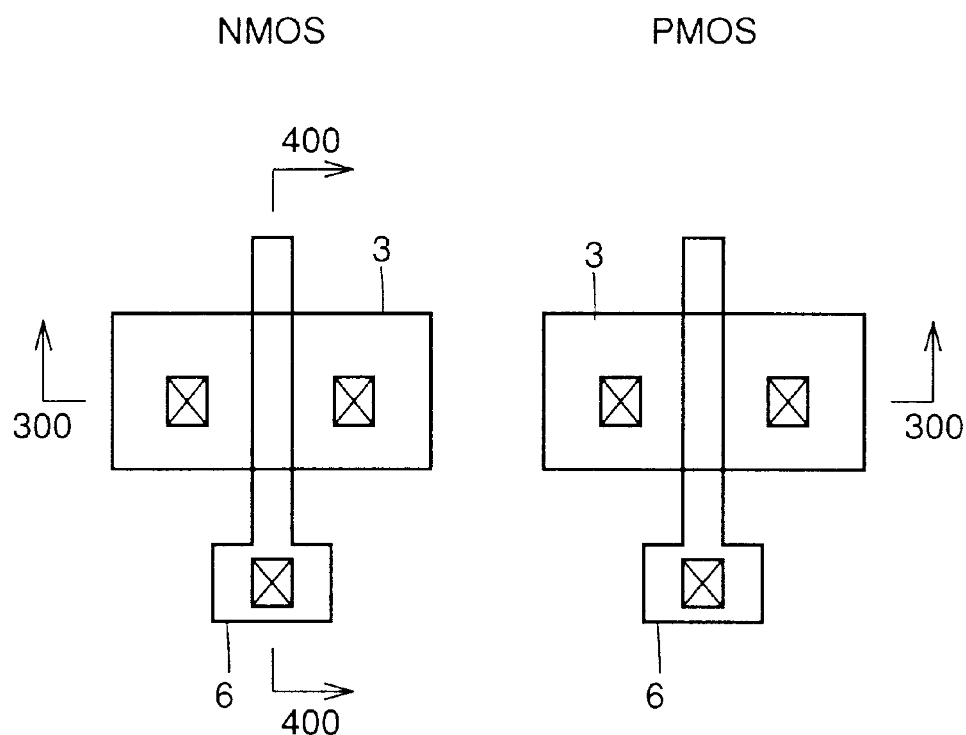
FIG. 152 is a plan showing a structure shown in FIG. 151.
Figure 153:
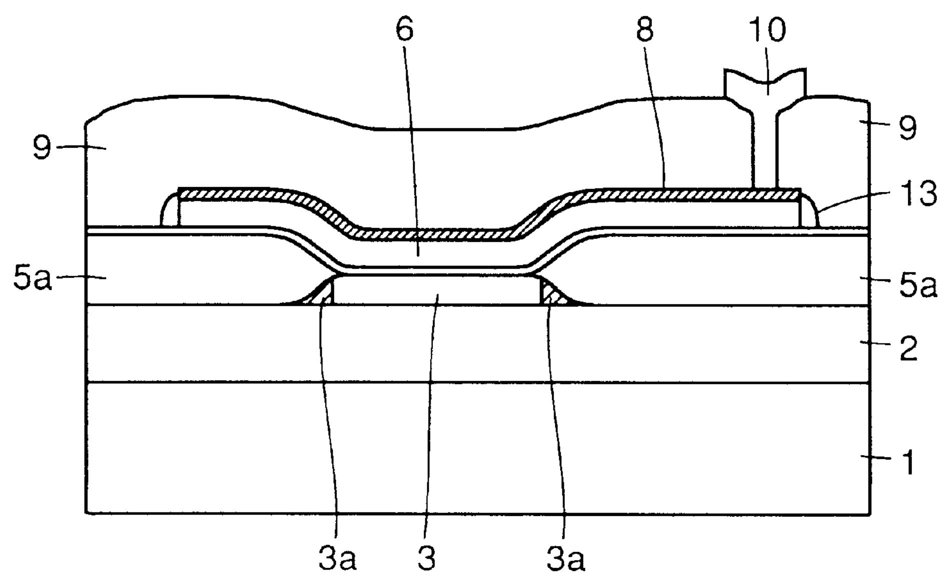
FIG. 153 is a cross section taken along line 400—400 in FIG. 152.

Thereafter, as shown in FIG. 151, gate electrodes 6 are formed on SOI layers 3 with gate oxide films 50 therebetween, and then side wall oxide films 13 are formed in contact with the opposite surfaces of each gate electrode 6. After forming metal silicide layers 8 on gate electrodes 6 and source/drain regions of SOI layer 3, interlayer insulating film 9 is formed over the whole surface. Contact holes are formed at predetermined regions of interlayer insulating film 9. Interconnection layers 10 filling the contact holes are formed. The gate electrode 6 is formed of a polycrystalline silicon layer containing phosphorus at an impurity region not lower than $1\times10^{20}/cm^2$. The purpose of silicide layer 8 is to lower the resistances of the source/drain regions and gate electrode 6. A major component of interconnection layer 10 is aluminum or copper. FIG. 151 is a cross section taken along line 300—300 in the plan of FIG. 152, and FIG. 153 is a cross section taken along line 400—400 in FIG. 152.

According to the method of manufacturing the semiconductor device of the twenty-sixth embodiment, since the ion implantation is performed for forming isolation regions 3*a* of SOI layers 3 after forming LOCOS oxide films 5*a*, it is possible to prevent absorption of the impurity in the isolation regions 3*a* into LOCOS oxide films 5*a* during formation of LOCOS oxide films 5*a*. As a result, it is possible to prevent lowering of a threshold voltage of a parasitic transistor.

Figure 154:
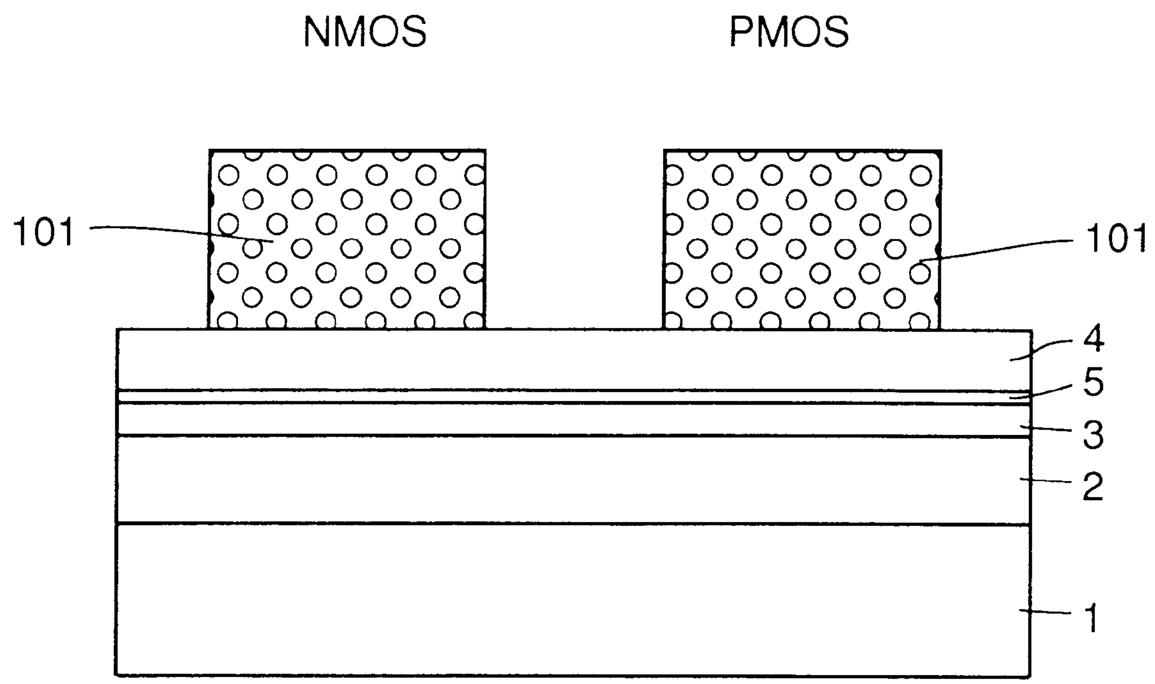
FIGS. 154 to 160 are cross sections showing 1st to 7th steps in a process of manufacturing a semiconductor device according to a twenty-seventh embodiment of the invention, respectively.
Figure 155:
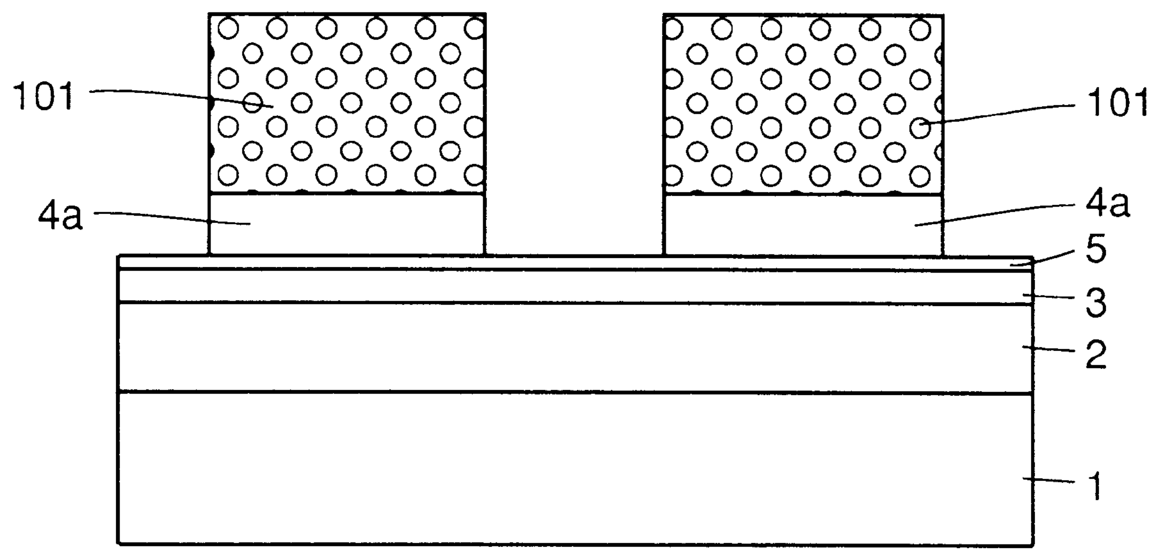
Figure 156:
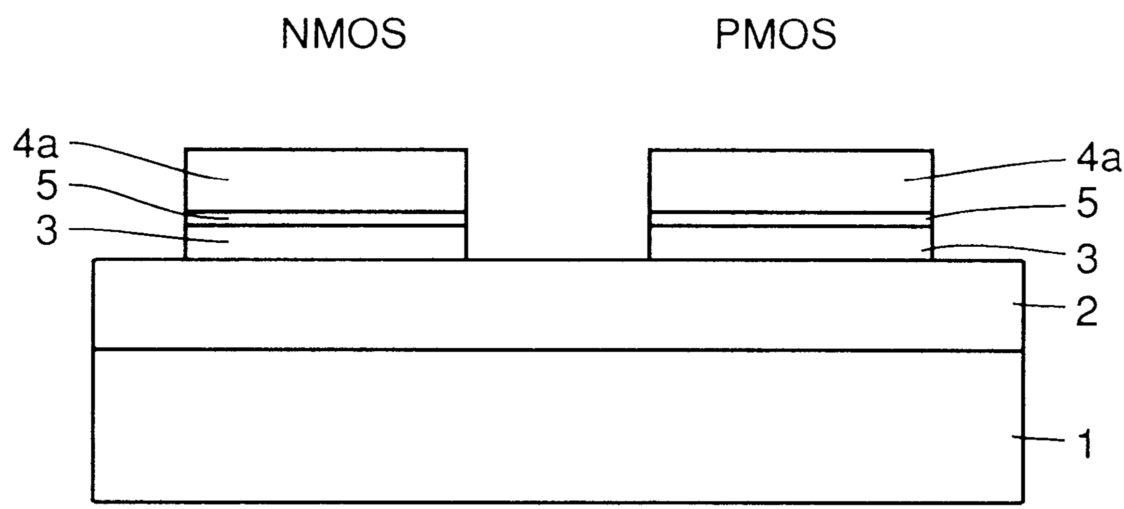

A process of manufacturing a semiconductor device of a twenty-seventh embodiment will be described below with reference to FIGS. 154 to 162. A process from the initial step to the step of forming resist 101 shown in FIG. 154 is performed in a manner similar to the manufacturing process of the twenty-sixth embodiment shown in FIG. 146. Using the resist 101 as a mask, dry etching is effected on nitride film 4 to form patterned nitride films 4*a* as shown in FIG. 155. Thereafter, resist 101 is removed. Using nitride films 4*a* as a mask, anisotropic etching is effected on oxide film 5 and SOI layer 3 to form a structure shown in FIG. 156.

Figure 157:
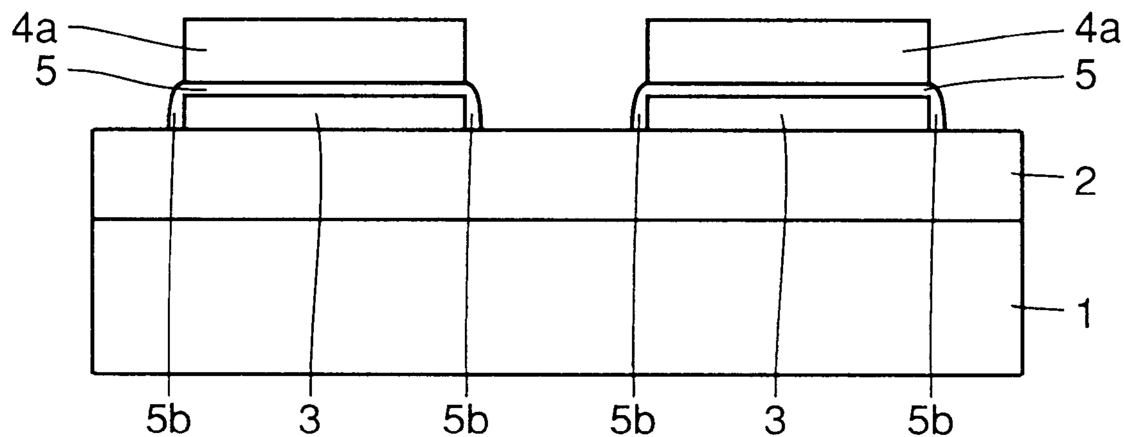

Thereafter, using nitride film 4*a* as a mask, side surfaces of each SOI layer 3 are oxidized to form oxide films 5*b* as shown in FIG. 157. Owing to formation of oxide films 5*b*, it is possible to remove regions at the side portions of SOI layer 3 damaged by the anisotropic etching.

Figure 158:
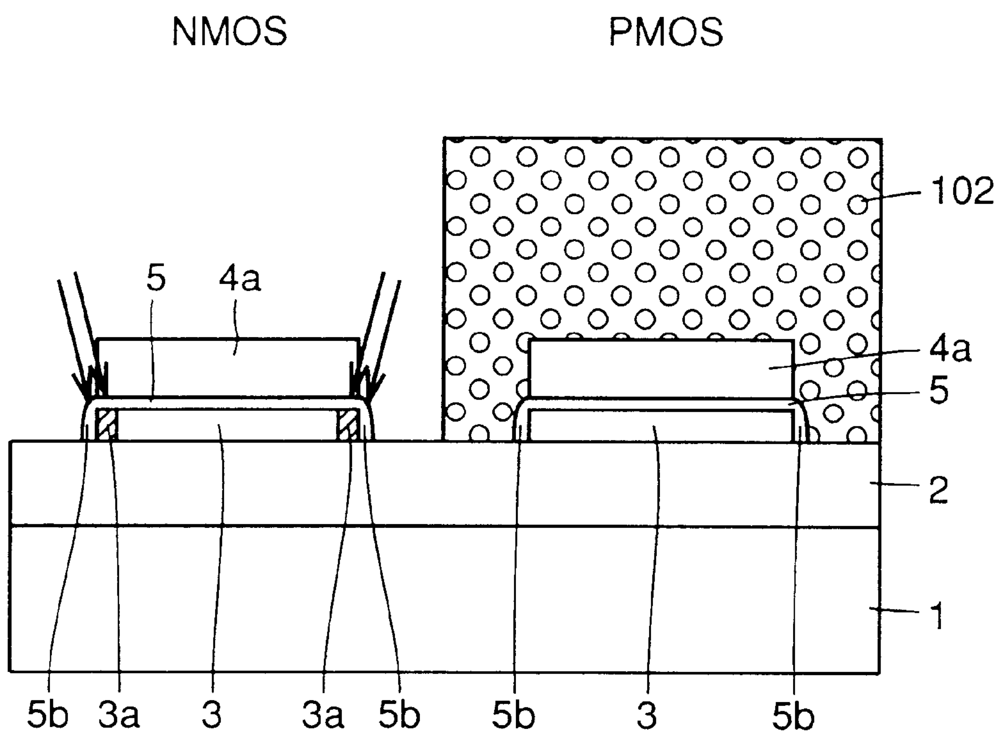
Figure 159:
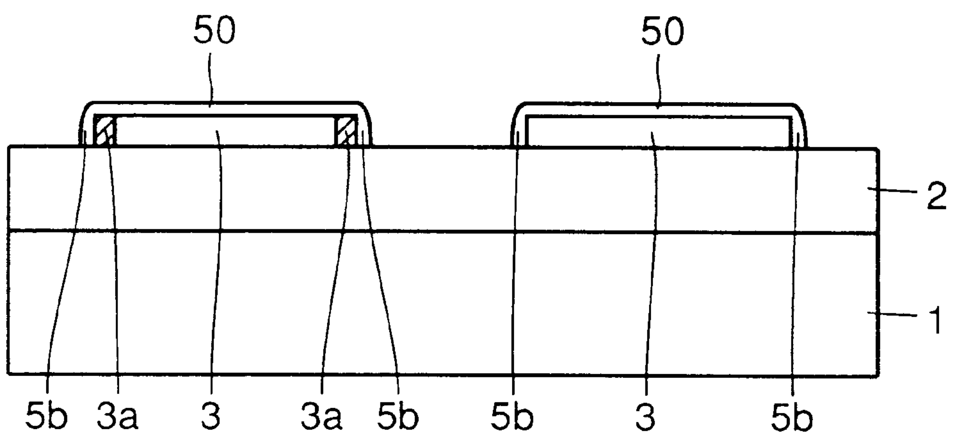
Figure 160:
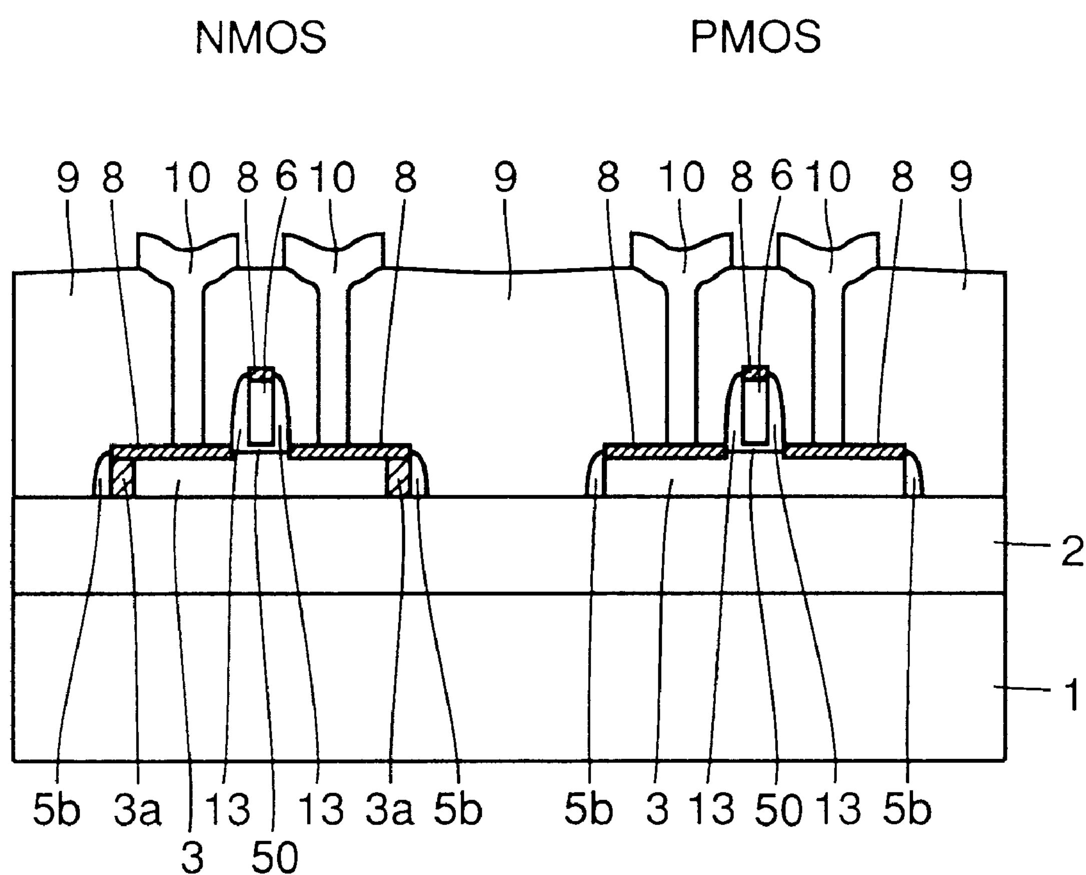
Figure 161:
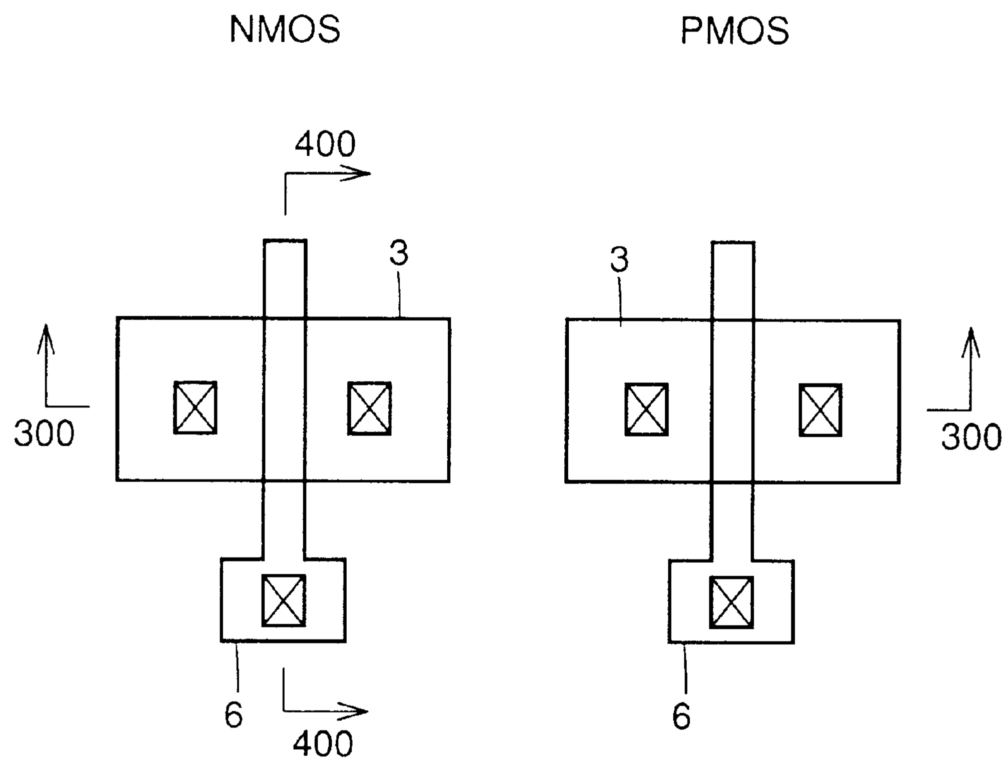
FIG. 161 is a plan showing a structure shown in FIG. 160.
Figure 162:
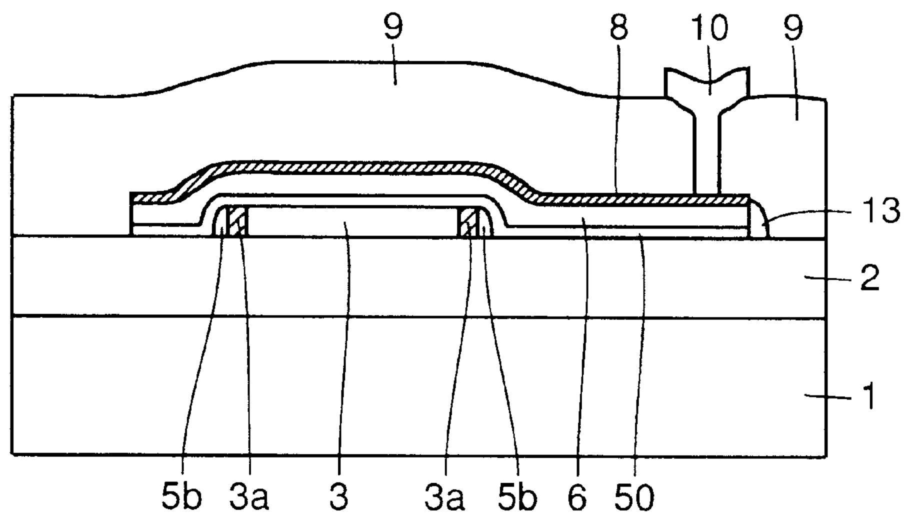
FIG. 162 is a cross section taken along line 400—400 in FIG. 161.

Then, as shown in FIG. 158, resist 102 is formed over the PMOS region. Using resist 102 and nitride film 4*a* at the NMOS region as a mask, boron ions are implanted into the side portions of SOI layer 3 at the NMOS region by the continuous rotary implantation method with the implantation energy of 30–40 keV and the implantation concentration of $3\times10^{13}$–$15\times10^{13}/cm^2$. Thereby, isolation regions 3*a* are formed. Thereafter, resist 102 is removed. After removing nitride films 4*a* and oxide films 5, gate oxide films 50 are formed again on the upper surfaces of SOI layers 3 as shown in FIG. 159. Thereafter, a process similar to the manufacturing process of the twenty-sixth embodiment already described with reference to FIG. 151 is performed to form the structure shown in FIG. 160. FIG. 161 is a plan showing a structure in FIG. 160, and FIG. 160 is a cross section taken along line 300—300 in FIG. 161. FIG. 162 is a cross section taken along line 400—400 in FIG. 161.

Figure 163:
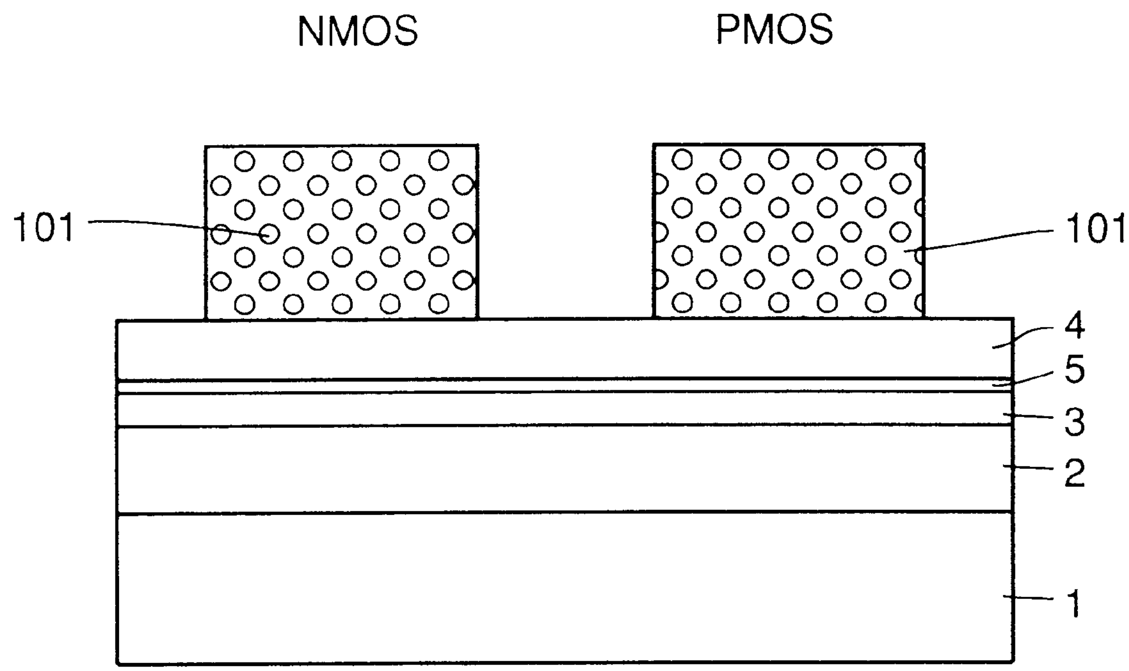
FIGS. 163 to 170 are cross sections showing 1st to 8th steps in a process of manufacturing a semiconductor device according to a twenty-eighth embodiment of the invention, respectively.
Figure 164:
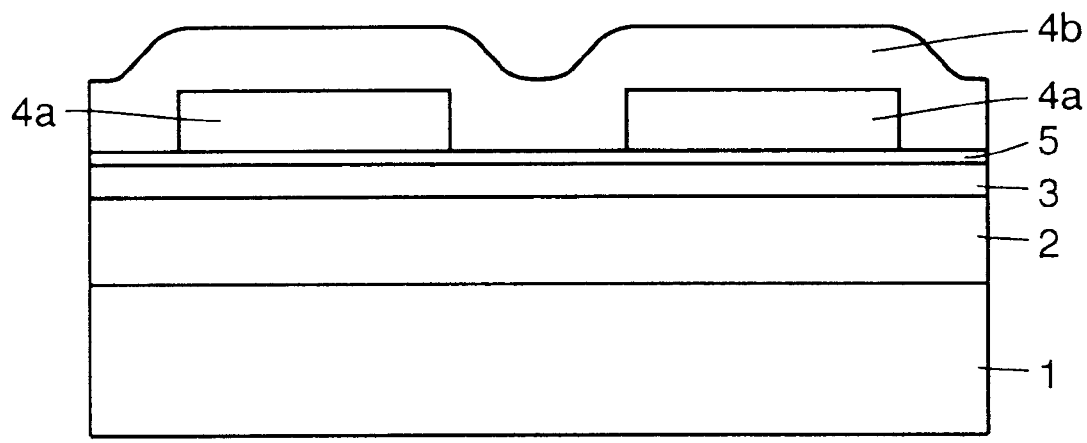
Figure 165:
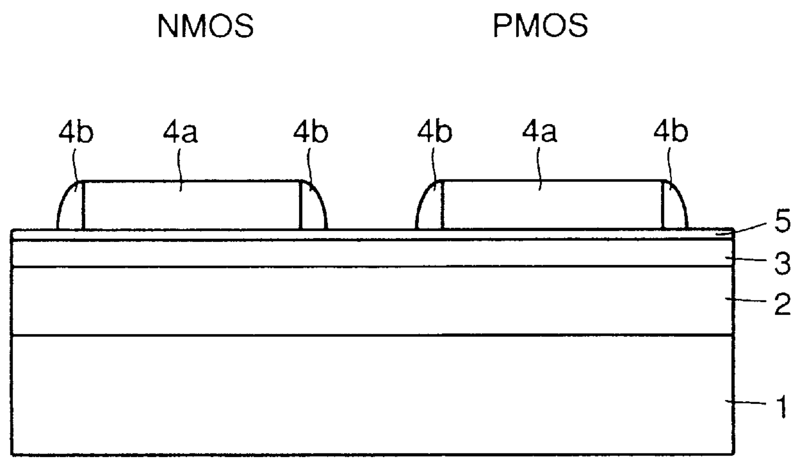
Figure 166:
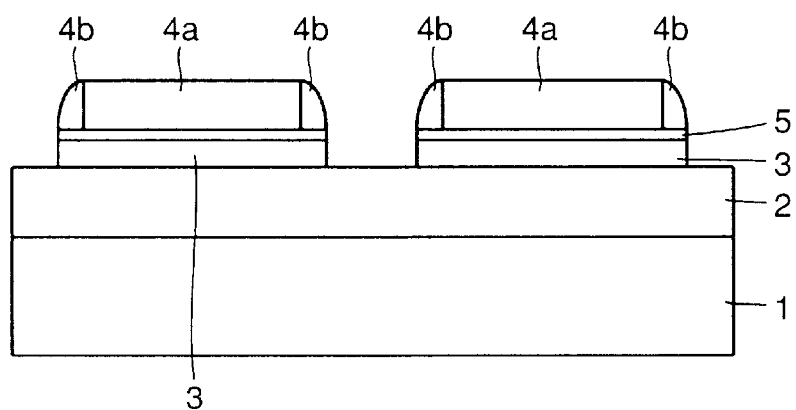
Figure 167:
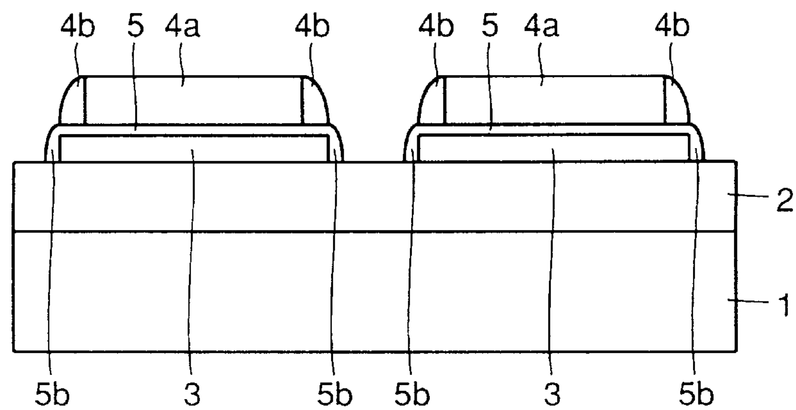

Referring to FIGS. 163 to 172, a manufacturing process of a semiconductor device of a twenty-eighth embodiment will be described below. A process from the initial step to the step of forming resist 101 shown in FIG. 163 is performed in a manner similar to the manufacturing process of the twenty-sixth embodiment shown in FIG. 146. Using the resist 101 as a mask, anisotropic etching is effected on nitride film 4 to form patterned nitride films 4*a* as shown in FIG. 164. After removing resist 101, nitride film 4*b* of about 1000 Å in thickness is formed. Nitride film 4*a* is anisotropically etched to form side wall nitride films 4*b* in a self-aligned manner as shown in FIG. 165. Provision of side wall nitride films 4*b* prevents reduction of the active region of SOI layer 3, which may be caused by oxidation of the side walls of SOI layer 3 in a later step. Thereafter, using nitride films 4*a* and side wall nitride films 4*b* as a mask, anisotropic etching is effected on oxide films 5 and SOI layers 3, so that a structure shown in FIG. 166 is obtained. Further, using nitride films 4*a* and side wall nitride films 4*b* as a mask, side surfaces of SOI layers 3 are oxidized to form oxide films 5*b* as shown in FIG. 167. Owing to formation of oxide films 5*b*, it is possible to remove regions at the side portions of SOI layers 3 damaged by the anisotropic etching.

Figure 168:
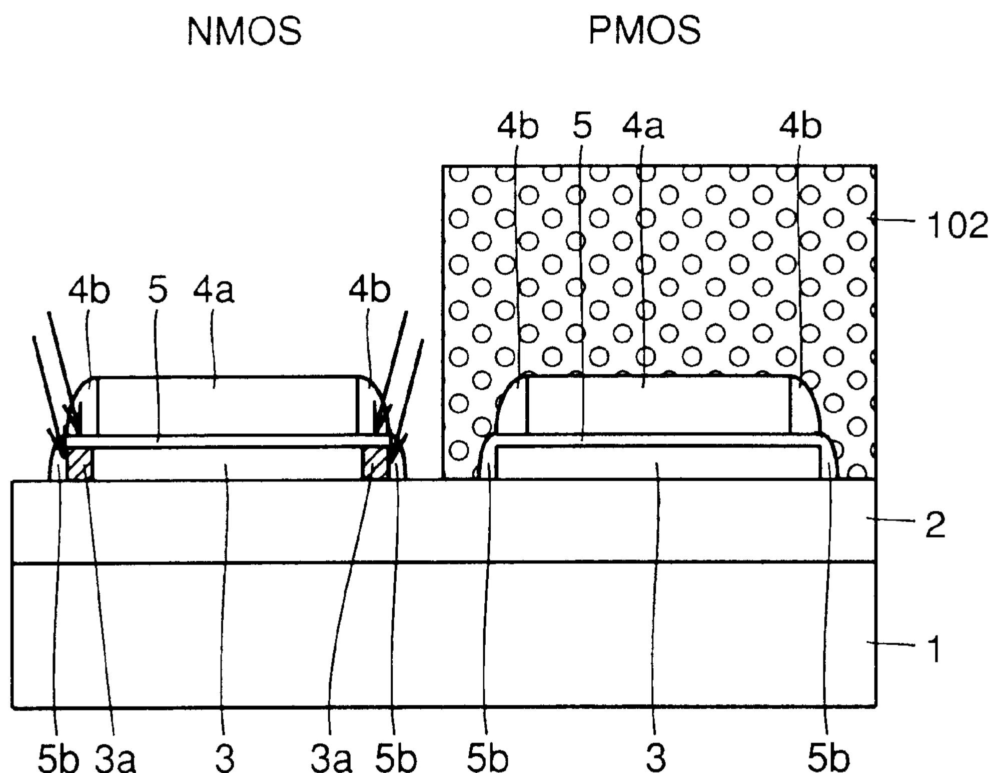
Figure 169:
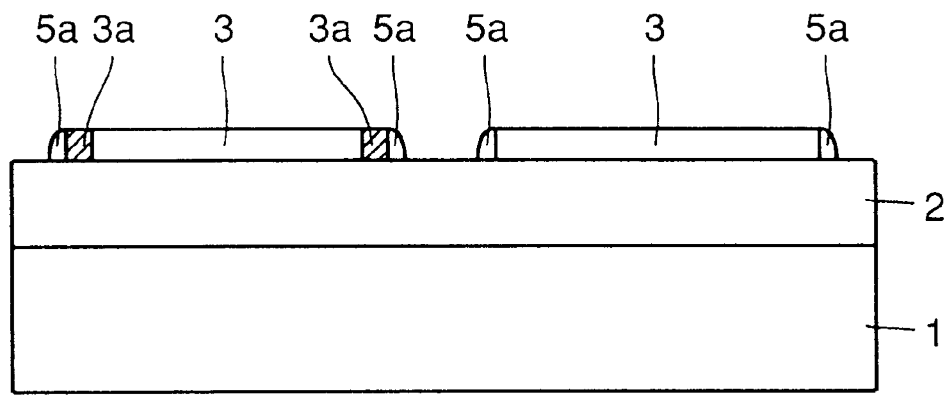
Figure 170:
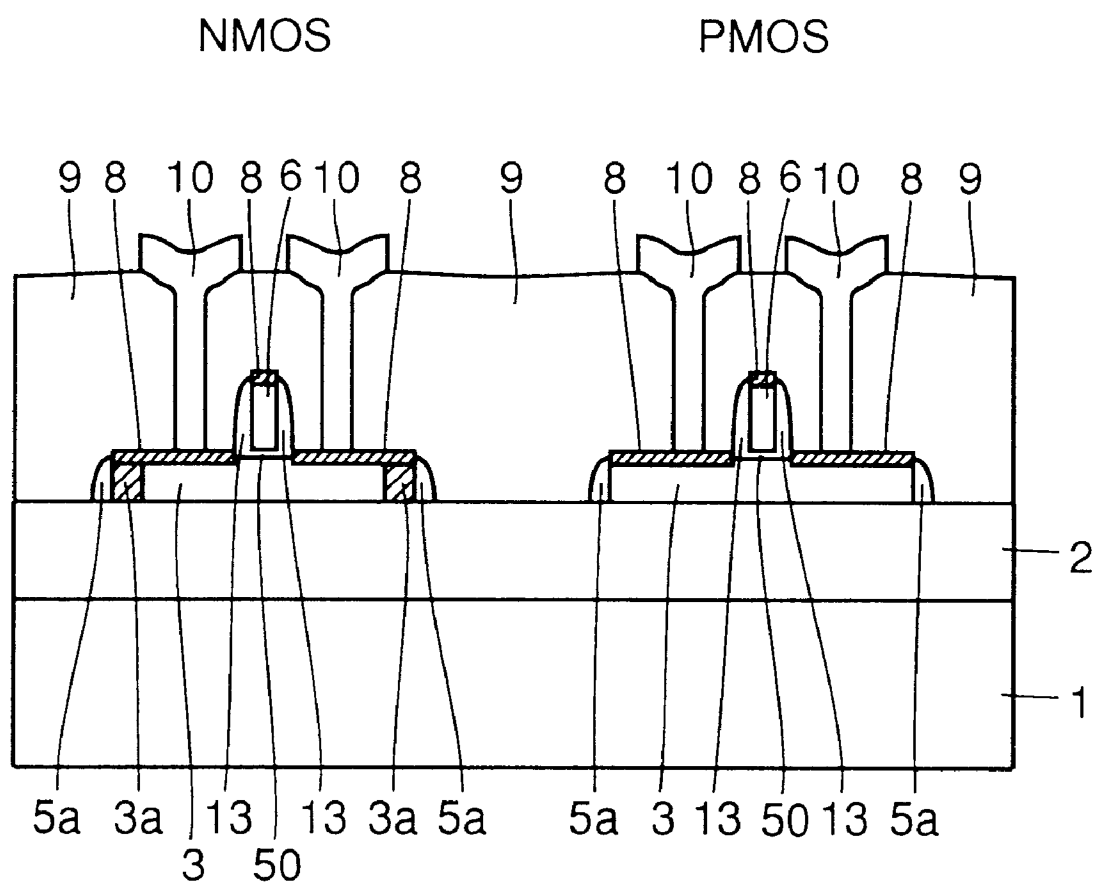
Figure 171:
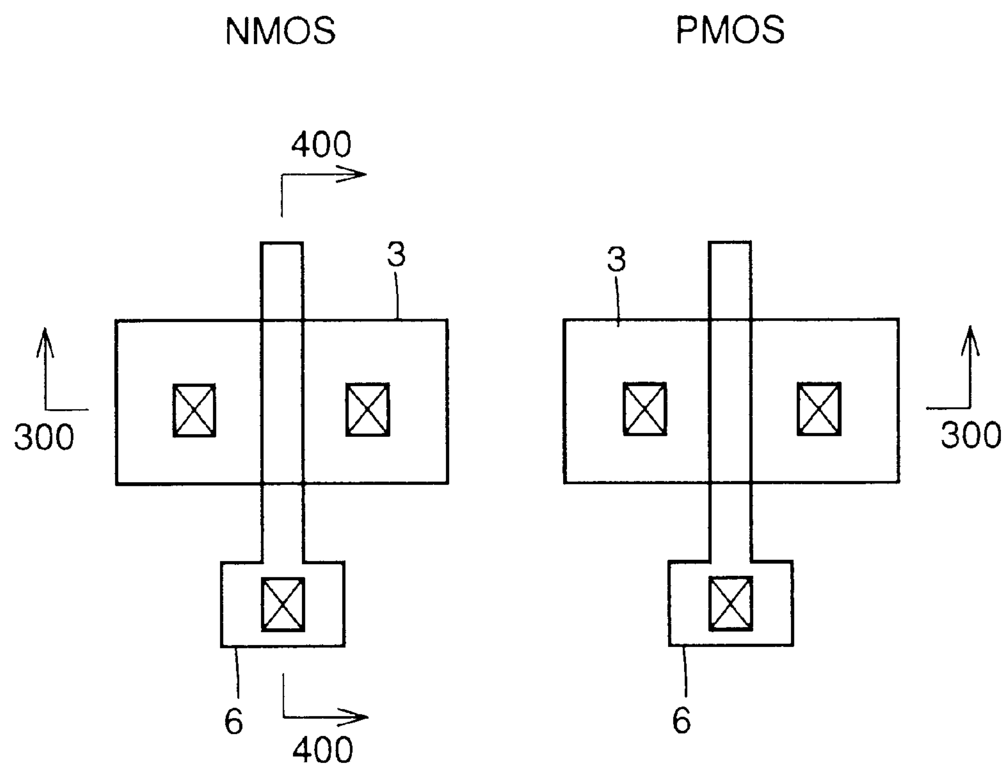
FIG. 171 is a plan showing a structure shown in FIG. 170.
Figure 172:
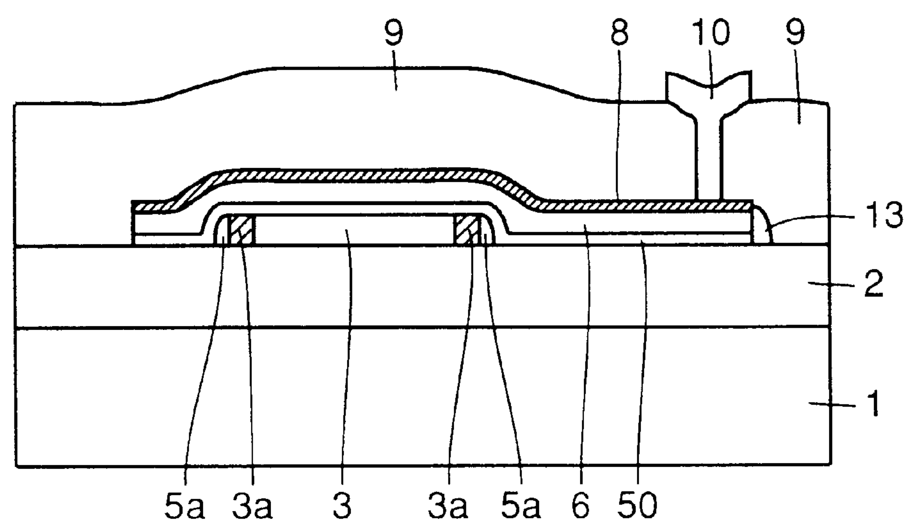
FIG. 172 is a cross section taken along line 400—400 in FIG. 171.
Figure 176:
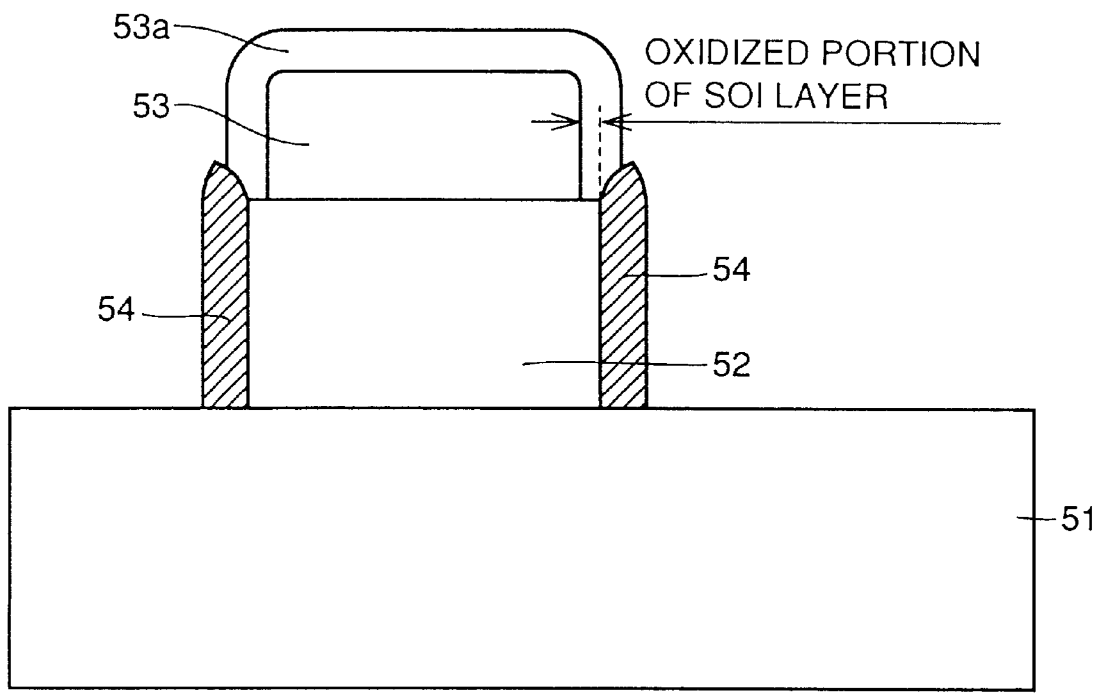

Then, as shown in FIG. 168, resist 102 is formed over the PMOS region. Using resist 102 and nitride films 4*a* and 4*b* at the NMOS region as a mask, boron ions are implanted into the side portions of SOI layers 3 at the NMOS region by the continuous rotary implantation method with the implantation energy of 30–80 keV and the implantation concentration of $3\times10^{13}$–$15\times10^{13}/cm^2$. Thereby, isolation regions 3*a* are formed. Isolation regions 3*a* suppresses generation of the parasitic transistor. Thereafter, resist 102 is removed. Nitride films 4*a* and 4*b* as well as oxide films 5 are removed to form a structure shown in FIG. 169. Thereafter, a process similar to the manufacturing process of the twenty-sixth embodiment already described with reference to FIG. 151 is performed, so that a structure shown in FIG. 170 is completed. FIG. 171 is a plan showing a structure in FIG. 170, and FIG. 170 is a cross section taken along line 300—300 in FIG. 171. FIG. 172 is a cross section taken along line 400—400 in FIG. 171. In this manner, the semiconductor device of the twenty-eighth embodiment is completed In a twenty-ninth embodiment, as shown in FIG. 176, a buried oxide film 52 is formed at a predetermined region on a silicon substrate 51, and an SOI layer 53 is formed on buried oxide film 52. An oxide film 53*a* is formed over the surface of SOI layer 53. There are formed nitride films 54 which are in contact with side surfaces of buried oxide film 52 and have upper portions of a predetermined height protruding beyond the upper surface of buried oxide film 52. Owing to provision of nitride films 54, it is possible to prevent movement of oxidant up to a rear surface of SOI layer 53 when oxidizing SOI layer 53 with the oxidant for forming oxide film 53*a*. Thereby, it is possible to prevent application of a stress to SOI layer 53, which may be caused by formation of an oxide film at the rear surface of SOI layer 53. Thereby, it is possible to prevent generation of a leak current of a transistor formed in SOI layer 53. The portion of nitride film 54 protruding beyond the upper surface of buried oxide film 52 has the height equal to a thickness of the oxidized side portion of SOI layer 53.

Figure 173:
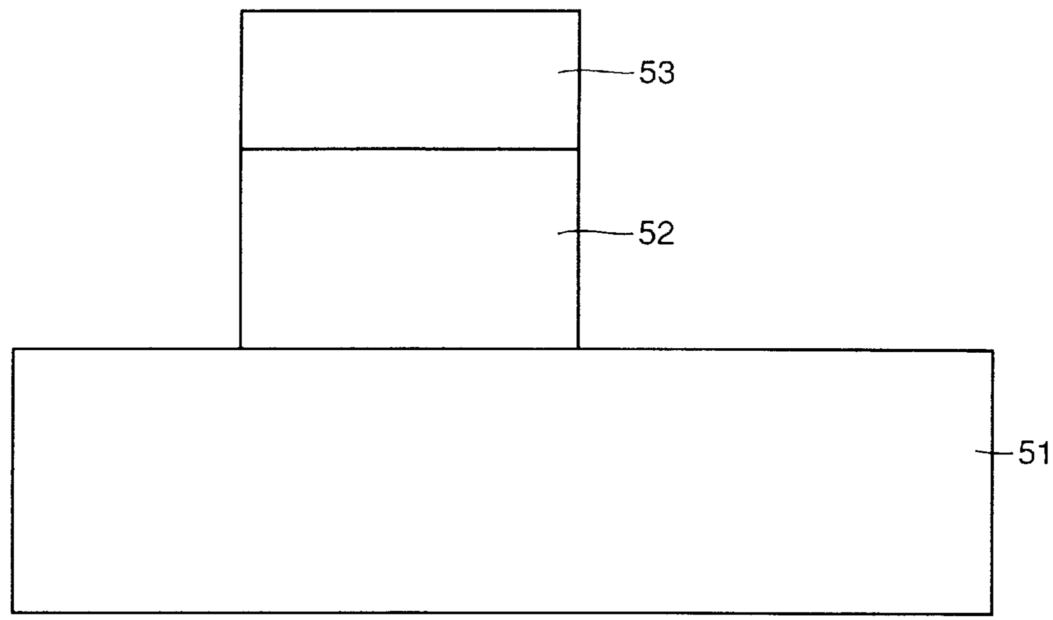
FIGS. 173 to 176 are cross sections showing 1st to 4th steps in a process of manufacturing a semiconductor device according to a twenty-ninth embodiment of the invention, respectively.

A process of manufacturing the semiconductor device of the twenty-ninth embodiment will be described below with reference to FIGS. 173 to 176. Referring to FIG. 173, a buried oxide film (not shown) is formed on silicon substrate 51, and an SOI layer (not shown) is formed on the buried oxide film The SOI layer and buried oxide film are etched to form patterned SOI layer 53 and buried oxide film 52.

Figure 174:
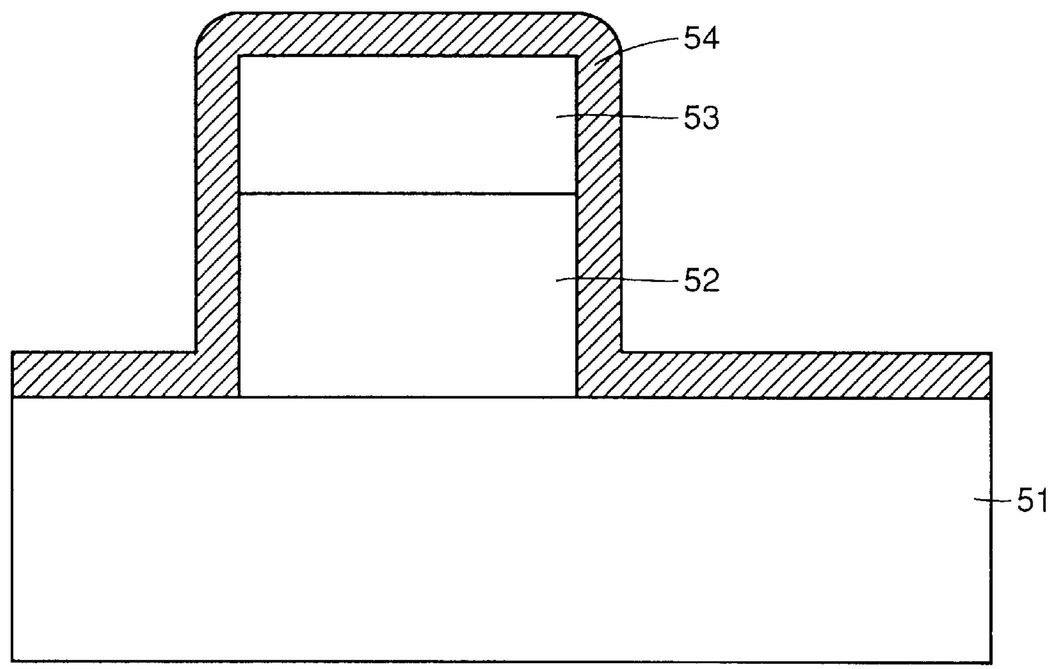

Thereafter, as shown in FIG. 174, nitride film 54 is formed over silicon substrate 51, buried oxide film 52 and SOI layer 53. In order to prevent direct contact of nitride film 54 with SOI layer 53, an oxide film of about 100 Å in thickness may be formed between nitride film 54 and SOI layer 53.

Nitride film 54 is etched back to form nitride films 54 which are in contact with side surfaces of buried oxide film

Figure 175:
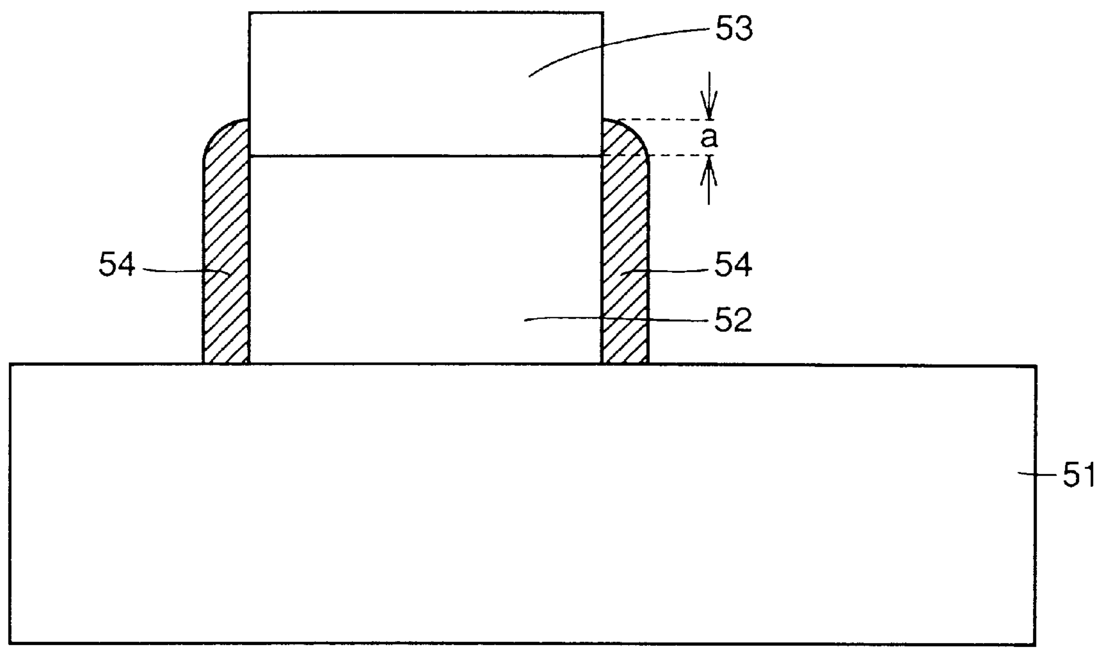

52 and lower portions of side surfaces of SOI layer 53 as shown in FIG. 175. Here, a height or length (a) of the portion of nitride film 54 which is in contact with the side surface of SOI layer 53 is substantially equal to the thickness of the portion of SOI layer 53 to be oxidized. The reason for this is as follows. If the length (a) were shorter than the thickness of the portion of SOI layer 53 to be oxidized, oxidant would move up to the rear surface of SOI layer 53 when oxidizing SOI layer 53. Therefore, at least an upper end of nitride film 54 must be located above the bottom surface of SOI layer 53. If the length (a) were longer than the thickness of the portion of SOI layer 3 to be oxidized, a lower portion of the side wall of SOI layer 53 would be left without being oxidized. Therefore, it is preferable that the length (a) is substantially equal to the thickness of the portion of SOI layer 53 to be oxidized.

In the state shown in FIG. 175, oxidation is performed using nitride films 54 as a mask, so that only the supper and side surfaces of SOI layer 53 are oxidized. Thereby, oxide film 53*a* is formed as shown in FIG. 176. The purpose of this oxidation is to change the side portions of SOI layer 53, which were damaged by the etching for the patterning, into the oxide films for preventing deterioration of transistor characteristics.

Figure 177:
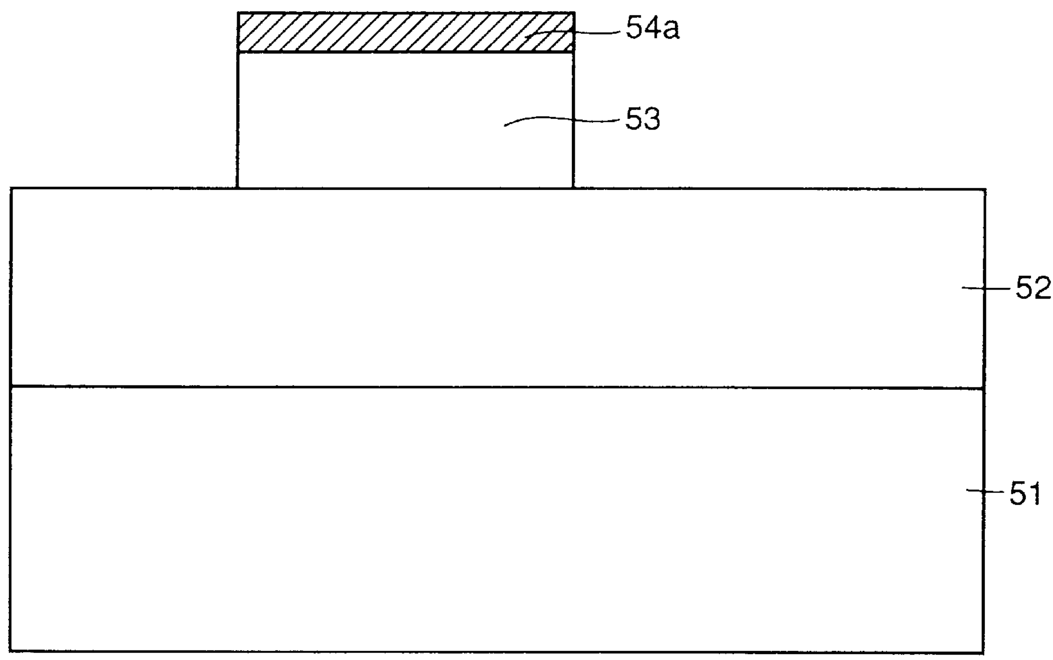
FIG. 177 is a cross section showing a disadvantage in the case where a nitride film is not arranged at a lower side portion of an SOI layer.
Figure 178:
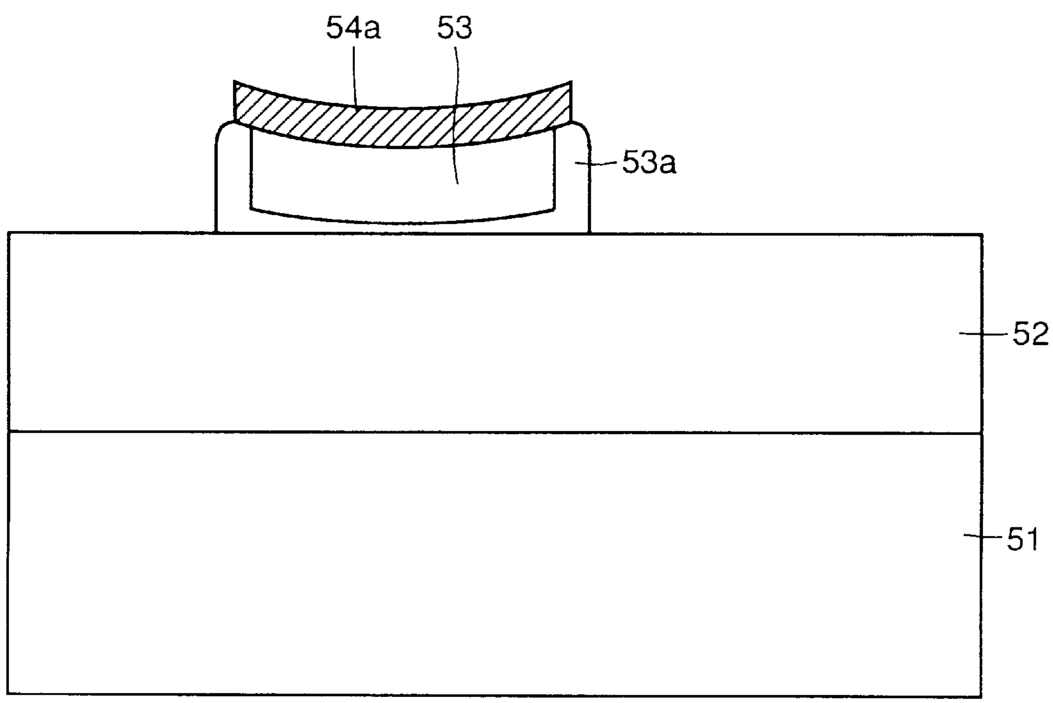
FIG. 178 is a cross section showing a structure formed by oxidizing the structure shown in FIG. 177.
Figure 179:
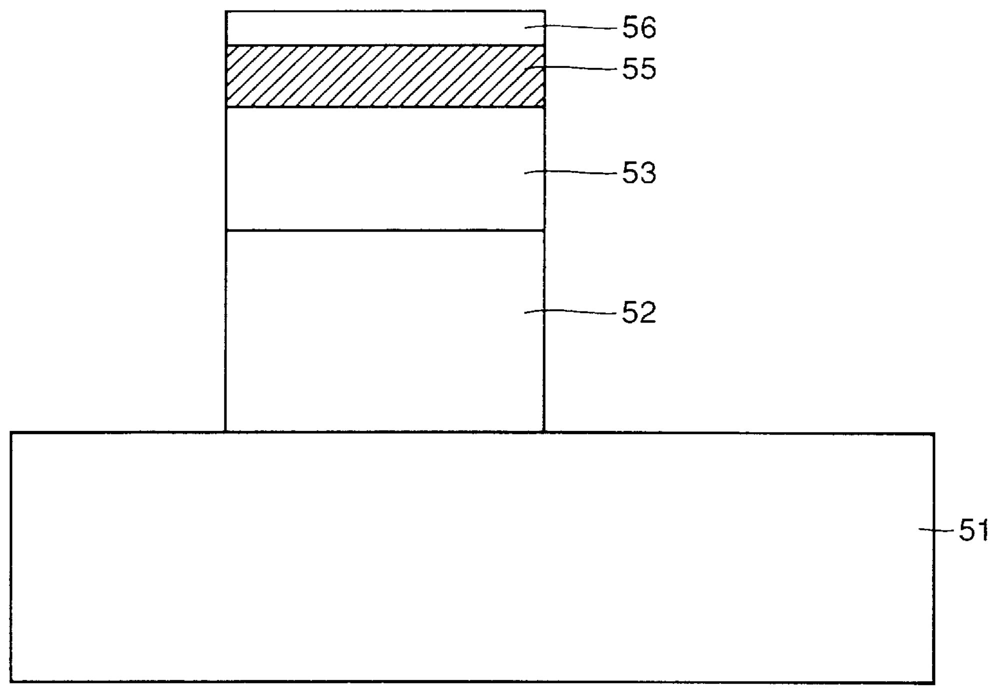
FIGS. 179 to 182 are cross sections showing 1st to 4th steps in a process of manufacturing a semiconductor device according to a thirtieth embodiment of the invention, respectively.

If nitride films 54 were not formed at the lower side portion of SOI layer 53, a disadvantage would occur as will be described below with reference to FIGS. 177 and 178. In the following description, it is assumed that SOI layer 53 is formed at a predetermined region on buried oxide film 52, and nitride films 54 are formed only on the upper surface of SOI layer 53. In this case, if SOI layer 53 were oxidized using nitride film 54*a* as a mask, the oxidant would move up to the rear surface of SOI layer 53 as shown in FIG. 178, so that a bird's-beak-like oxide film would be formed at the rear surface of SOI layer 53. As a result, a stress would be applied to the rear surface of SOI layer 53, resulting in a problem generation of a leak current of the SOI transistor. In order to prevent this disadvantage, in the twenty-ninth embodiment, nitride films 54 are formed in contact with the side surfaces of buried oxide film 52 and lower portions of the side surfaces of SOI layer 53 as shown in FIG. 175. Thereby, it is possible to prevent the oxidant from moving to the lower surface of SOI layer 53 during oxidation of SOI layer 53, so that the leak current of the SOI transistor can be prevented.

Figure 182:
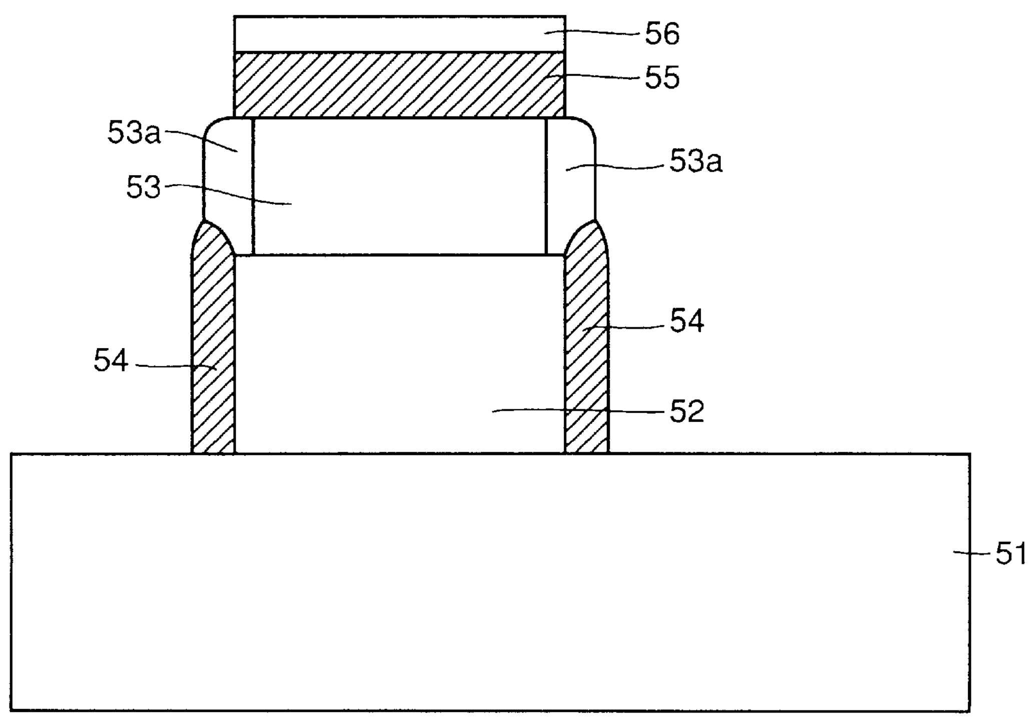

In a thirtieth embodiment, as shown in FIG. 182, a nitride film 55 is formed also on the upper surface of SOI layer 53, which is different from the twenty-ninth embodiment shown in FIG. 176. Further, an etching stopper film 56 is formed on nitride film 55. Owing to this structure, oxide films 53*a* can be formed in contact with the side surfaces of SOI layer 53. Thereby, it is possible to eliminate a later step of removing the oxide film formed on the upper surface of SOI layer 53.

Referring to FIGS. 179 to 182, a manufacturing process of the semiconductor device of the thirtieth embodiment will be described below. First, the buried oxide film, SOI layer, nitride film and etching stopper layer are successively formed on the main surface of silicon substrate 51, and then are patterned to form patterned etching stopper film 56, nitride film 55, SOI layer 53 and buried oxide film 52. A thin oxide film may be interposed between SOI layer 53 and nitride film 55.

Figure 180:
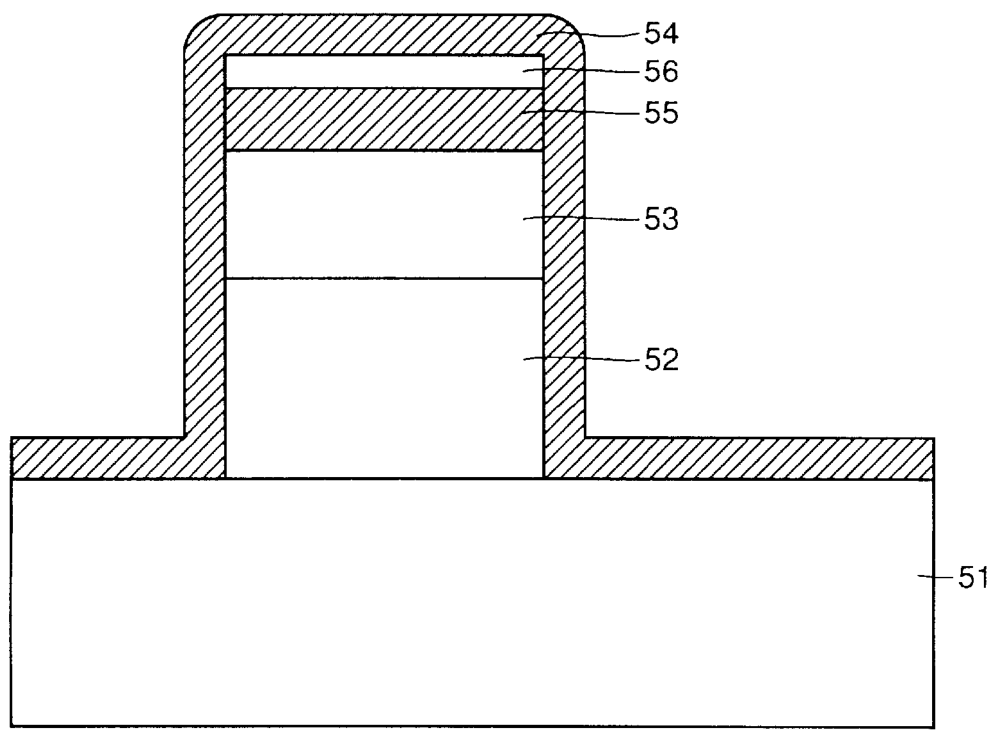
Figure 181:
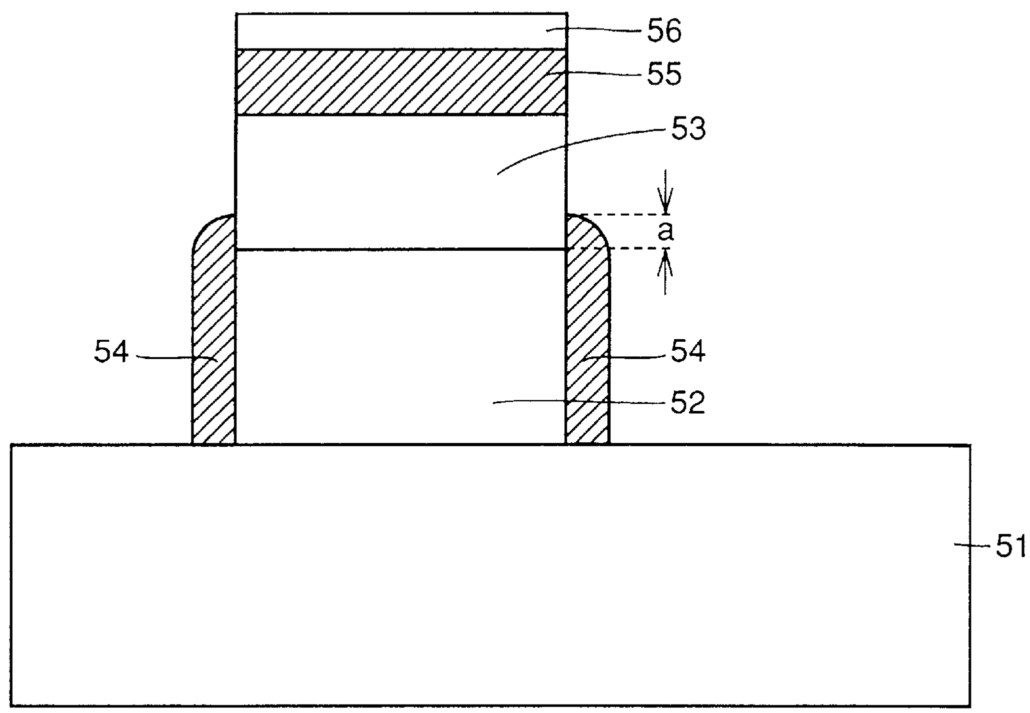

Thereafter, nitride film 54 is formed over the whole surface as shown in FIG. 180. Nitride film 54 is etched back to form nitride films 54 which are in contact with side surfaces of buried oxide film 52 and lower portions of side surfaces of SOI layer 53. Etching stopper film 56 is used as the etching stopper during this etch-back of nitride film 54. Therefore, it may be formed of any material provided that it can have a large etching selection ratio with respect to the nitride film 54. For example, it may be a silicon oxide film or a polycrystalline silicon film The length (a) of the upper end of nitride film 54 is set to satisfy the same conditions as the twenty-ninth embodiment. Thereafter, SOI layer 53 is oxidized using nitride films 54 and 55 as a mask. Thereby, oxide films 53*a* can be formed only at the side portions of SOI layer 53.

Figure 184:
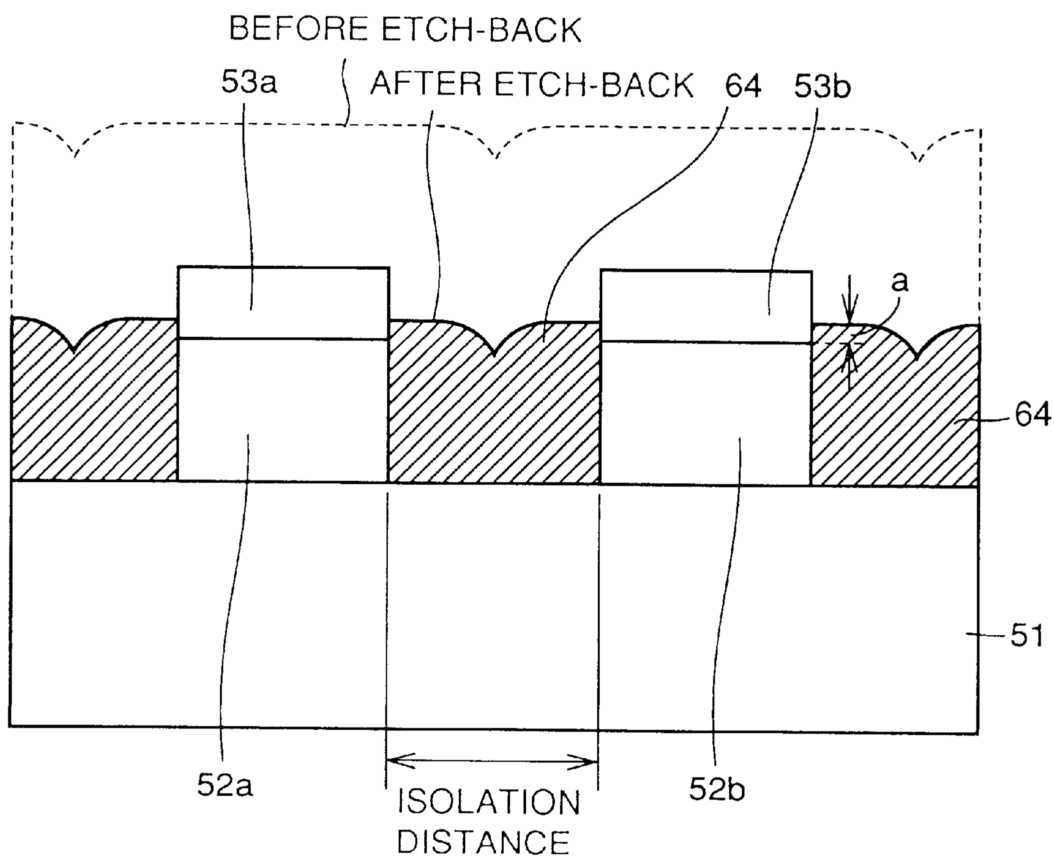

Referring to FIG. 184, a thirty-first embodiment is provided with a nitride film 64 filling a space defined between buried oxide films 52*a* and 52*b* which are spaced by a predetermined distance as well as a between SOI layers 53*a* and 53*b* which are located on buried oxide films 52*a* and 52*b*, respectively. This can reduce a level difference between the upper surfaces of SOI layers 53*a* and 53*b* on buried oxide films 52*a* and 52*b* and the main surface of silicon substrate 51. As a result, a structure having a small level difference can be formed.

Figure 183:
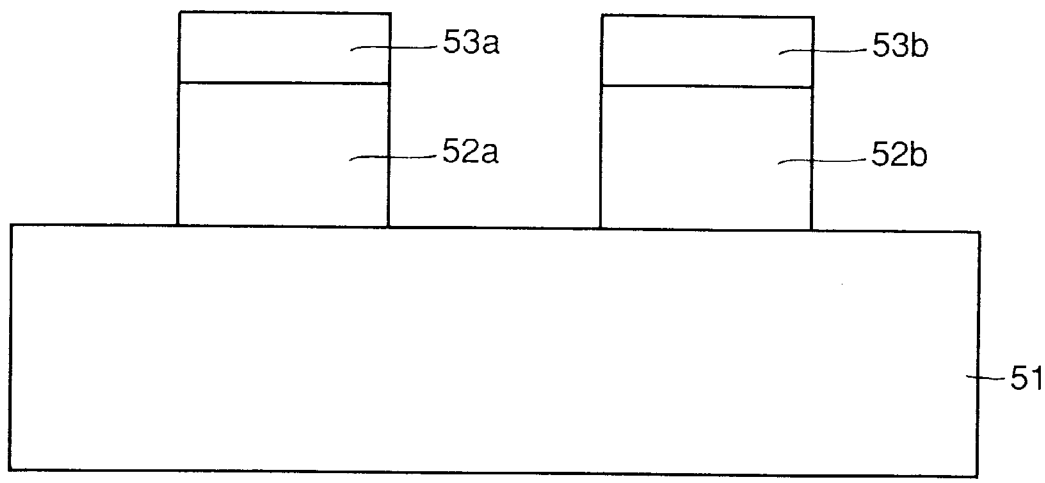
FIGS. 183 and 184 are cross sections showing 1st and 2nd steps in a process of manufacturing a semiconductor device according to a thirty-first embodiment of the invention, respectively.

Referring to FIGS. 183 and 184, a manufacturing process of the semiconductor device of a thirty-first embodiment will be described below. As shown in FIG. 183, buried oxide films 52*a* and 52*b* are formed at predetermined regions of silicon substrate 51 with a predetermined space between each other, and SOI layers 53*a* and 53*b* are formed thereon. Nitride film 64 is formed over the whole surface as shown in FIG. 184, and then is etched back. In order to fill the isolation regions with nitride film 64, a thickness of deposited nitride film 64 must be larger than half the length of the isolation region. The length (a) of the portion of nitride film 64 which is in contact with the side surfaces of SOI layers 53*a* and 53*b* after the etch-back is set to satisfy the same conditions as the foregoing twenty-ninth and thirtieth embodiments. Thereby, it is possible to prevent movement of oxidant up to the rear surfaces of SOI layers 53*a* and 53*b* during oxidation of SOI layers 53*a* and 53*b* at a later step. As a result, the leak current of SOI transistor can be prevented. The structure of the thirty-first embodiment in which the space is filled with nitride film 64 may be applied to the structure of the thirtieth embodiment shown in FIG. 182.

Figure 185:
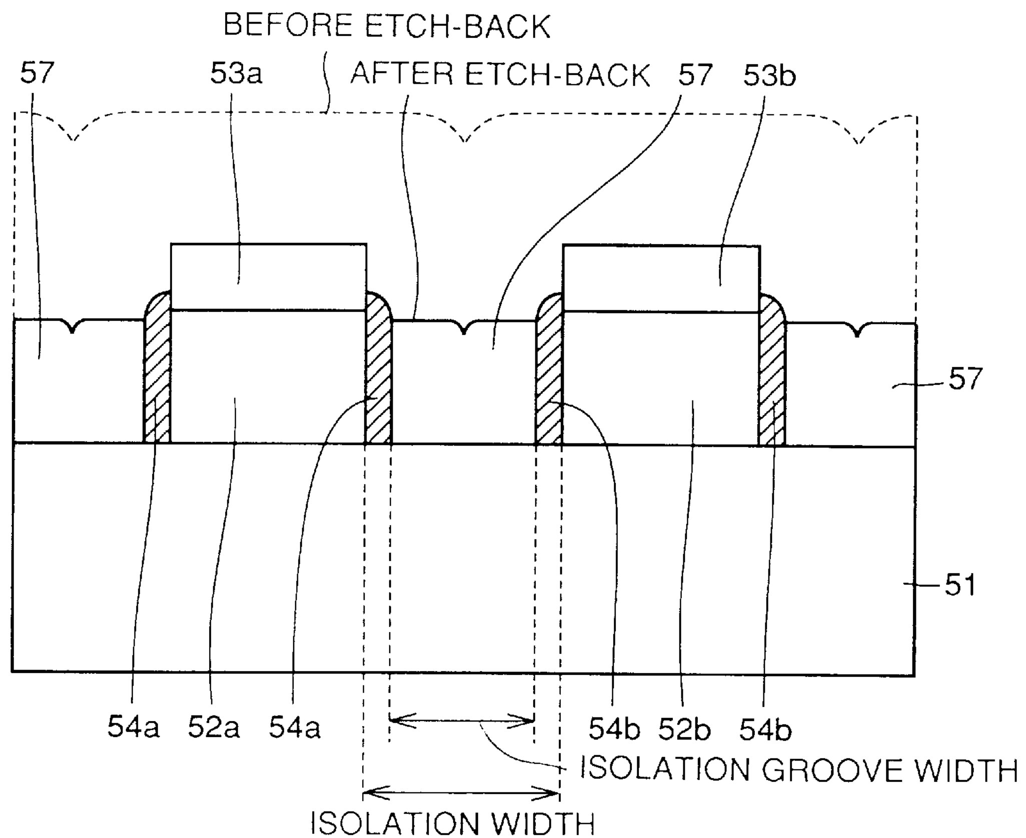
FIG. 185 is a cross section showing a process of manufacturing a semiconductor device according to a thirty-second embodiment of the invention.

A thirty-second embodiment shown in FIG. 185 is provided with buried oxide films 52*a* and 52*b* spaced by a predetermined distance as well as SOI layers 53*a* and 53*b* formed thereon and spaced by the predetermined distance. Nitride films 54*a* are formed in contact with the side surfaces of buried oxide film 52*a* and lower portions of the side surfaces of SOI layer 53*a*. Nitride films 54*b* are formed in contact with the side surfaces of buried oxide film 52*b* and lower portions of the side surfaces of SOI layer 53*b*. Oxide films 57 fill the spaces between nitride films 54*a* and 54*b*. Thereby, a structure having a small level difference can be formed similarly to the thirty-first embodiment. In this thirty-second embodiment, since oxide films 57 having a lower dielectric constant than a nitride film are used to fill the isolation regions, a parasitic capacitance can be advantageously reduced as compared with the structure of the thirty-first embodiment. Thereby, delay of the operation and thus reduction of the operation speed can be suppressed as compared with the structure of the thirty-first embodiment.

Referring to FIG. 185, a manufacturing process of the semiconductor device of the thirty-second embodiment will be described below. First, buried oxide films 52*a* and 52*b* are formed at predetermined regions of silicon substrate 51 with a predetermined space between each other, and SOI layers 53*a* and 53*b* are formed thereon. Nitride film 54 is formed over the whole surface, and then is etched back to form nitride films 54*a* and 54*b*. The silicon oxide film having a thickness larger than half the width of the isolation groove or region is formed, and then is etched back to form oxide films 57 as shown in FIG. 185. Thereby, the isolation regions are substantially fully filled with oxide films 57, so that the parasitic capacitance can be reduced. As a result, high-speed operation of SOI elements is allowed.

Figure 186:
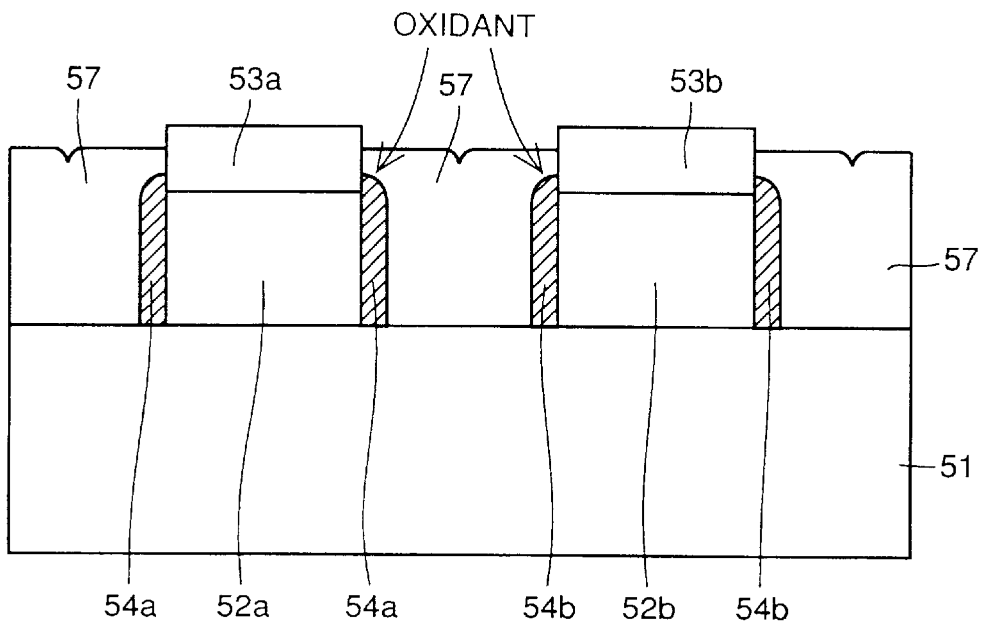
FIG. 186 is a cross section showing a modification of the manufacturing process shown in FIG. 185.

As shown in FIG. 186, the amount of etch-back of oxide film 57 may be reduced to some extent, whereby the level difference is reduced further. In this case, since the oxidant passes through the oxide film 57, no problem is caused even if oxide film 57 exists at the side surface of SOI layer 53*a*. Accordingly, a significant problem is not caused even if oxide film 57 is not etched back.

Figure 188:
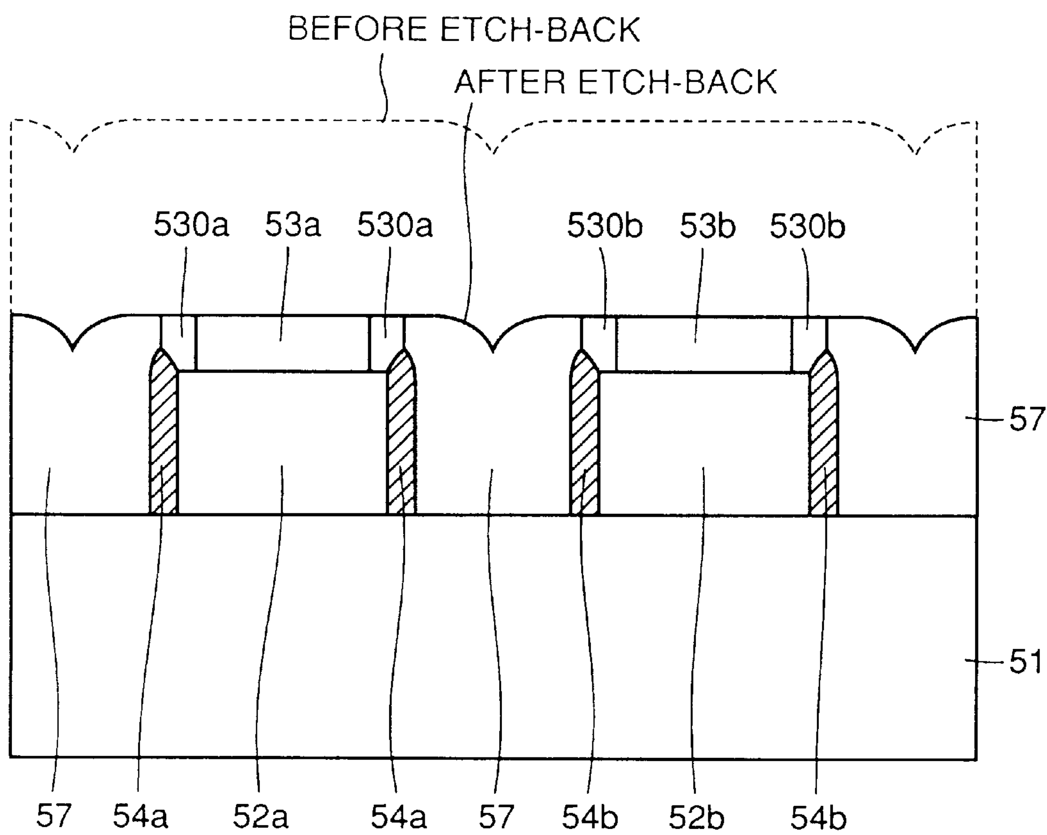

In a semiconductor device of a thirty-third embodiment shown in FIG. 188, oxide film 57 is deposited on the oxidized side surfaces of SOI layers 53*a* and 53*b*, and then is etched back. According to this manner, a thermally oxidized film which was formed on the upper surfaces of SOI layers 53*a* and 53*b* can be removed during the etch-back of oxide film 57, so that the manufacturing process can be simplified.

Figure 187:
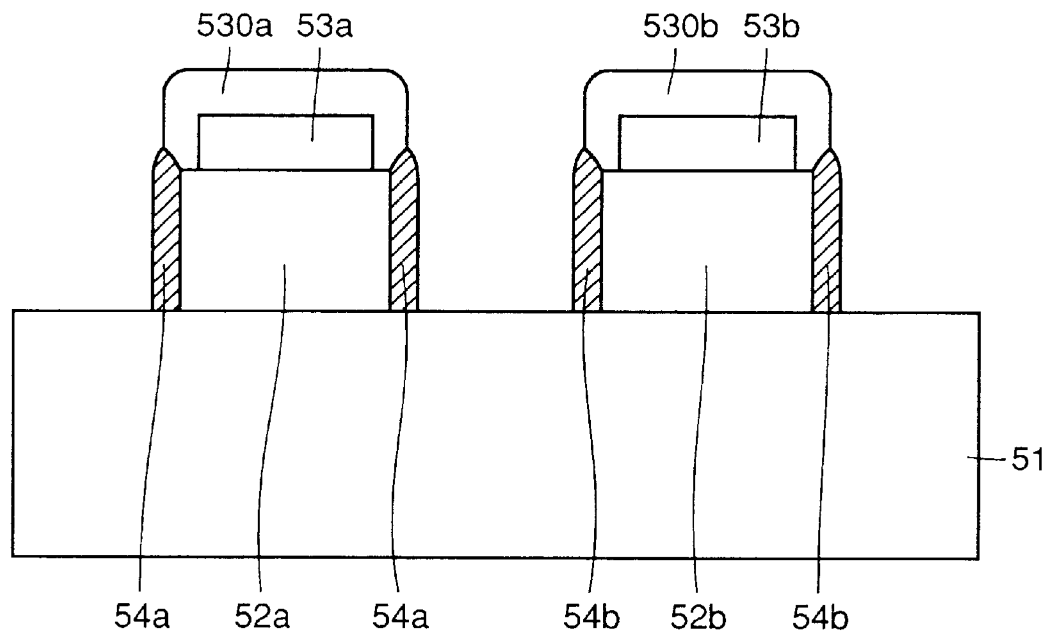
FIGS. 187 and 188 are cross sections showing 1st and 2nd steps in a process of manufacturing a semiconductor device according to a thirty-third embodiment of the invention, respectively.

Referring to FIGS. 187 and 188, a process of manufacturing the semiconductor device of the thirty-third embodiment will be described below. A process similar to the manufacturing process of the semiconductor device of the twenty-ninth embodiment shown in FIGS. 173 to 176 is performed to form buried oxide films 530*a* and 530*b* covering SOI layers 53*a* and 53*b*. Thereafter, the oxide film is formed over the whole surface, and then is etched back to form oxide film 57 covering the isolation regions as shown in FIG. 188.

Figure 189:
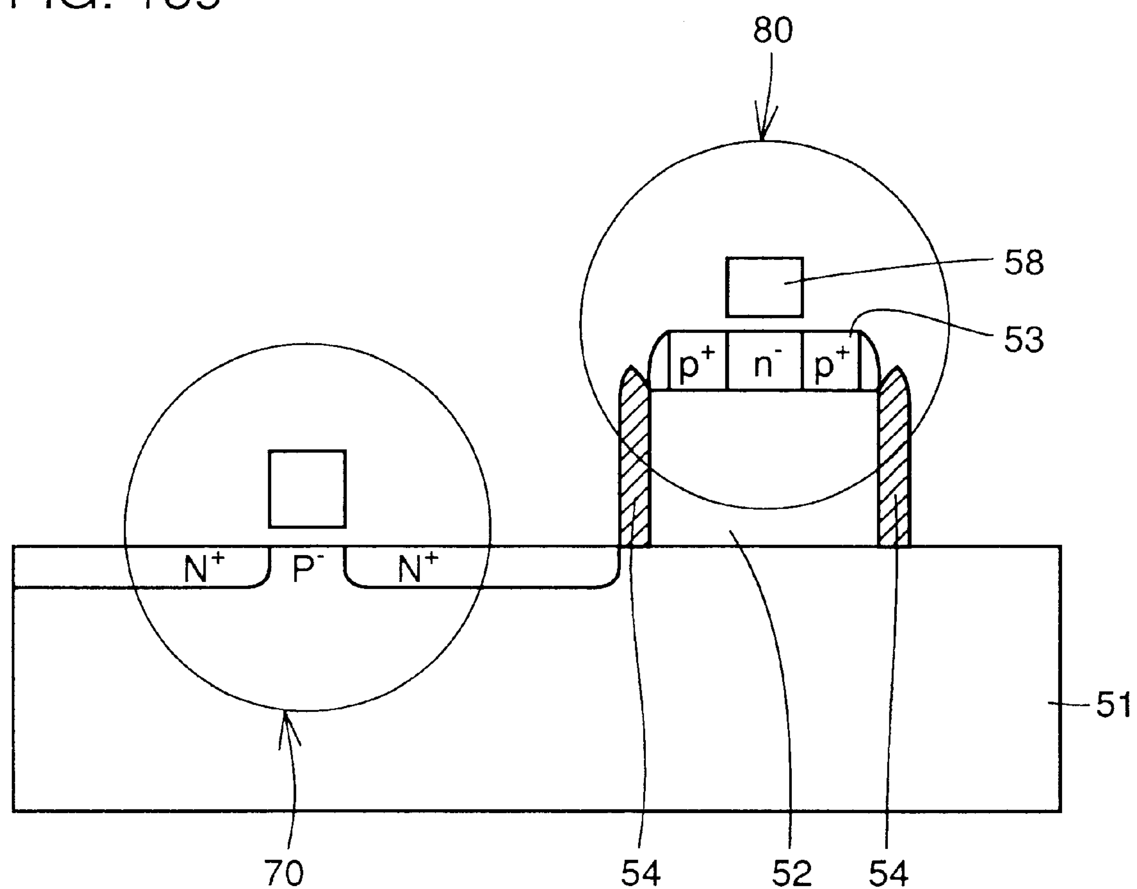
FIG. 189 is a cross sections showing a process of manufacturing a semiconductor device according to a thirty-fourth embodiment of the invention.

In a thirty-fourth embodiment shown in FIG. 189, a bulk transistor 70 and an SOI transistor 80 neighboring to each other are formed on the main surface of silicon substrate 51. Bulk transistor 70 may be formed within a space between adjacent SOI transistors 80, so that an integrated circuit having a significantly small area can be formed. As shown in FIG. 182, conductivity types of bulk transistor 70 and SOI transistor 80 may be different from each other, whereby a CMOS completely preventing latch-up can be formed.

Figure 190:
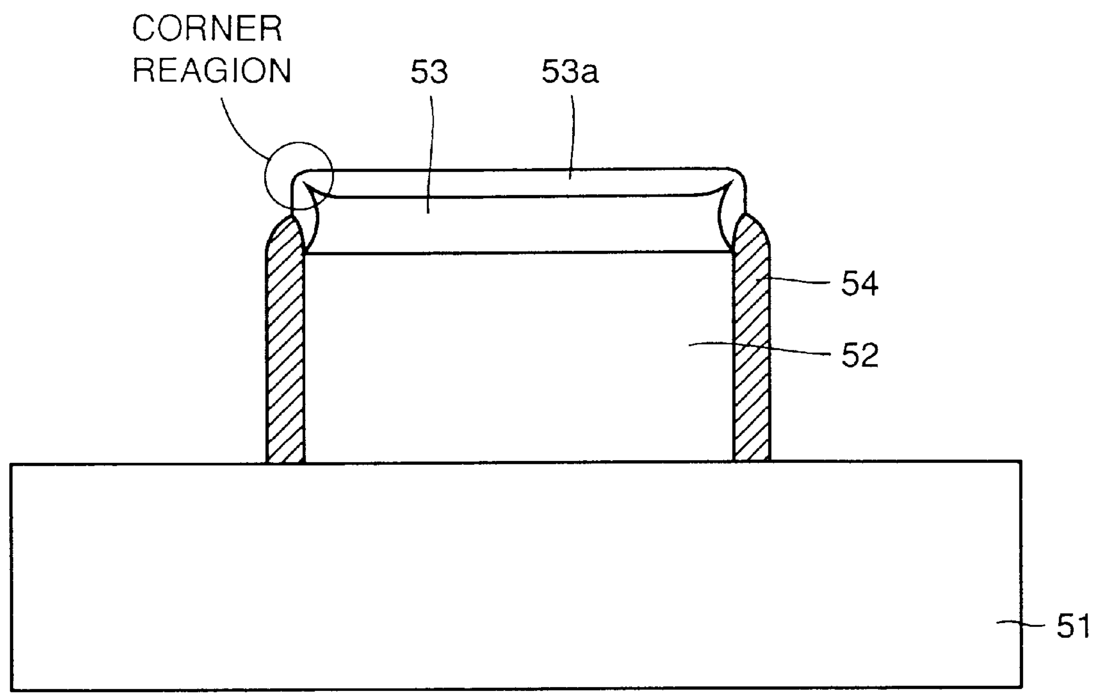
FIG. 190 is a cross sections showing a purpose of a process of manufacturing a semiconductor device according to a thirty-fifth embodiment of the invention.
Figure 191:
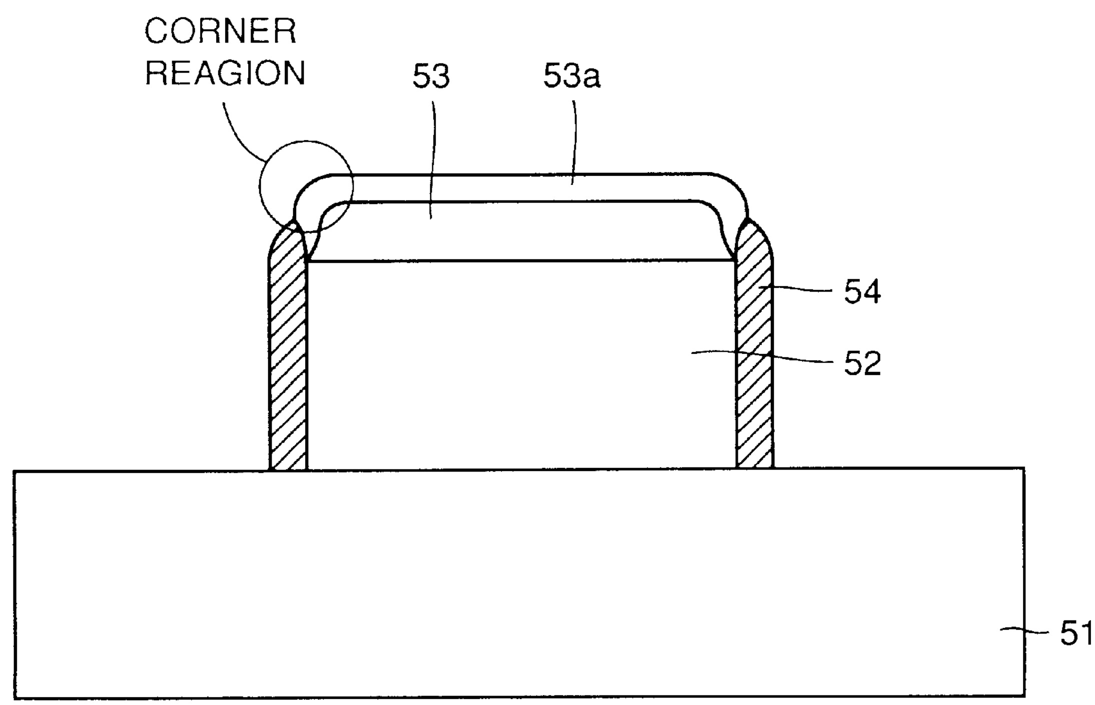
FIG. 191 is a cross sections showing the process of manufacturing the semiconductor device according to the thirty-fifth embodiment of the invention.

A thirty-fifth embodiment will be described below In an SOI-MOSFET having a structure shown in FIG. 190, oxide film 53*a* is formed by oxidizing SOI layer 53 under the temperature condition of about 900° C. using nitride film 54 as a mask, whereby SOI layer 53 has corners of an acute or sharp section. If oxide film 53*a* were thereafter removed and the SOI-MOSFET were formed, a gate electrode would wind around the corner of SOI layer 53, resulting in disadvantageous concentration of the electric field. This would cause disadvantageous generation of a parasitic transistor and increase of a leak current. In the thirty-fifth embodiment, SOI layer 53 is oxidized in a wet atmosphere at 1100° C. or more as shown in FIG. 191 in order to prevent the above disadvantages. Thereby, the corners of SOI layer 53 can be rounded. As a result, generation of the parasitic transistor can be prevented, and the leak current can be reduced.

Figure 192:
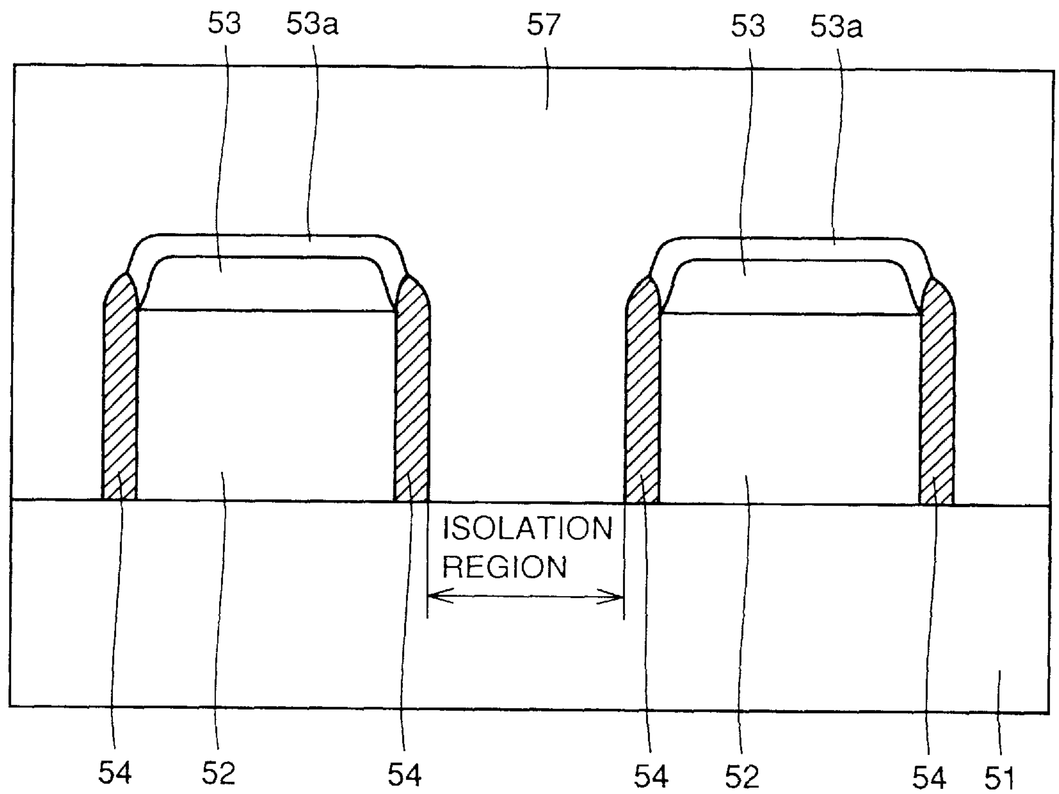
FIGS. 192 and 193 are cross sections showing 1st and 2nd steps in a process of manufacturing a semiconductor device according to a thirty-sixth embodiment of the invention, respectively.
Figure 193:
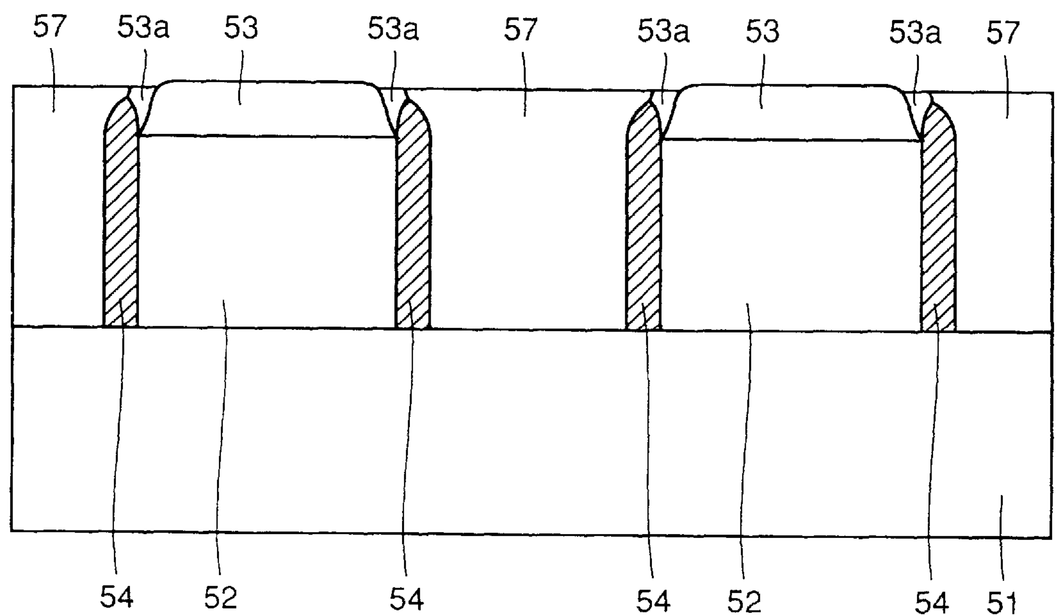

Referring to FIGS. 192 and 193, a thirty-sixth embodiment is provided with silicon oxide film 57 of which thickness is not lower than half the width of the isolation range. The upper surface of silicon oxide film 57 is etched back to obtain a structure shown in FIG. 193. Thus, the structure in which the isolation region is filled with oxide film 57, so that a level difference can be reduced. This significantly facilitates the subsequent manufacturing process In a manufacturing process of this thirty-sixth embodiment, SOI layer 53 is oxidized in the wet atmosphere under the temperature condition of about 1100° C. similarly to the manufacturing process of the thirty-fifth embodiment, so that the corners of SOI layer 53 can be rounded. Thereby, similarly to the thirty-sixth embodiment, generation of the parasitic transistor can be suppressed, and the leak current can be reduced. In the step of etching back silicon oxide film 57, wet etching is more preferable than dry etching, because the former causes less damage to the surface of SOI layer 53. However, the dry etching may be employed, in which case damages by the etching can be removed by oxidizing SOI layer 53 after the dry etching.

Figure 194:
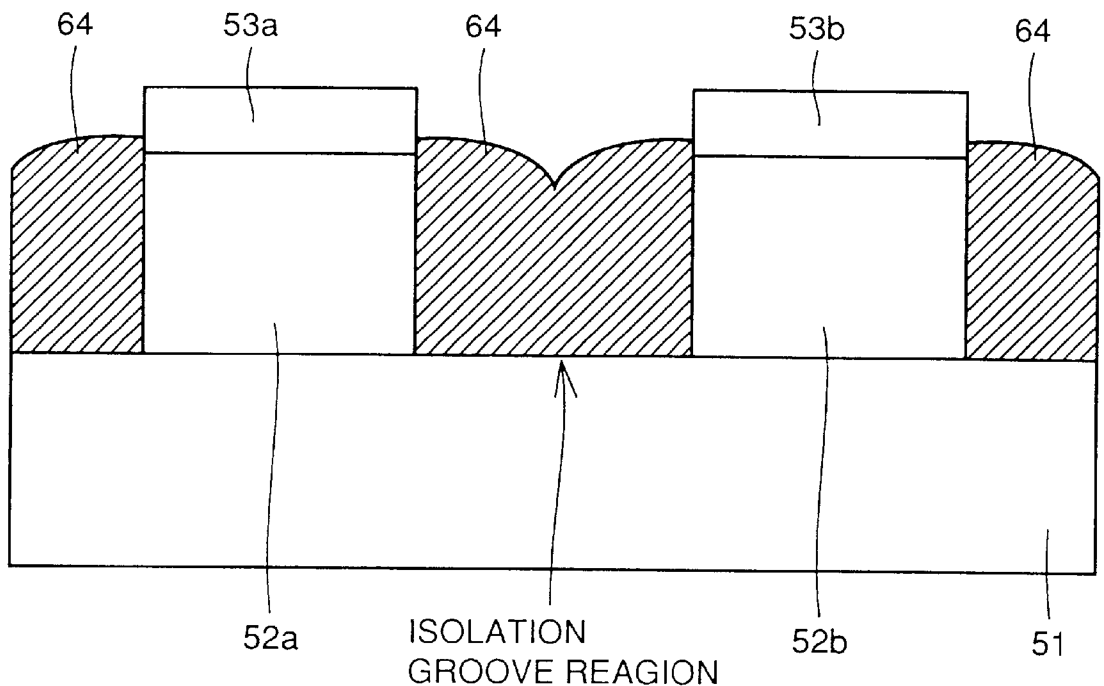
FIGS. 194 and 195 are cross sections showing 1st and 2nd steps in a process of manufacturing a semiconductor device according to a thirty-seventh embodiment of the invention, respectively.
Figure 195:
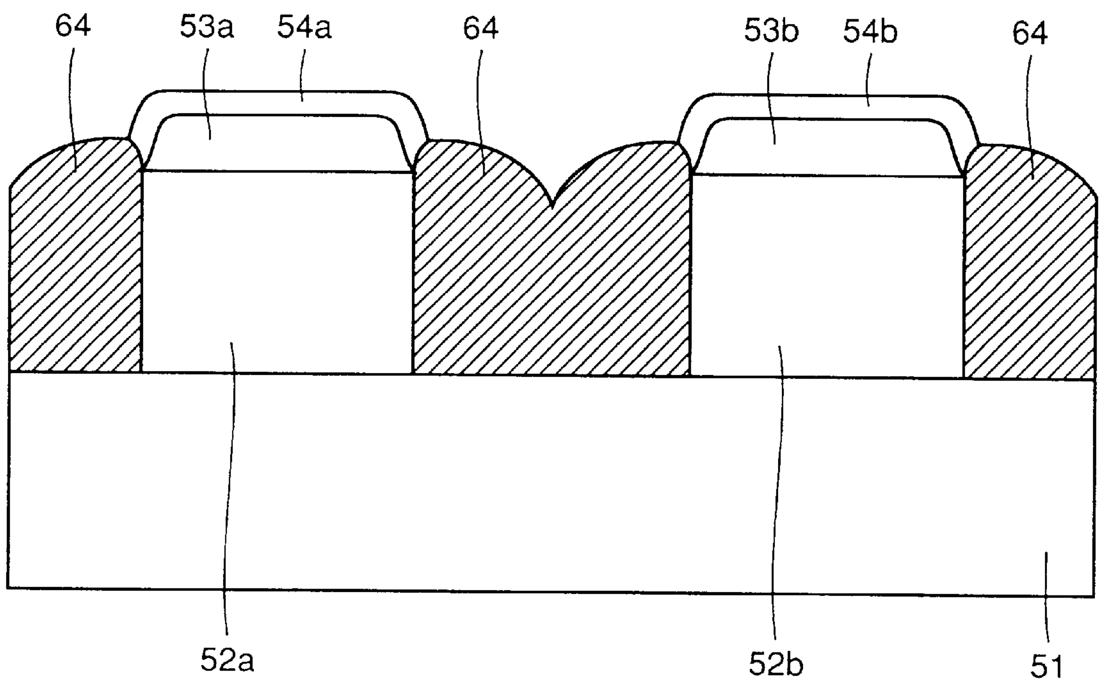

In a thirty-seventh embodiment shown in FIGS. 194 and 195, buried oxide films 52*a* and 52*b* as well as SOI layers 53*a* and 53*b* are patterned into the same configuration, and then a nitride film 64 is deposited to have a thickness not smaller than half the width of isolation region or groove. Then, nitride film 64 is etched back to leave nitride films 64 only at isolation grooves. The nitride films 64 are in contact with side surfaces of buried oxide films 52*a* and 52*b* as well as lower portions of the side surfaces of SOI layers 53*a* and 53*b*.

Using nitride films 64 as a mask, SOI layers 53*a* and 53*b* are oxidized in a wet atmosphere under the temperature condition of 1100° C. or more. Thereby, oxide films 54*a* and 54*b* shown in FIG. 195 are formed, and the corners of SOI layers 53*a* and 53*b* are rounded. Therefore, generation of the parasitic transistor can be prevented, the leak current can be reduced, and the isolation region can be flattened, so that the subsequent manufacturing process can be facilitated. In the manufacturing process of the thirty-seventh embodiment, since the step of forming nitride film 64 also serves as the step of filling the isolation groove, it is possible to eliminate the steps of forming and etching back oxide film 57 in the thirty-sixth embodiment. Therefore, the manufacturing process can be simpler than the thirty-sixth embodiment.

Figure 196:
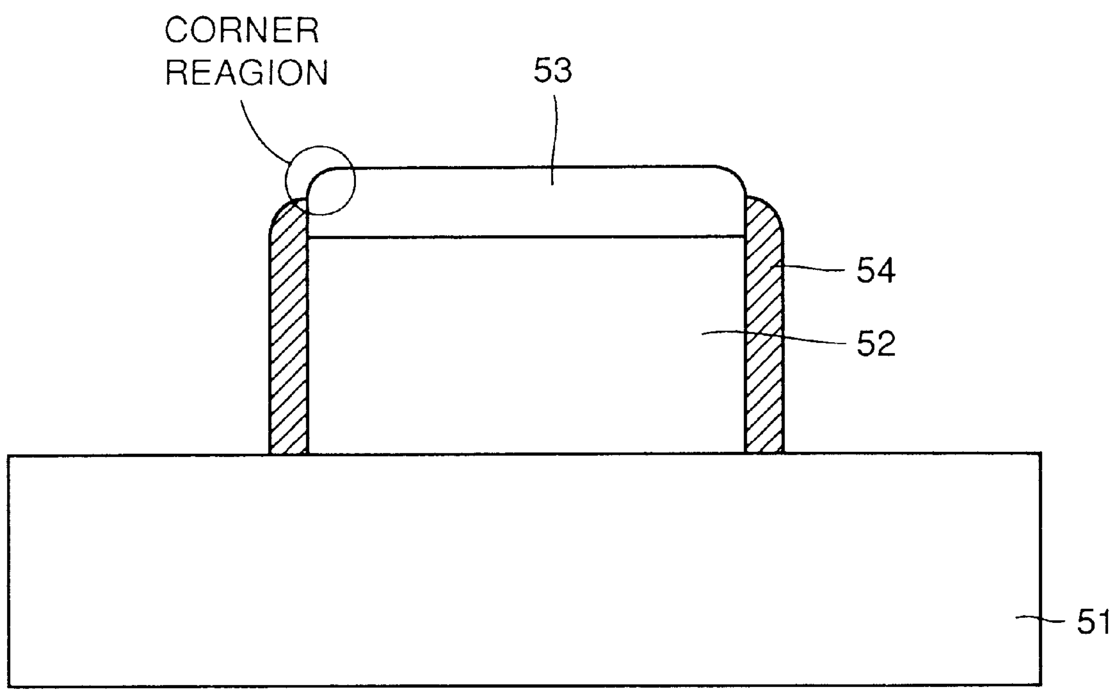
FIGS. 196 and 197 are cross sections showing 1st and 2nd steps in a process of manufacturing a semiconductor device according to a thirty-eighth embodiment of the invention, respectively.
Figure 197:
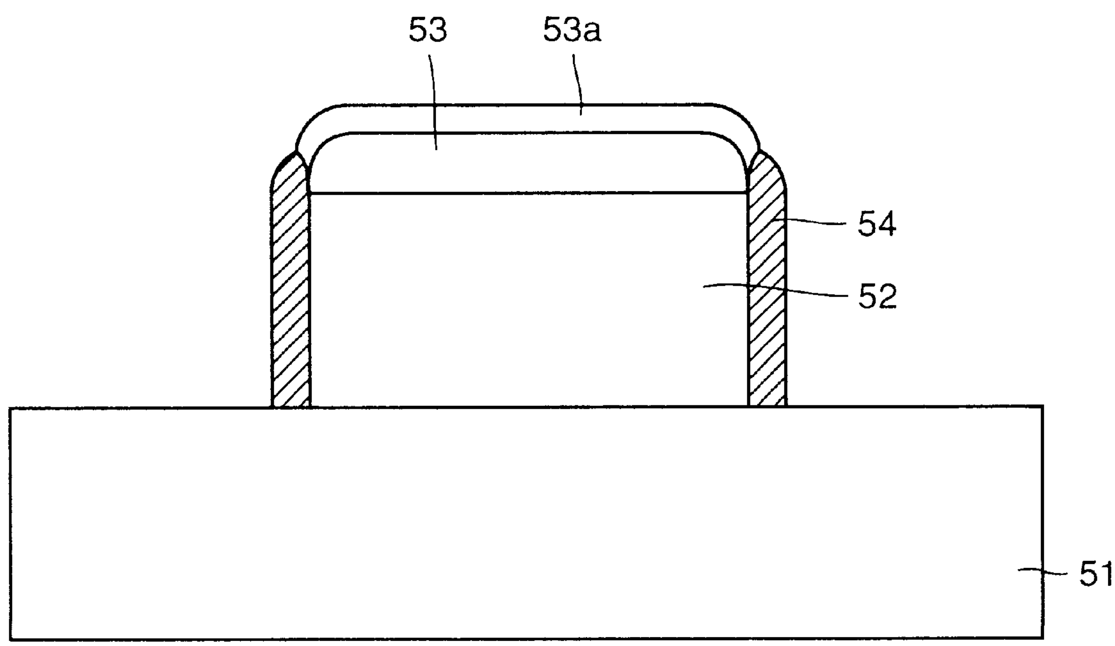
Figure 198:
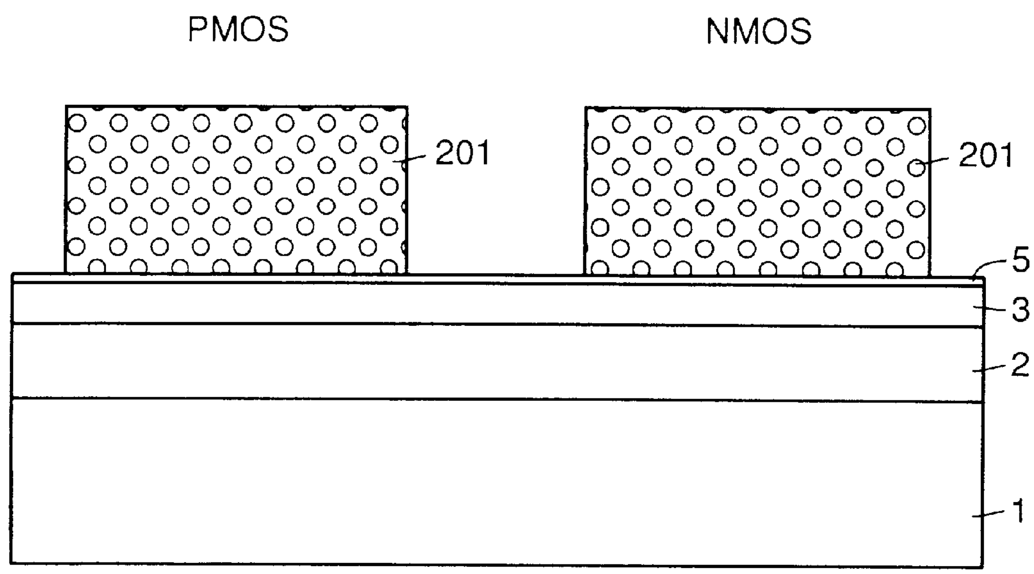
FIGS. 198 to 206 are cross sections showing 1st and 9th steps in a process of manufacturing a semiconductor device in the prior art, respectively.
Figure 199:
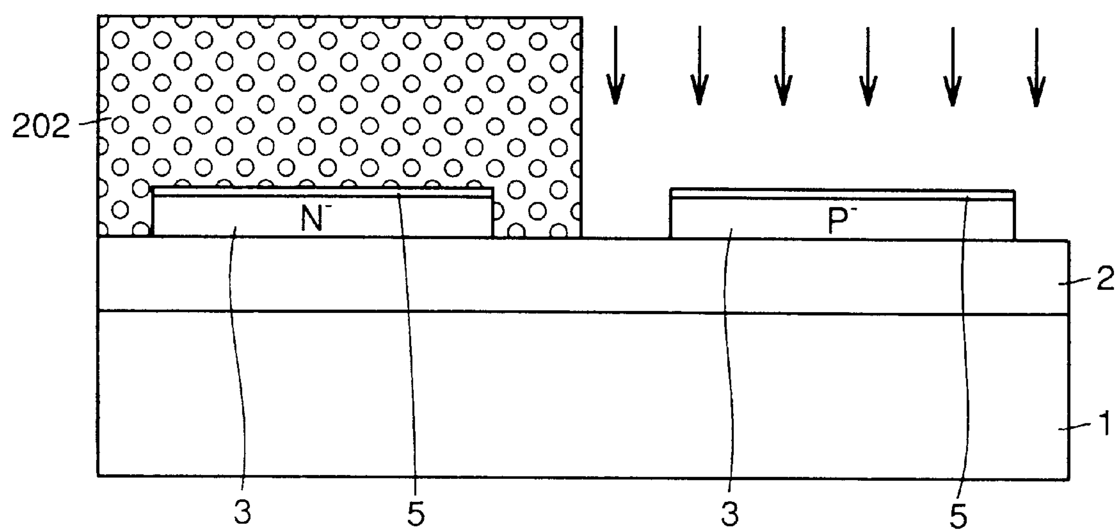
Figure 200:
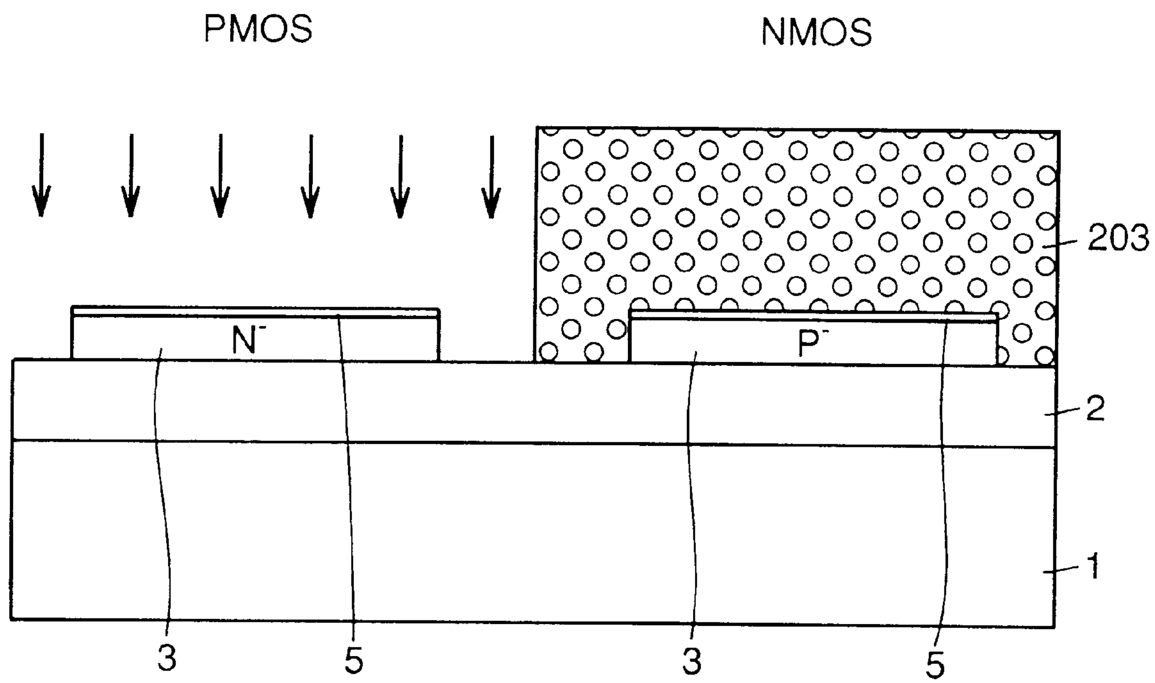
Figure 201:
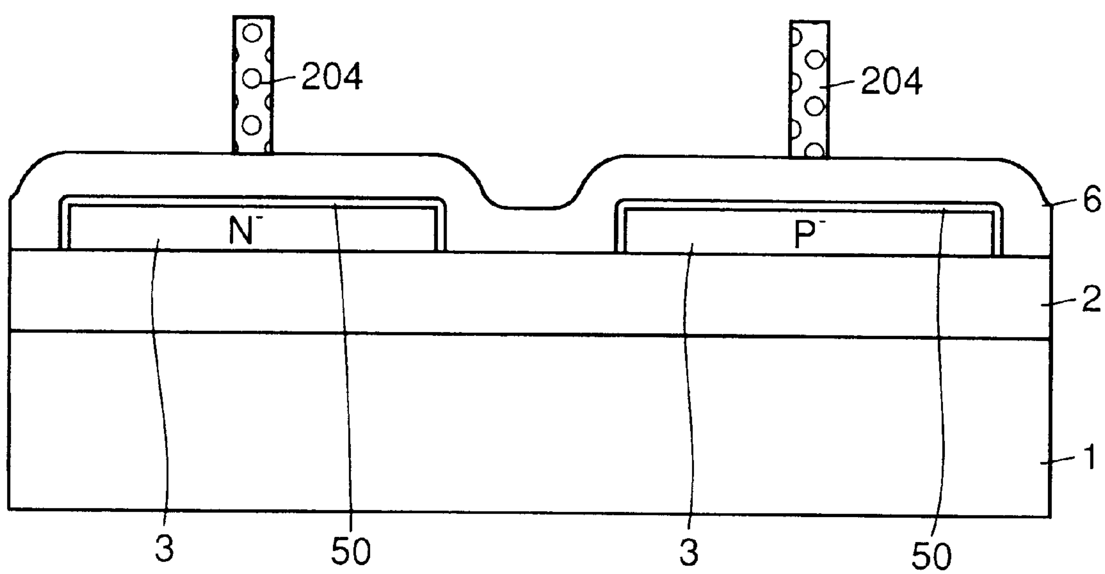
Figure 202:
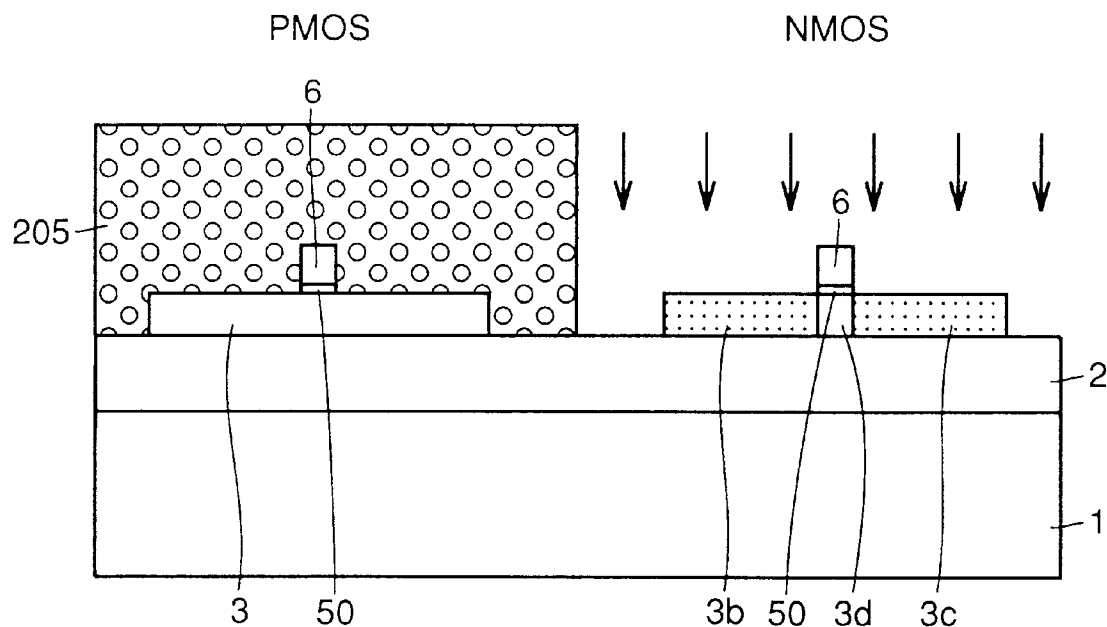
Figure 203:
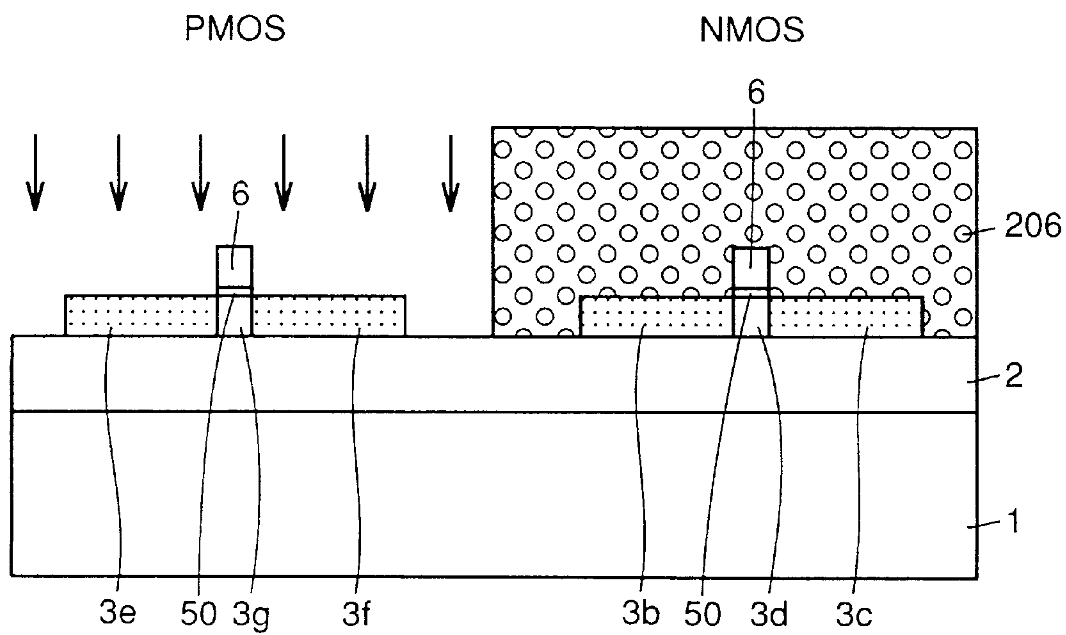
Figure 204:
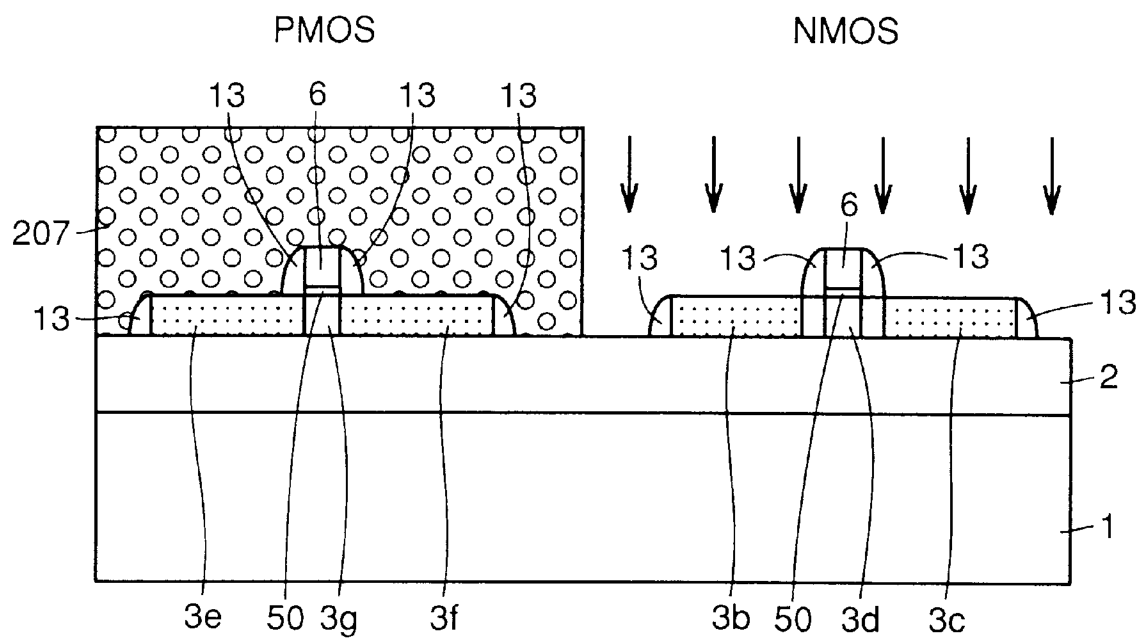
Figure 205:
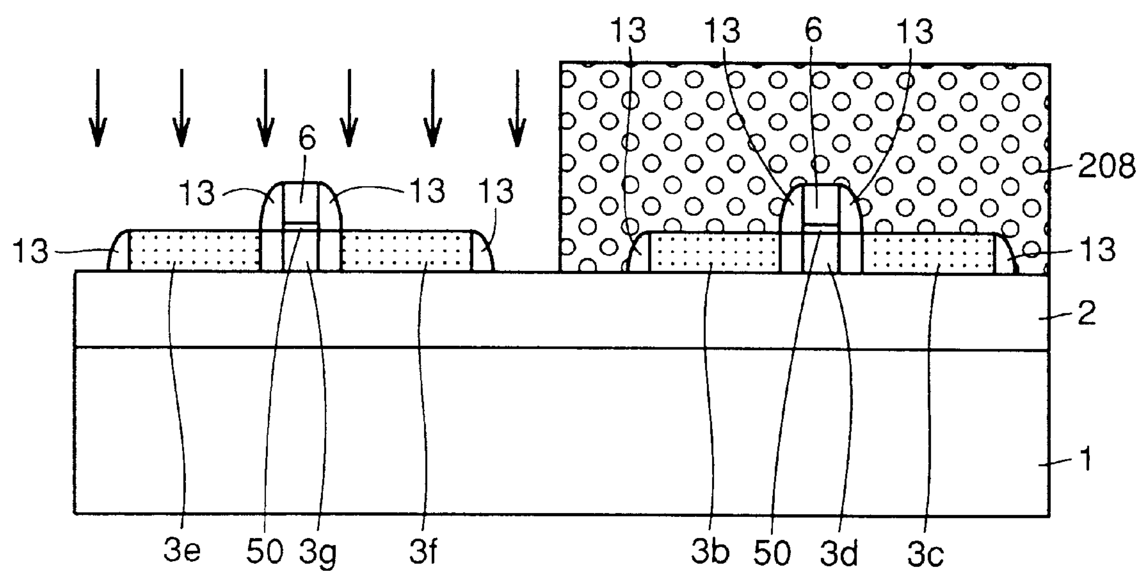
Figure 206:
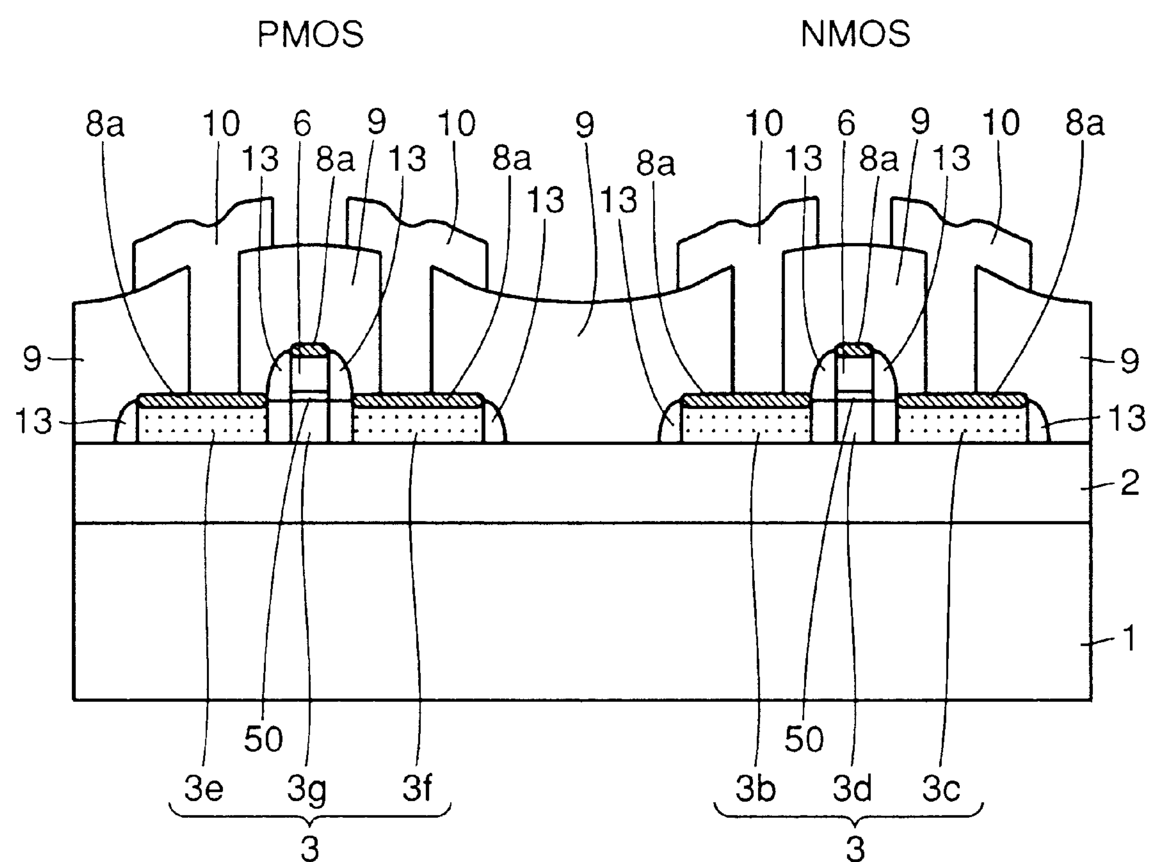
Figure 207:
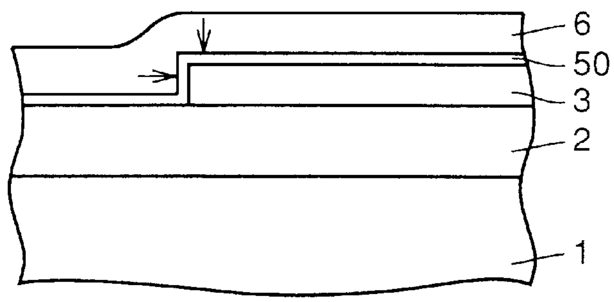
FIG. 207 is a cross section showing a problem of the semiconductor device in the prior art shown in FIG. 206.
Figure 208:
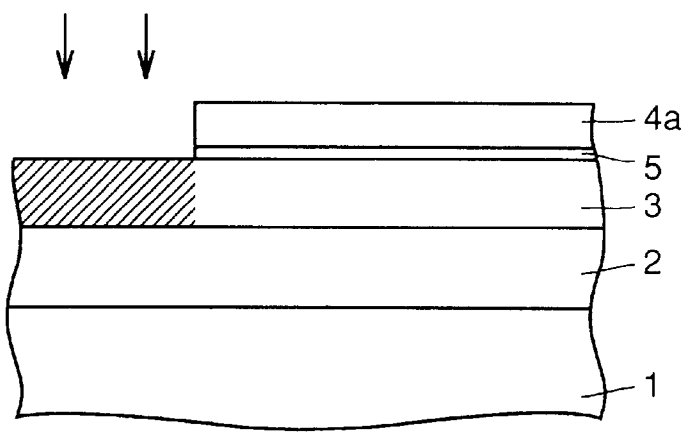
FIGS. 208 to 214 are cross sections showing 1st and 7th steps in another process of manufacturing a semiconductor device in the prior art, respectively.
Figure 209:
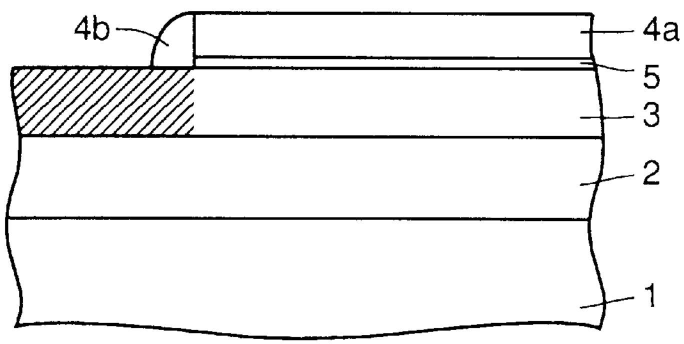
Figure 210:
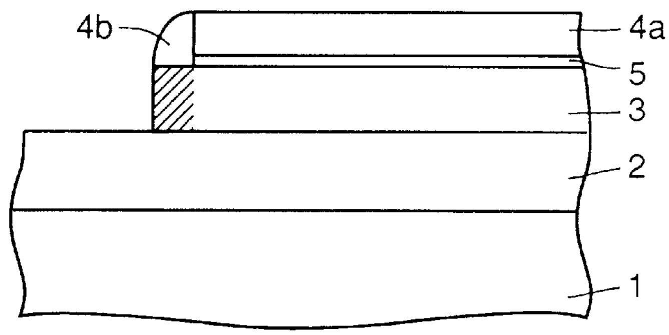
Figure 211:
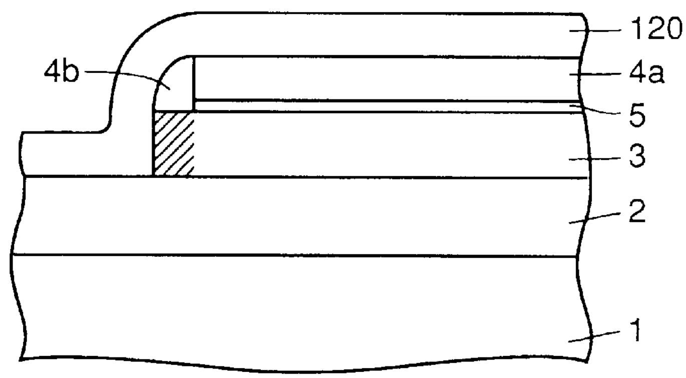
Figure 212:
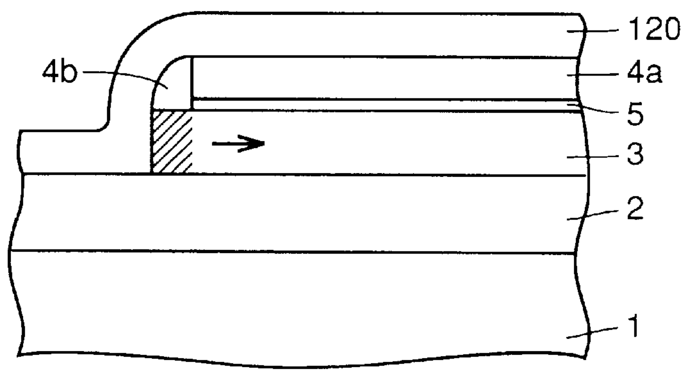
Figure 213:
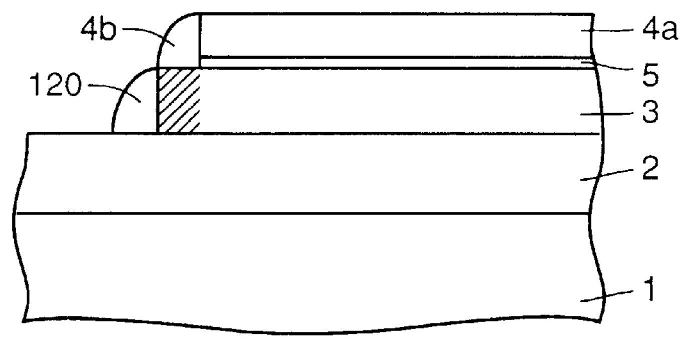
Figure 214:
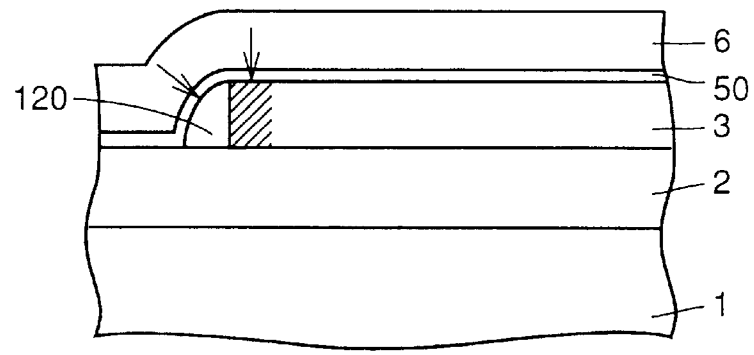
Figure 215:
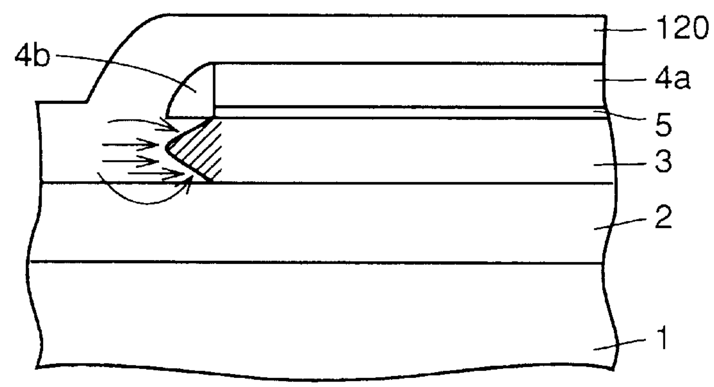
FIGS. 215 to 217 are cross sections showing a problem of the proposed manufacturing process in the prior art, and specifically showing 1st to 3rd steps, respectively.
Figure 216:
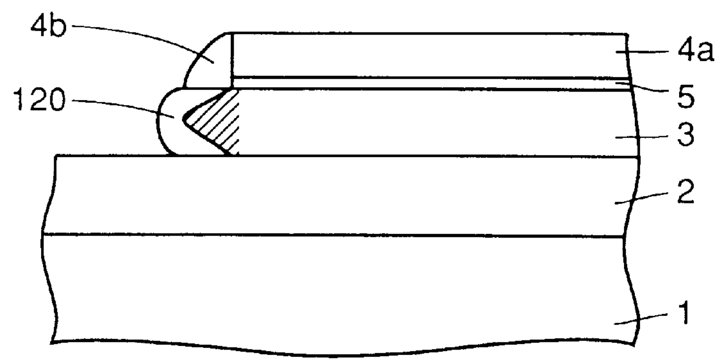
Figure 217:
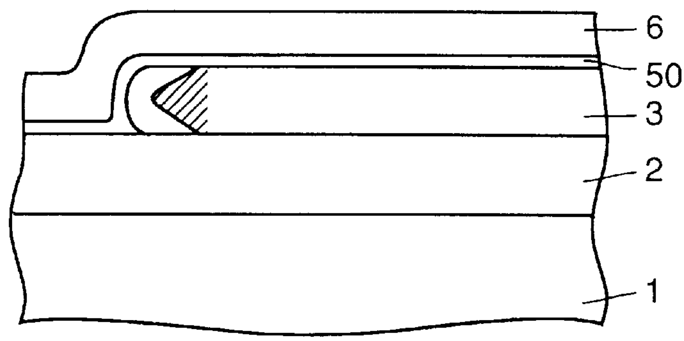
Figure 218:
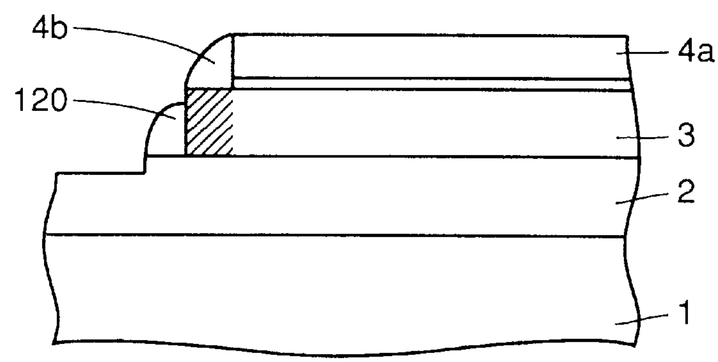
FIGS. 218 and 219 are cross sections showing a problem of the proposed manufacturing process in the prior art, and specifically showing 1st and 2nd steps, respectively.
Figure 219:
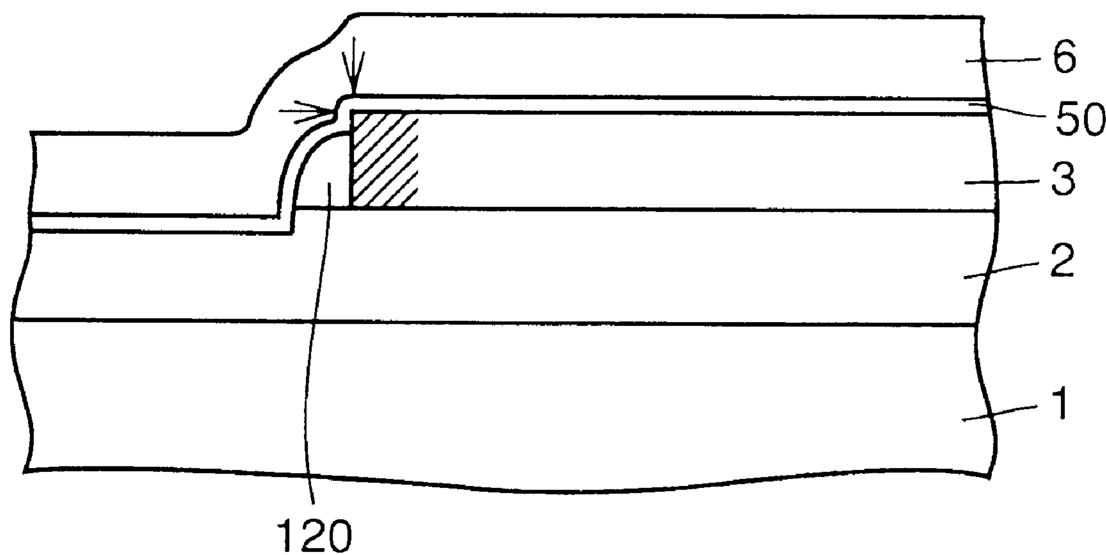

In a thirty-eighth embodiment, as shown in FIGS. 196 and 197, corners of SOI layer 53 are polished into a rounded form by the mechanical-chemical polishing method. Thereby, generation of the parasitic transistor can be prevented and the leak current is reduced in the SOI-MOSFET. Thereafter, as shown in FIG. 197, SOI layer 53 is oxidized to form oxide film 53*a*. The temperature condition not lower than 1100° C. is not essential for this oxidation, because the corners of SOI layer 53 are already rounded by the mechanical-chemical polishing.

According to the semiconductor device of an aspect of the invention, since the upper side portion of the semiconductor layer has a round section, concentration of the electric field at the upper side portion can be prevented. As a result, lowering of the threshold voltage of parasitic transistor can be prevented. Therefore, the parasitic transistor does not adversely affect the subthreshold characteristics of regular transistor. Further, the U-shaped concavity is formed at the region of the insulating layer located under the semiconductor layer and neighboring to the lower end of the side surface of the semiconductor layer, so that etching residue of the gate electrode can be prevented from remaining near the lower end of the side surface of the semiconductor layer during patterning of the gate electrode in the later manufacturing process.

According to the semiconductor device of another aspect of the invention, there is provided the nitride film which are in contact with the side surface of the insulating layer and the lower portion of the oxide film located at the side surface of the semiconductor layer which is formed on the insulating layer, so that the oxidant is prevented from moving to the rear surface of the semiconductor layer when oxidizing the side surface of the semiconductor layer. As a result, such a disadvantage can be prevented that the leak current of the SOI element generates due to formation of an oxide film at the rear surface of the semiconductor layer. Further, the oxide film may be buried between the first nitride film, which is in contact with the side surface of the first insulating layer and the lower portion of side surface of the first semiconductor layer, and the second nitride film, which is formed in contact with the side surface of the second insulating layer and the lower portion of side surface of the second semiconductor layer, in which case the level difference can be reduced, and the parasitic capacitance can be reduced. The above nitride film may be formed to fill the space between, on one hand, the first insulating layer and the first semiconductor layer formed thereon and, on the other hand, the second insulating layer and the second semiconductor layer formed thereon, the level difference can be reduced. The upper end of the side surface of the semiconductor layer may be rounded, in which case it is possible to prevent concentration of the electric field at the upper portion of side surface of the semiconductor layer. The above insulating layer may be formed on the main surface of the semiconductor substrate, and the second field-effect transistor neighboring to the above insulating layer may be formed at the main surface of the semiconductor substrate, in which case the first and second field-effect transistors can be formed without a space therebetween, and thus the semiconductor device can be integrated to a higher extent.

According to the semiconductor device of still another aspect of the invention, the semiconductor layer has a substantially trapezoidal section, and the upper portion of its side surface has a round section, whereby it is possible to suppress concentration of the electric field at the upper side portion of the semiconductor layer as compared with the case where the semiconductor layer has a square section. As a result, it is possible to prevent lowering of the threshold voltage of parasitic transistor.

According to the semiconductor device of yet another aspect of the invention, the nitride film is formed to cover the gate insulating film located at the side surface of the semiconductor layer as well as the upper surface of the insulating layer located between the adjacent semiconductor layers, whereby it is possible to prevent movement of the oxidant to the lower surface of the semiconductor layer when oxidizing the upper side portion of the semiconductor layer. Thereby, it is possible to prevent application of a stress to the semiconductor layer.

According to the semiconductor device of a further aspect of the invention, the side wall insulating film is formed to fill the concavity formed at the region of the insulating layer located under the side end of the semiconductor layer, and the polycrystalline silicon layer is formed to fill the isolation region between the semiconductor layers, so that the isolation region can be flattened.

According to the semiconductor device of a further aspect of the invention, the oxide film is formed between the upper surface of the convexity of the insulating layer and the semiconductor layer, so that fixed charges existing between the convexity of the insulating layer and the semiconductor layer can be removed.

According to the method of manufacturing the semiconductor device of a further aspect of the invention, the second semiconductor layer is formed over the first semiconductor layer, and then is oxidized to form the oxide film, so that it is possible to prevent effectively movement of the oxidant up to the rear surface of the semiconductor layer during formation of the oxide film. Therefore, such a semiconductor device can be easily manufactured that can prevent formation of the oxide film at the rear surface of the first semiconductor layer causing the leak current of the SOI transistor.

According to the method of manufacturing the semiconductor device of a further aspect of the invention, a predetermined region of the semiconductor layer is etched by a predetermined thickness, and then the semiconductor layer is oxidized using the nitride film as a mask, so that the semiconductor layer having the rounded upper side portion can be easily formed. Since the oxide film obtained by oxidizing the semiconductor layer fills a space between the neighboring semiconductor layers, the level difference can be reduced.

According to the method of manufacturing the semiconductor device of a further aspect of the invention, after the semiconductor layer is selectively oxidized using the nitride film as a mask, a region of the nitride film near the side surface of the semiconductor layer is removed, and then the semiconductor layer is anisotropically etched using the nitride film as a mask, so that the semiconductor layer having the nearly rounded upper side portion can be manufactured easily.

According to the method of manufacturing the semiconductor device of a further aspect of the invention, the second semiconductor layer covering the first semiconductor layer is formed by the sputtering method, and then is oxidized, so that the side portion of the first semiconductor layer can be oxidized to a higher extent.

According to the method of manufacturing the semiconductor device of a further aspect of the invention, the second semiconductor layer covering the first semiconductor layer is formed by the sputtering method, and then is oxidized similarly to the above aspect, so that the damaged side portion of the first semiconductor layer can be oxidized to a higher extent. Consequently, the semiconductor device of which transistor characteristics are not deteriorated can be formed easily.

According to the method of manufacturing the semiconductor device of a further aspect of the invention, inactive ions are implanted into the first semiconductor layer and then is thermally processed, so that gettering of metal contaminant in the first semiconductor layer can be performed.

According to the method of manufacturing the semiconductor device of a further aspect of the invention, after inactive ions and impurity ions are implanted into the portions near the side surface of the first semiconductor layer, the second semiconductor layer is formed over the first semiconductor layer and then is oxidized, so that gettering of metal contaminant can be performed, and the upper side portion of the first semiconductor layer can be easily rounded.

According to the method of manufacturing the semiconductor device of a further aspect of the invention, the first oxide film which was formed by oxidizing the semiconductor layer over a predetermined thickness using the nitride film as a mask is removed, and then the semiconductor layer is oxidized over a remaining thickness to form the second oxide film, so that it is possible to form easily the semiconductor layer having the side surface, of which upper portion has a round section, and of which lower portion extends substantially perpendicularly to the main surface of the insulating layer.

According to the method of manufacturing the semiconductor device of a further aspect of the invention, after the side portion of the semiconductor layer is oxidized using the nitride film as a mask, the portion of the nitride film located on the surface of the semiconductor layer is removed, and then impurity ions are implanted into the portion near the side surface of the semiconductor layer using the above nitride film as a mask, so that it is possible to manufacture easily the semiconductor device in which impurity concentration at the side surface of the semiconductor layer is not reduced.

According to the method of manufacturing the semiconductor device of a further aspect of the invention, the oxide film, which is formed by selectively oxidizing the predetermined region of the semiconductor layer using the nitride film as a mask, is removed by etching, and then the side portion of the semiconductor layer is oxidized using the nitride film as a mask, so that it is possible to form easily the semiconductor layer having the side surface, of which upper portion has a round section, and of which lower portion extend substantially perpendicularly to the main surface of the insulating layer.

According to the method of manufacturing the semiconductor device of a further aspect of the invention, the semiconductor layer is selectively oxidized over a predetermined thickness to form the first oxide film using the nitride film as a mask, and then the first oxide film is etched and removed using the nitride film as a mask, so that the upper side portion of the semiconductor layer has a round section when forming the first oxide film, and thus it is possible to form easily the semiconductor device in which concentration of the electric field can be prevented even after the gate electrode is formed at a later step.

According to the method of manufacturing the semiconductor device of a further aspect of the invention, after the oxide film is formed on the main surface of the semiconductor layer, the nitride film and the side wall nitride film are formed on the oxide film, the semiconductor layer is etched using the nitride film and the side wall nitride film as a mask, and then the nitride film and the side wall nitride film are removed by thermo-phosphoric acid, so that it is possible to prevent shaving or removal of the upper surface of the semiconductor layer by the thermo-phosphoric acid when removing the nitride film and the side wall nitride film.

According to the method of manufacturing the semiconductor device of a further aspect of the invention, after the second semiconductor layer is selectively oxidized to have a trapezoidal section using the nitride film as a mask, the second semiconductor layer and the first semiconductor layer located under the same are anisotropically etched to give a trapezoidal section to the first semiconductor layer, so that the semiconductor device which can suppress concentration of the electric field can be manufactured easily.

According to the method of manufacturing the semiconductor device of a further aspect of the invention, the nitride film is formed to cover the upper surface of the insulating layer located at the isolation region between the adjacent semiconductor layers and the side surface of the semiconductor layer, and then the upper side portion of the semiconductor layer is oxidized using the nitride film as a mask, so that it is possible to prevent the oxidant used for the above oxidation from moving up to the rear surface of the semiconductor layer.

According to the method of manufacturing the semiconductor device of a further aspect of the invention, the side wall insulating film is formed to fill the concavity at the lower side portion of the semiconductor layer, and the polycrystalline silicon layer is formed to fill the concavity between the adjacent semiconductor layers, so that the semiconductor layer having the flattened isolation region can be manufactured easily. Further, the polycrystalline silicon layer having the same expansion coefficient as the semiconductor layer is buried in the isolation region, so that a thermal stress can be suppressed.

According to the method of manufacturing the semiconductor device of a further aspect of the invention, epitaxial growth from the exposed surface of the semiconductor layer is performed to form the epitaxial growth layer using the second insulating layer as a mask, and then the epitaxial growth layer and the underlying semiconductor layer are anisotropically etched to form the semiconductor layer having a trapezoidal section, so that the semiconductor device which can suppress concentration of the electric field can be manufactured easily.

According to the method of manufacturing the semiconductor device of a further aspect of the invention, the insulating layer is isotropically etched to remove a portion of the insulating layer, which is in contact with the lower surface of the semiconductor layer, by a predetermined amount using the semiconductor layer as a mask, and then the semiconductor layer is oxidized to form the oxide film at least between the lower surface of the semiconductor layer and the insulating layer, so that fixed charges existing between the semiconductor layer and the insulating layer can be removed.

According to the method of manufacturing the semiconductor device of a further aspect of the invention, after the semiconductor layer is selectively oxidized to form the element isolating oxide film using the nitride film as a mask, impurity is ion-implanted into the side end of the semiconductor layer through the element isolating oxide film, so that such a disadvantage can be prevented that impurity introduced into the side end of the semiconductor layer is absorbed into the element isolating oxide film during formation of the element isolating oxide film, and thus lowering of the threshold voltage of parasitic transistor can be prevented.

According to the method of manufacturing the semiconductor device of a further aspect of the invention, impurity is ion-implanted into the portion near the side surface of the semiconductor layer through the side wall oxide film using the nitride film as a mask, so that it is possible to prevent the impurity introduced into the portion near the side surface of the semiconductor layer from being absorbed due to oxidation for forming the side wall oxide film. Thereby, the semiconductor device which can prevent lowering of the threshold voltage of parasitic transistor can be easily manufactured.

According to the method of manufacturing the semiconductor device of a further aspect of the invention, after the nitride film is formed in contact with the side surface of the insulating layer and the lower portion of side surface of the semiconductor layer, the side surface of the semiconductor layer is oxidized using the nitride film as a mask, so that it is possible to prevent the oxidant from moving to the rear surface of the semiconductor layer. Thereby, the semiconductor device which can prevent generation of the leak current can be manufactured easily. Further, the side surface of the semiconductor layer may be oxidized in the wet atmosphere under the temperature condition not lower than 1100° C., whereby the upper side portion of the semiconductor layer can be easily rounded. Prior to oxidation of the side surface of the semiconductor layer, the upper portion of side surface of the semiconductor layer can be polished by the mechanical-chemical polishing to round the upper side portion, whereby the semiconductor device which can suppress concentration of the electric field can be manufactured easily. The oxide film may be buried between the first nitride film which is in contact with the side surface of the first semiconductor layer and the second nitride film which is in contact with the side surface of the second semiconductor layer, whereby the structure in which a level difference is reduced can be manufactured easily.

According to the method of manufacturing the semiconductor device of a further aspect of the invention, the first nitride film and the etching stopper layer are formed on the semiconductor layer, and the second nitride film is formed in contact with the side surface of the insulating layer and the lower portion of side surface of the semiconductor layer, so that only the side surface of the semiconductor layer can be oxidized when oxidizing the semiconductor layer using the first and second nitride films as a mask. Thereby, it is possible to eliminate a step of removing the oxide film which will be formed on the upper surface of the semiconductor layer in a later step.

According to the method of manufacturing the semiconductor device of a further aspect of the invention, the nitride film is formed to fill the isolation region between the first and second semiconductor layers, and then is etched back, so that the semiconductor device in which a level difference is reduced and a leak current is suppressed can be manufactured easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor layer formed on a predetermined region of an insulating layer and having a main surface; and a field-effect transistor formed on the main surface of said semiconductor layer, wherein said semiconductor layer has a concave round section at an end of its main surface.

2. The semiconductor device according to claim 1, further comprising an impurity region formed at a side surface of said semiconductor layer, wherein said insulating layer under said semiconductor layer has a U-shaped concavity at a region located near a lower end of the side surface of said impurity region.

3. The semiconductor device according to claim 2, wherein said lower end of the side surface of said impurity region extends substantially perpendicularly to the main surface of said insulating layer; and said concavity of said insulating layer is continuous with said lower end of the side surface of said impurity region.

4. The semiconductor device according to claim 2, further comprising:

a first side wall insulating film formed in contact with the side surface of said impurity region; and a second side wall insulating film formed in contact with a side surface of said first side wall insulating film.

5. The semiconductor device according to claim 2, wherein:

said impurity region has the same conductivity type as said semiconductor layer; and said impurity region has an impurity concentration greater than that of said semiconductor layer.

6. The semiconductor device according to claim 1, further comprising an impurity region formed at a side surface of said semiconductor layer.

7. The semiconductor device according to claim 6, wherein the side surface of the impurity region is substantially perpendicular to the main surface of said semiconductor layer.

8. The semiconductor device according to claim 6, wherein:

said impurity region has the same conductivity type as that of said semiconductor layer; and said impurity region has an impurity concentration greater than that of said semiconductor layer.

9. The semiconductor device according to claim 1, further comprising first and second insulating films formed on a side surface of said semiconductor layer.

10. A semiconductor device comprising:

a semiconductor layer formed at a predetermined region on an insulating layer, which has a U-shaped concavity, said semiconductor layer having a main surface;

an impurity region formed at a side surface of said semiconductor layer; and a field-effect transistor formed at the main surface of said semiconductor layer; wherein said impurity region has a round section formed in an upper part of said impurity region, wherein:

said impurity region has the same conductivity type as said semiconductor layer; and said impurity region has an impurity concentration greater than that of said semiconductor layer.

11. A semiconductor device comprising:

a semiconductor layer having a main surface; and a field-effect transistor formed on the main surface or said semiconductor layer, wherein said semiconductor layer has a concave round section at an end of its main surface.

12. The semiconductor device according to claim 11, further comprising an impurity region formed at a side surface of said semiconductor layer.

13. The semiconductor device according to claim 12, wherein the side surface of the impurity region is substantially perpendicular to the main surface of said semiconductor layer.

14. The semiconductor device according to claim 12, wherein: said impurity region has the same conductivity type as that of said semiconductor layer; and said impurity region has an impurity concentration greater than that of said semiconductor layer.

15. The semiconductor device according to claim 11, further-comprising first and second insulating films formed on a side surface of said semiconductor layer.

* * * * *